US010978642B2

(12) United States Patent
Pan et al.

(10) Patent No.: US 10,978,642 B2
(45) Date of Patent: Apr. 13, 2021

(54) MIXTURE, COMPOSITION AND ORGANIC ELECTRONIC DEVICE

(71) Applicant: GUANGZHOU CHINARAY OPTOELECTRONIC MATERIALS LTD., Guangdong (CN)

(72) Inventors: Junyou Pan, Guangdong (CN); Jiahui Tan, Guangdong (CN)

(73) Assignee: GUANGZHOU CHINARAY OPTOELECTRONIC MATERIALS LTD., Guangdong (CN)

( * ) Notice: Subject to any disclaimer, the term of this patent is extended or adjusted under 35 U.S.C. 154(b) by 51 days.

(21) Appl. No.: 16/467,413

(22) PCT Filed: Dec. 8, 2017

(86) PCT No.: PCT/CN2017/115308

§ 371 (c)(1),
(2) Date: Jun. 6, 2019

(87) PCT Pub. No.: WO2018/103744

PCT Pub. Date: Jun. 14, 2018

(65) Prior Publication Data

US 2020/0098992 A1 Mar. 26, 2020

(30) Foreign Application Priority Data

Dec. 8, 2016 (CN) ........................ 201611123275.X

(51) Int. Cl.

| | |
|---|---|
| ***C09K 11/06*** | (2006.01) |
| ***H01L 51/00*** | (2006.01) |
| *H01L 51/50* | (2006.01) |

(52) U.S. Cl.

CPC .......... *H01L 51/0058* (2013.01); *C09K 11/06* (2013.01); *H01L 51/006* (2013.01);

(Continued)

(58) Field of Classification Search

CPC ........... C09K 11/06; C09K 2211/1029; C09K 2211/185; H01L 51/00; H01L 51/0056;

(Continued)

(56) References Cited

U.S. PATENT DOCUMENTS

| | | |
|---|---|---|
| 3,567,450 A | 3/1971 | Brantly et al. |
| 3,615,404 A | 10/1971 | Price et al. |

(Continued)

FOREIGN PATENT DOCUMENTS

| | | |
|---|---|---|
| CN | 1583691 A | 2/2005 |
| CN | 101490207 | 7/2009 |

(Continued)

OTHER PUBLICATIONS

PCT/CN2017/115308, "International Search Report", dated Feb. 26, 2018, 2 pages.

(Continued)

*Primary Examiner* — Mark Kopec
*Assistant Examiner* — Jaison P Thomas
(74) *Attorney, Agent, or Firm* — Cozen O'Connor

(57) ABSTRACT

A mixture consists of three or more organic compounds, wherein the molecular weight difference of any two organic compounds is less than 160 Dalton. In the mixture, the molar percentage of each organic compound is not less than 3% and not more than 90%, and the organic compounds all have at least one same or similar photoelectronic function.

19 Claims, 1 Drawing Sheet

(52) U.S. Cl.
CPC ...... *H01L 51/0072* (2013.01); *H01L 51/0073* (2013.01); *H01L 51/0085* (2013.01); *C09K 2211/1029* (2013.01); *C09K 2211/185* (2013.01); *H01L 51/0056* (2013.01); *H01L 51/5012* (2013.01); *H01L 51/5016* (2013.01)

(58) Field of Classification Search
CPC ............... H01L 51/0058; H01L 51/006; H01L 51/0072; H01L 51/0073; H01L 51/0085; H01L 51/5012; H01L 51/5016; Y02E 10/549
See application file for complete search history.

(56) References Cited

U.S. PATENT DOCUMENTS

| | | | |
|---|---|---|---|
| 4,720,432 | A | 1/1988 | VanSlyke et al. |
| 4,769,292 | A | 9/1988 | Tang et al. |
| 5,061,569 | A | 10/1991 | VanSlyke et al. |
| 5,121,029 | A | 6/1992 | Hosokawa et al. |
| 5,130,603 | A | 7/1992 | Tokailin et al. |
| 6,020,078 | A | 2/2000 | Chen et al. |
| 6,251,531 | B1 | 6/2001 | Enokida et al. |
| 6,824,895 | B1 | 11/2004 | Sowinski et al. |
| 6,830,828 | B2 | 12/2004 | Thompson et al. |
| 6,835,469 | B2 | 12/2004 | Kwong et al. |
| 7,029,766 | B2 | 4/2006 | Huo et al. |
| 7,250,532 | B2 | 7/2007 | Iwakuma et al. |
| 10,454,040 | B2 * | 10/2019 | Stoessel .............. H01L 51/0072 |
| 2001/0053462 | A1 | 12/2001 | Mishima |
| 2005/0258742 | A1 | 11/2005 | Tsai et al. |
| 2006/0210830 | A1 | 9/2006 | Funahashi et al. |
| 2006/0222886 | A1 | 10/2006 | Kwong et al. |
| 2007/0087219 | A1 | 4/2007 | Ren et al. |
| 2007/0092753 | A1 | 4/2007 | Begley et al. |
| 2007/0252517 | A1 | 11/2007 | Owczarczyk et al. |
| 2008/0027220 | A1 | 1/2008 | Stossel et al. |
| 2008/0113101 | A1 | 5/2008 | Inoue et al. |
| 2008/0297037 | A1 * | 12/2008 | Vestweber .......... H01L 51/0059 313/504 |
| 2009/0053557 | A1 * | 2/2009 | Spindler ............. H01L 51/0058 428/690 |
| 2009/0061681 | A1 | 3/2009 | McMunigal et al. |
| 2009/0134784 | A1 | 5/2009 | Lin et al. |
| 2012/0004407 | A1 | 1/2012 | Stoessel et al. |
| 2012/0217869 | A1 | 8/2012 | Adachi et al. |
| 2012/0326141 | A1 * | 12/2012 | Pflumm .................. C09B 57/10 257/40 |
| 2014/0197389 | A1 * | 7/2014 | Adamovich ........ H01L 51/5028 257/40 |
| 2016/0093808 | A1 | 3/2016 | Adamovich et al. |
| 2017/0194585 | A1 * | 7/2017 | Yan ..................... H01L 51/0051 |
| 2017/0309829 | A1 * | 10/2017 | Jung .................... C07D 403/10 |
| 2018/0076393 | A1 * | 3/2018 | Zeng ................... H01L 51/0085 |
| 2020/0098996 | A1 * | 3/2020 | Koenen ............... H01L 51/0056 |
| 2020/0176685 | A1 * | 6/2020 | Kang .................. H01L 51/0073 |

FOREIGN PATENT DOCUMENTS

| | | | |
|---|---|---|---|
| CN | 102282150 | A | 12/2011 |
| CN | 102668152 | A | 9/2012 |
| CN | 103026525 | | 4/2013 |
| CN | 103483332 | A | 1/2014 |
| CN | 103563117 | | 2/2014 |
| CN | 104081553 | | 10/2014 |
| DE | 102005058557 | A1 | 6/2007 |
| EP | 1191613 | B1 | 3/2006 |
| EP | 1957606 | A1 | 8/2008 |
| EP | 1191614 | B1 | 5/2009 |
| EP | 1191612 | B1 | 9/2009 |
| JP | 8053397 | A | 3/2008 |
| TW | 201309696 | A | 3/2013 |
| TW | 201309778 | A | 3/2013 |
| TW | 201343874 | A | 11/2013 |
| TW | 201350558 | A | 12/2013 |
| WO | 200070655 | A2 | 11/2000 |
| WO | 200141512 | A1 | 6/2001 |
| WO | 200202714 | A2 | 1/2002 |
| WO | 200215645 | A1 | 2/2002 |
| WO | 2005019373 | A2 | 3/2005 |
| WO | 2005033244 | A1 | 4/2005 |
| WO | 2006/000388 | A1 | 1/2006 |
| WO | 2006/000389 | A1 | 1/2006 |
| WO | 2006/058737 | A1 | 6/2006 |
| WO | 2006/122630 | A1 | 11/2006 |
| WO | 2007/065549 | A1 | 6/2007 |
| WO | 2007095118 | A2 | 8/2007 |
| WO | 2007/115610 | A1 | 10/2007 |
| WO | 2007/140847 | A1 | 12/2007 |
| WO | 2008/006449 | A1 | 1/2008 |
| WO | 2009118087 | A1 | 10/2009 |
| WO | 2009146770 | A2 | 12/2009 |
| WO | 2010015307 | A1 | 2/2010 |
| WO | 2010031485 | A1 | 3/2010 |
| WO | 201034125 | A1 | 4/2010 |
| WO | 2010054728 | A1 | 5/2010 |
| WO | 2010054731 | A1 | 5/2010 |
| WO | 2010086089 | A1 | 8/2010 |
| WO | 2010099852 | A1 | 9/2010 |
| WO | 2010102709 | A1 | 9/2010 |
| WO | 2010135519 | A1 | 11/2010 |
| WO | 2011110277 | A1 | 9/2011 |
| WO | 2011141110 | A2 | 11/2011 |
| WO | 2011/157339 | A1 | 12/2011 |
| WO | 2012/007086 | A1 | 1/2012 |
| WO | 2012/007087 | A1 | 1/2012 |
| WO | 2012/007088 | A1 | 1/2012 |
| WO | 2013113349 | | 8/2013 |
| WO | 2013133359 | A1 | 9/2013 |
| WO | 2013154064 | A1 | 10/2013 |
| WO | 2015180524 | A1 | 12/2015 |
| WO | 2016036171 | A1 | 3/2016 |

OTHER PUBLICATIONS

Baldo, et al., "High-efficiency fluorescent organic light-emitting devices using a phosphorescent sensitizer", Nature vol. 403, (2000), pp. 750-753.
Adachi et al., "High-efficiency red electrophosphorescence devices", Appl. Phys. Lett. vol. 78 (2001), pp. 1622-1624.
Kido et. al., "Bright red lightemitting organic electroluminescent devices having a europium complex as an emitter", Appl. Phys. Lett. vol. 65 (1994), p. 2124-2126.
Kido et al., "Electroluminescence in a Terbium Complex", Chem. Lett. (1990) pp. 657-660.
Johnson et. al., "Luminescent Iridium(I), Rhodium(I), and Platinum(II) Dithiolate Complexes", JACS (1983) vol. 105, pp. 1795-1802.
Wrighton et al., "The Nature of the Lowest Excited State in Tricarbonylchloro-1, 10-phenanthrolinerhenium(I) and Related Complexes", JACS vol. 96 (1974) pp. 998-1003.
Ma, et. al., "Electroluminescence from triplet metal-ligand charge-transfer excited state of transition metal complexes", Synth. Metals vol. 94 (1998) pp. 245-248.
Endo et. al., "Thermally Activated Delayed Fluorescence from Sn4lo—Porphyrin Complexes and Their Application to Organic Light-Emitting Diodes—A Novel Mechanism for Electroluminescence", Adv. Mater., vol. 21 (2009) pp. 4802-4806.
Endo et. al., "Efficient up-conversion of triplet excitons into a singlet state and its application for organic light emitting diodes", Appl. Phys. Lett., vol. 98 (2011) pp. 083302-01-083302-03.
Lee et al., "High-efficiency organic light-emitting diodes utilizing thermally activated delayed fluorescence from triazine-based donor—acceptor hybrid molecules", vol. 101 Appl. Phys. Lett., vol. 101 (2012) 093306-01-093306-04.
Tanaka, "Efficient green thermally activated delayed fluorescence (TADF) from a phenoxazine—triphenyltriazine (PXZ—TRZ) derivative", Chem. Commun. vol. 48 (2012) 11392-11394.
Goushi et.al., "Organic light-emitting diodes employing efficient reverse intersystem crossing for triplet-to-singlet state conversion", Nature Photonics, vol. 6 (2012) pp. 253-258.

(56) References Cited

OTHER PUBLICATIONS

Uoyama et al., "Highly efficient organic light-emitting diodes from delayed fluorescence", Nature, vol. 492 (2012) pp. 234-238.
Zhang et.al., "Design of Efficient Thermally Activated Delayed Fluorescence Materials for Pure Blue Organic Light Emitting Diodes", J. Am. Chem. Soc, vol. 134 (2012) pp. 14706-14709.
Mehes et.al., "Enhanced Electroluminescence Efficiency in a Spiro-Acridine Derivative through Thermally Activated Delayed Fluorescence", Angew. Chem. Int. Ed, vol. 51 (2012) pp. 11311-11315.
Nakagawa et.al., "Electroluminescence based on thermally activated delayed fluorescence generated by a spirobifluorene donor—acceptor structure", Chem. Commun., vol. 48 (2012) 9580-9582.
Nasu et.al., "A highly luminescent spiro-anthracenone-based organic light-emitting diode exhibiting thermally activated delayed fluorescence", Chem. Commun., vol. 49 (2013), 10385-10387.
Li et.al., "Highly Efficient Organic Light-Emitting Diode Based on a Hidden Thermally Activated Delayed Fluorescence Channel in a Heptazine Derivative", Adv. Mater., vol. 25 (2013) pp. 1-5.
Dias et.al., "Triplet Harvesting with 100% Efficiency by Way of Thermally Activated Delayed Fluorescence in Charge Transfer OLED Emitters", Adv. Mater., vol. 25 (2013) pp. 3707-3714.
Komino et.al., "Suppression of Efficiency Roll-Off Characteristics in Thermally Activated Delayed Fluorescence Based Organic Light-Emitting Diodes Using Randomly Oriented Host Molecules", Chem. Mater., vol. 25 (2013) pp. 3038-3047.
Tanaka et.al., "Twisted Intramolecular Charge Transfer State for Long-Wavelength Thermally Activated Delayed Fluorescence", Chem. Mater., vol. 25, (2013) pp. 3766-3771.
Lee et.al., "Oxadiazole- and triazole-based highly-efficient thermally activated delayed fluorescence emitters for organic light-emitting diodes", J. Mater. Chem. C., vol. 1 (2013) pp. 4599-4605.
Ishimatsu et.al., "Solvent Effect on Thermally Activated Delayed Fluorescence by 1,2,3,5-Tetrakis(carbazol-9-yl)-4,6-dicyanobenzene", J. Phys. Chem. A., vol. 117 (2013) pp. 5607-5612.
Kipphan (Handbook of Print Media: Technologies and Production Methods), ISBN 3-540-67326-1,Chapter 1.3, pp. 40-67, Chapter 1.5, pp. 117-144, Chapter 5.5, pp. 711-730.
Bulovic et. al., "Transparent light-emitting devices", Nature, vol. 380 (1996) pp. 29.
Gu et. al., "Transparent organic light emitting device", Appl. Phys. Lett. vol. 68 (1996) pp. 2606-2608.
European Application No. EP17879321.2, "Invitation pursuant to Rule 63 (1)", dated Aug. 16, 2019, 3 pages.
European Application No. EP17879321.2, "Extended Search Report", dated Nov. 19, 2019, 6 pages.
European Application No. EP17879321.2, "Office Action", dated Aug. 3, 2020, 4 pages.

* cited by examiner

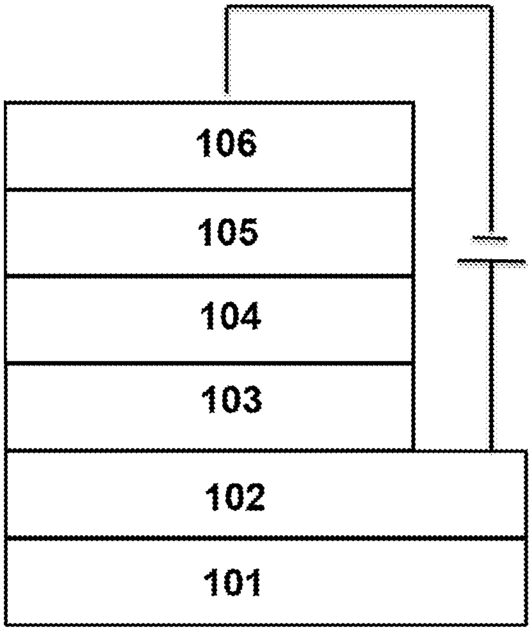
106
105
104
103
102
101

MIXTURE, COMPOSITION AND ORGANIC ELECTRONIC DEVICE

CROSS-REFERENCE TO RELATED APPLICATIONS

The present application is a national stage for International Application No. PCT/CN2017/115308, filed on Dec. 8, 2017, which claims priority to Chinese Application No. 201611123275.X, filed on Dec. 8, 2016, both of which are incorporated herein by reference in their entireties.

TECHNICAL FIELD

The present disclosure relates to the field of organic electronic devices, and particularly to a mixture, a formulation, and an organic electronic device.

BACKGROUND

Currently, as a new-generation display technology, organic light-emitting diode (OLED) is prepared by an evaporation method. In the preparation process, a large number of vacuum procedures are involved, which result in low material utilization rate. And a fine metal mask (FMM) is required, so the cost is high and the yield rate is low. At the same time, quantum dot light-emitting diode (QLED) as another new display technology cannot be prepared by an evaporation method and must be prepared by solution processing. For these seasons, new technique for realizing high-resolution full-color display using a printing process has been receiving more and more attention. For example inkjet printing can produce functional material thin films in a large area. With the properties of the low energy consumption, low water consumption, and environmental friendliness, this kind of production technology with great advantages and potential compared with traditional semiconductor production processes. Therefore, to achieve printing display, it is necessary to break through key issues about a printing ink and related processing techniques.

The performance of OLEDs prepared by vacuum evaporation based on small molecular materials is excellent, these materials also have basically met the commercial requirements. However, the commercialized small molecular OLED materials usually have properties of small molecular weight, low glass transition temperature and high molecular planar structural rigidity, which results in poor film forming property and prone to crystallize in the subsequent heating process. These property leads to a significant decrease in the performance and lifetime of solution processed OLED, and has seriously hindered the development of printed OLED technology.

SUMMARY

Accordingly, a mixture capable of improving the performance and lifetime of an OLED is provided.

In addition, a formulation and an organic electronic device are also provided.

A mixture comprises three or more organic compounds, wherein a molecular weight difference between any two organic compounds is less than 160 Dalton, in the mixture, a molar content of each organic compound is no less than 3% and no more than 90%, and all of the organic compounds have at least one identical or similar optoelectronic function.

A formulation includes the foregoing mixture and an organic solvent.

An organic electronic device includes a functional layer whose materials include one of the foregoing mixture and the foregoing formulation.

The details of one or more embodiments of the present disclosure are set forth in the accompanying drawings and the description below. Other features, objects and advantages of the present disclosure will become apparent from the description, the accompanying drawings, and the claims.

BRIEF DESCRIPTION OF THE DRAWINGS

FIG. 1 is a schematic view of an organic light emitting diode in an organic electronic device according to an embodiment.

In FIG. 1, 101 is a substrate, 102 is an anode, 103 is a hole injection layer or a hole transporting layer, 104 is a light-emitting layer, 105 is an electron injection layer or an electron transporting layer, and 106 is a cathode.

DETAILED DESCRIPTION OF THE EMBODIMENTS

The present disclosure provides a mixture, a formulation and an organic electronic device. In order to make the purpose, technical solution and effects of the present disclosure clearer and more specific, the present disclosure will be furthermore described in detail below. It should be noted that the specific embodiment illustrated herein is merely for the purpose of explanation, and should not be deemed to limit the disclosure.

A mixture according to an embodiment comprises three or more organic compounds, wherein the molecular weight difference between any two organic compounds is less than 160 Dalton, in the mixture, the molar content of each organic compound is no less than 3% and no more than 90%, and all of the organic compounds have at least one identical or similar optoelectronic function.

The optoelectronic function is one selected from, but not limited to, a hole transporting function, a hole blocking function, an electron transporting function, an electron blocking function, an exciton blocking function, a fluorescent light-emitting function, a phosphorescent light-emitting function, a host function, and a light-absorption function.

The mixture exhibits better solubility, is easily processed by solution to obtain pinhole free and uniform film, and maintains an amorphous morphology. The thermodynamic principle of the mixture is as follows:

Entropy is a state function that describes the system's disorder of material in thermodynamics, and according to Boltzmann's assumption about the relationship between entropy and system disorder, entropy is defined as the probability of a special state, i.e., the number of microstates, that is, the number of atomic aggregation ways. When the state of the system is certain, the number of microstates is certain, i.e., the degree of system disorder is certain; the greater the number of microscopic states, i.e., the greater the degree of system disorder, the greater the entropy is. In material thermodynamics, entropy can be divided into mixed entropy, configuration entropy, vibration entropy and the like. Due to the small configuration entropy and vibration entropy in mixed systerm, the effect of the atomic vibration configuration, electronic configuration, magnetic moment configuration and the like on entropy values can be neglected.

Suppose the total number of atoms in the mixed system is N, where no atoms are the same type of elements, $n_1$ atoms are the same type of elements, . . . , $n_r$ atoms are the same type of elements, k is the Boltzmann constant, the mixed entropy of the mixed system is:

$$\Delta S_{conf} = k\ln\left(\frac{N!}{n_0!n_1!n_2!\ \ldots\ n_r!}\right) = k\ln\frac{N!}{\prod_{i=0}^{i=r} n!} \quad \text{(Equation 1)}$$

When each atomic fraction of component (element) in the mixed system is the same, i.e., n0=n1= . . . =nr=1 rN, the maximum of ΔSconf will be obtained. For a 1 mol mixed system, the molar mixed entropy can be expressed as:

$$\Delta S^m_{conf} = R\ \ln(n) \quad \text{(Equation 2)}$$

wherein R in equation 2 is a gas molar constant, R=8.131 (KJ·K−1·mol-1), and m is a unit mole. Therefore, when n=2, ΔSconf=0.693R; when n=3, ΔSconf=1.099R; when n=4, ΔSconf=1.386R; when n=5, ΔSconf=1.609R; when n=6, ΔSconf=1.792R; . . . .

According to the Gibbs free energy formula:

$$G_{mix} = H_{mix} - TS_{mix} \quad \text{(Equation 3)}$$

It can be seen that the greater the number of pivot elements in the mixed system is, the greater the mixed entropy value of the system is, then the smaller the Gibbs free energy is and the more stable the system is.

The foregoing mixture can provide a stable mixed system to solve the problem of film-forming of small molecular materials in the conventional solution processing.

In one of the embodiments, the molecular weight difference between any two organic compounds in the mixture is less than 140 Dalton. Further, the molecular weight difference between any two organic compounds in the mixture is less than 120 Dalton. Still further, the molecular weight difference between any two organic compounds in the mixture is less than 100 Dalton. Still further, the molecular weight difference between any two organic compounds in the mixture is less than 80 Dalton. Even further, the molecular weight difference between any two organic compounds in the mixture is less than 40 Dalton.

In one of the embodiments, the molar content of each organic compound in the mixture is no less than 3% and no more than 80%. Further, the molar content of each organic compound in the mixture is no less than 5% and no more than 70%. Still further, the molar content of each organic compound in the mixture is no less than 5% and no more than 60%. Still further, the molar content of each organic compound in the mixture is no less than 10% and no more than 50%. Even further, the molar content of each organic compound in the mixture is no less than 10% and no more than 40%.

In one of the embodiments, the molar content difference between any two organic compounds in the mixture is no greater than 0.3. Further, the molar content difference between any two organic compounds in the mixture is no greater than 0.2. Still further, the molar content difference between any two organic compounds in the mixture is no greater than 0.15. Even further, the molar content difference between any two organic compounds in the mixture is no greater than 0.1.

In one of the embodiments, each of the organic compounds in the mixture is one selected from a fluorescent host material (a singlet host), a phosphorescent host material (a triplet host), a hole transporting material, and an electron transporting material. Further, each of the organic compounds in the mixture is one selected from a fluorescent host material and a phosphorescent host material.

In one of the embodiments, the organic compounds in the mixture all have at least one similar or identical optoelectronic property, or all have at least one similar or identical physical property.

Specifically, the organic compounds in the mixture satisfy at least one of the following conditions, while conditions (7) and (8) cannot be simultaneously satisfied:

(1) a difference in singlet excited state energy level between any two of the organic compounds is no greater than 0.2 eV. Further, a difference in singlet excited state energy level between any two of the organic compounds is no greater than 0.15 eV. Still further, a difference in singlet excited state energy level between any two of the organic compounds is no greater than 0.12 eV Even further, a difference in singlet excited state energy level between any two of the organic compounds is no greater than 0.10 eV;

(2) a difference in triplet excited state energy level between any two of the organic compounds is no greater than 0.2 eV. Further, a difference in triplet excited state energy level between any two of the organic compounds is no greater than 0.15 eV. Still further, a difference in triplet excited state energy level between any two of the organic compounds is no greater than 0.12 eV. Even further, a difference in triplet excited state energy level between any two of the organic compounds is no greater than 0.10 eV;

(3) a difference in HOMO energy level between any two of the organic compounds is no greater than 0.2 eV. Further, a difference in HOMO energy level between any two of the organic compounds is no greater than 0.15 eV Still further, a difference in HOMO energy level between any two of the organic compounds is no greater than 0.12 eV Even further, a difference in HOMO energy level between any two of the organic compounds is no greater than 0.10 eV;

(4) a difference in LUMO energy level between any two organic compounds is no greater than 0.2 eV. Further, a difference in LUMO energy level between any two of the organic compounds is no greater than 0.15 eV. Still further, a difference in LUMO energy level between any two of the organic compounds is no greater than 0.12 eV Even further, a difference in LUMO energy level between any two of the organic compounds is no greater than 0.10 eV;

(5) any one of the organic compounds has a ΔHOMO no less than 0.2 eV Further, any one of the organic compounds has a ΔHOMO no less than 0.3 eV. Still further, any one of the organic compounds has a ΔHOMO no less than 0.4 eV Even further, any one of the organic compounds has a ΔHOMO no less than 0.45 eV;

(6) any one of the organic compounds has a ΔLUMO no less than 0.2 eV Further, any one of the organic compounds has a ΔLUMO no less than 0.3 eV Still further, any one of the organic compounds has a ΔLUMO no less than 0.4 eV Even further, any one of the organic compounds has a ΔLUMO no less than 0.45 eV;

(7) any one of the organic compounds has a Δ(S1−T1) no less than 0.8 eV. Further, any one of the organic compounds has a Δ(S1−T1) no less than 0.9 eV Still further, any one of the organic compounds has a Δ(S1−T1) no less than 1.0 eV. Even further, any one of the organic compounds has a Δ(S1−T1) no less than 1.1 eV;

(8) any one of the organic compounds has a Δ(S1−T1) no greater than 0.3 eV. Further, any one of the organic compounds has a Δ(S1−T1) no greater than 0.25 eV. Still further, any one of the organic compounds has a Δ(S1−T1) no greater than 0.2 eV. Even further, any one of the organic compounds has a Δ(S1−T1) no greater than 0.1 eV;

(9) a difference in sublimation temperature between any two of the organic compounds is no greater than 30° C.; further, a difference in sublimation temperature between any two of the organic compounds is no greater than 25° C. Still further, a difference in sublimation temperature between any two of the organic compounds is no greater than 20° C. Even further, a difference in sublimation temperature between any two of the organic compounds is no greater than 15° C.;

wherein Δ(S1−T1)=|S1−T1|, ΔHOMO=□(HOMO−1)−HOMO□, ΔLUMO=□(LUMO+1)−LUMO□.

The energy level structure of the organic compound in the mixture includes the triplet excited state energy level ET, HOMO and LUMO. The energy level structure of an organic compound plays a key role in the performance of an organic electronic device.

The triplet excited state energy level ET can be measured by low temperature time-resolved luminescence spectroscopy, and ET also can be obtained by quantum simulation. Further, ET can be obtained by Time-dependent DFT calculation. Specifically, ET can be obtained by simulation calculation using a commercial software Gaussian 09W (Gaussian Inc.), and specific simulation methods can be found in WO2011141110.

The HOMO and LUMO energy levels can be measured by photoelectric effect, such as by x-ray photoelectron spectroscopy (XPS), ultraviolet photoelectron spectroscopy (UPS), cyclic voltammetry (hereinafter referred to as CV) or a quantum chemistry method. Specifically, the quantum chemistry method is the density functional theory (hereinafter referred to as DFT).

It should be noted that the absolute values of the HOMO, LUMO, ET depend on the used measurement method or calculation method. Even for the same measurement method, different HOMO/LUMO or ET values can be obtained with different evaluation methods, for example, different HOMO/LUMO or ET values can be obtained with a starting point or a peak point on the CV curve. Therefore, reasonable and meaningful comparisons should be made by using same measurement method and same evaluation method. In the present embodiment, the HOMO, LUMO and ET values are based on the simulations of Time-dependent DFT, but this does not affect the application of other measurement or calculation methods.

(HOMO−1) is the second highest occupied orbital energy level, (HOMO−2) is the third highest occupied orbital energy level, and so on. (LUMO+1) is the second lowest unoccupied orbital energy level, and (LUMO+2) is the third lowest occupied orbital energy level, and so on.

In one of the embodiments, all of the organic compounds in the mixture include the same core structure. For a specific organic functional material, the core structure determines the key properties or parameters of the entire organic compound corresponding to such functions, such as the triplet excited state energy level of a phosphorescent host material, the singlet excited state energy level of a fluorescent host material, the LUMO of an electron transporting material, the HOMO of a hole transporting material and the like.

Generally, an organic functional material consists of a core structural group and an auxiliary structural group. In one of the embodiments, all of the organic compounds in the mixture include the same number of same core structural groups and the same number of same or similar auxiliary structural groups, except that the various groups of each organic compound are bonded in different ways. For example, the organic compounds in the mixture are all fluorescent host materials, and each organic compound in the mixture includes an anthryl group and the same number of naphthyl groups. Further, each organic compound in the mixture includes an anthryl group and the same number of naphthyl groups and the same under of phenyl groups.

Specifically, the organic compound is one selected from the following formulas:

(1)

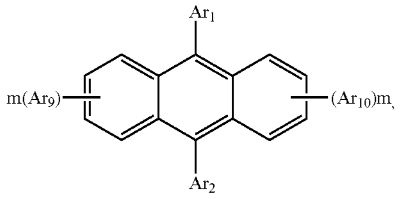

(2)

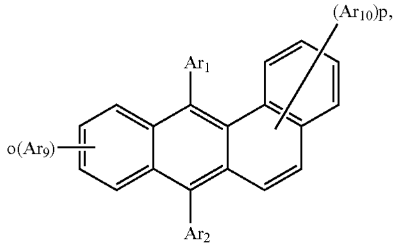

(3)

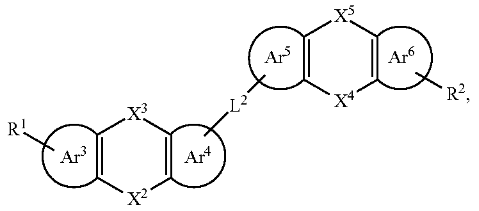

(4)

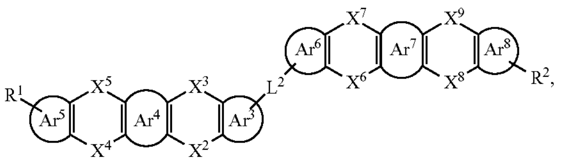

(5)

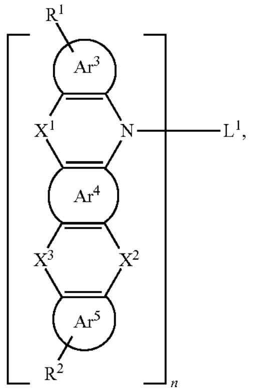

and

-continued (6)

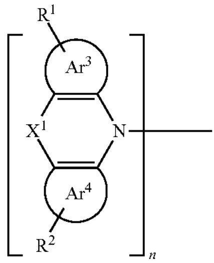

Wherein, $Ar^1$ and $Ar^2$ are each independently selected from the group consisting of an aryl group containing 6 to 60 carbon atoms, a heteroaryl group containing 3 to 60 carbon atoms, a fused cyclic aryl group containing 6 to 60 carbon atoms, and a fused cyclic heteroaryl group containing 3 to 60 carbon atoms;

Ar9 and Ar10 are each at least one independently selected from the group consisting of H, D, F, —CN, —NO2, —CF3, alkenyl, alkynyl, amino, acyl, amide, cyano, isocyano, alkoxy, hydroxy, carbonyl, sulfonyl, an alkyl group containing 1 to 60 carbon atoms, a cycloalkyl group containing 3 to 60 carbon atoms, an aryl group containing 6 to 60 carbon atoms, a heteroaryl group containing 3 to 60 carbon atoms, and a fused cyclic aryl group containing 7 to 60 carbon atoms, and a fused heterocyclic aryl group containing 4 to 60 carbon atoms; wherein one or more groups can form a monocyclic or polycyclic aliphatic or aromatic ring system with each other or with a ring bonded to said groups;

L1 is one selected from an aryl group containing 5 to 60 ring atoms and a heteroaryl group containing 5 to 60 ring atoms;

-L2- is a single bond, or L2 is one selected from an aryl group containing 5 to 30 ring atoms and a heteroaryl group containing 5 to 30 ring atoms;

Ar3, Ar4, Ar5, Ar6, Ar7, and Ar8 are each independently selected from an aryl group containing 5 to 30 ring atoms and a heteroaryl group containing 5 to 30 ring atoms;

—X1- is a single bond, or X1 is one selected from the group consisting of N(R), C(R)2, Si(R)2, O, C═N(R), C═C(R)2, P(R), P(═O)R, S, S═O and SO2;

—X2-, —X3-, —X4-, —X5-, —X6-, —X7-, —X8-, and —X9- are each a single bond, or —X2-, —X3-, —X4-, —X5-, —X6-, —X7-, —X8-, and —X9- are each independently selected from the group consisting of N(R), C(R)2, Si(R)2, O, C═N(R), C═C(R)2, P(R), P(═O)R, S, S═O and SO2, wherein —X2- and —X3- are not single bonds simultaneously, —X4- and —X5- are not single bonds simultaneously, —X6- and —X7- are not single bonds simultaneously, and —X8- and —X9- are not single bonds simultaneously;

R1, R2, and R are each independently selected from the group consisting of H, D, F, CN, alkenyl, alkynyl, nitrile, amine, nitro, acyl, alkoxy, carbonyl, sulfonyl, an alkyl containing 1 to 30 carbon atoms, a cycloalkyl containing 3 to 30 carbon atoms, an aromatic hydrocarbyl group containing 5 to 60 ring atoms, and an heteroaromatic ring group containing 5 to 60 ring atoms;

m is any integer from 0 to 4, o is any integer from 0 to 4, p is any integer from 0 to 6, and n is any integer from 1 to 4.

In one embodiment, L1 in general formulas (5) and (6) is one selected from an aryl group containing 5 to 50 ring atoms and a heteroaryl group containing 5 to 50 ring atoms. Further, L1 is one selected from an aryl group containing 5 to 40 ring atoms and a heteroaryl group containing 5 to 40 ring atoms. Still further, L1 is one selected from an aryl group containing 6 to 30 ring atoms and a heteroaryl group containing 6 to 30 ring atoms.

In one embodiment, -L2- in general formulas (3) and (4) is a single bond, or L2 is one selected from an aryl group containing 5 to 25 ring atoms and a heteroaryl group containing 5 to 25 ring atoms. Further, L2 is one selected from an aryl group containing 5 to 20 ring atoms and a heteroaryl group containing 5 to 20 ring atoms. Still further, L2 is one selected from an aryl group containing 5 to 15 ring atoms and a heteroaryl group containing 5 to 15 ring atoms.

In one embodiment, Ar3, Ar4, Ar5, Ar6, Ar7 and Ar8 in general formulas (3) to (5) are each selected from an aryl group containing 5 to 25 ring atoms and a heteroaryl group containing 5 to 25 ring atoms. Further, Ar3, Ar4, Ar5, Ar6, Ar7 and Ar8 are each selected from an aryl group containing 5 to 20 ring atoms and a heteroaryl group containing 5 to 20 ring atoms. Still further, Ar3, Ar4, Ar5, Ar6, Ar7 and Ar8 are each selected from an aryl group containing 5 to 15 ring atoms and a heteroaryl group containing 5 to 15 ring atoms.

In one embodiment, —X1- in general formulas (5) to (6) is a single bond, or X1 is one selected from the group consisting of N(R), C(R)2, O and S.

In one embodiment, —X2-, —X3-, —X4-, —X5-, —X6-, —X7-, —X8-, and —X9- in general formulas (3) to (4) are each a single bond, or —X2-, —X3-, —X4-, —X5-, —X6-, —X7-, —X8-, and —X9- are each selected from the group consisting of N(R), C(R)2, O and S.

In one embodiment, n in general formulas (5) to (6) is any integer from 1 to 3. Further, n is any integer from 1 to 2.

In one embodiment, $Ar^1$, $Ar^2$, $Ar^9$ and $Ar^{10}$ in general formulas (1) to (2) and $Ar^3$, $Ar^4$, $Ar^5$, $Ar^6$, $Ar^7$ and $Ar^8$ in general formulas (3) to (6) each include at least one of the following formulas:

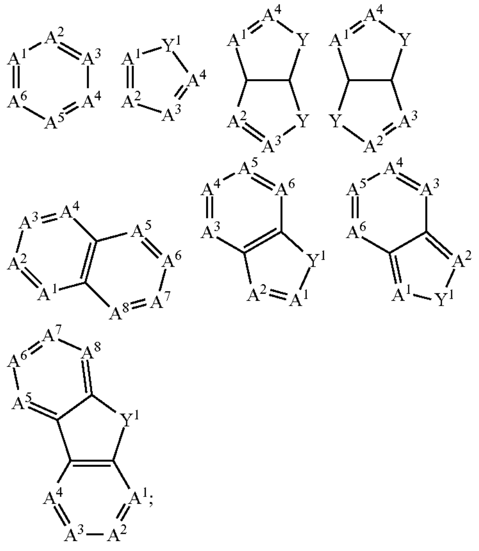

wherein $Ar^1$, $Ar^2$, $Ar^3$, $Ar^4$, Ar5, Ar6, Ar7, and Ar8 are each independently selected from CR3 and N;

Y1 is one selected from the group consisting of CR4R5, SiR4R5, NR3, C(═O), S and O;

R3, R4, and R5 are each at least one selected from of the group consisting of H, D, a linear alkyl containing 1 to 20 carbon atoms, a branched alkyl containing 3 to 20 carbon atoms, a cyclic alkyl containing 3 to 20 carbon atoms, an alkoxy containing 3 to 20 carbon atoms, a thioalkoxy containing 3 to 20 carbon atoms, a silyl containing 3 to 20 carbon atoms, a substituted keto containing 1 to 20 carbon atoms, an alkoxycarbonyl containing 2 to 20 carbon atoms, an aryloxycarbonyl containing 7 to 20 C atoms, a cyano group (—CN), a carbamoyl group (—C(═O)NH2), a halocarbonyl group (C(═O)—X, wherein X represents a halogen atom), a formyl group (—C(═O)—H), an isocyano group, an isocyanate group, a thiocyanate group, an isothiocyanate group, hydroxyl, nitryl, a CF3 group, Cl, Br, F, a crosslinkable group, an aromatic ring group containing 5 to 40 ring atoms, a heteroaromatic ring group containing 5 to 40 ring atoms, an aryloxy containing 5 to 40 ring atoms and a heteroaryloxy containing 5 to 40 ring atoms. One or more groups of R3, R4, and R5 can form a monocyclic or polycyclic aliphatic or aromatic ring with each other and/or with a ring bonded to said groups.

Specifically, $Ar^1$, $Ar^2$, $Ar^9$, and $Ar^{10}$ in general formulas (1) to (2), and $Ar^3$, $Ar^4$, $Ar^5$, $Ar^6$, $Ar^7$, and $Ar^8$ in general formulas (3) to (6) are each selected from the following formulas:

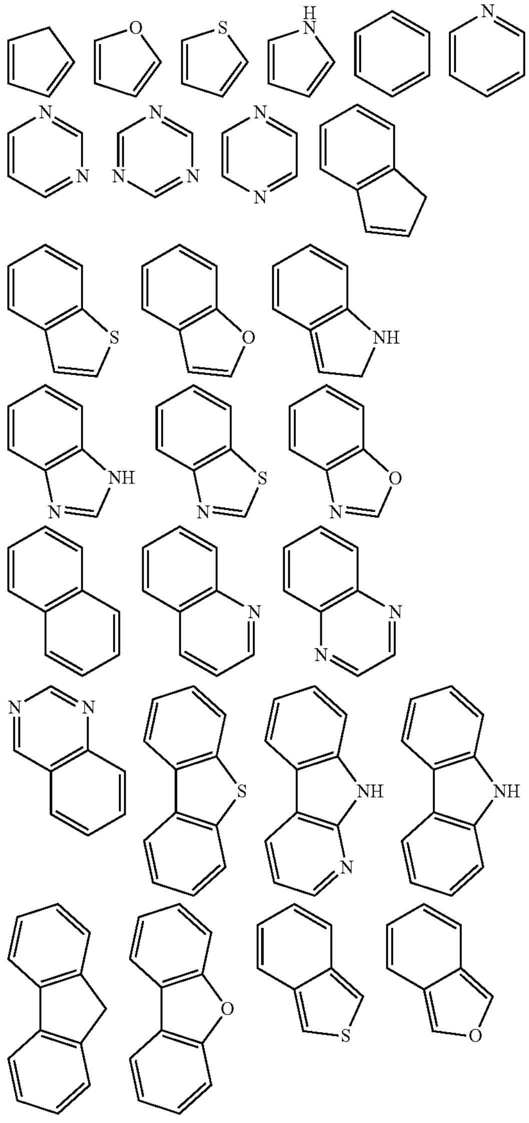

-continued

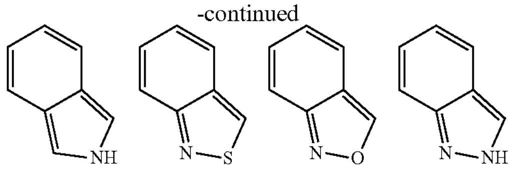

wherein H in the rings of the foregoing groups may be substituted.

In one of the embodiments, the organic compounds in the mixture are all fluorescent host materials and each organic compound is one selected from general formulas (1) and (2).

Further, the compounds represented by general formula (1) are selected from the following formulas:

(1-1)

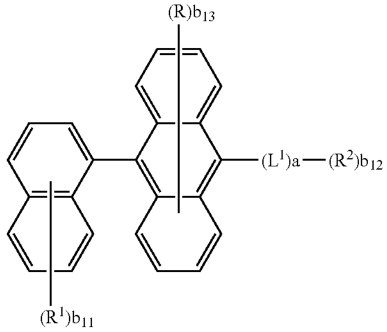

(1-2)

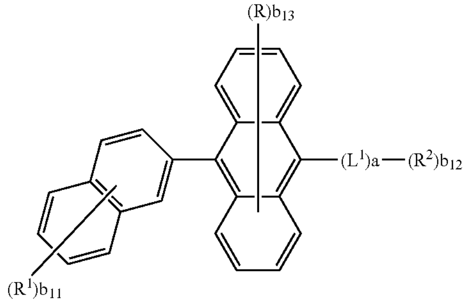

wherein $L^1$, $R^1$, $R^2$, and R are defined as described above; a is any integer from 1 to 3; and $b_{11}$ to $b_{13}$ are each any integer selected from 0 to 6.

Even further, the compounds represented by general formula (1) are selected from the following formulas:

(1-1a)

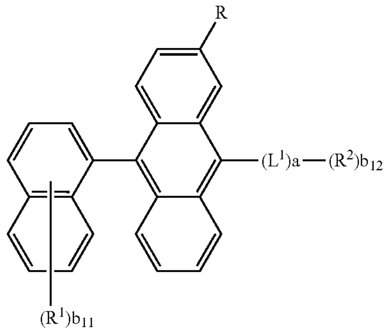

-continued
(1-2a)
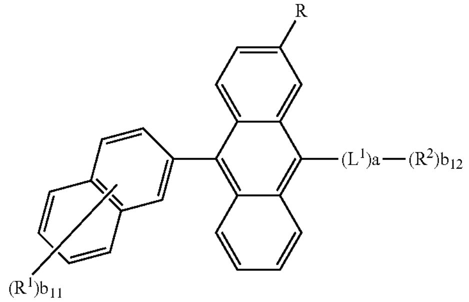
wherein L, $R^1$, $R^2$, R, a, $b_{11}$, and $b_{12}$ are defined as described above.
Specifically, the organic compounds in the mixture are all selected from, but not limited to, the following formulas:
FH-1
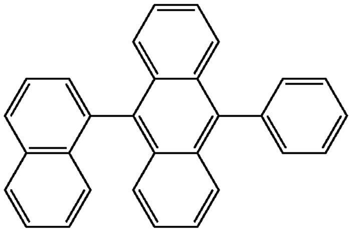
FH-2
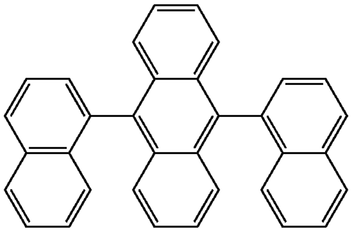
FH-3
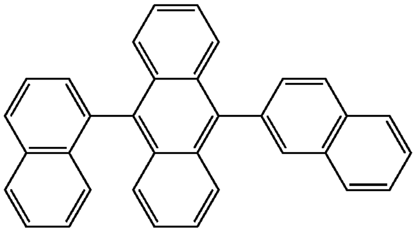
FH-4
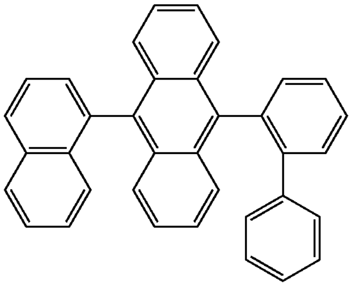
-continued
FH-5
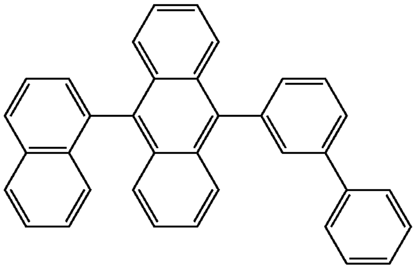
FH-6
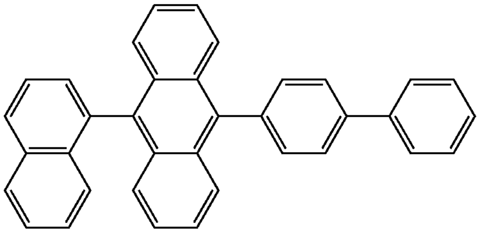
FH-7
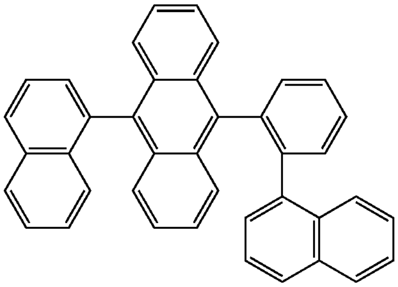
FH-8
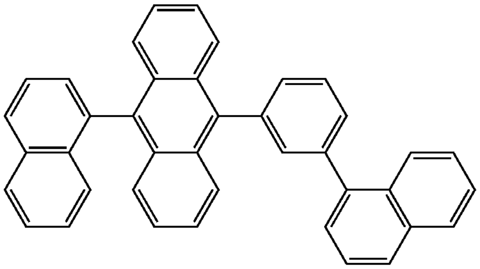
FH-9
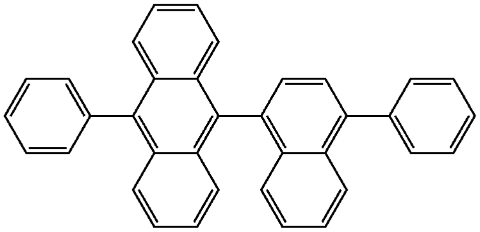
FH-10
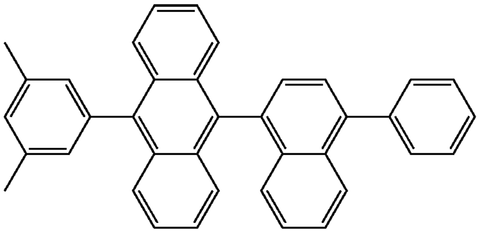

-continued
FH-11
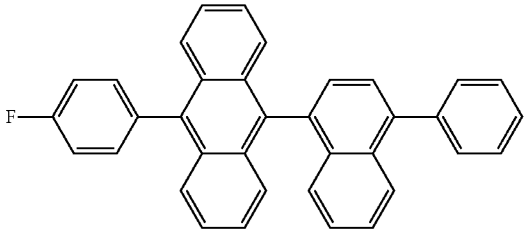
FH-12
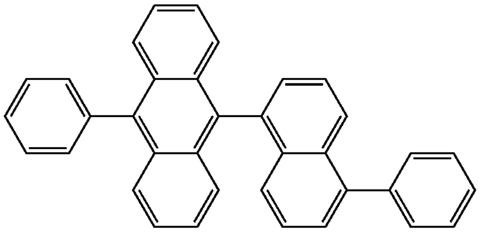
FH-13
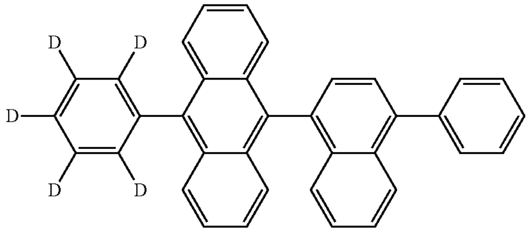
FH-14
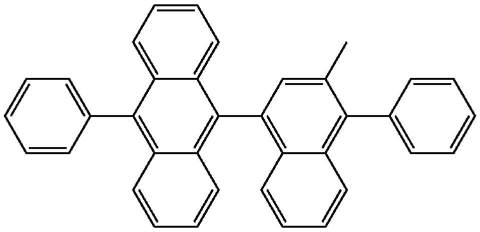
FH-15
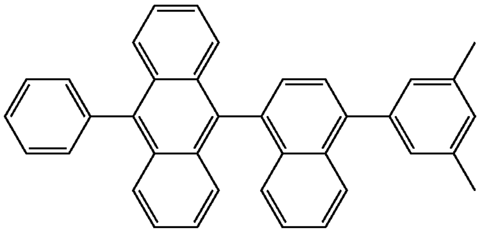
FH-16
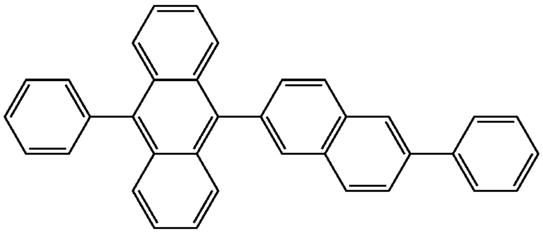
-continued
FH-17
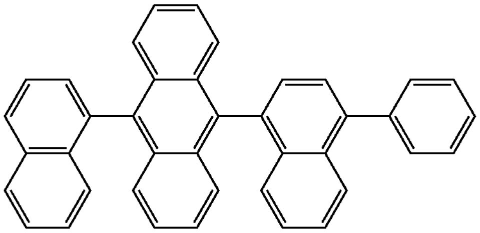
FH-18
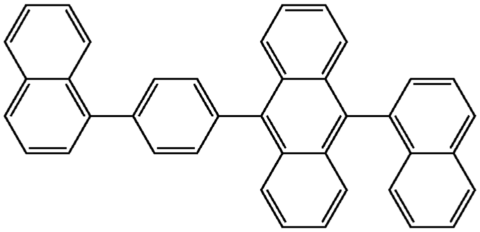
FH-19
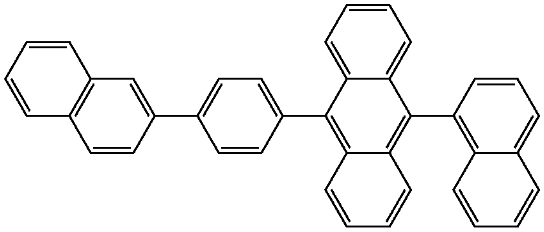
FH-20
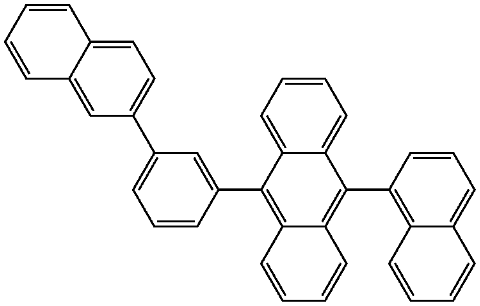
FH-21
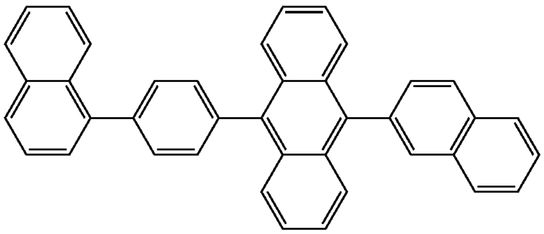
FH-22
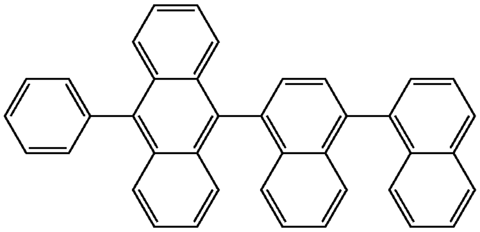

-continued
FH-23
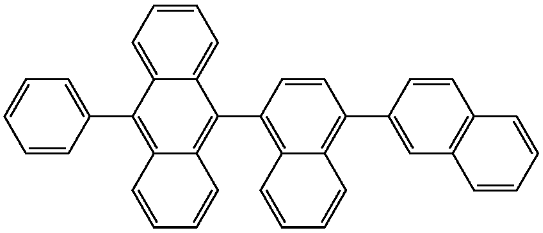
FH-24
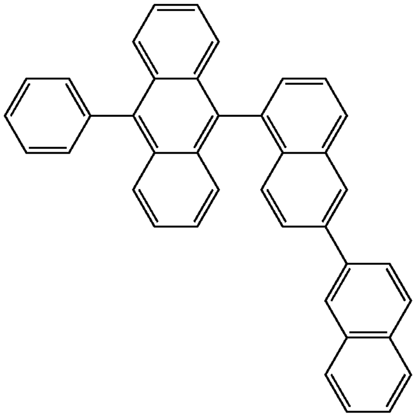
FH-25
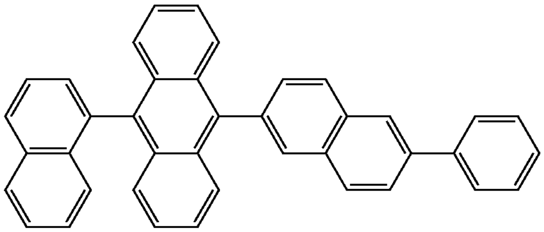
FH-26
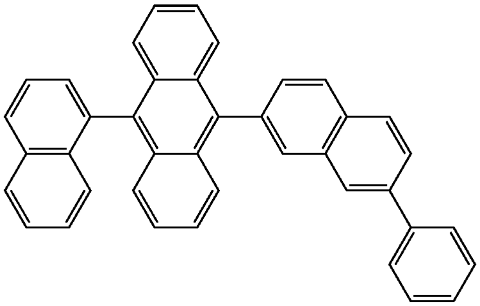
FH-27
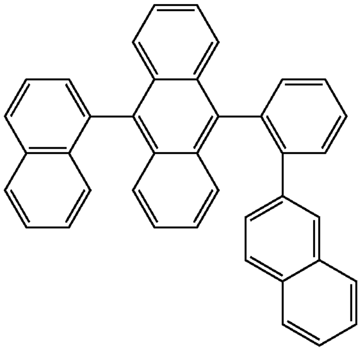
-continued
FH-28
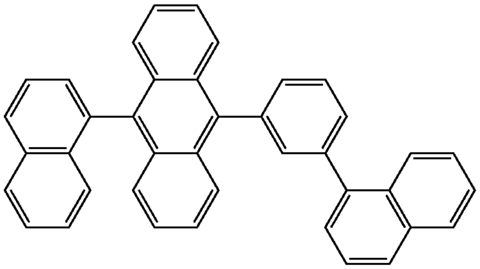
FH-29
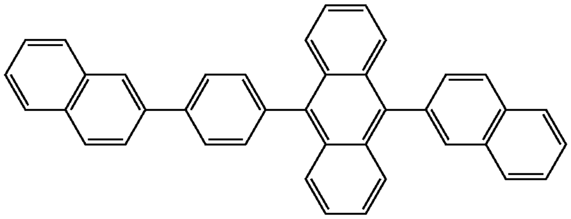
FH-30
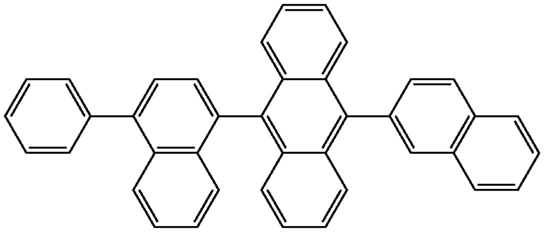
FH-31
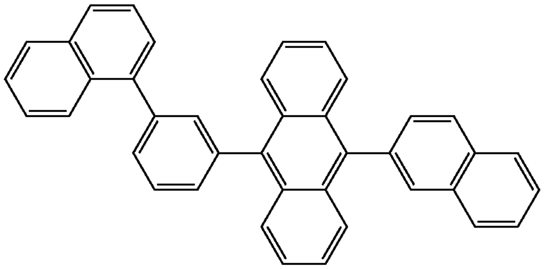
FH-32
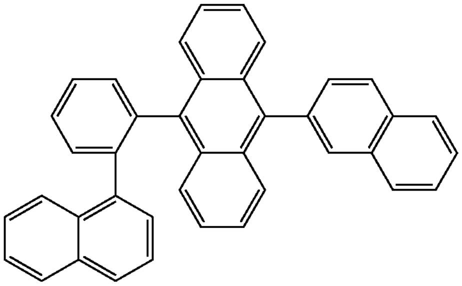
FH-33
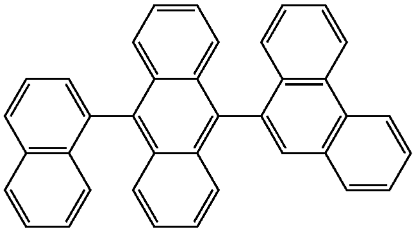

-continued
FH-34
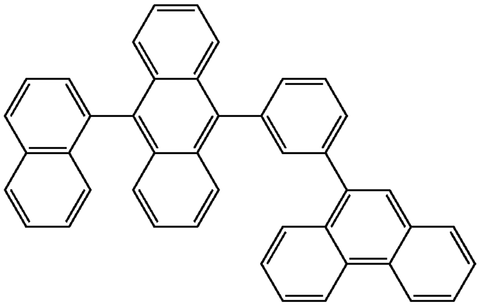
FH-35
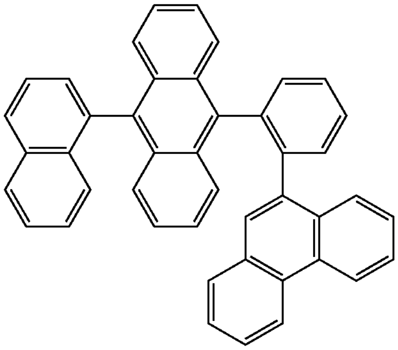
FH-36
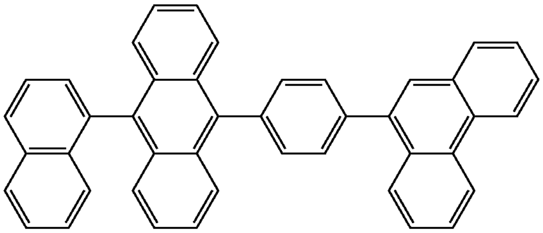
FH-37
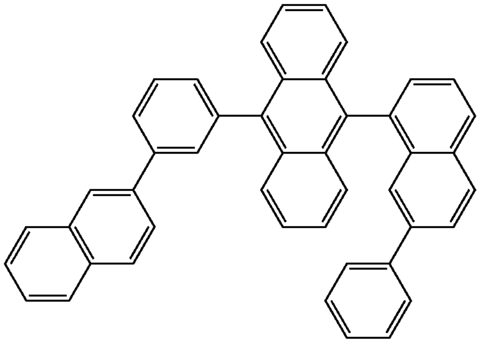
FH-38
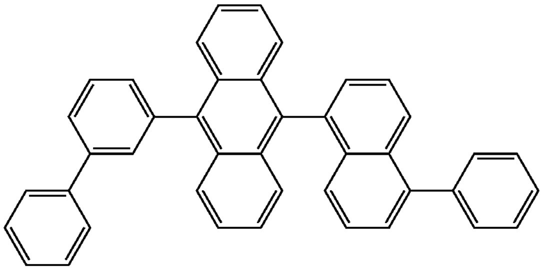
-continued
FH-39
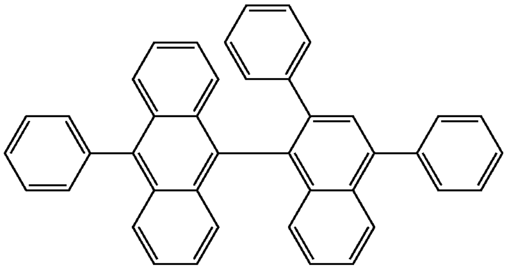
FH-40
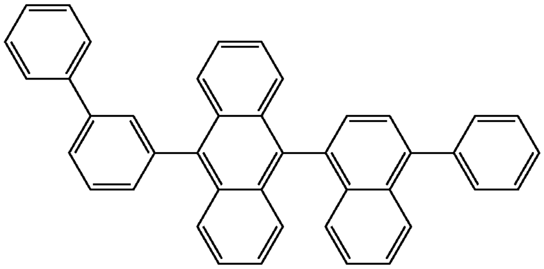
FH-41
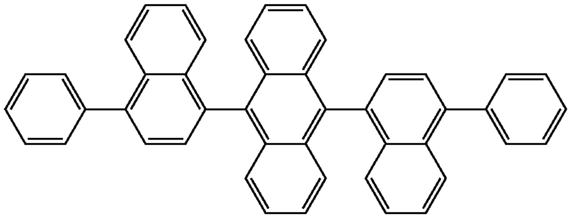
FH-42
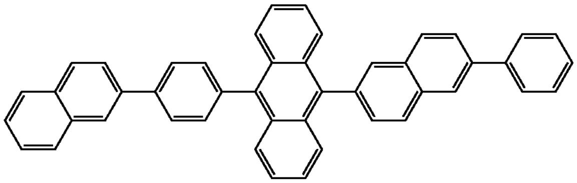
FH-43
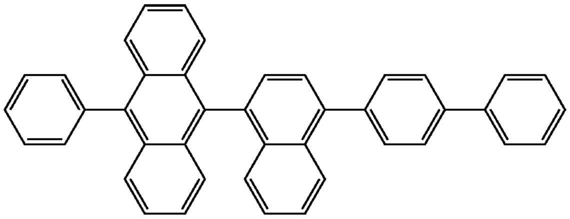
FH-44
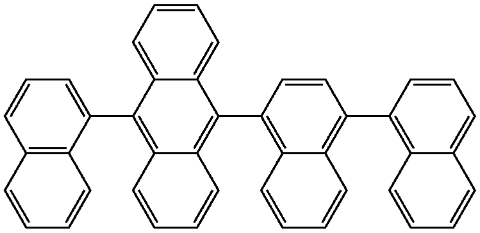

-continued
FH-45
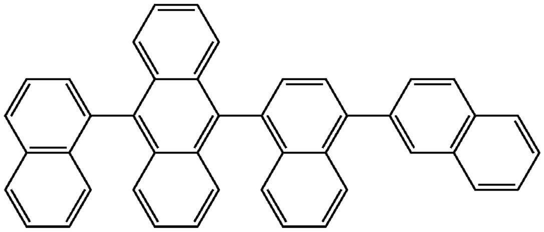
FH-46
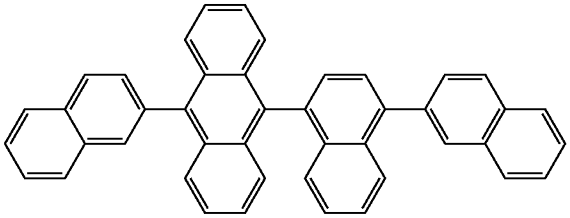
FH-47
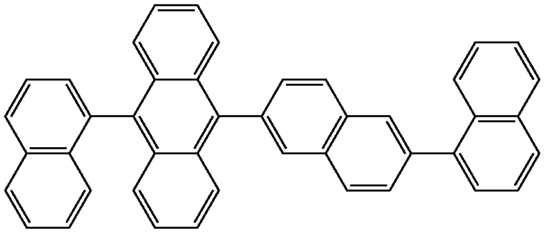
FH-48
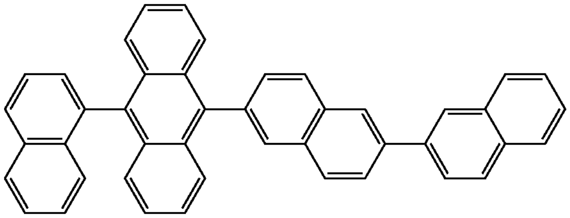
FH-49
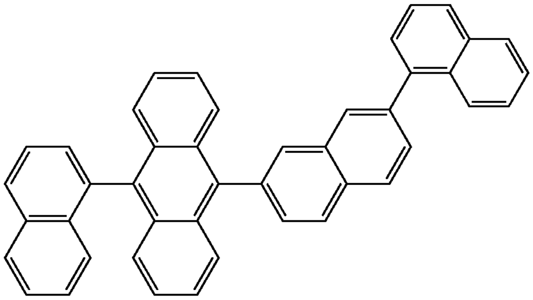
-continued
FH-50
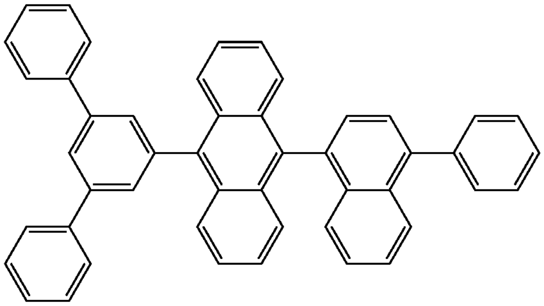
FH-51
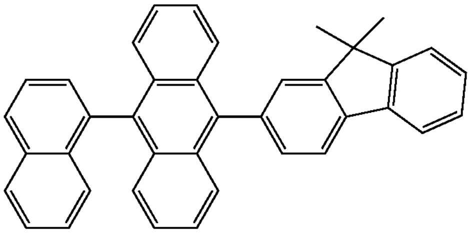
FH-52
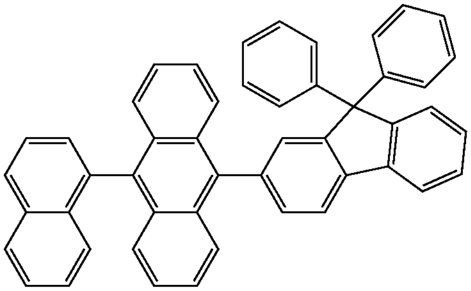
FH-53
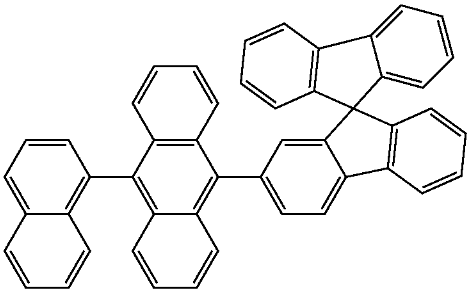
FH-54
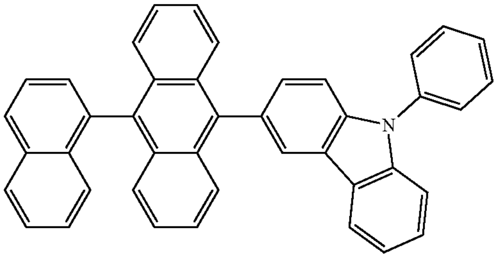

-continued
FH-55
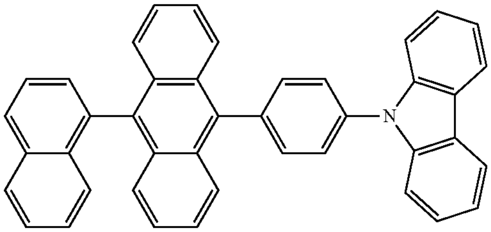
FH-56
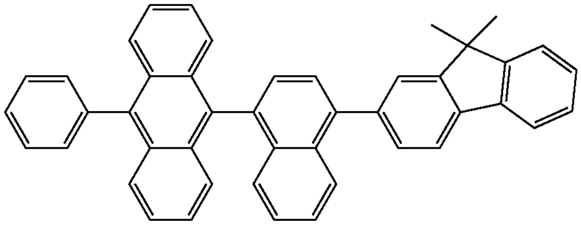
FH-57
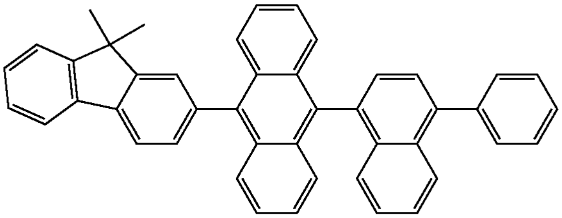
FH-58
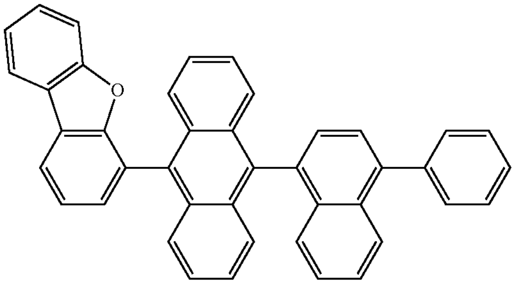
FH-59
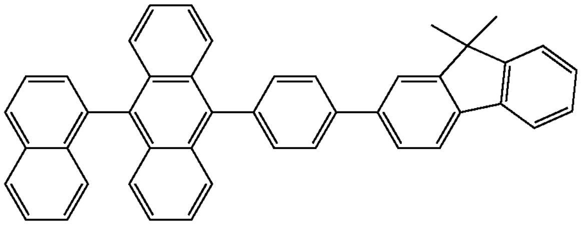
FH-60
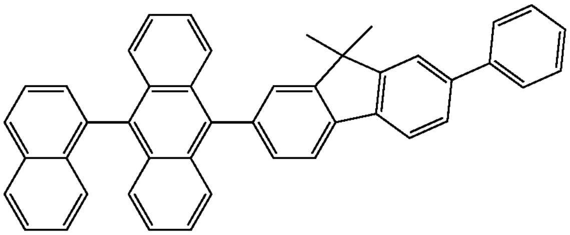
-continued
FH-61
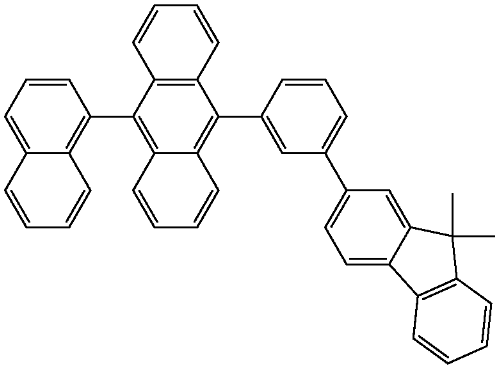
FH-62
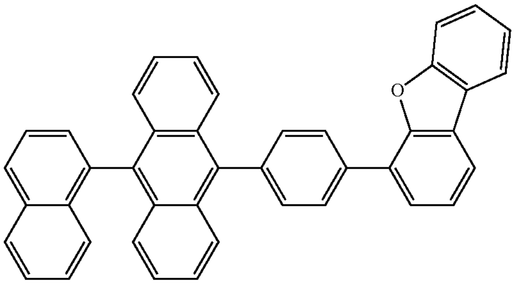
FH-63
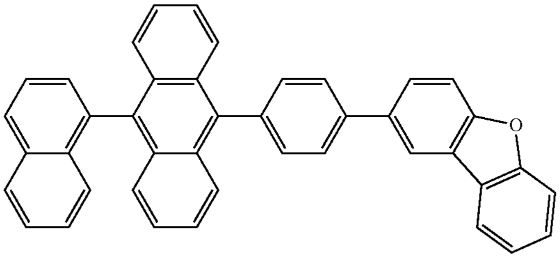
FH-64
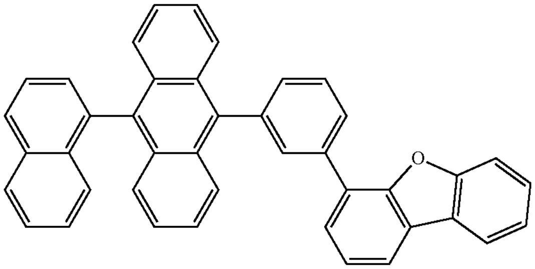
FH-65
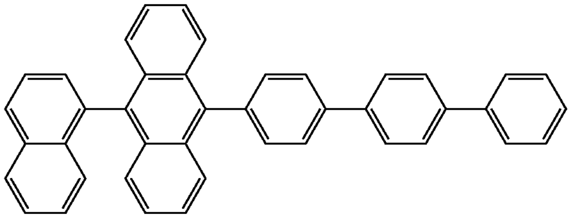

-continued
FH-66
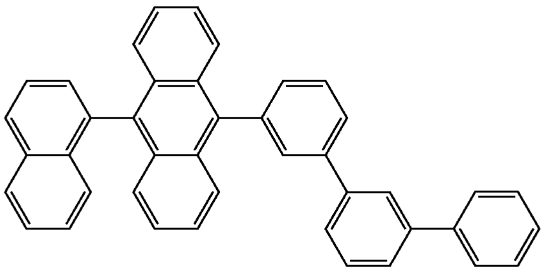
FH-67
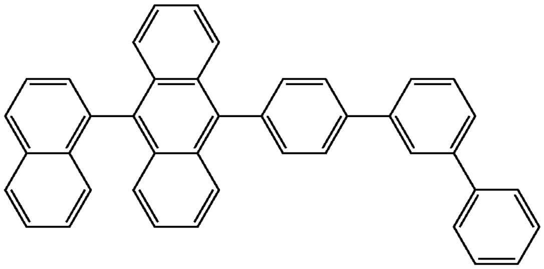
FH-68
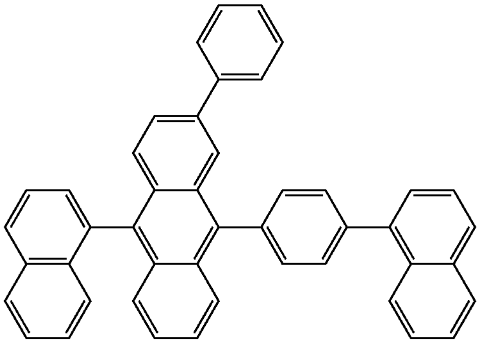
FH-69
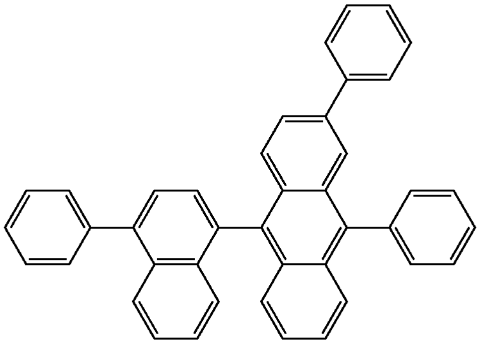
FH-70
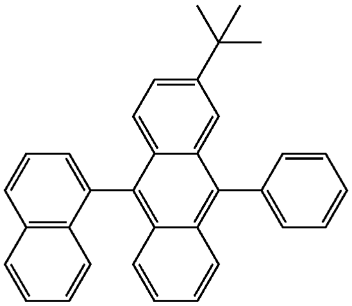
-continued
FH-71
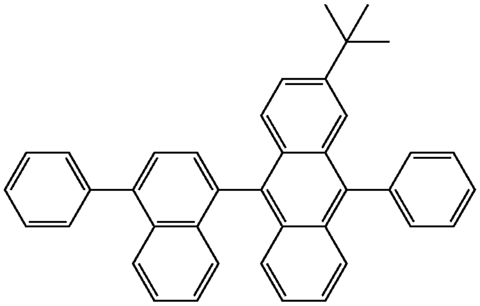
FH-72
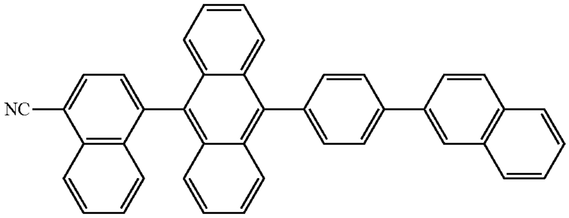
FH-73
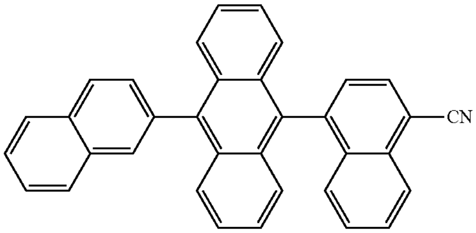
FH-74
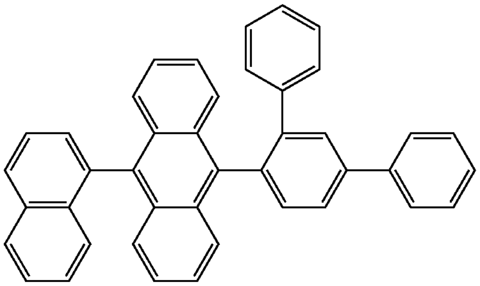
FH-75
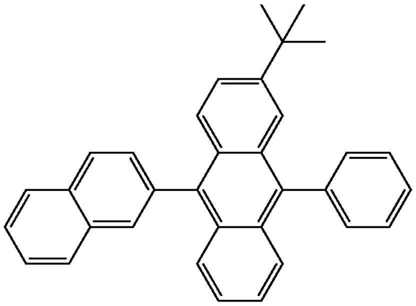

-continued

FH-76

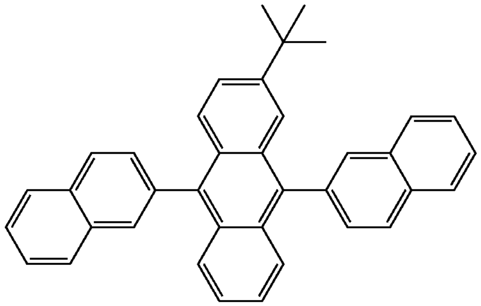

FH-77

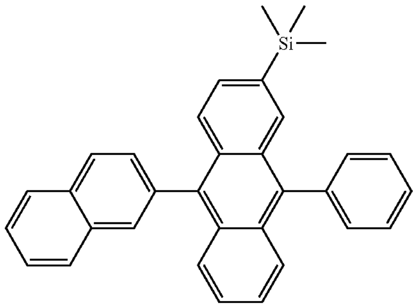

FH-78

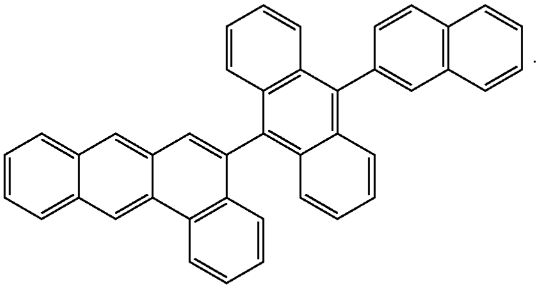

When the organic compounds in the mixture are all fluorescent host materials, the core structure of the organic compounds is one selected from the group consisting of a cyclic aromatic hydrocarbonyl group, an heteroaromatic ring group, and a group containing 2 to 10 ring structures. The cyclic aromatic hydrocarbonyl group is one selected from the group consisting of biphenyl, triphenyl, benzo, naphthalene, anthracene, phenalene, phenanthrene, fluorene, pyrene, chrysene, perylene, and azulene. The heteroaromatic ring group is one selected from the group consisting of dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, isoxazole, thiazole, oxadiazole, oxytriazole, dioxazole, thiadiazole, pyridine, pyridazine, pyrimidine, pyrazine, triazine, oxazine, oxathiazole, oxadiazine, indole, benzimidazole, indazole, indolizine, benzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furan dipyridine, benzothiophene pyridine, thiophene dipyridine, benzoselenophene pyridine and selenophene dipyridine. The groups containing 2 to 10 ring structures is one selected from a cyclic aromatic hydrocarbonyl group and a heteroaromatic ring group, and linked to each other directly or through at least one of the following groups: an oxygen atom, a nitrogen atom, a sulfur atom, a silicon atom, a phosphorus atom, a boron atom, a chain structure unit, and an aliphatic ring group.

Further, the core structure of the organic compounds is selected from the following groups:

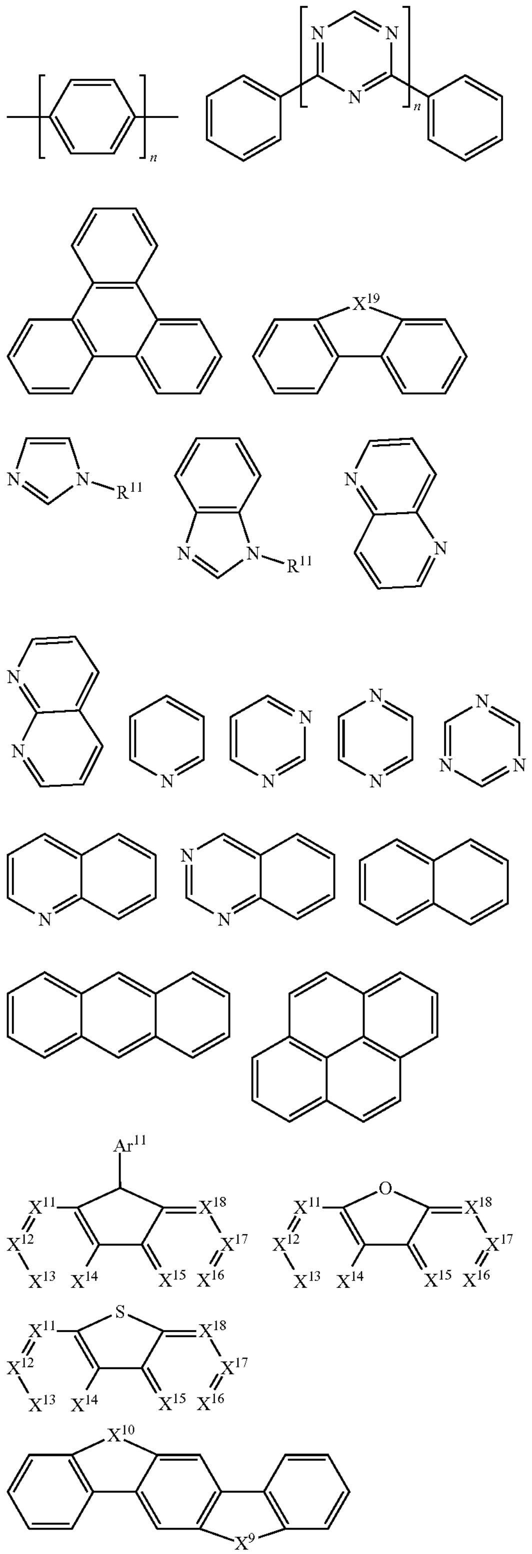

-continued

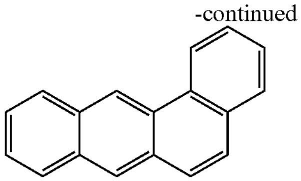

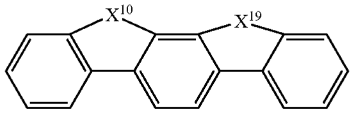

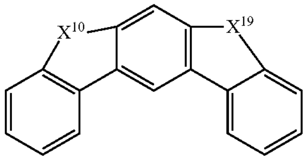

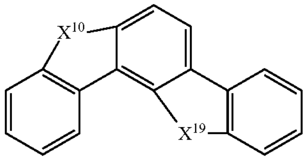

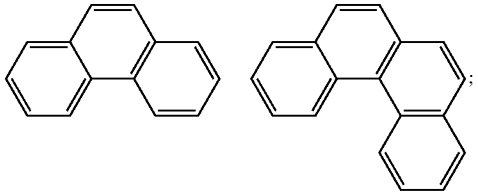

wherein $R^{11}$ is one independently selected from the group consisting of hydrogen, alkyl, alkoxy, amino, alkene, alkyne, aralkyl, heteroalkyl, aryl and heteroaryl; $Ar^{11}$ is one selected from the group consisting of an aryl group containing 6 to 60 carbon atoms, a heteroaryl group containing 3 to 60 carbon atoms, a fused cyclic aryl group containing 6 to 60 carbon atoms and a fuse heterocyclic aryl group containing 3 to 60 carbon atoms; n is any integer from 0 to 20; $X^{11}$ to $X^{18}$ are each selected from CH and N; and $X^{19}$ and $X^{10}$ are each selected from $CR^1R^2$ and $NR^1$.

In one of the embodiments, the organic compounds in the mixture are all phosphorescent host materials and each organic compound is one selected from general formulas (3) and (6).

Further, the organic compounds represented by general formula (3) are all selected from the following formulas:

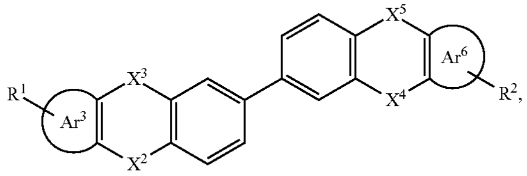

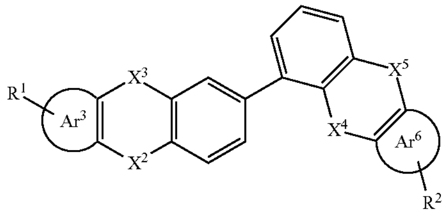

and

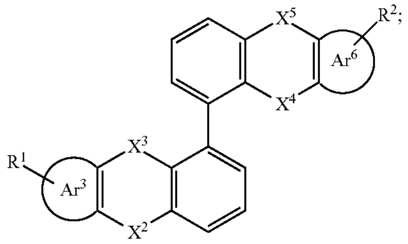

wherein $Ar^3$, $Ar^6$, $X^2$, $X^3$, $X^4$, $X^5$, $R^1$, and $R^2$ are as defined above.

Even further, the compounds represented by general formula (3) have a formula as follow:

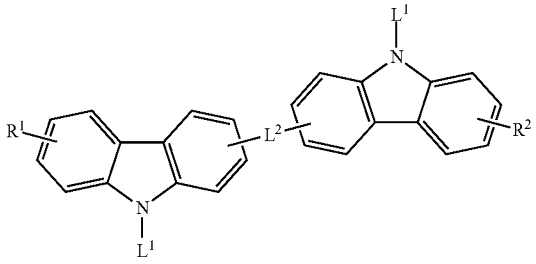

wherein $R^1$, $R^2$, $L^1$, and $L^2$ are as defined above; $L^3$ is one selected from an aryl group containing 5 to 60 ring atoms and a heteroaryl group containing 5 to 60 ring atoms.

Specifically, the compounds represented by general formula (3) are each selected from the following formulas:

(3-1)

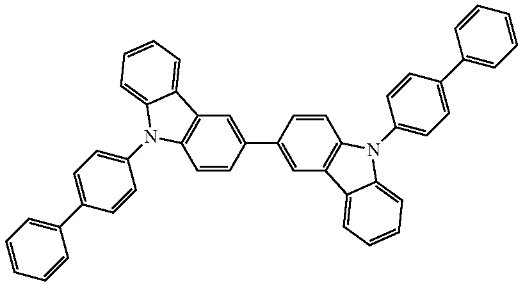

(3-2)

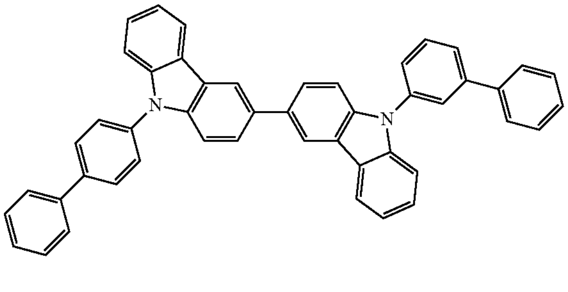

-continued
(3-3)
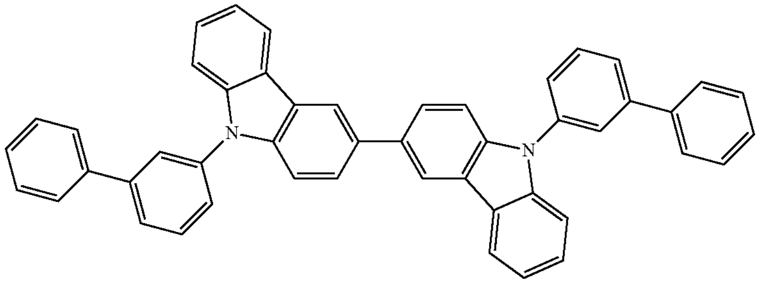
(3-4)
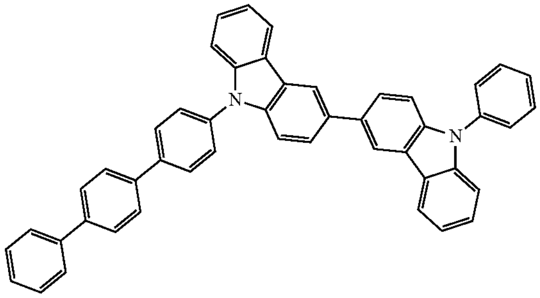
(3-5)
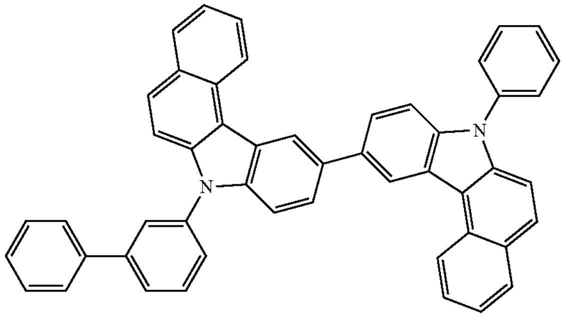
(3-6)
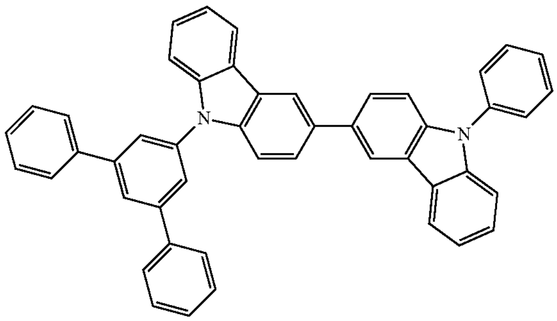
(3-7)
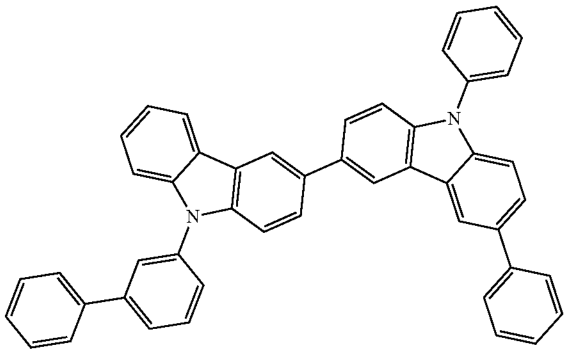
(3-8)
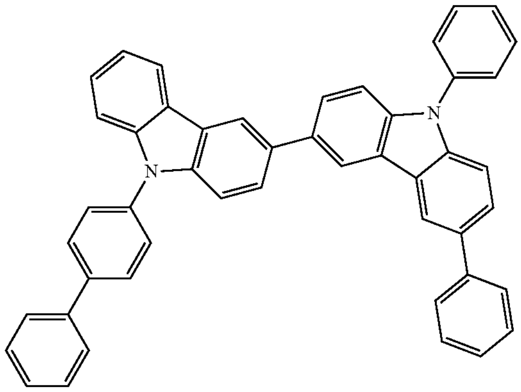
(3-9)
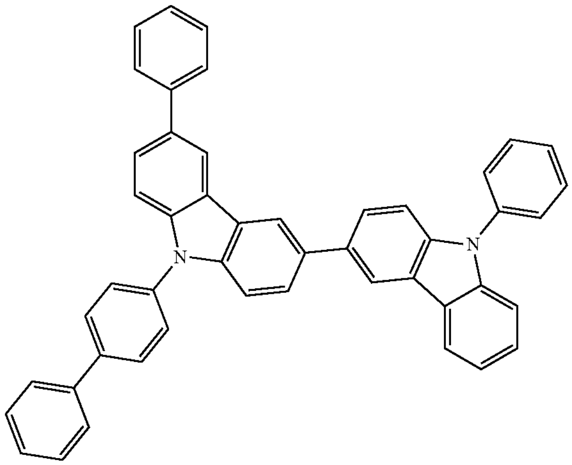

-continued
(3-10)
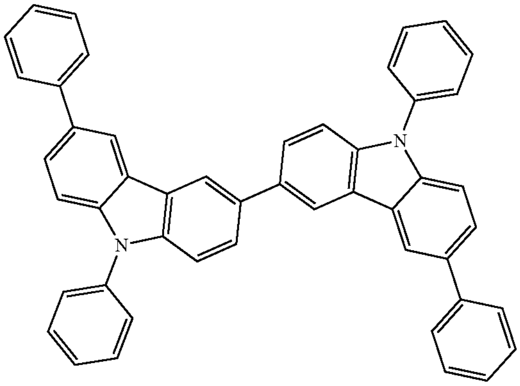
(3-11)
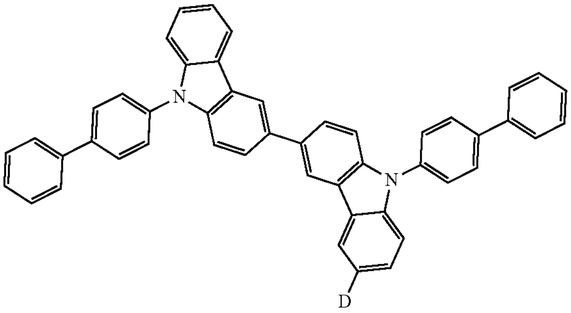
(3-12)
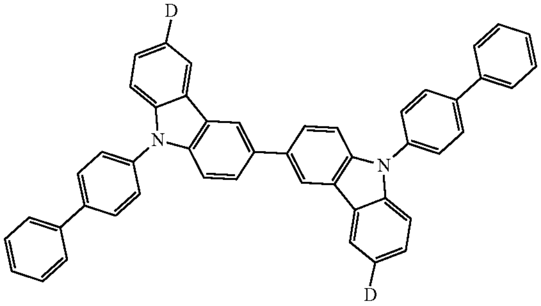
(3-13)
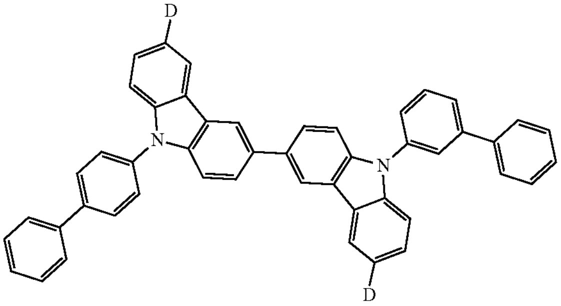
(3-14)
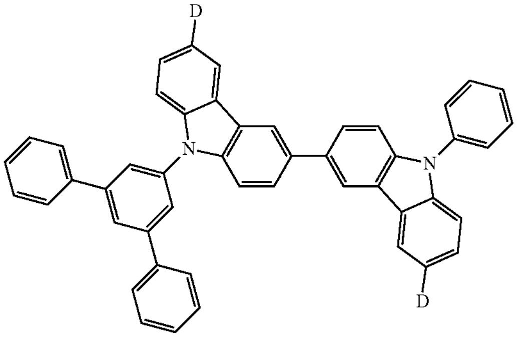
(3-15)
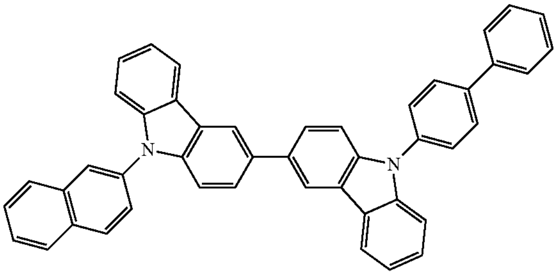
(3-16)
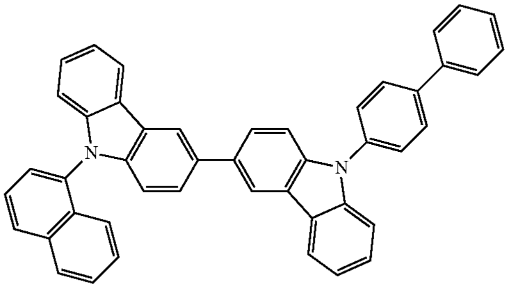
(3-17)
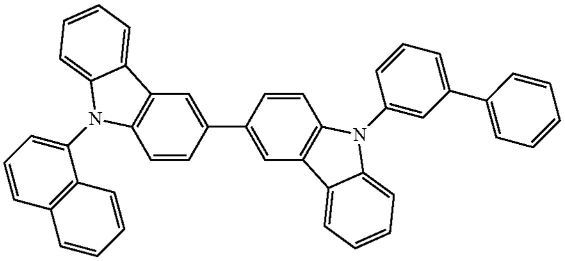

-continued
(3-18)
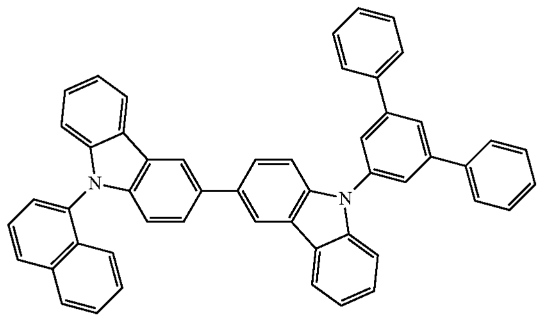
(3-19)
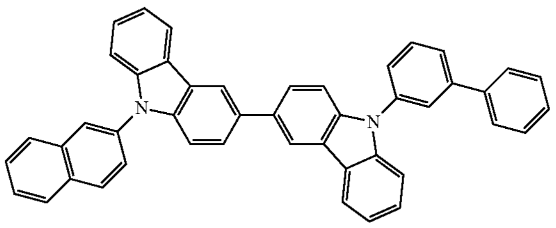
(3-20)
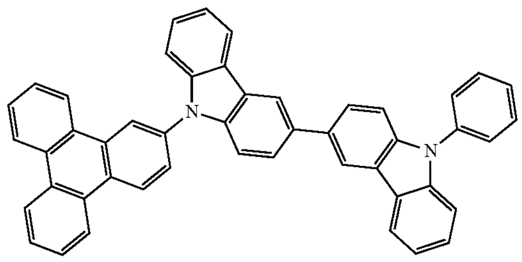
(3-21)
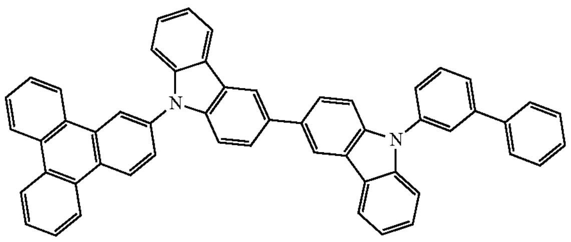
(3-22)
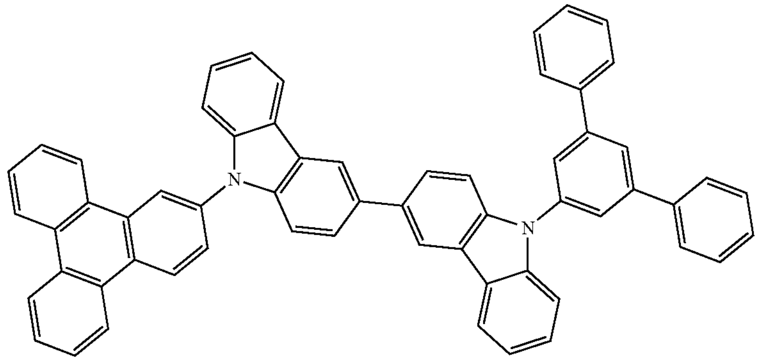
(3-23)
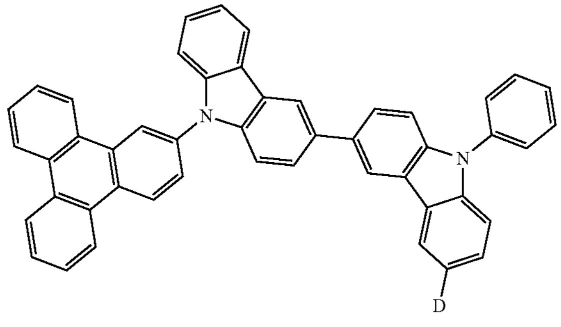
(3-24)
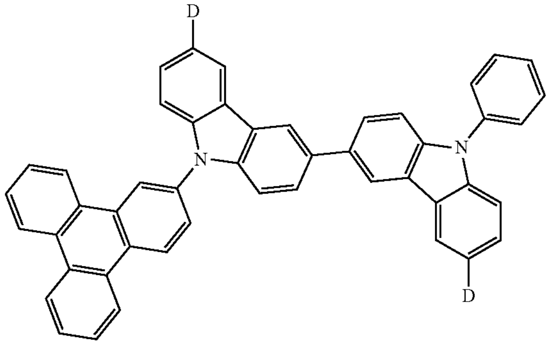

-continued
(3-25)
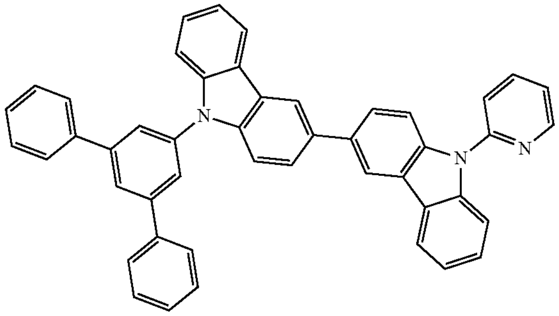
(3-26)
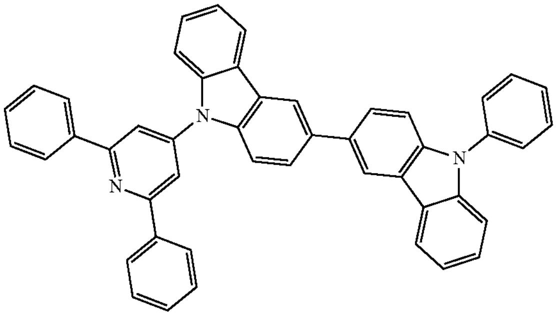
(3-27)
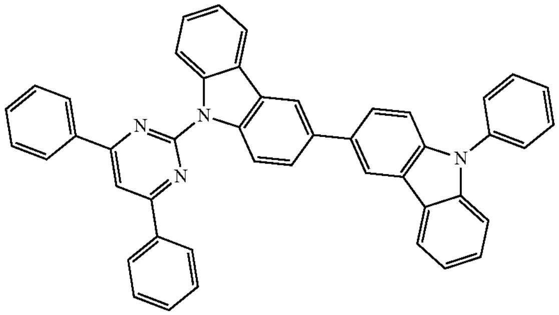
(3-28)
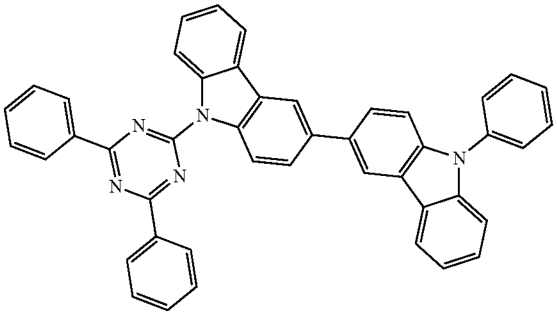
(3-29)
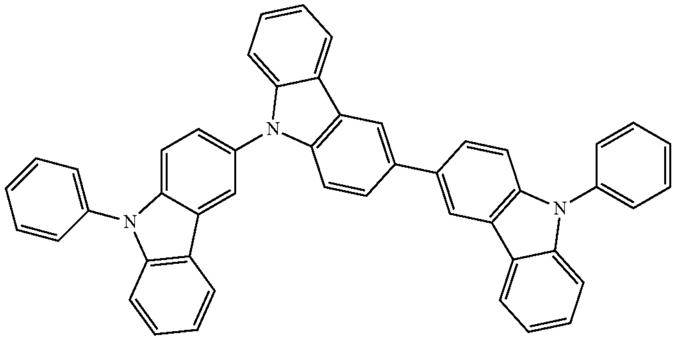
(3-30)
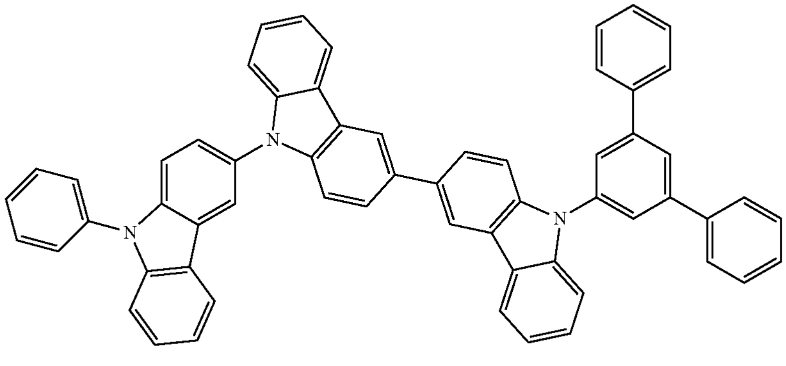

-continued
(3-31)
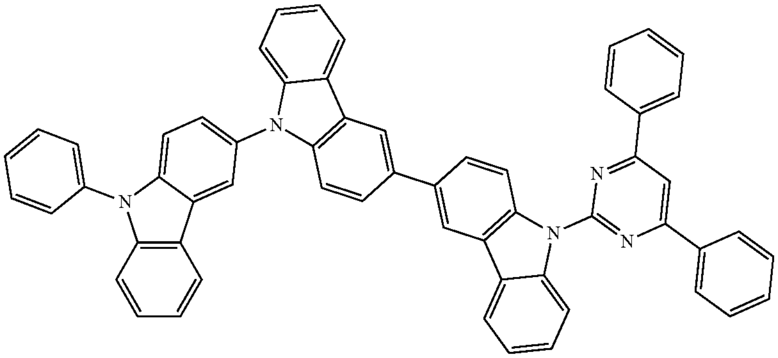
(3-32)
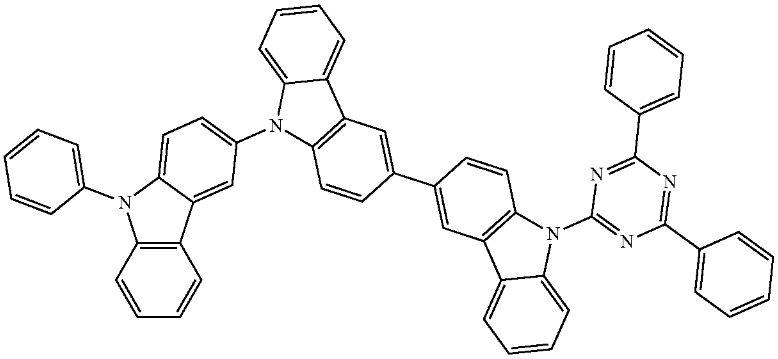
(3-33)
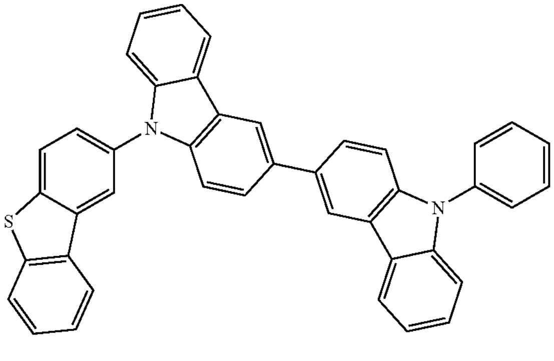
(3-34)
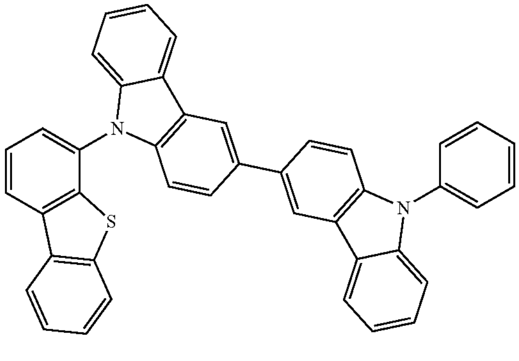
(3-35)
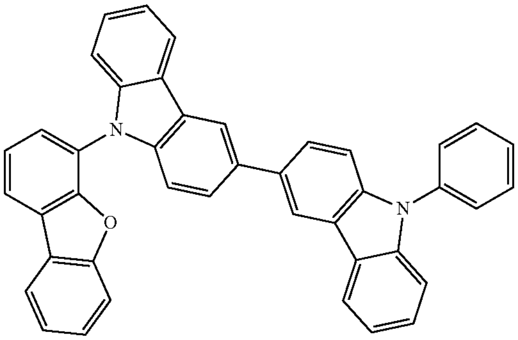
(3-36)
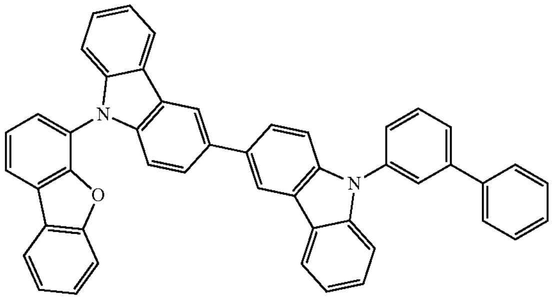

-continued
(3-37)
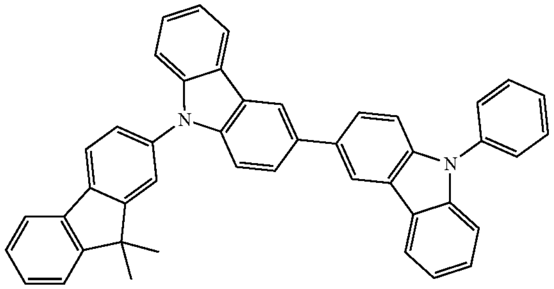
(3-38)
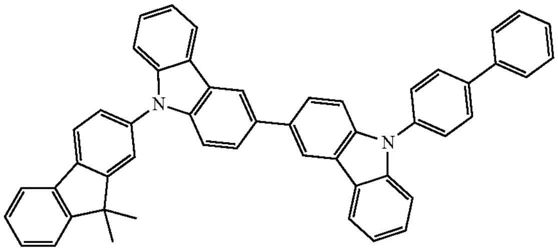
(3-39)
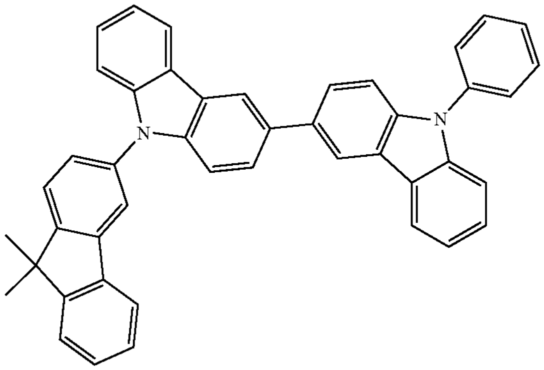
(3-40)
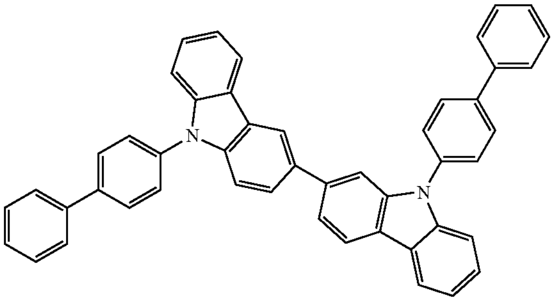
(3-41)
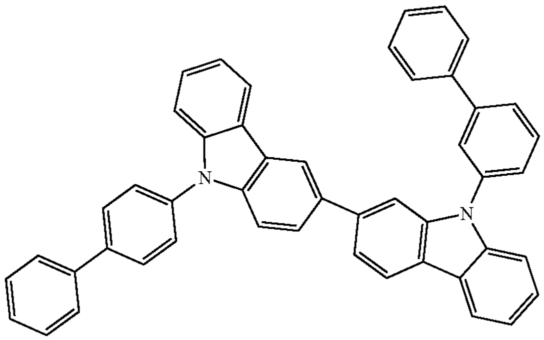
(3-42)
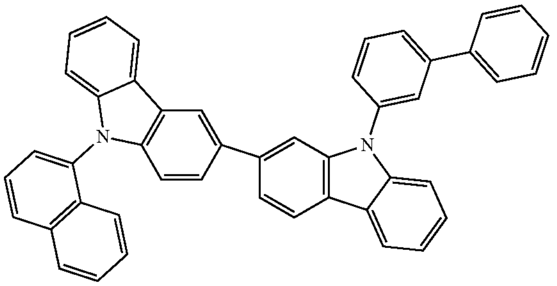
(3-43)
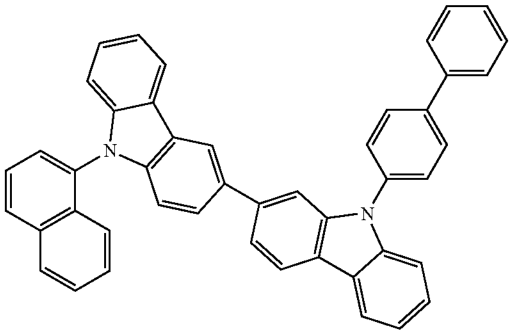
(3-44)
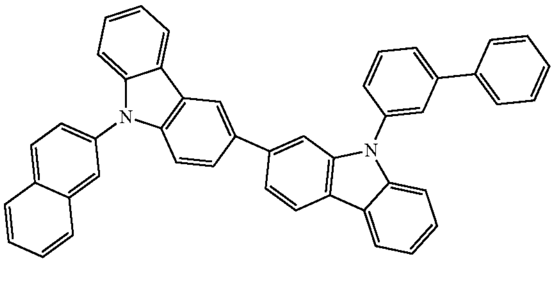

-continued
(3-45)
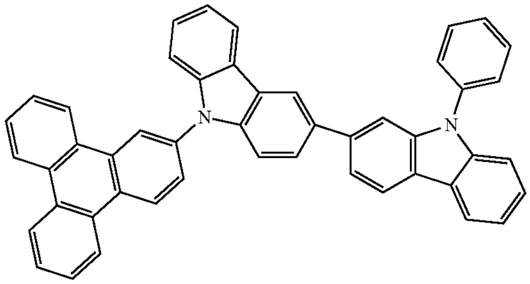
(3-46)
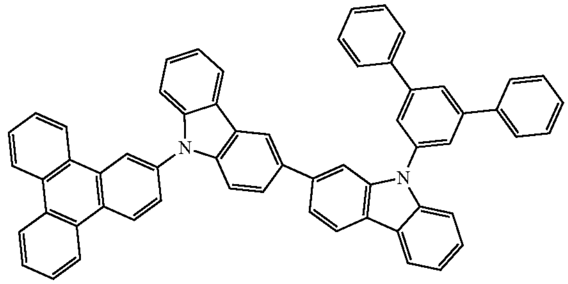
(3-47)
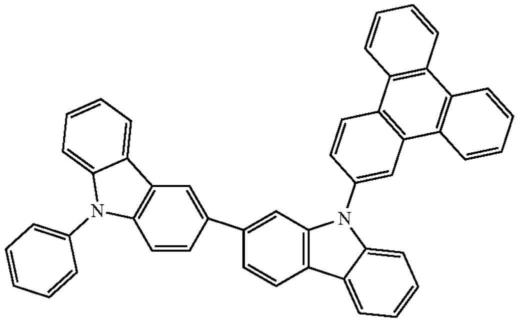
(3-48)
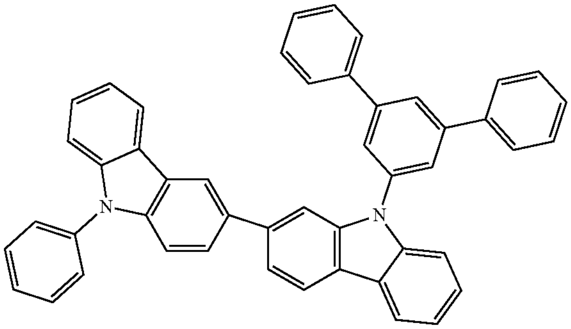
(3-49)
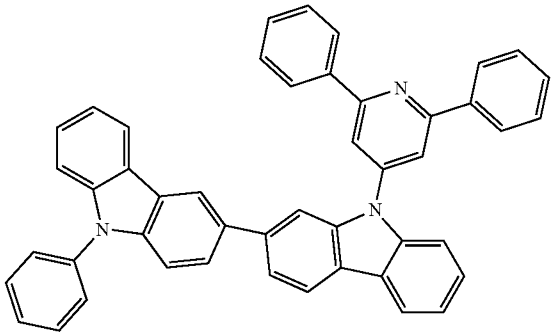
(3-50)
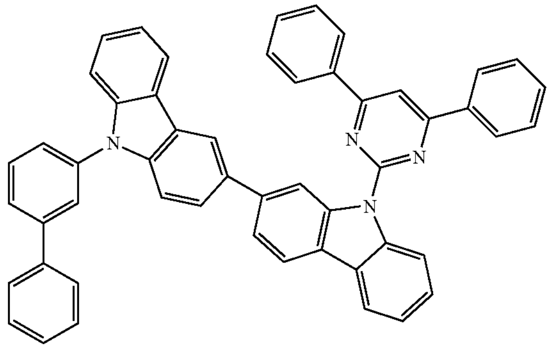
(3-51)
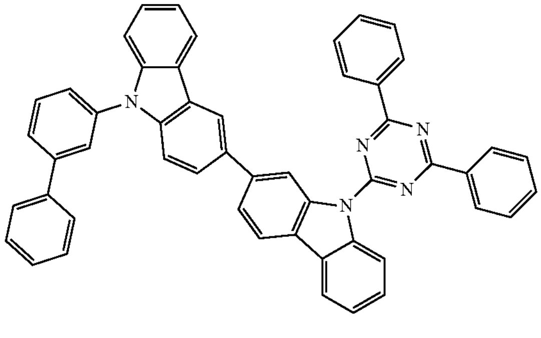
(3-52)
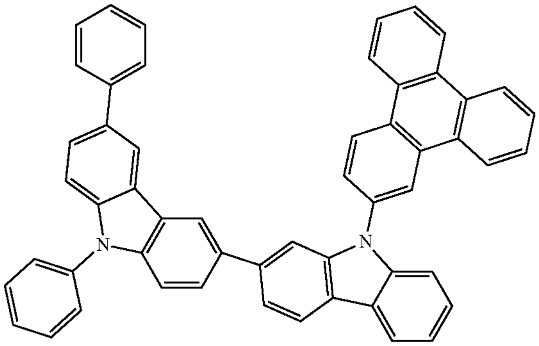

-continued
(3-53)
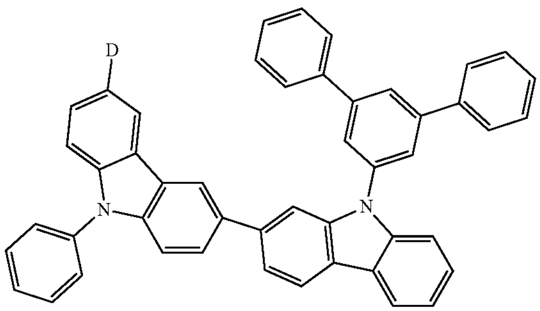
(3-54)
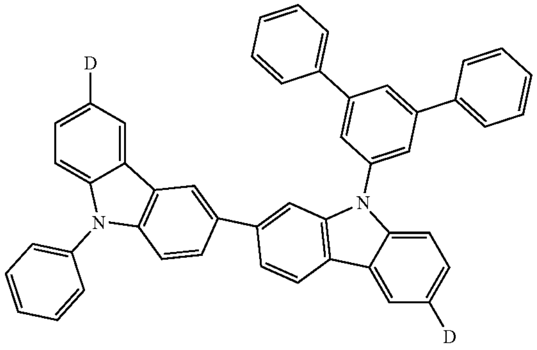
(3-55)
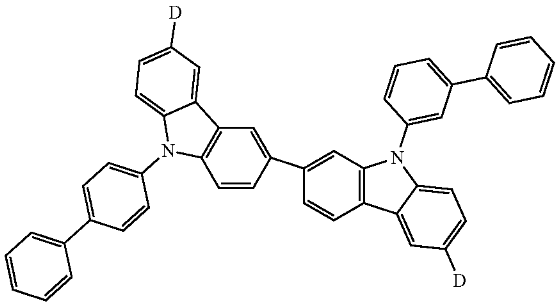
(3-56)
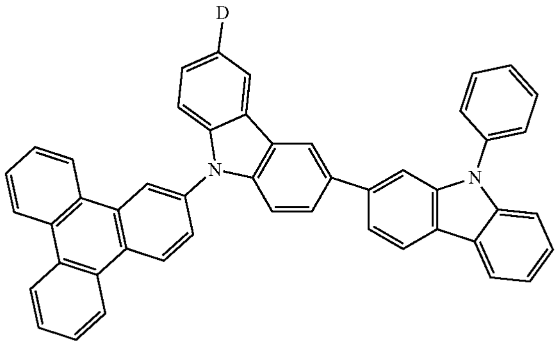
(3-57)
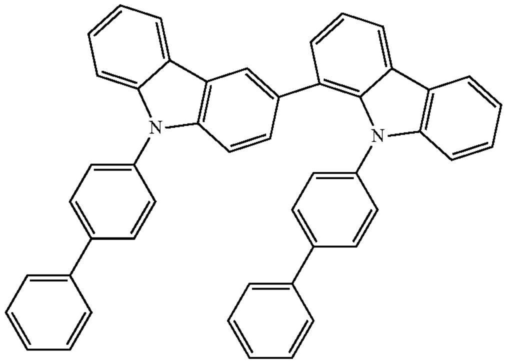
(3-58)
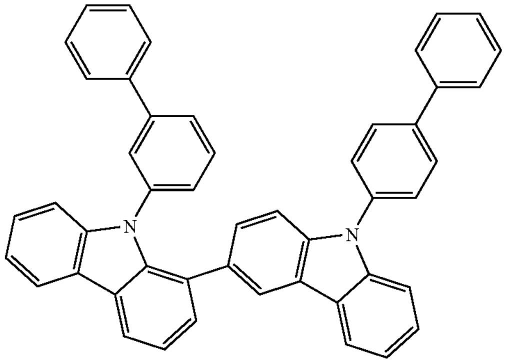
(3-59)
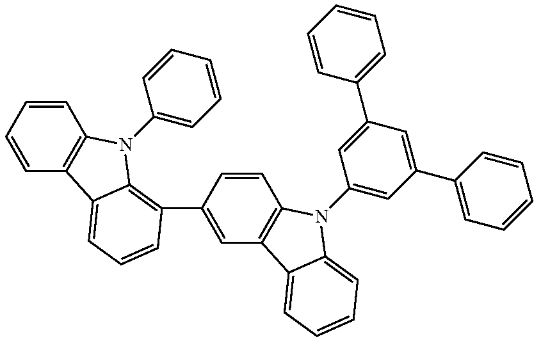
(3-60)
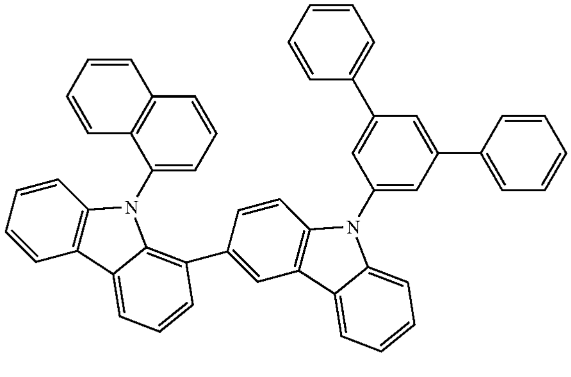

-continued
(3-61)
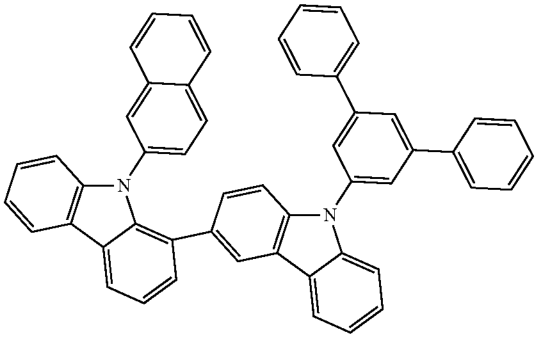
(3-62)
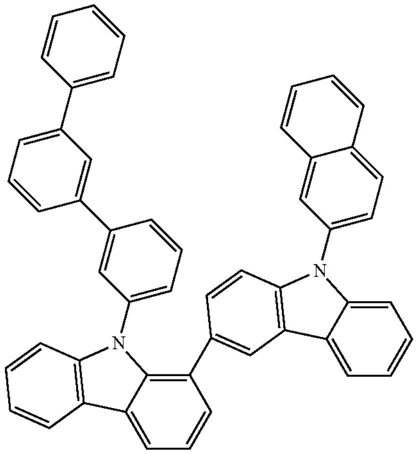
(3-63)
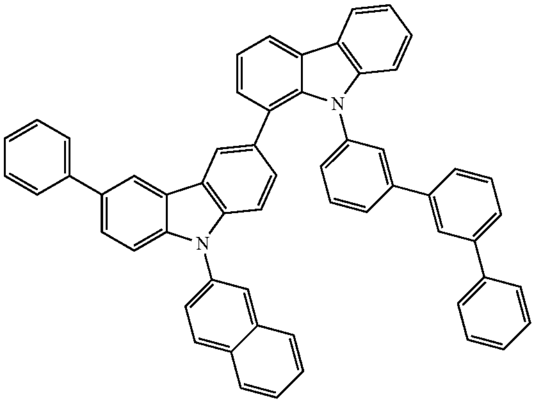
(3-64)
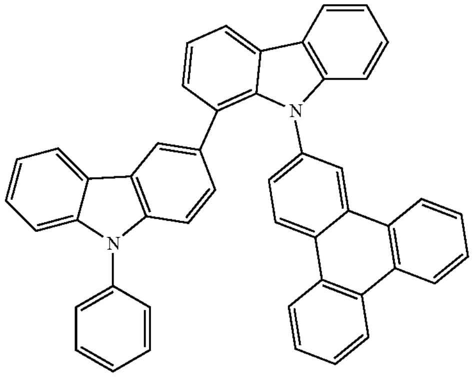
(3-65)
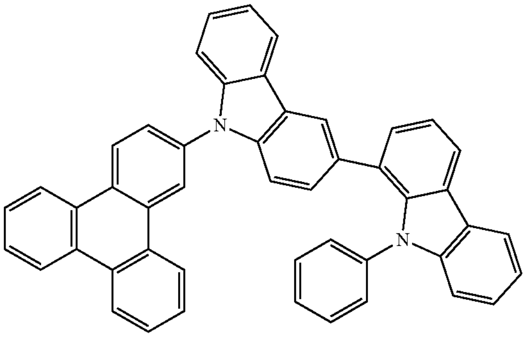
(3-66)
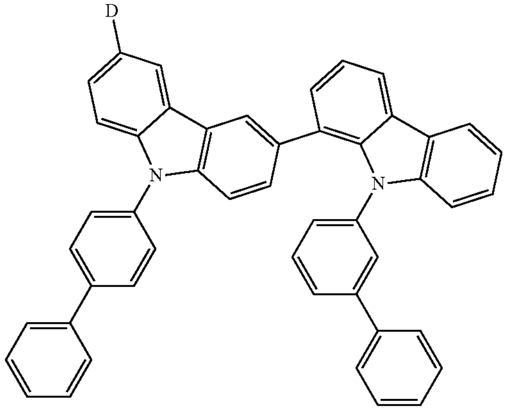

-continued
(3-67)
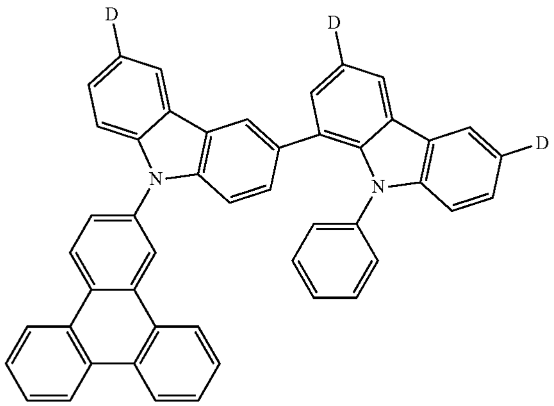
(3-68)
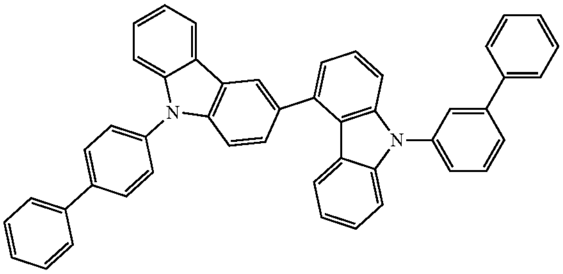
(3-69)
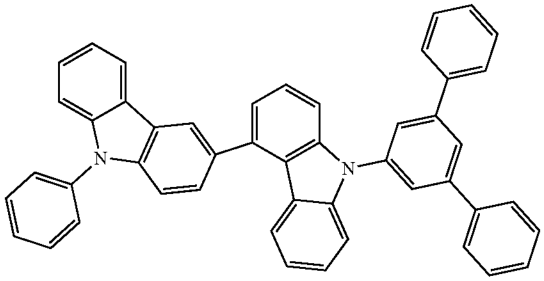
(3-70)
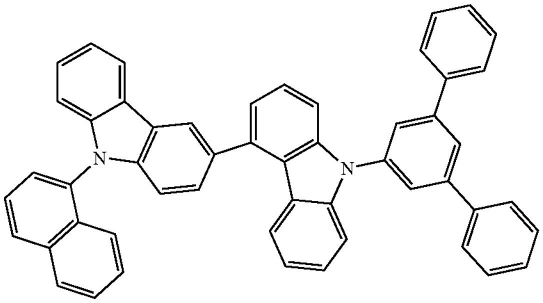
(3-71)
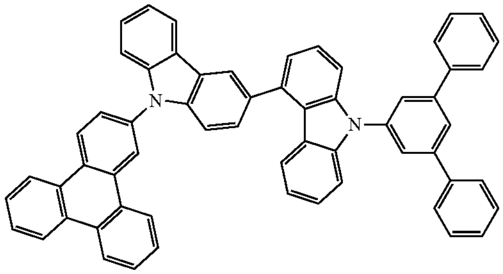
(3-72)
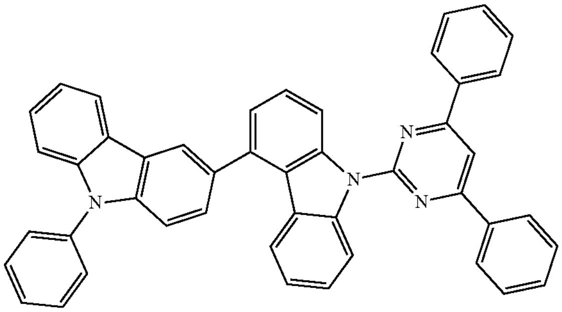
(3-73)
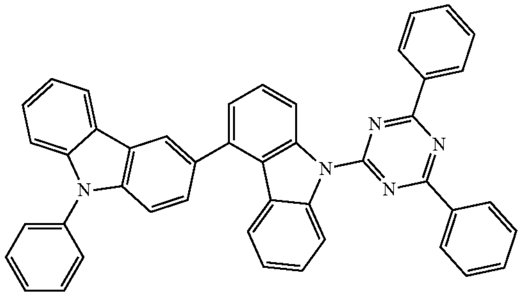
(3-74)
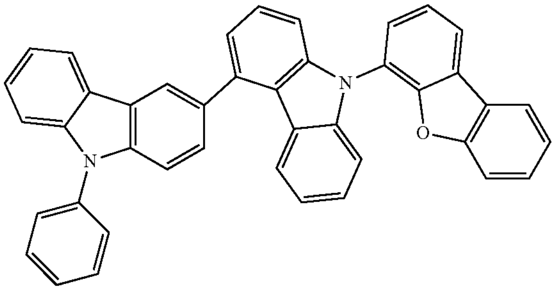

-continued
(3-75)
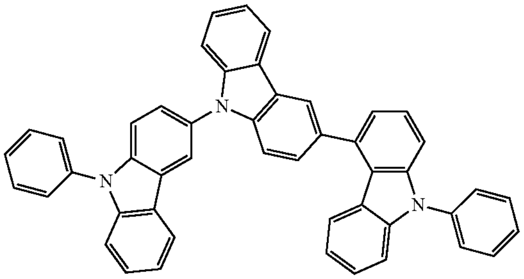
(3-76)
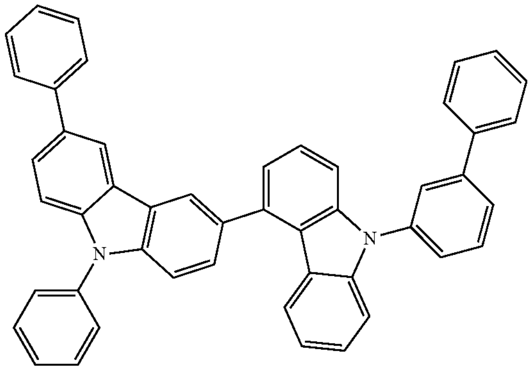
(3-77)
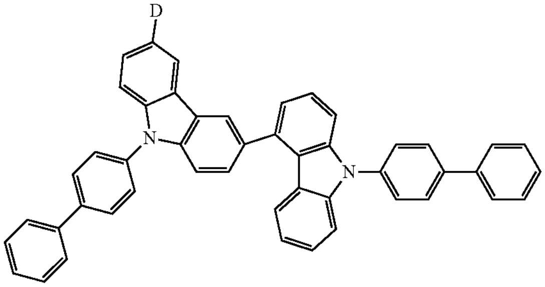
(3-78)
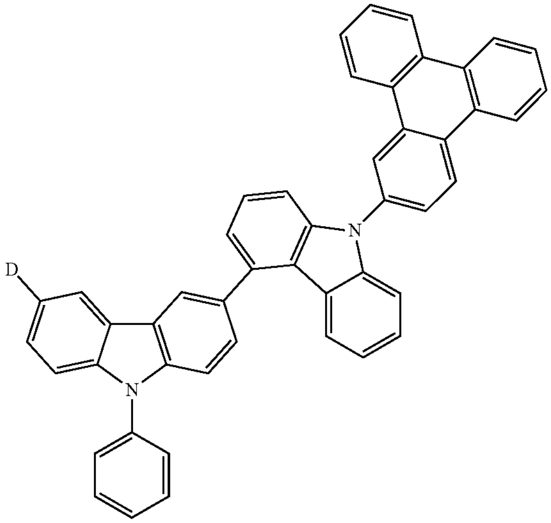
(3-79)
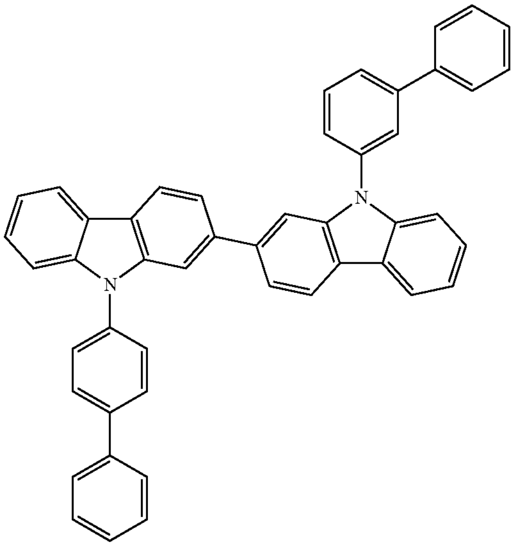
(3-80)
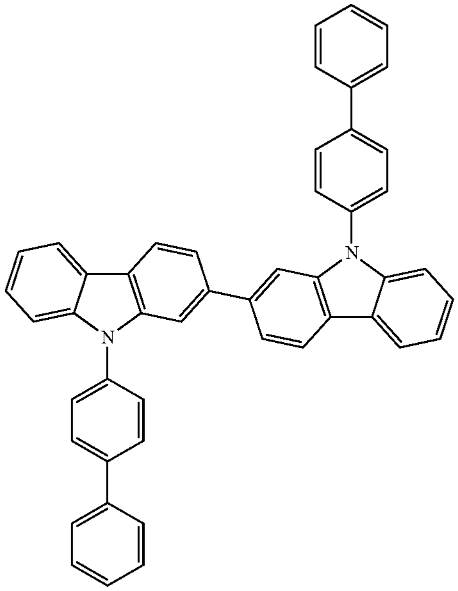

-continued
(3-81)
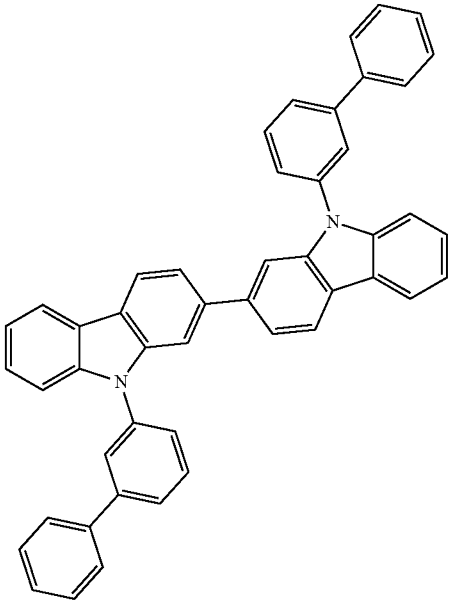
(3-82)
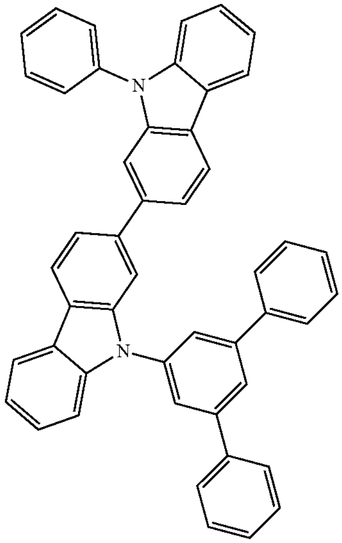
(3-83)
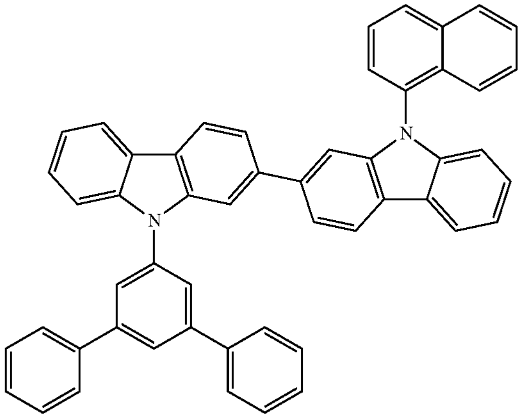
(3-84)
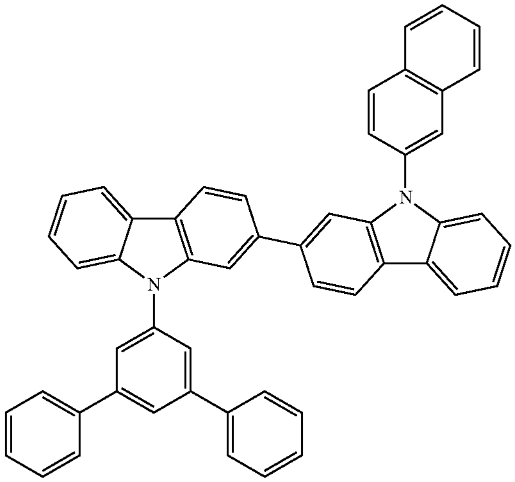
(3-85)
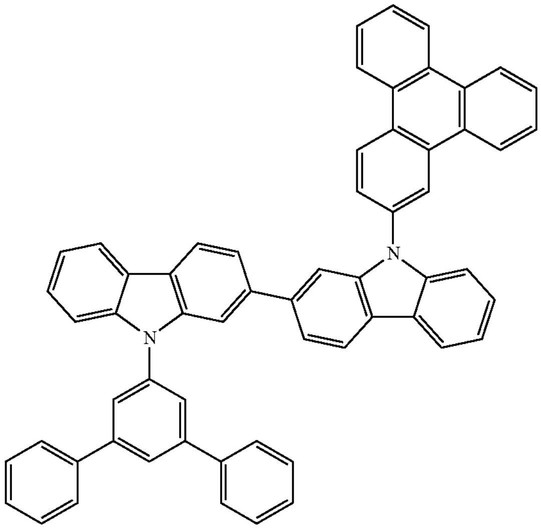
(3-86)
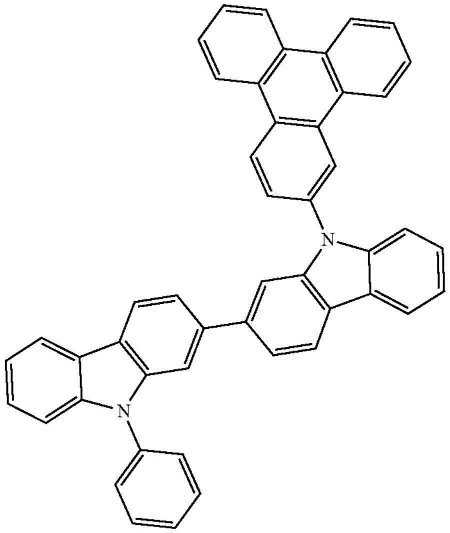

-continued
(3-87)
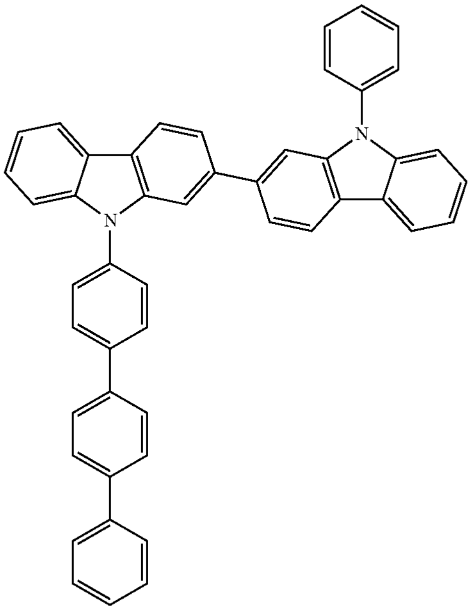
(3-88)
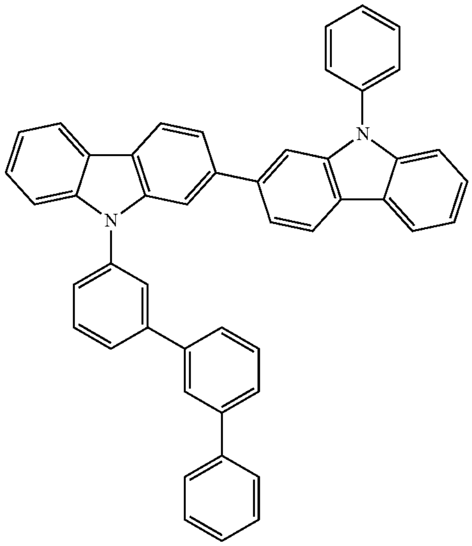
(3-89)
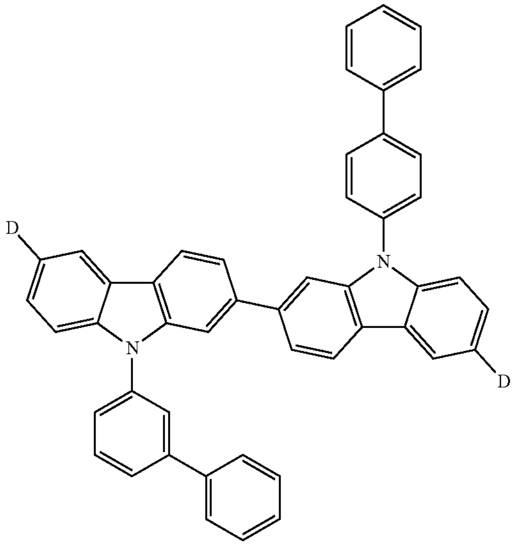
(3-90)
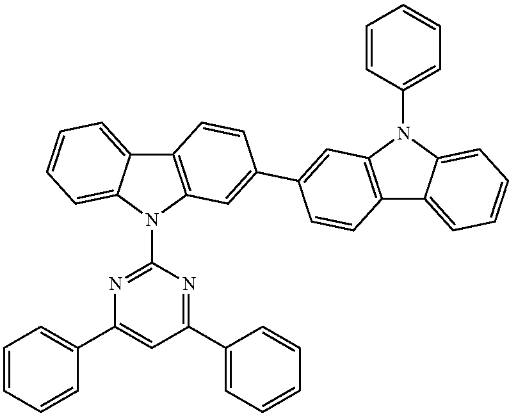

-continued
(3-91)
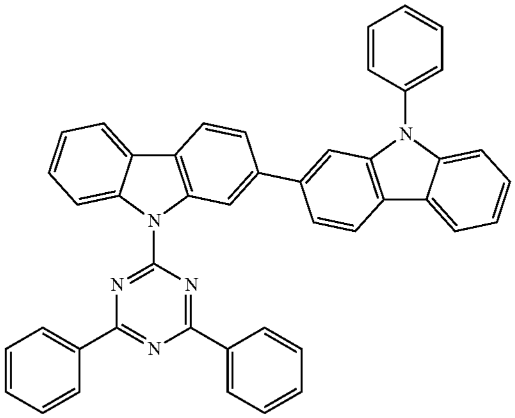
(3-92)
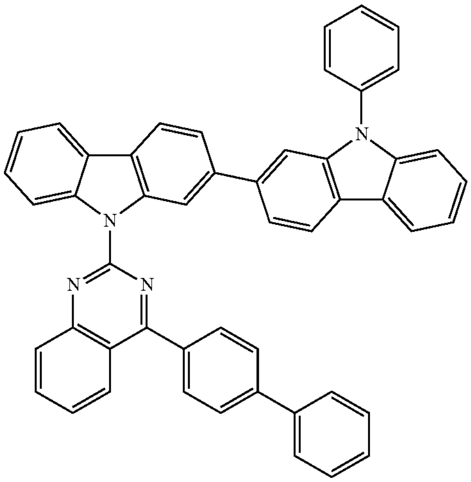
(3-93)
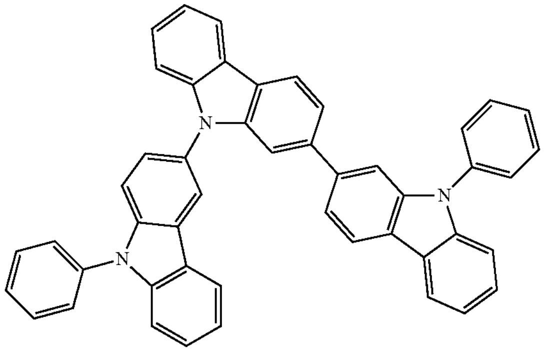
(3-94)
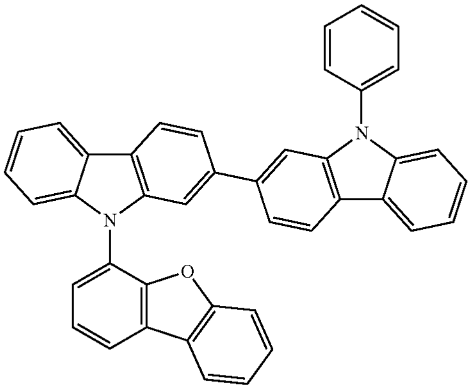
(3-95)
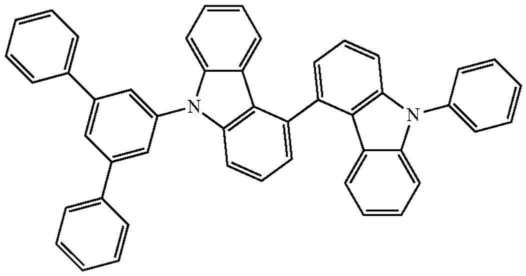
(3-96)
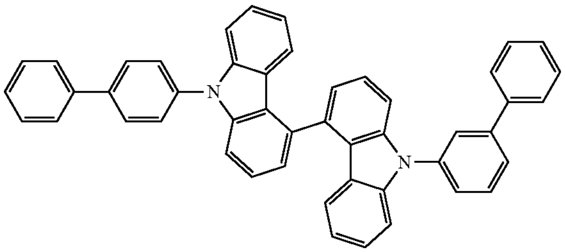
(3-97)
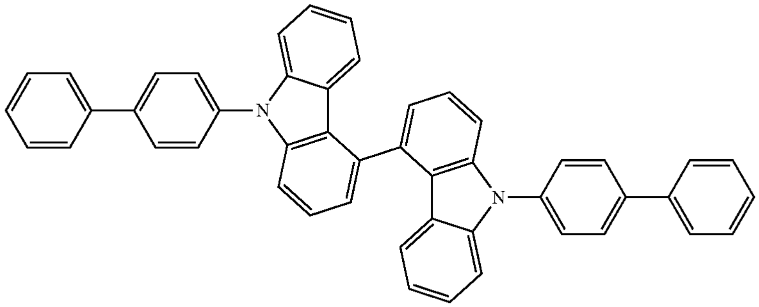

-continued
(3-98)
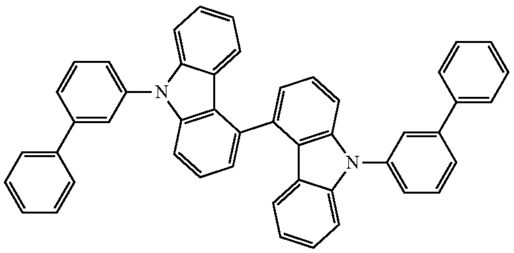
(3-99)
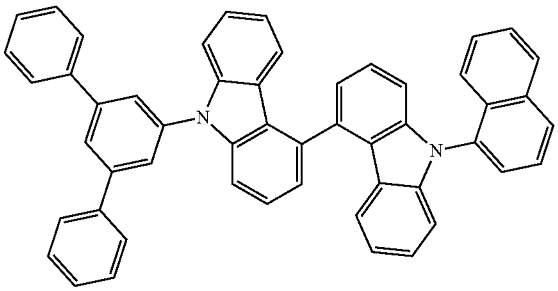
(3-100)
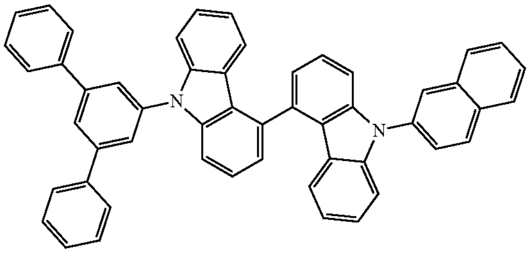
(3-101)
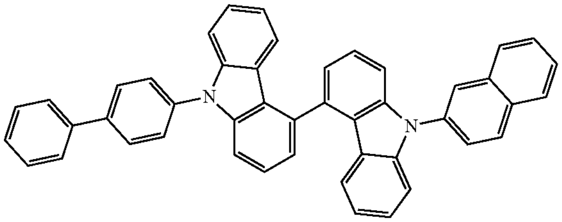
(3-102)
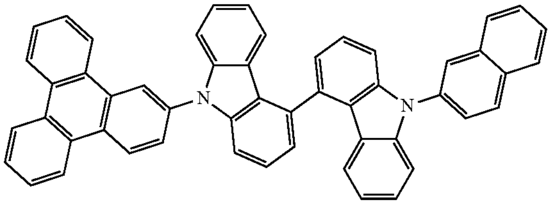
(3-103)
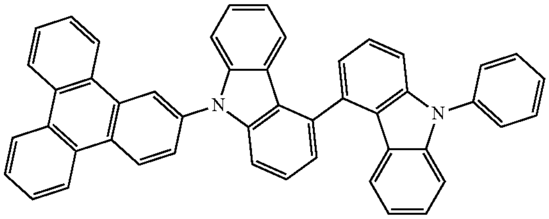
(3-104)
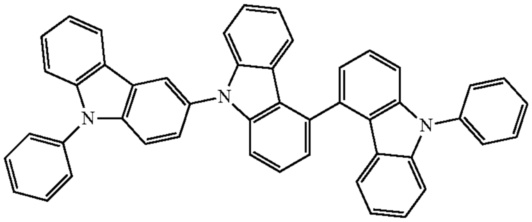
(3-105)
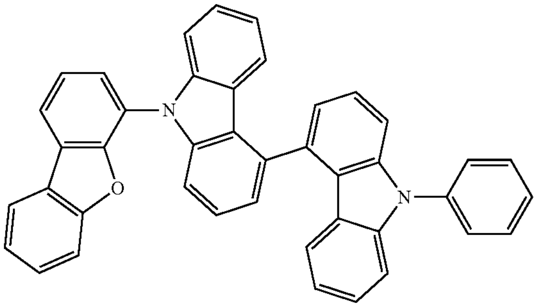
(3-106)
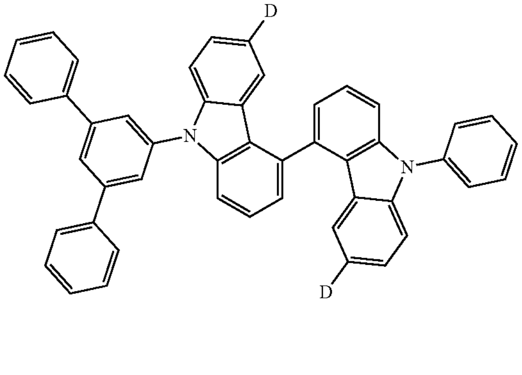
(3-107)
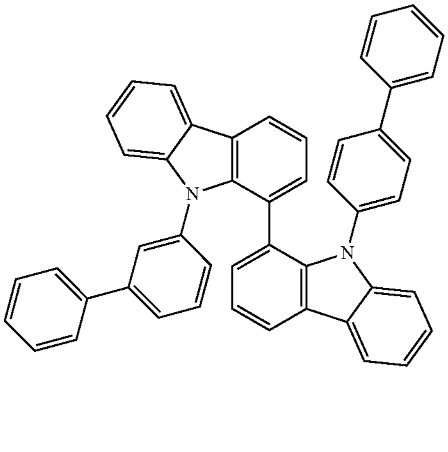

-continued
(3-108)
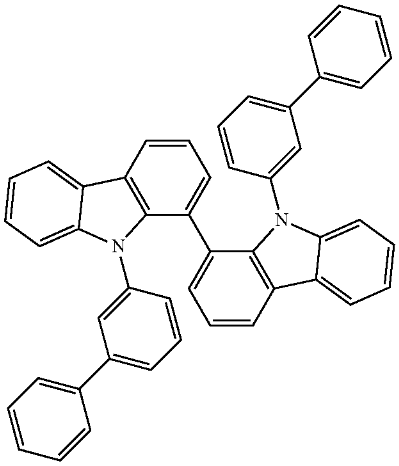
(3-109)
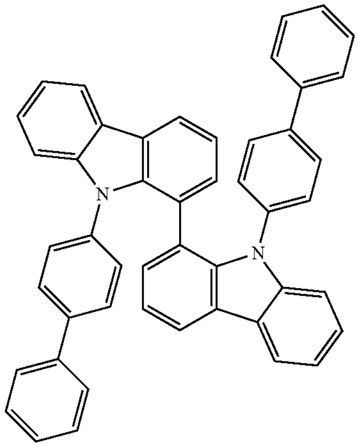
(3-110)
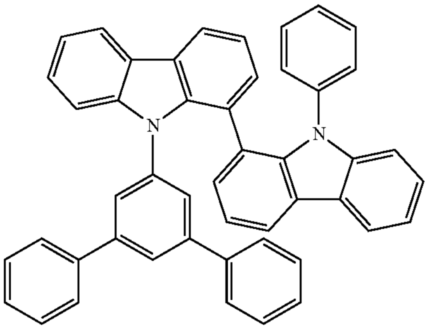
(3-111)
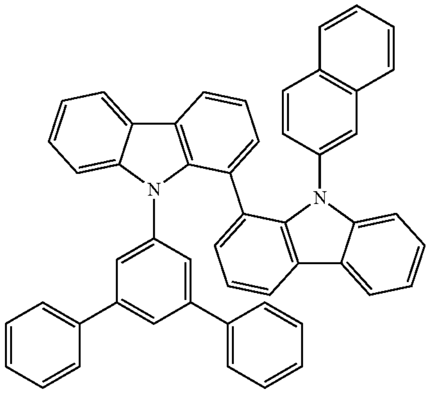
(3-112)
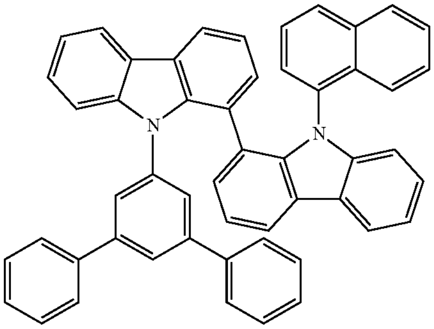
(3-113)
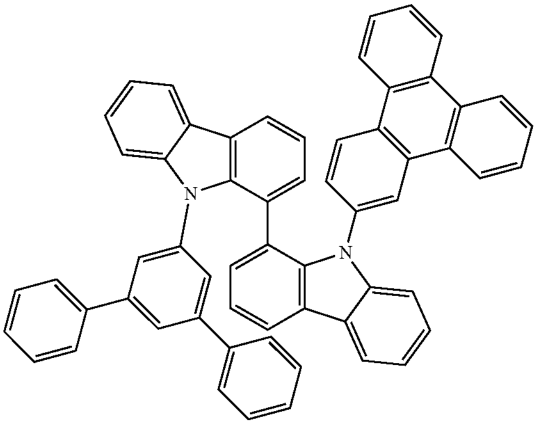

-continued
(3-114)
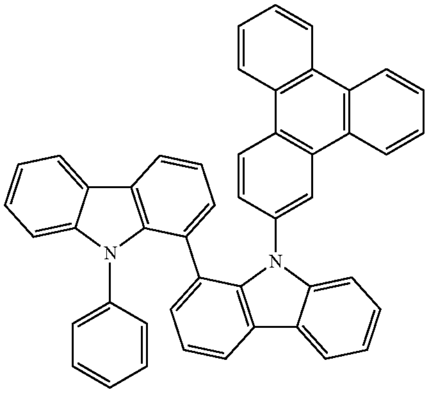
(3-115)
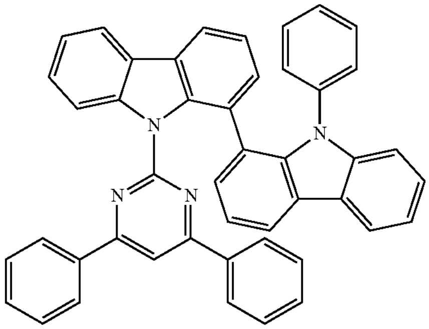
(3-116)
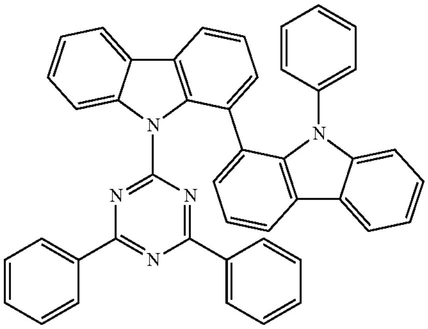
(3-117)
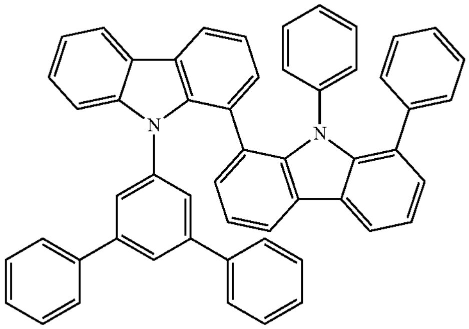
(3-118)
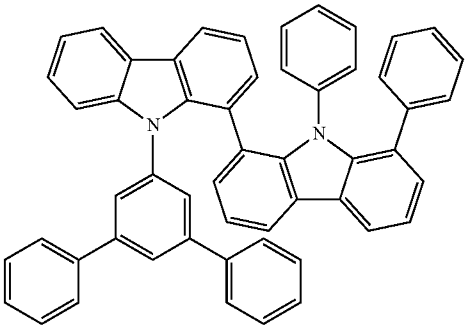
(3-119)
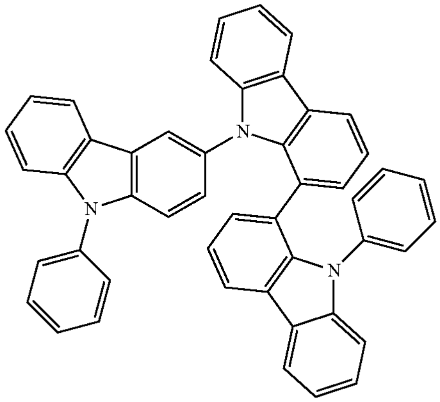
(3-120)
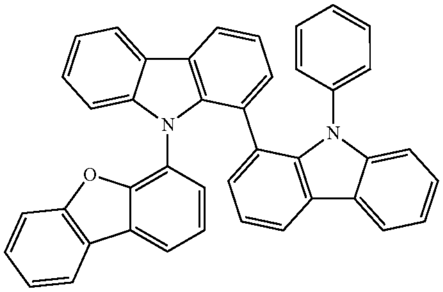
(3-121)
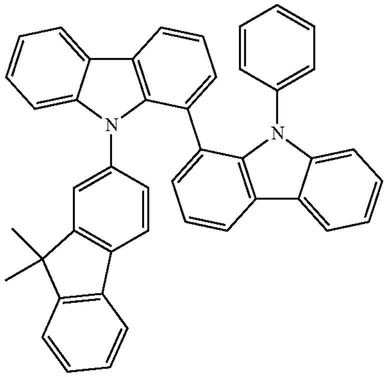

-continued
(3-122)
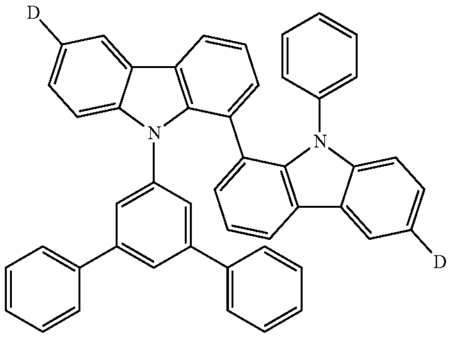
(3-123)
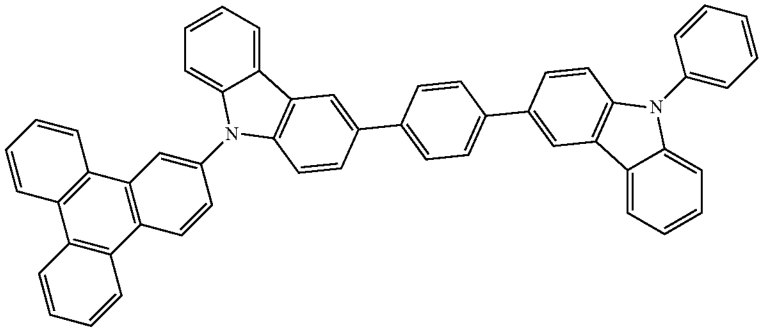
(3-124)
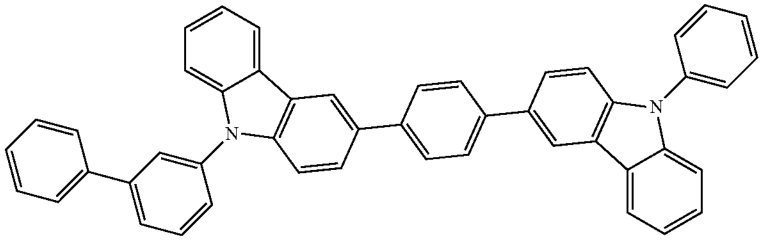
(3-125)
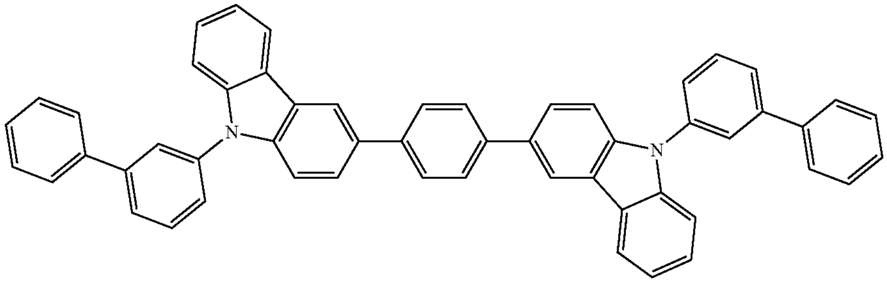
(3-126)
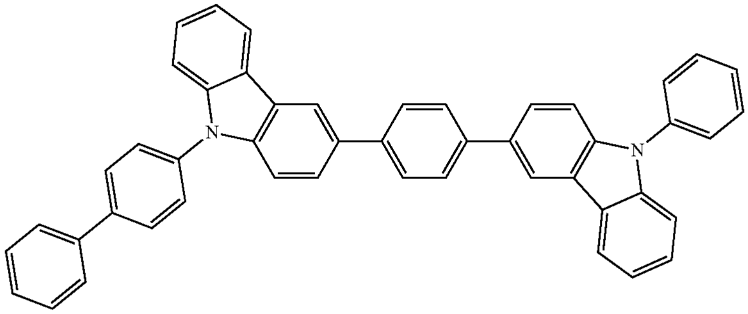

-continued
(3-127)
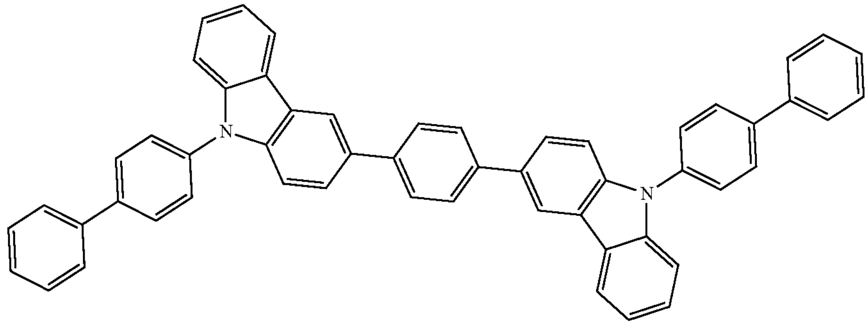
(3-128)
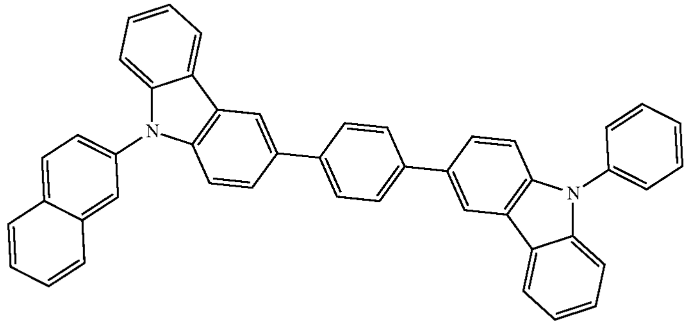
(3-129)
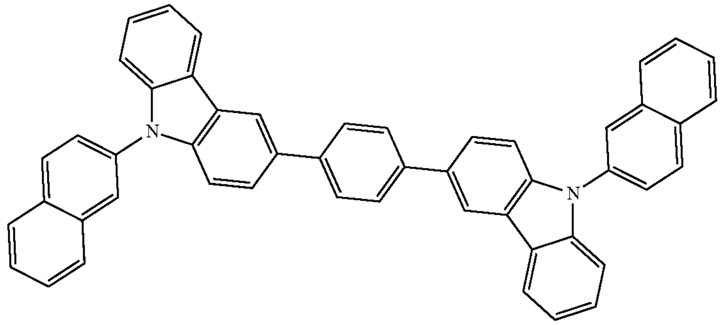
(3-130)
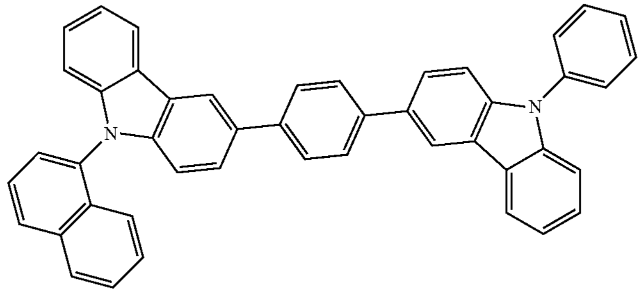
(3-131)
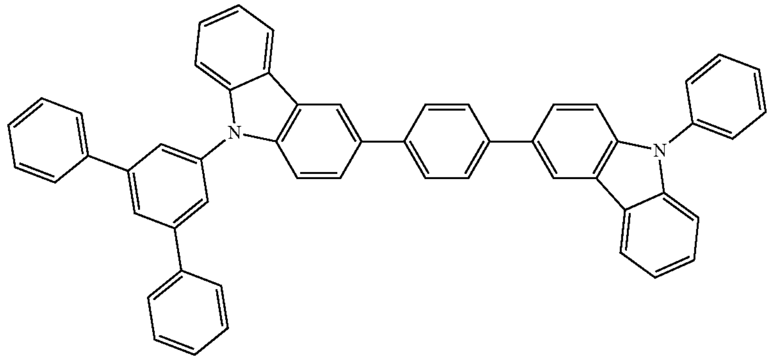

-continued
(3-132)
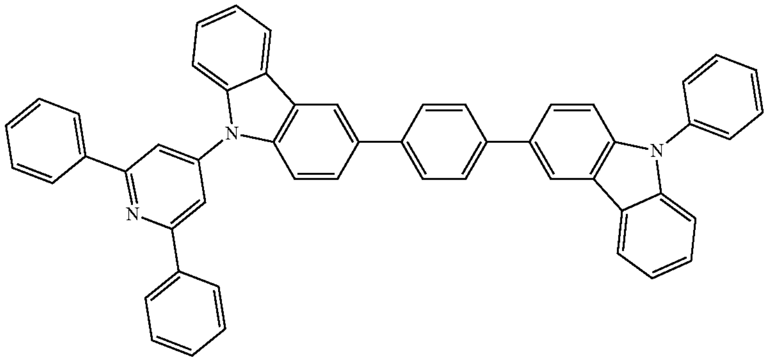
(3-133)
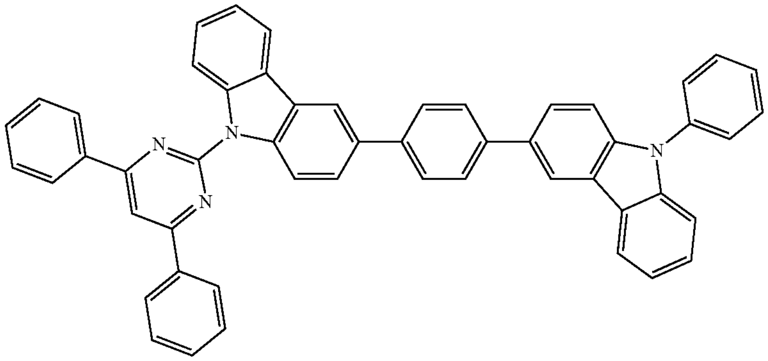
(3-134)
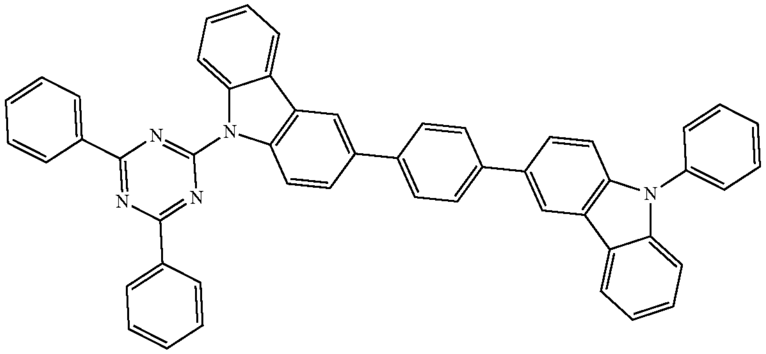
(3-135)
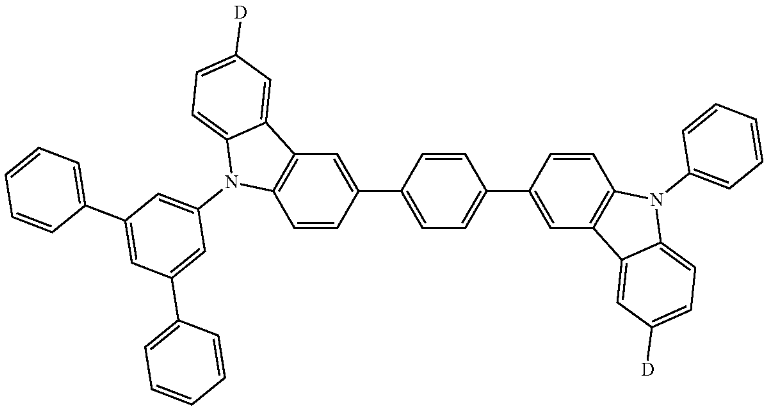

-continued
(3-136)
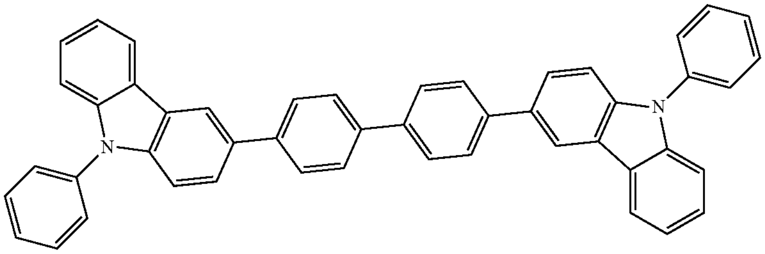
(3-137)
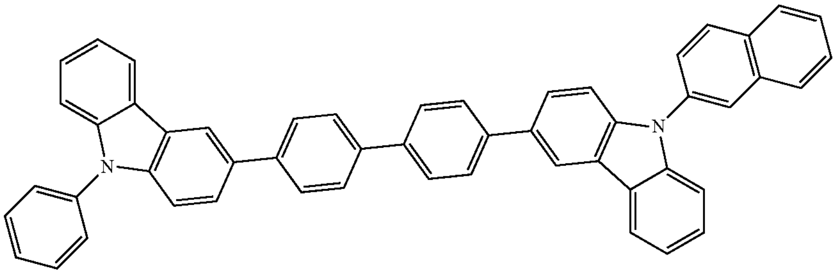
(3-138)
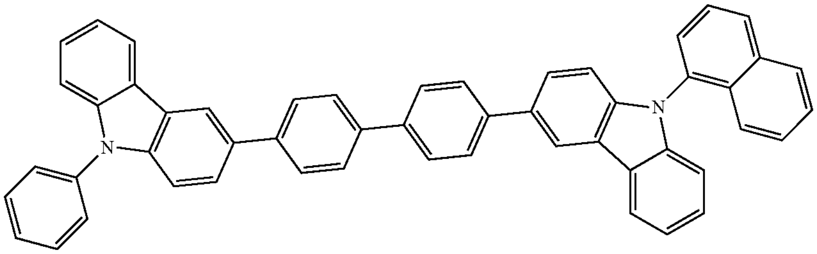
(3-139)
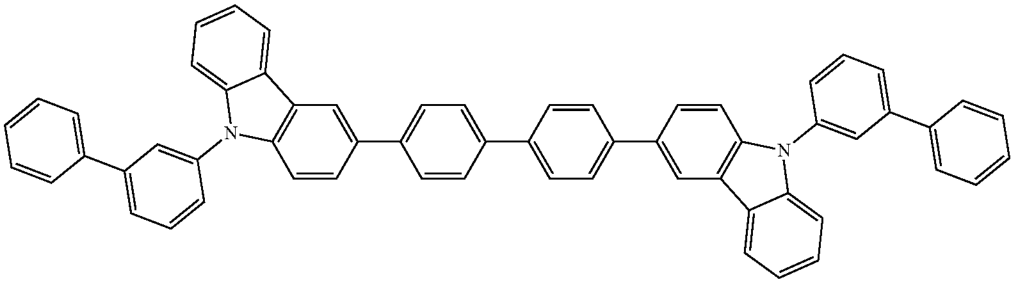
(3-140)
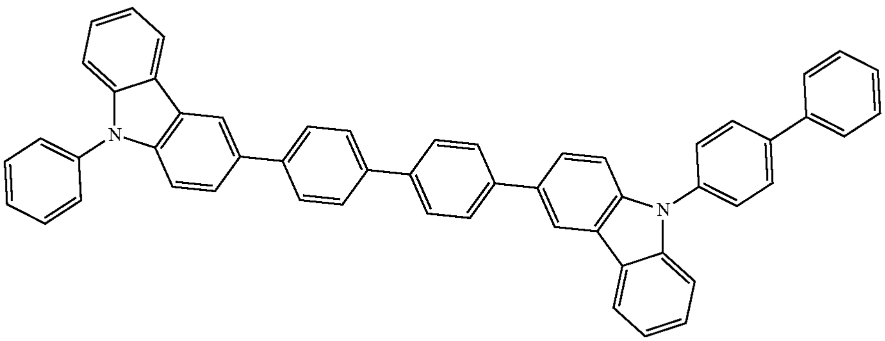

-continued
(3-141)
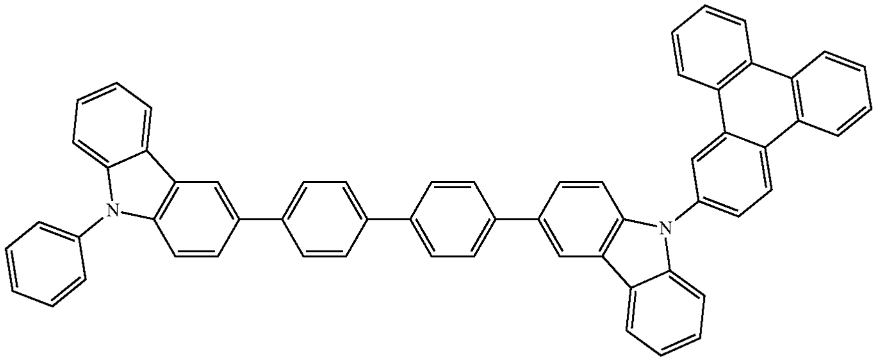
(3-142)
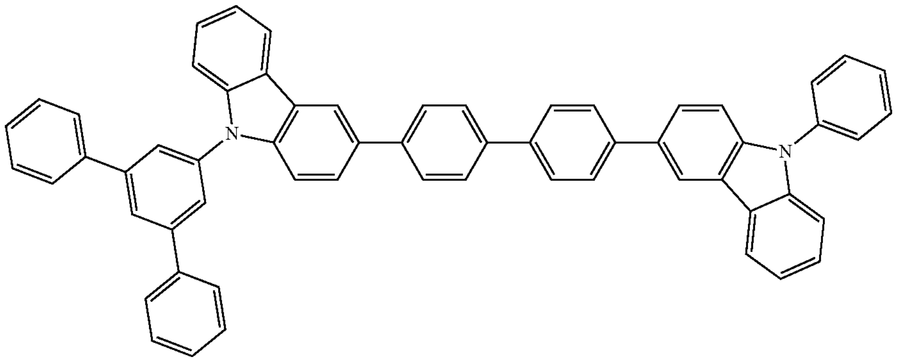
(3-143)
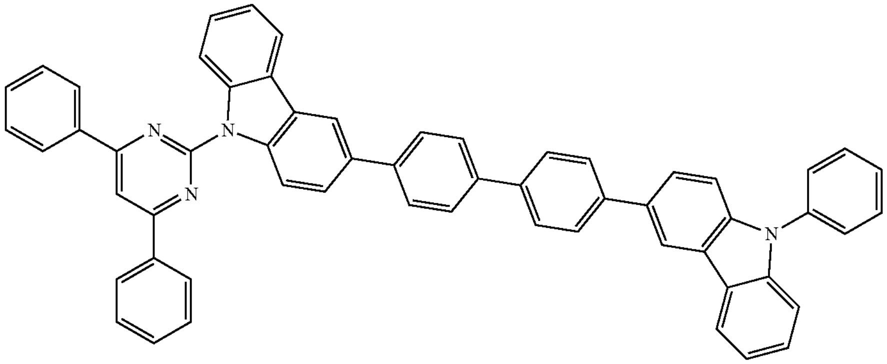
(3-144)
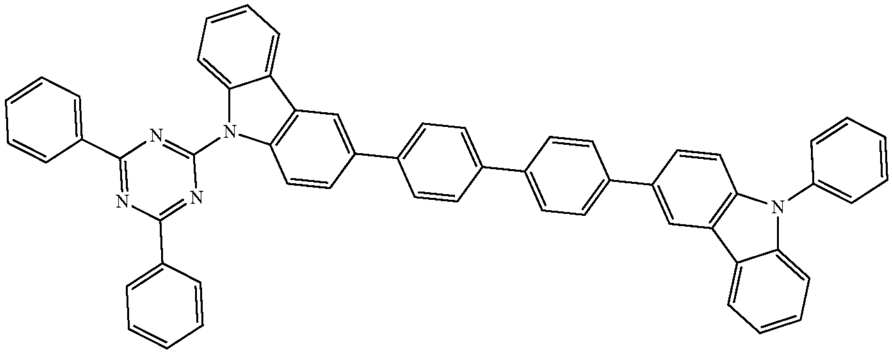

-continued
(3-145)
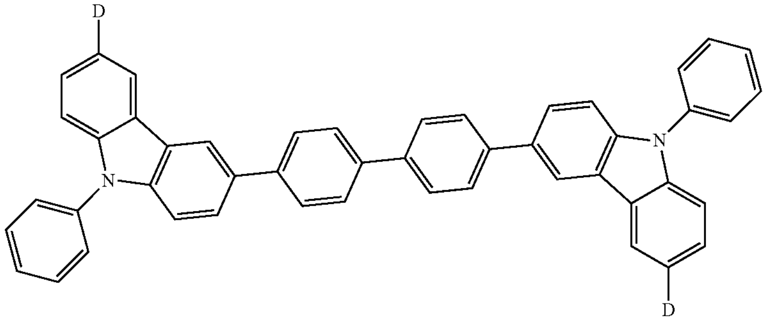
(3-146)
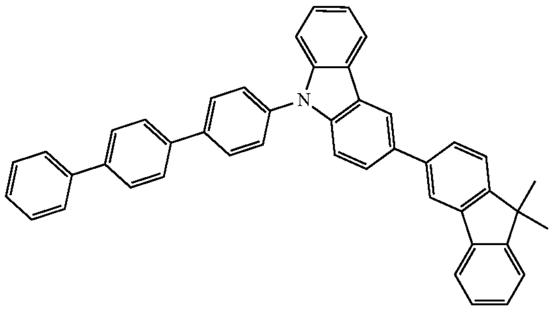
(3-147)
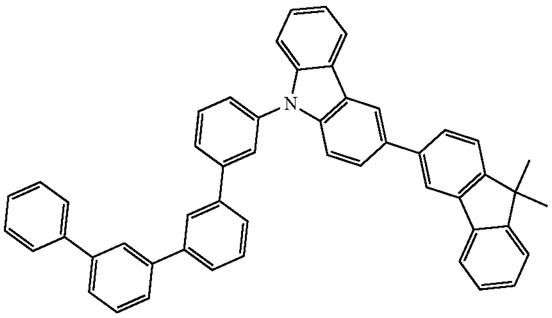
(3-148)
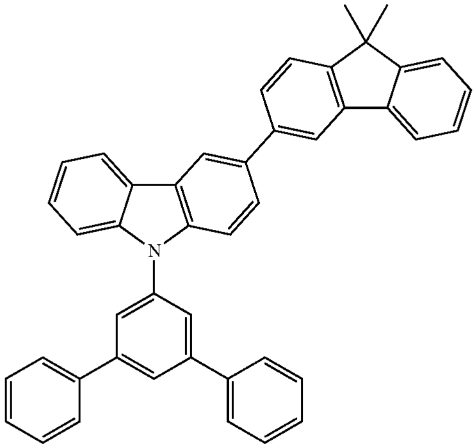
(3-149)
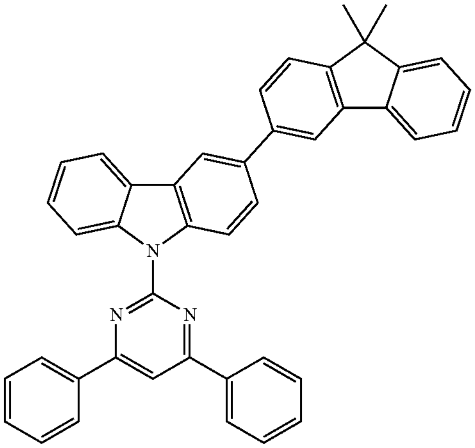
(3-150)
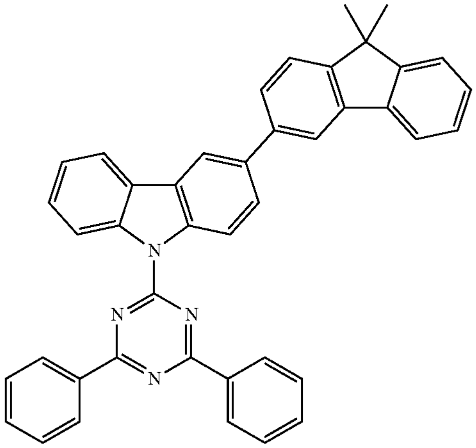
(3-151)
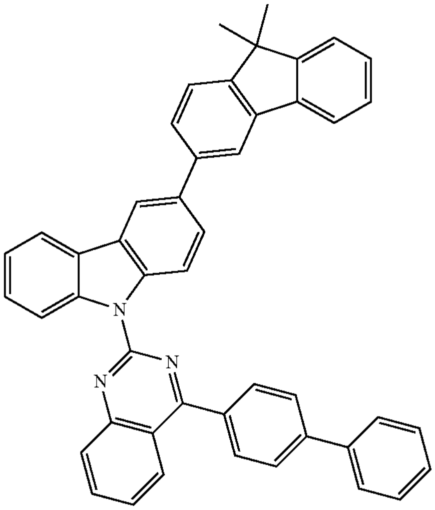

-continued
(3-152)
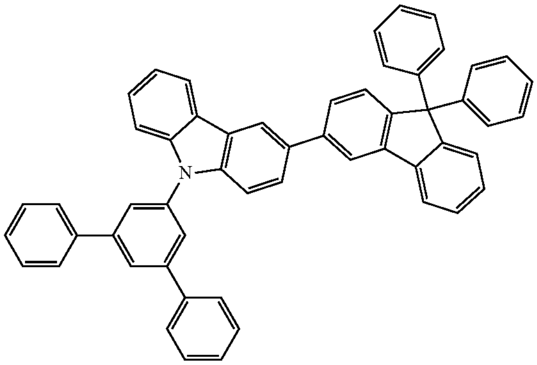
(3-153)
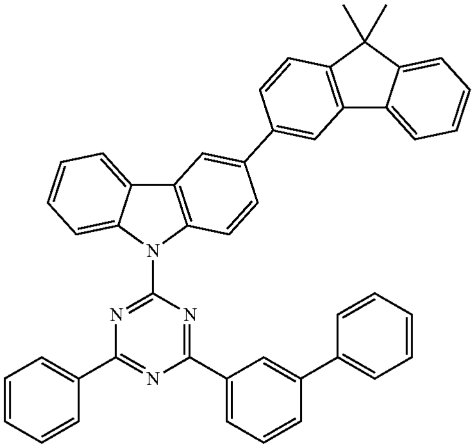
(3-154)
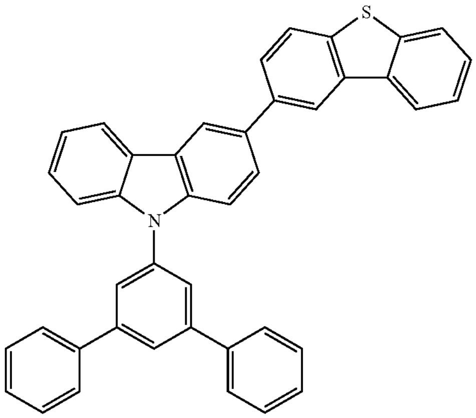
(3-155)
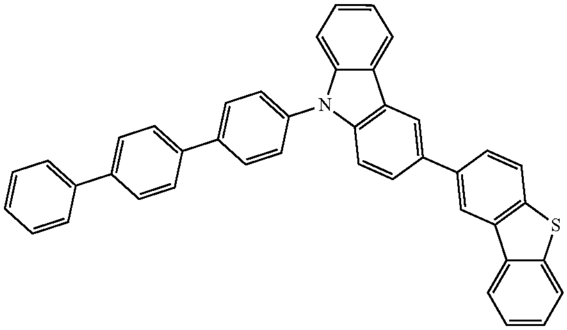
(3-156)
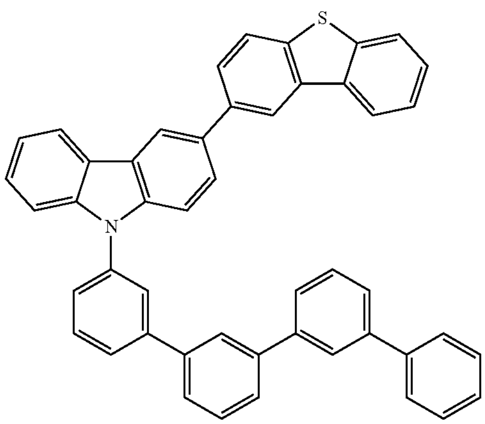
(3-157)
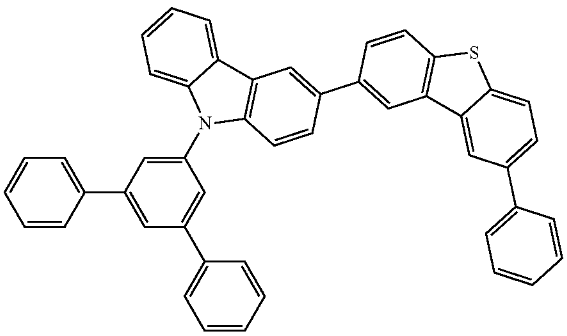

-continued
(3-158)
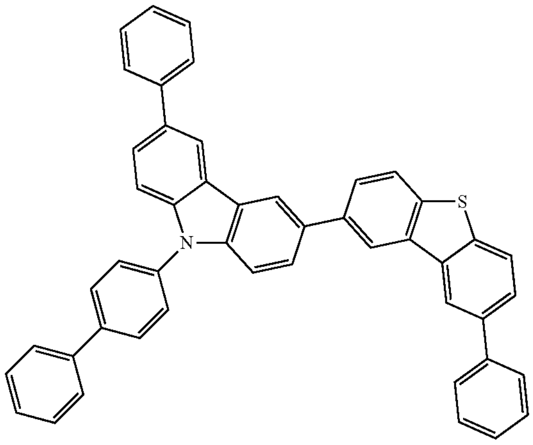
(3-159)
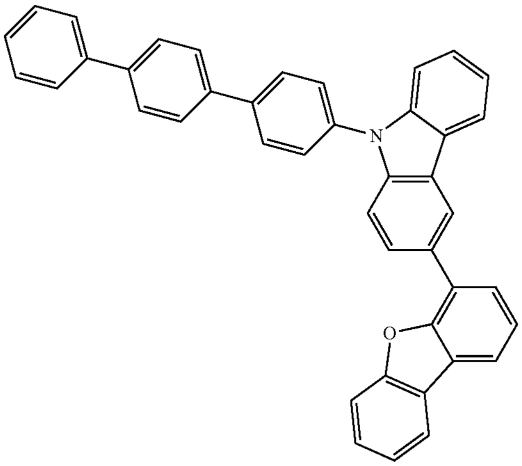
(3-160)
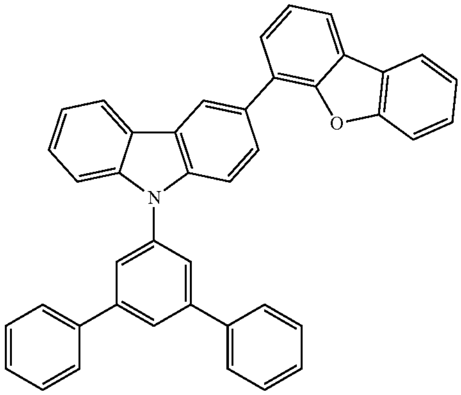
(3-161)
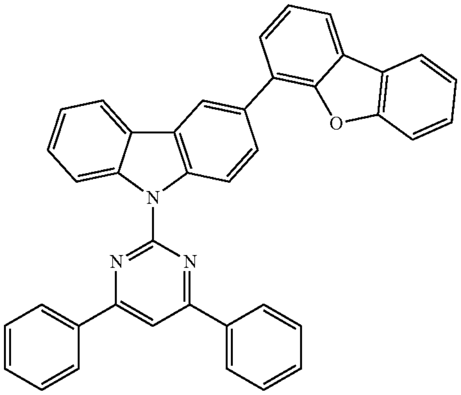
(3-162)
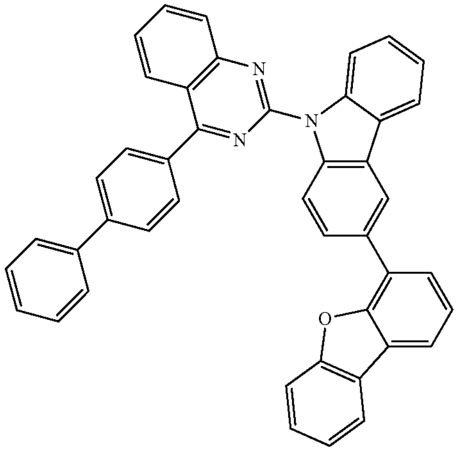
(3-163)
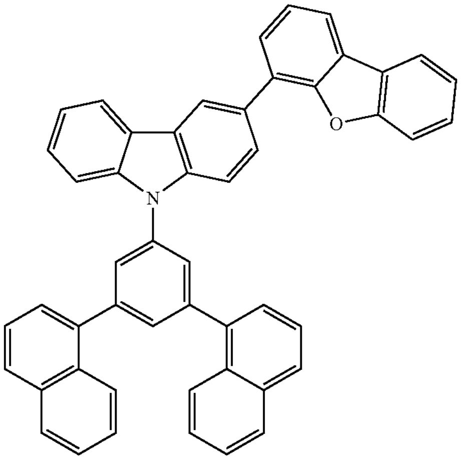

-continued
(3-164)
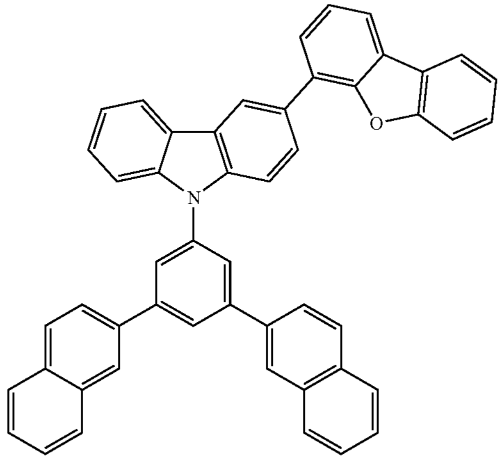
(3-165)
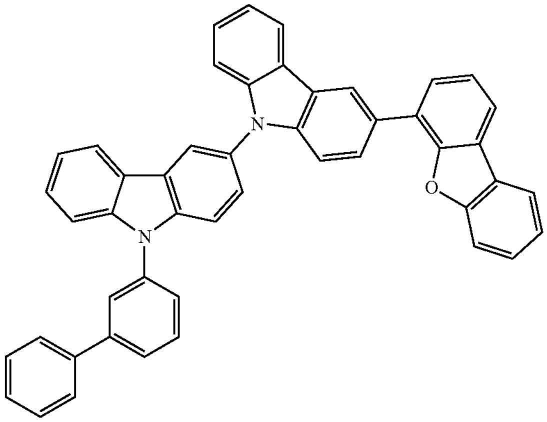
(3-166)
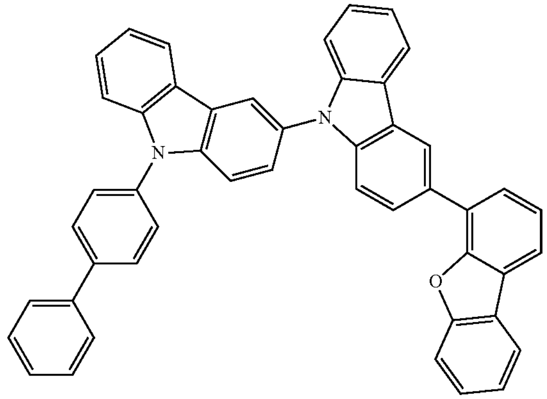
(3-167)
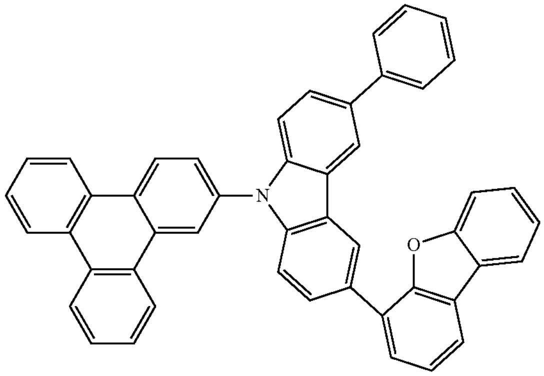
(3-168)
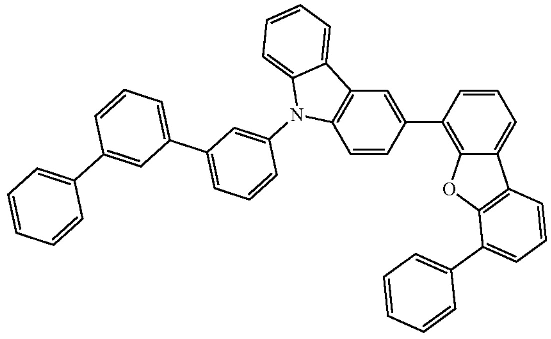
(3-169)
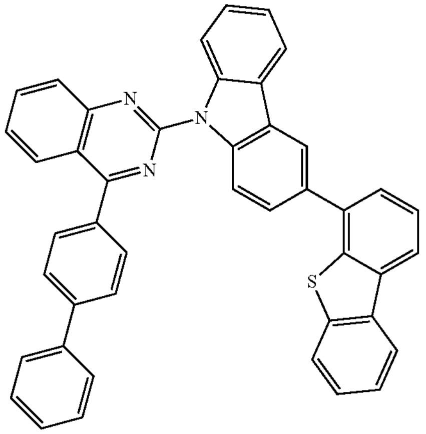

-continued
(3-170)
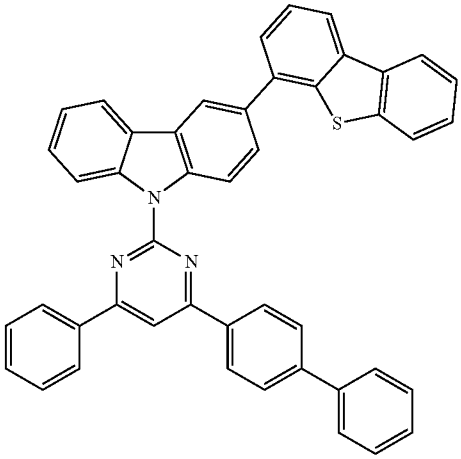
(3-171)
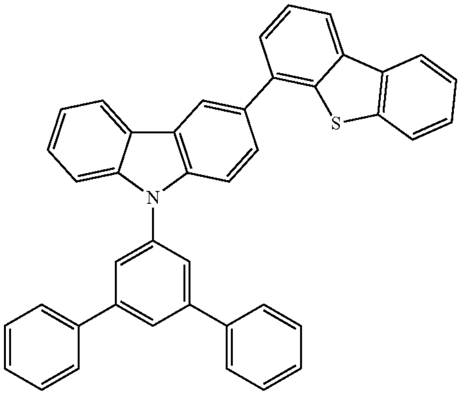
(3-172)
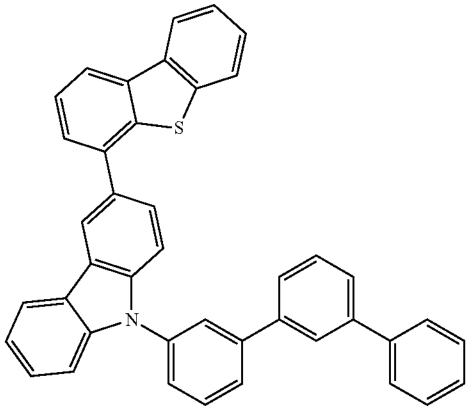
(3-173)
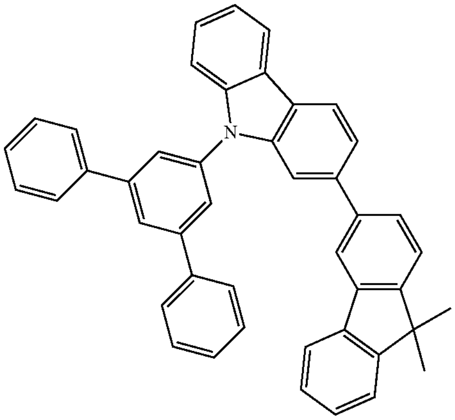
(3-174)
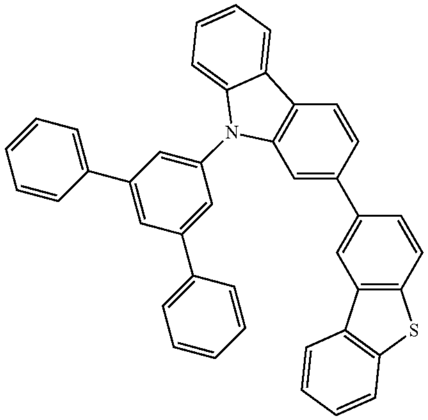
(3-175)
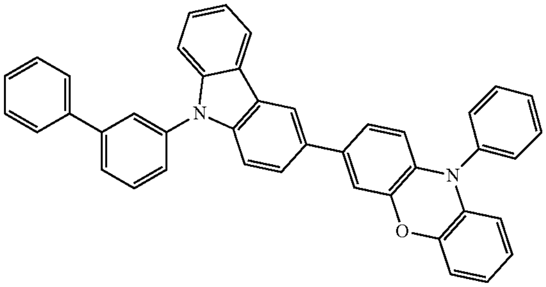

-continued
(3-176)
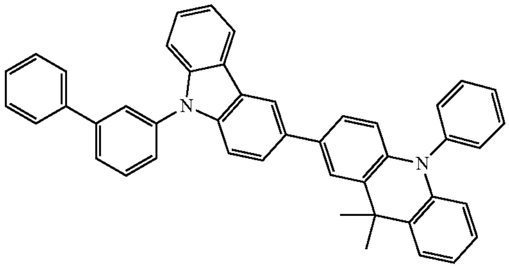
(3-177)
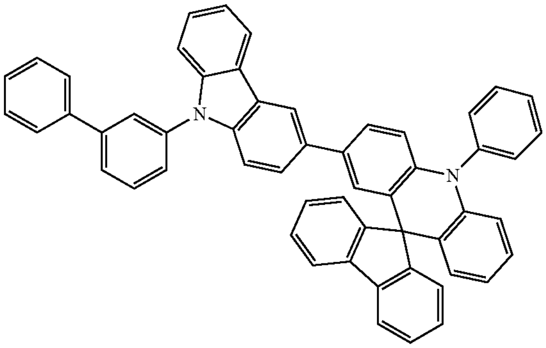
(3-178)
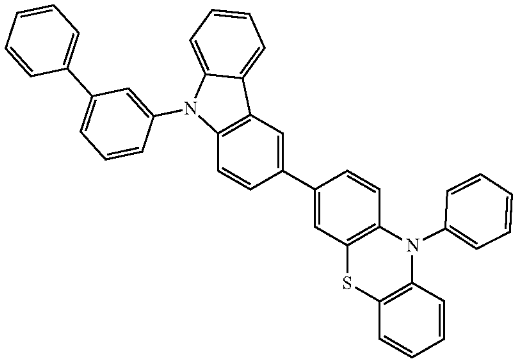
(3-179)
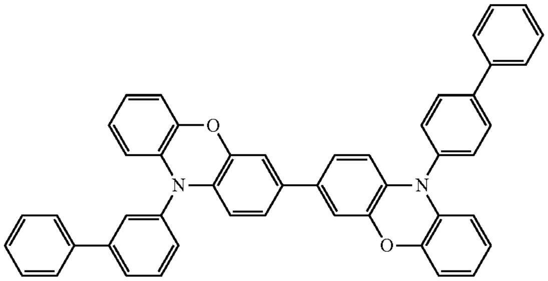
(3-180)
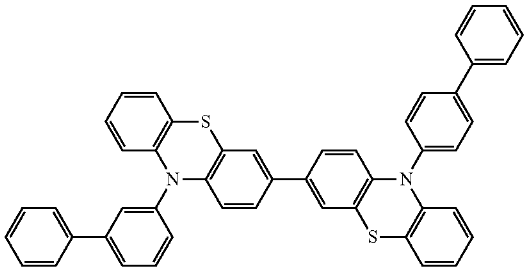
(3-181)
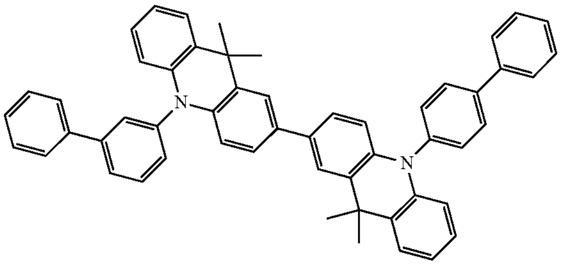
(3-182)
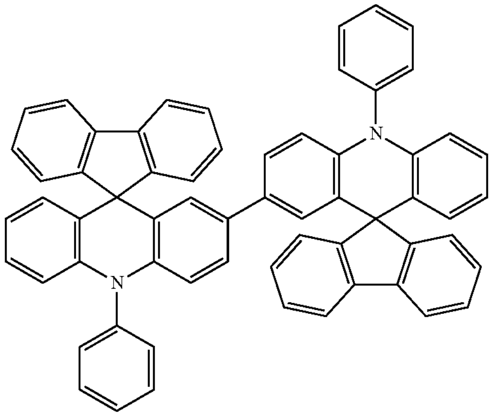
(3-183)
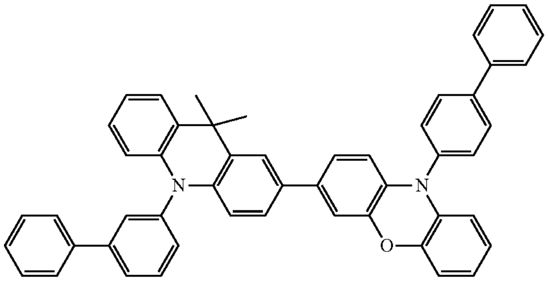

-continued
(3-184)
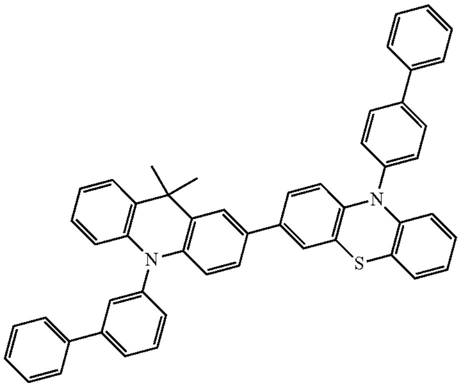
(3-185)
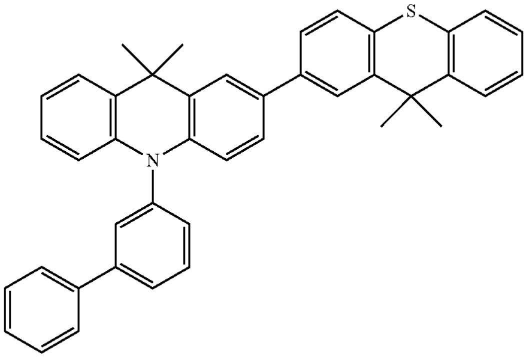
Further, the organic compounds represented by general formula (4) are all selected from the following formulas:
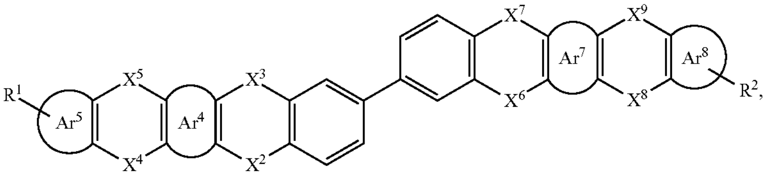
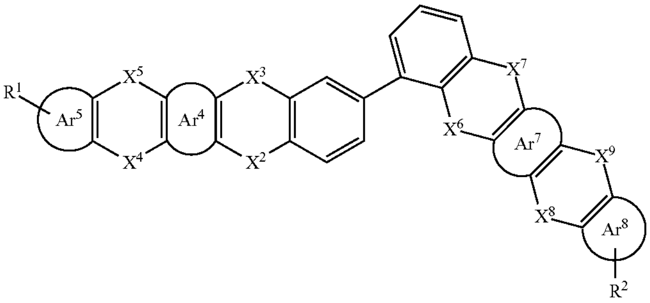
,
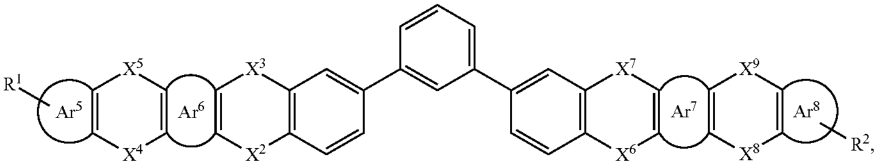
and
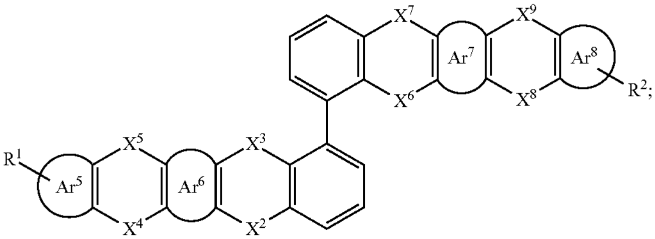

wherein $Ar^4$, $Ar^5$, $Ar^7$, $Ar^8$, $X^2$, $X^3$, $X^4$, $X^5$, $X^6$, $X^7$, $X^8$, $X^9$, $R^1$, and $R^2$ are as defined above.

Even further, the compounds represented by general formula (4) are:

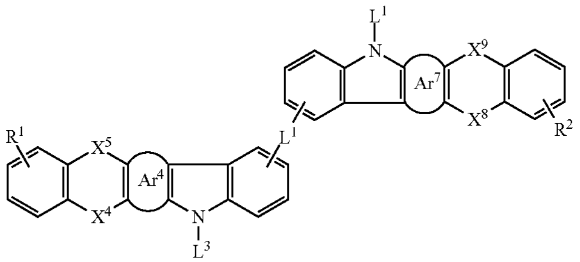

wherein $Ar^4$, $Ar^7$, $X^4$, $X^5$, $X^8$, $X^9$, $R^1$ and $R^2$ are as defined above.

Specifically, the compounds represented by general formula (4) are each selected from the following structural formulas:

(4-1)

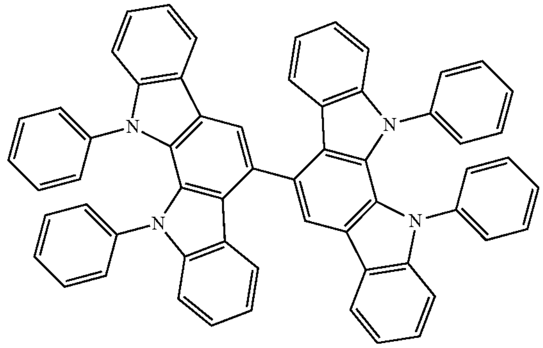

(4-2)

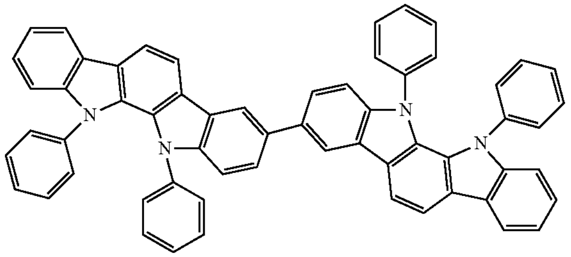

(4-3)

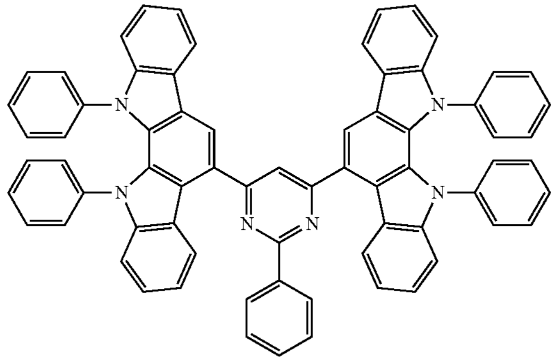

(4-4)

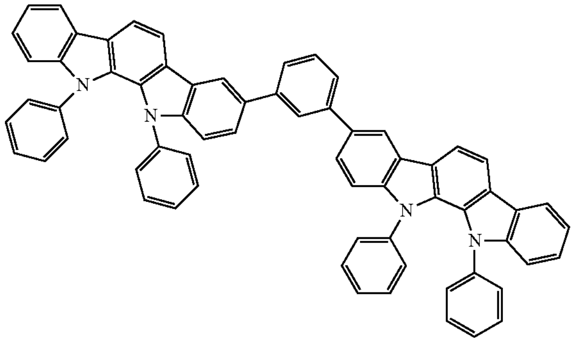

(4-5)

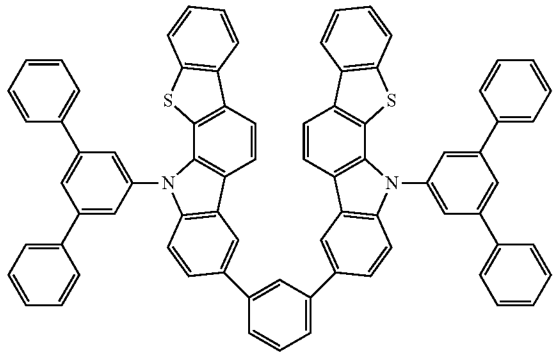

(4-6)

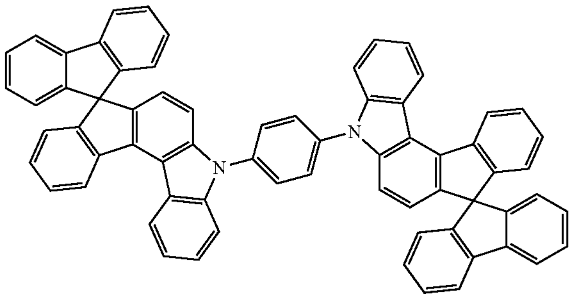

-continued
(4-7)
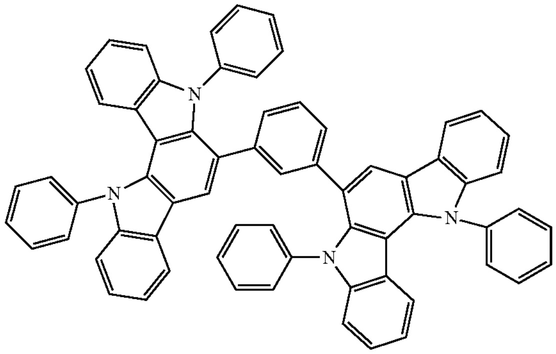
(4-8)
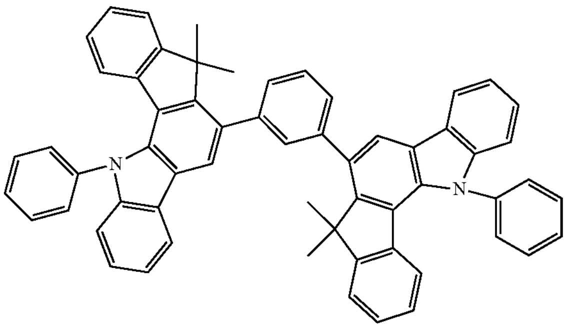
(4-9)
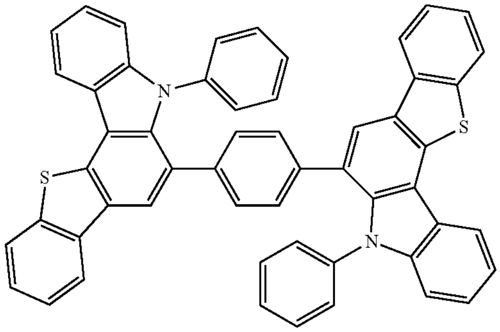
(4-10)
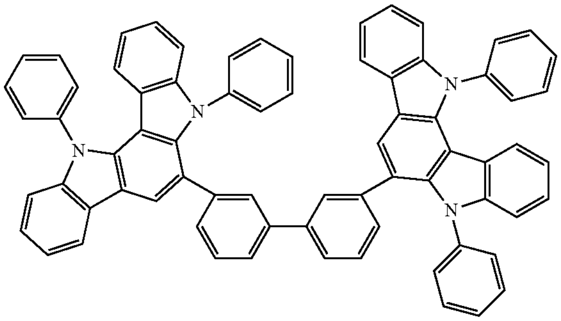
(4-11)
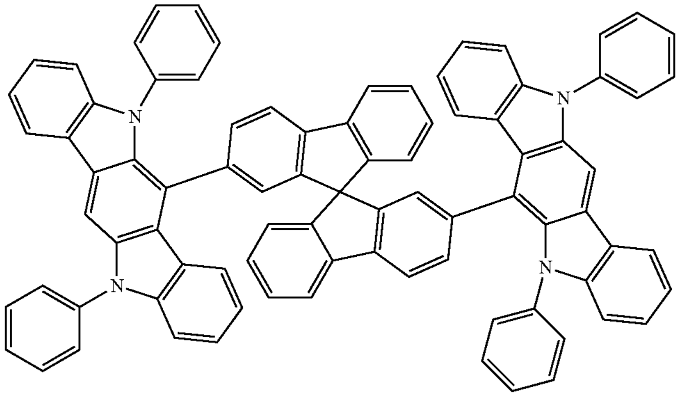
(4-12)
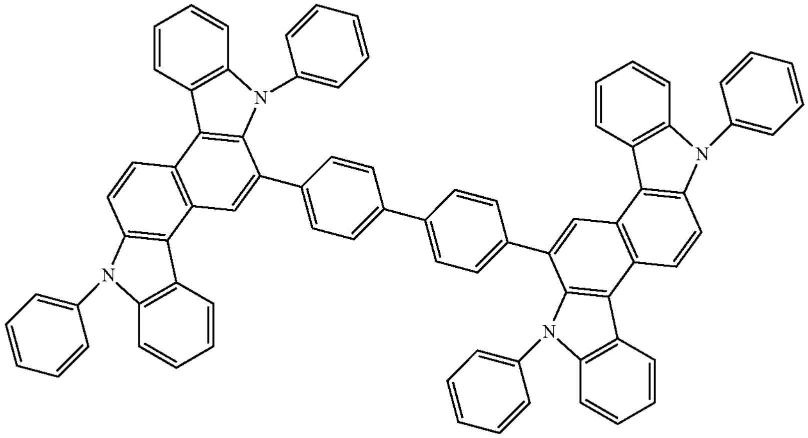

-continued
(4-13)
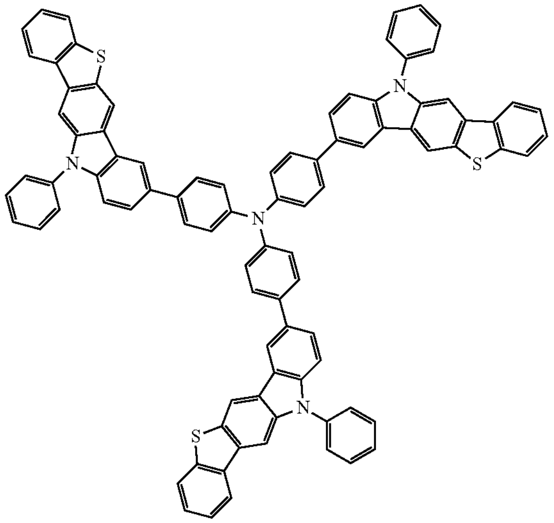
(4-14)
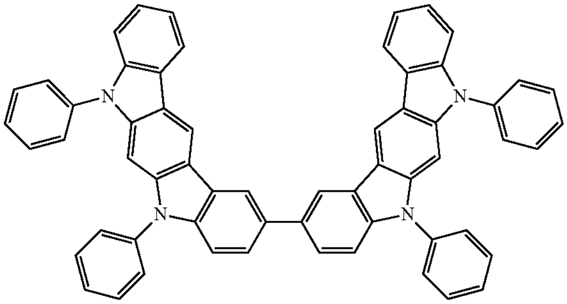
(4-15)
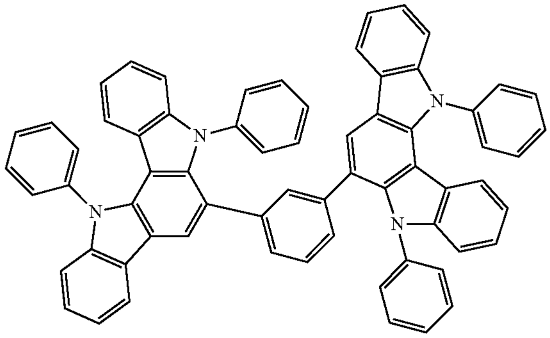
(4-16)
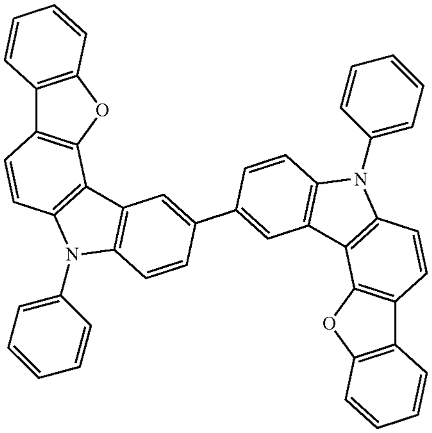
(4-17)
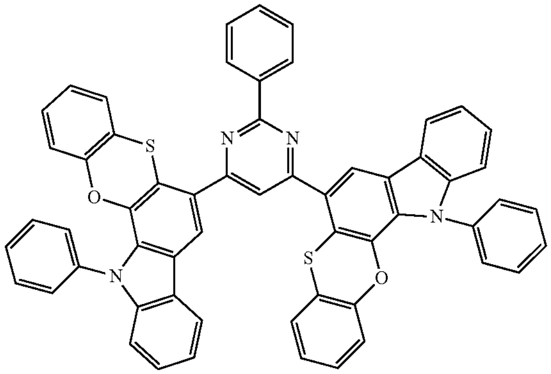
(4-18)
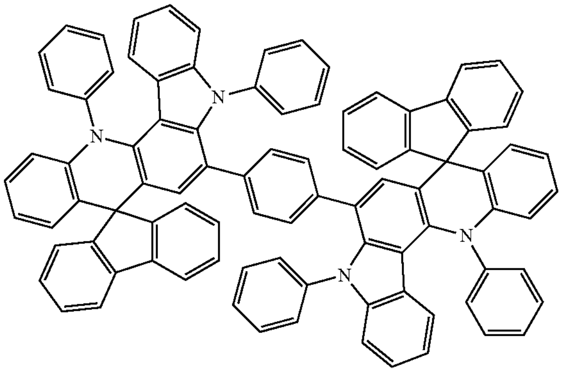

-continued
(4-19)
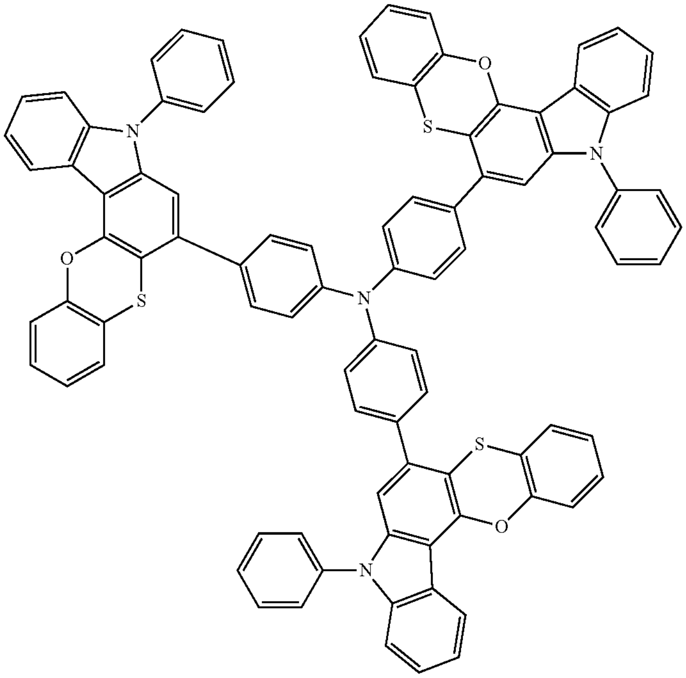
(4-20)
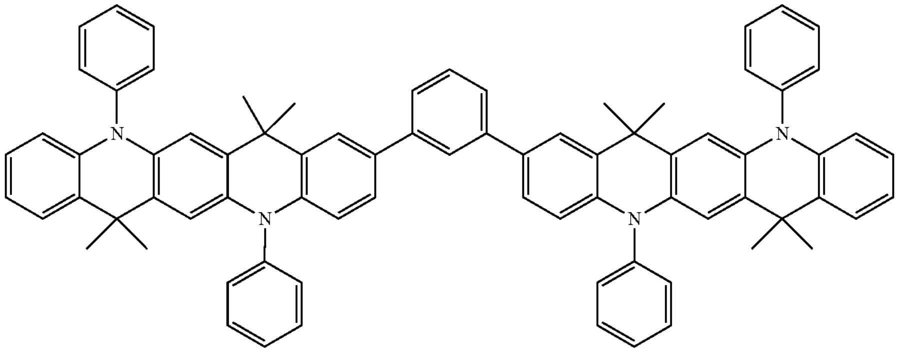
Further, the organic compounds represented by general formula (5) are all selected from the following structural formulas:
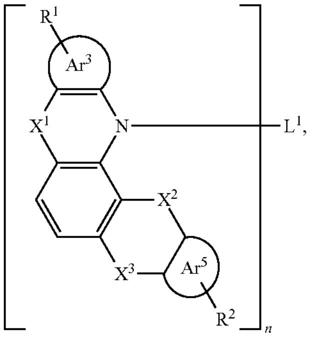
-continued
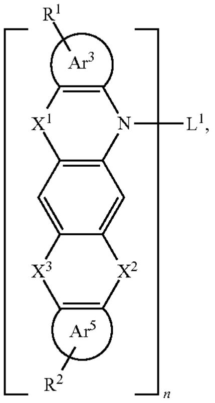

-continued
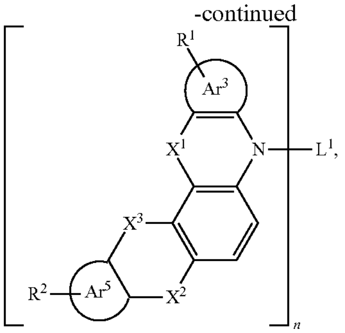
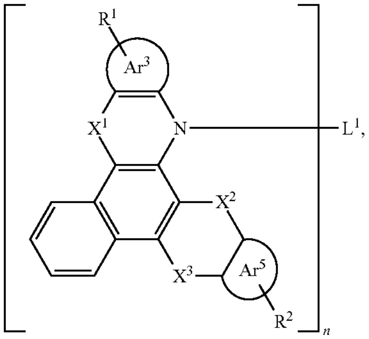
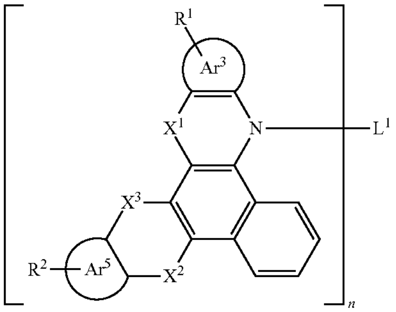
and
-continued
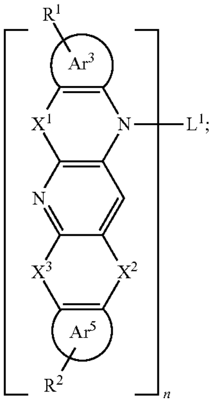
wherein $Ar^3$, $Ar^5$, $X^1$, $X^2$, $X^3$, $R^1$, $R^2$, L1 and n are as defined above.
Even further, the compounds represented by general formula (5) are:
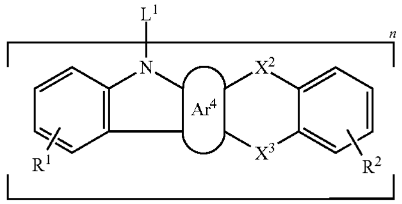
wherein $X^2$, $X^3$, $R^1$, $R^2$, $L^1$ and n are defined as above.
Specifically, the organic compounds represented by general formula (5) are each selected from the following structural formulas:
(5-1)
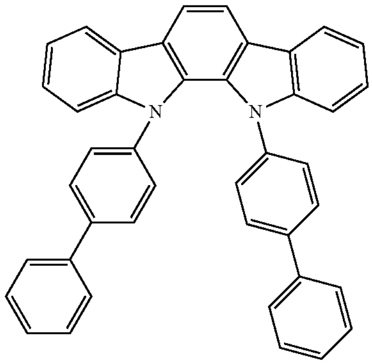
(5-2)
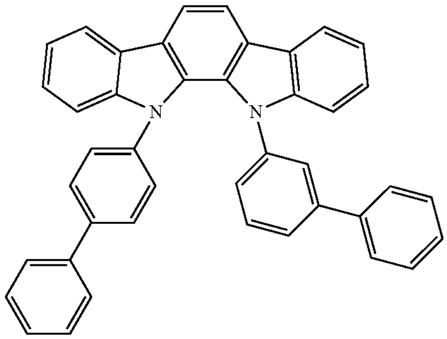

-continued
(5-3)
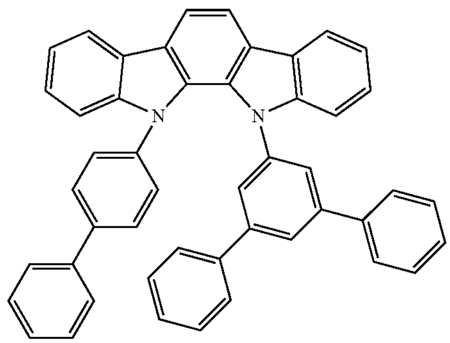
(5-4)
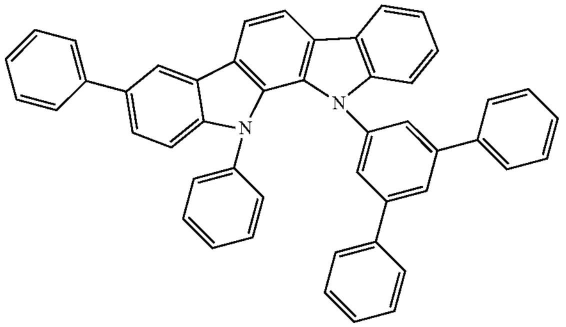
(5-5)
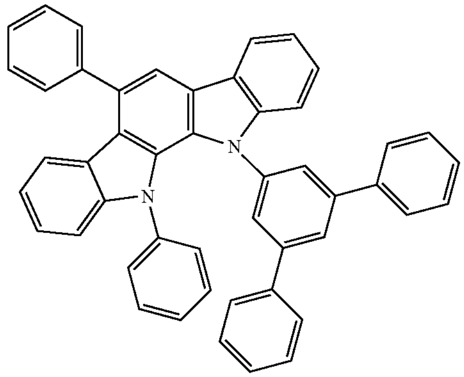
(5-6)
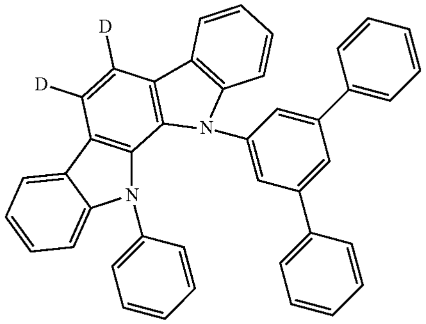
(5-7)
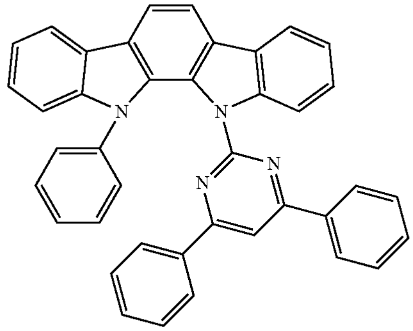
(5-8)
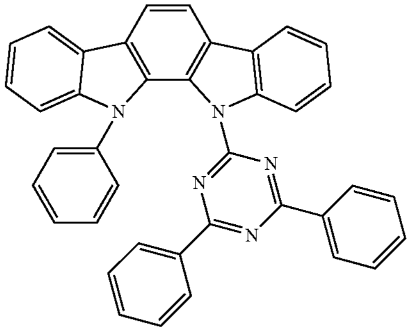
(5-9)
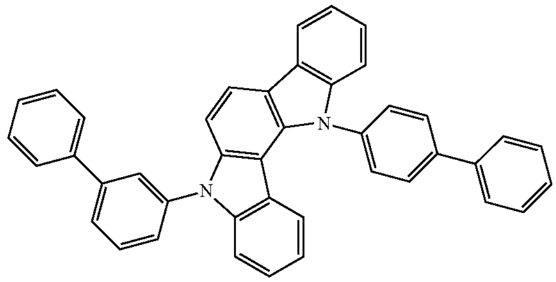
(5-10)
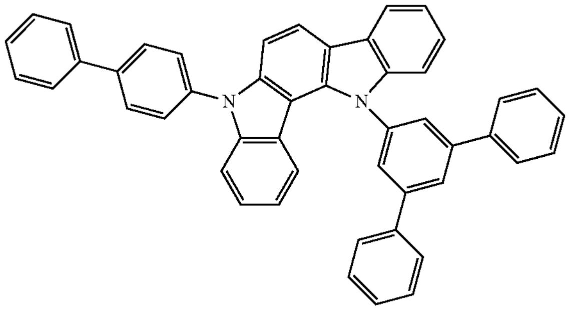

-continued
(5-11)
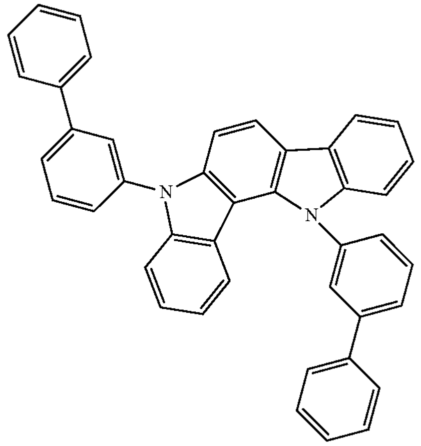
(5-12)
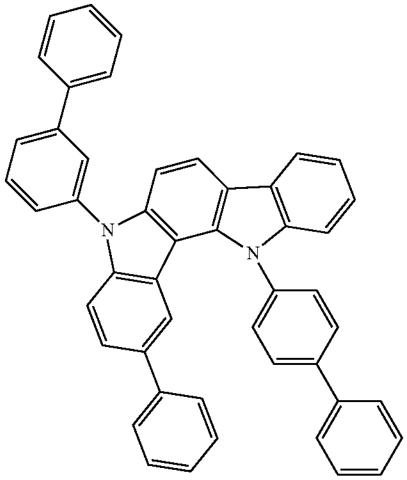
(5-13)
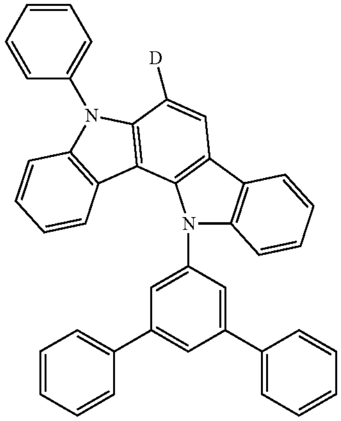
(5-14)
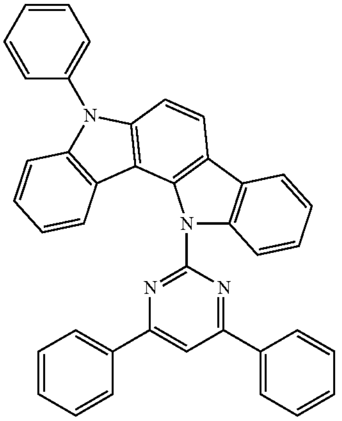
(5-15)
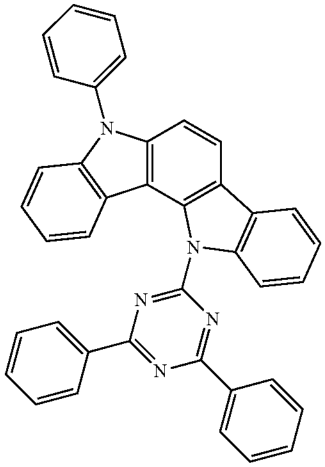
(5-16)
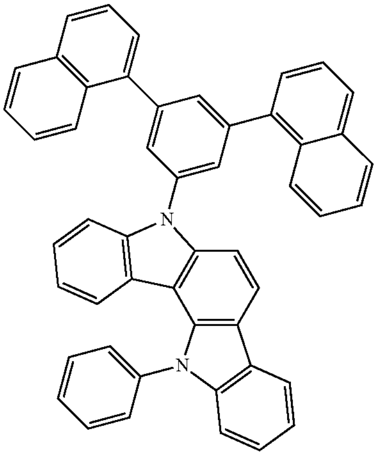

-continued
(5-17)
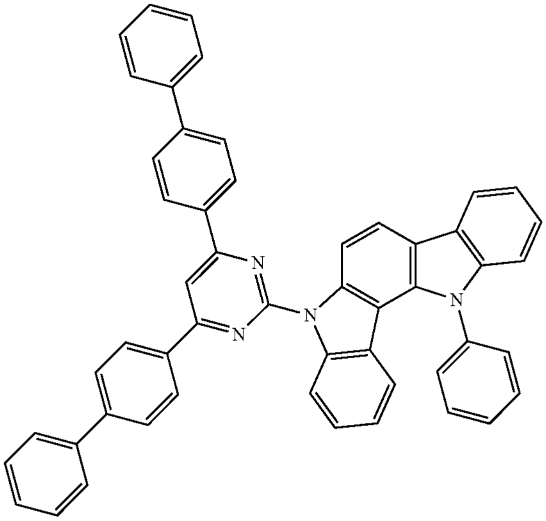
(5-18)
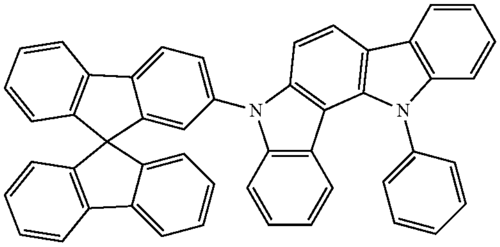
(5-19)
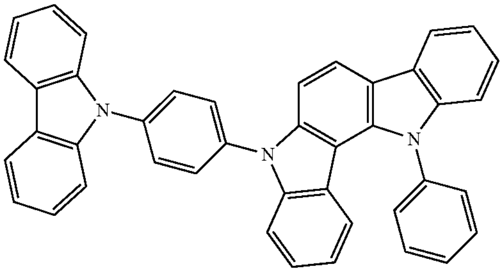
(5-20)
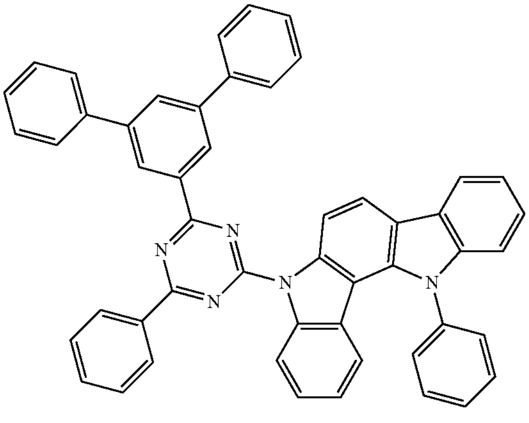
(5-21)
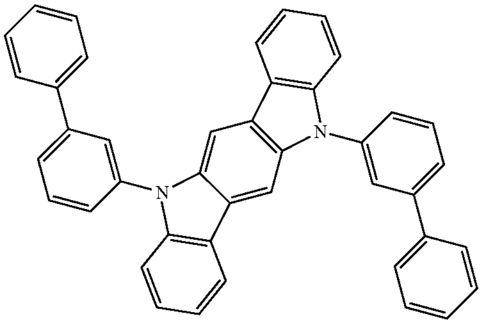
(5-22)
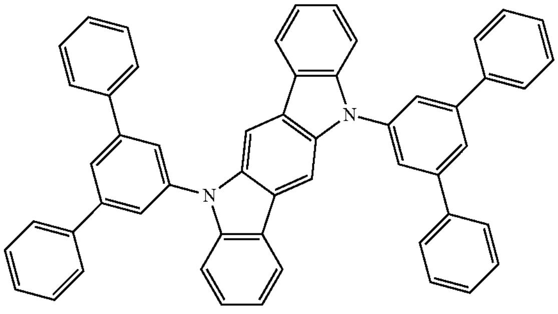

-continued
(5-23)
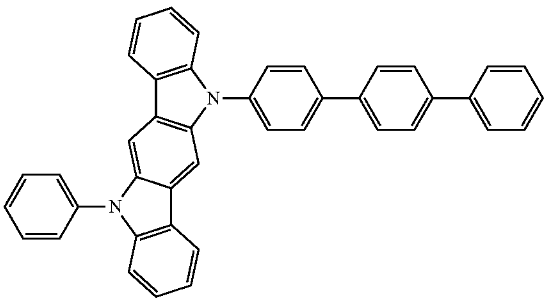
(5-24)
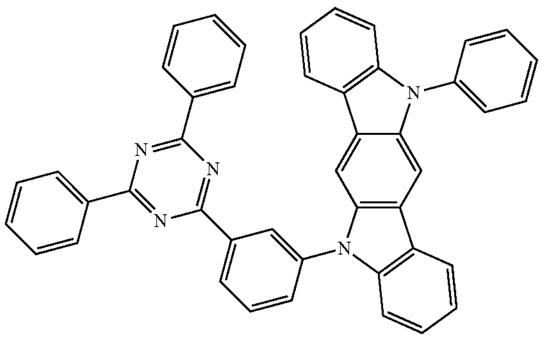
(5-25)
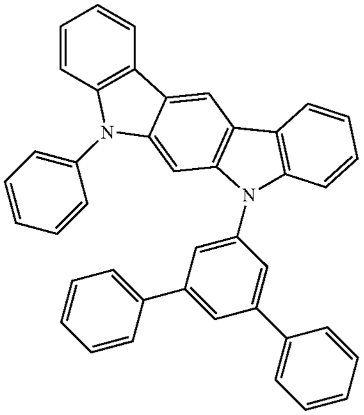
(5-26)
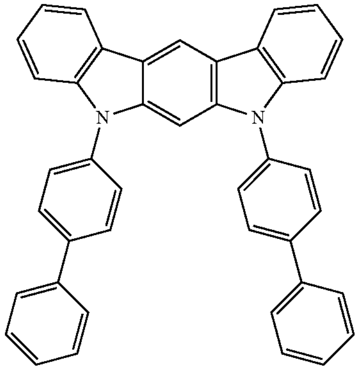
(5-27)
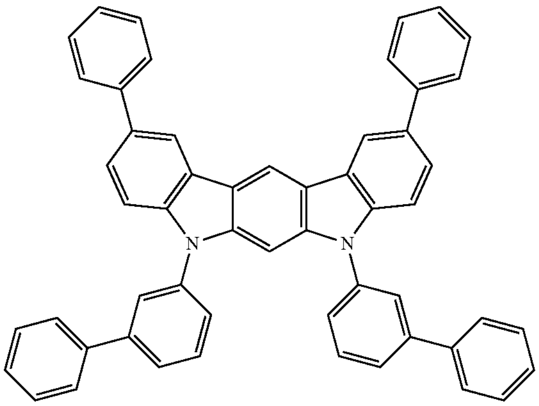
(5-28)
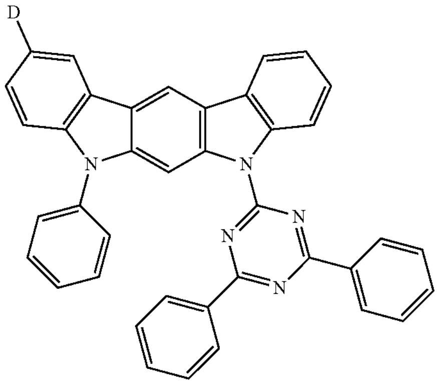
(5-29)
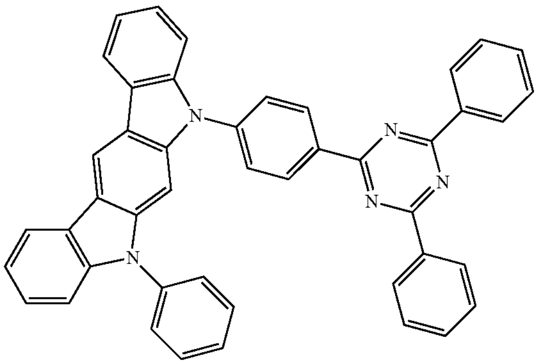
(5-30)
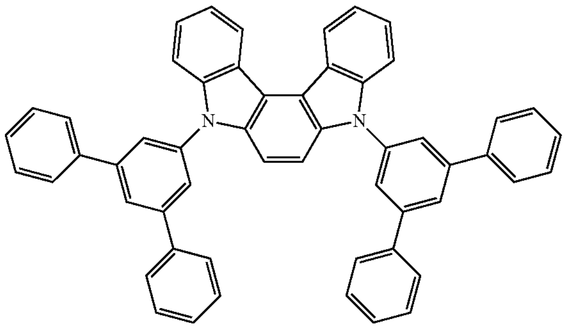

-continued
(5-31)
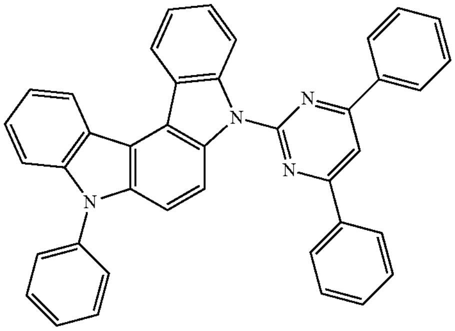
(5-32)
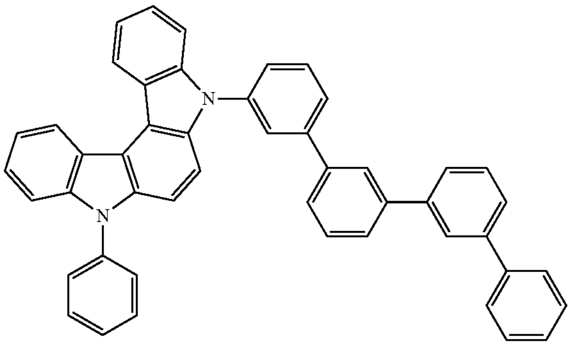
(5-33)
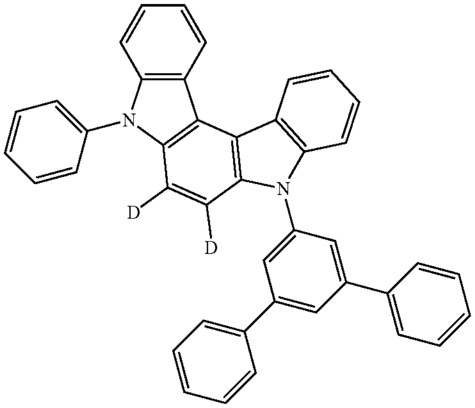
(5-34)
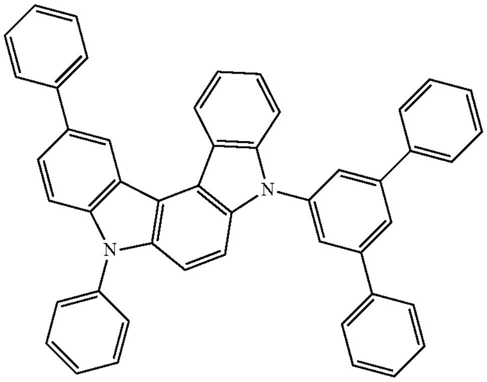
(5-35)
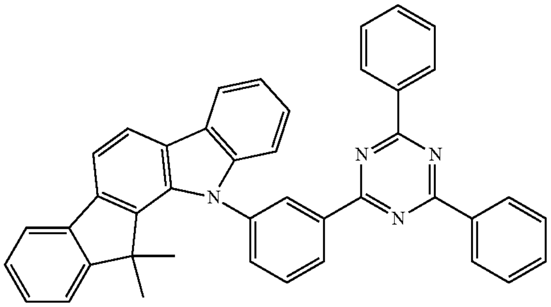
(5-36)
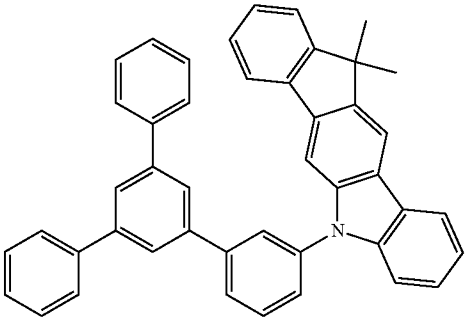
(5-37)
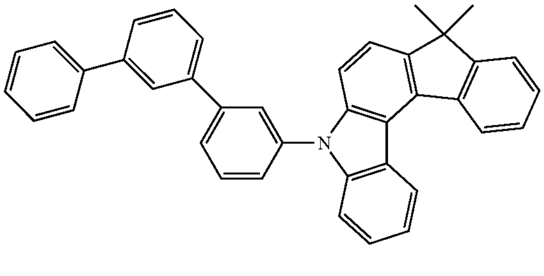
(5-38)
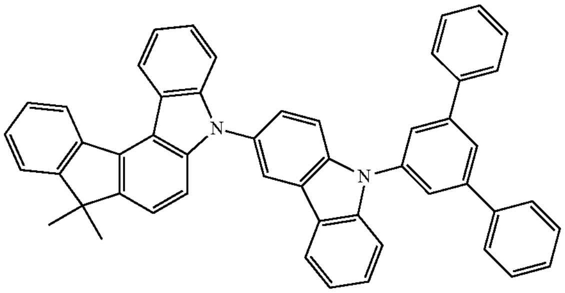

-continued
(5-39)
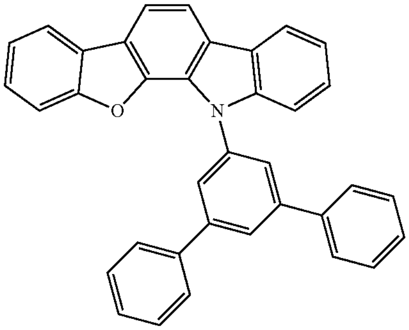
(5-40)
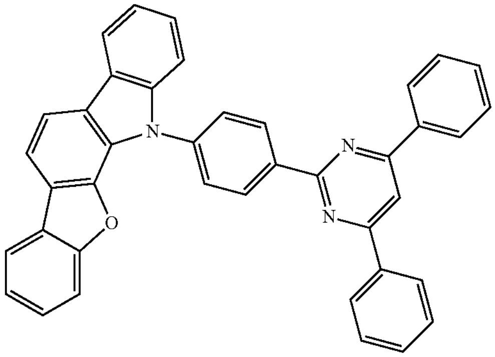
(5-41)
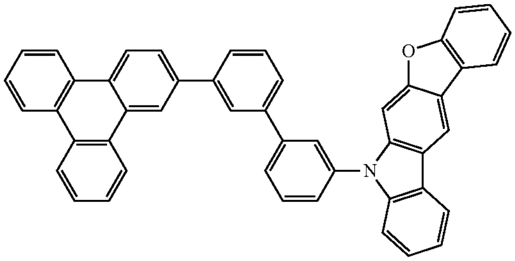
(5-42)
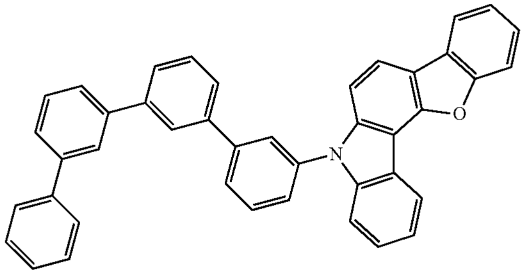
(5-43)
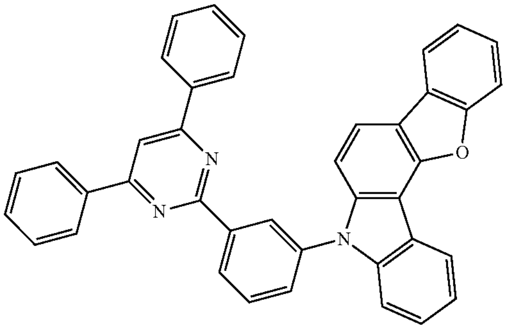
(5-44)
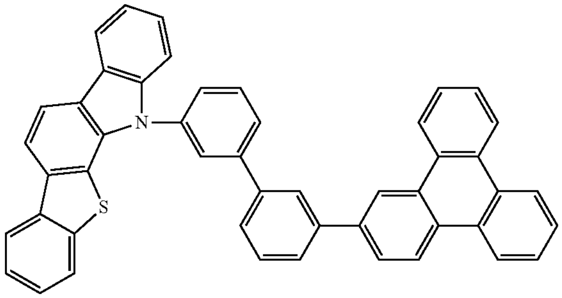
(5-45)
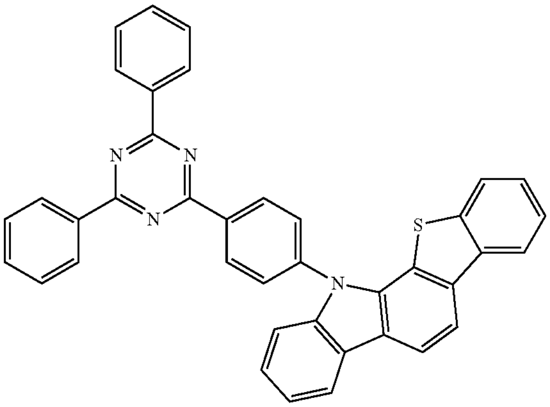
(5-46)
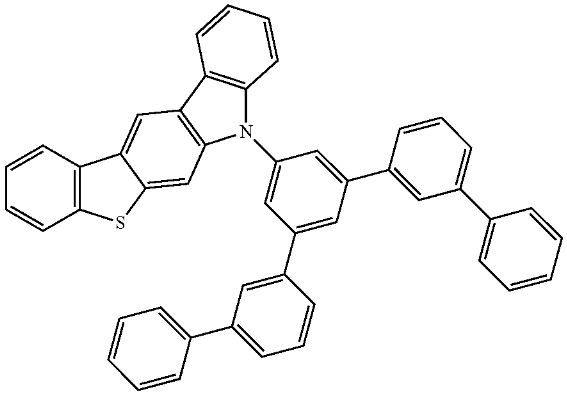

-continued
(5-47)
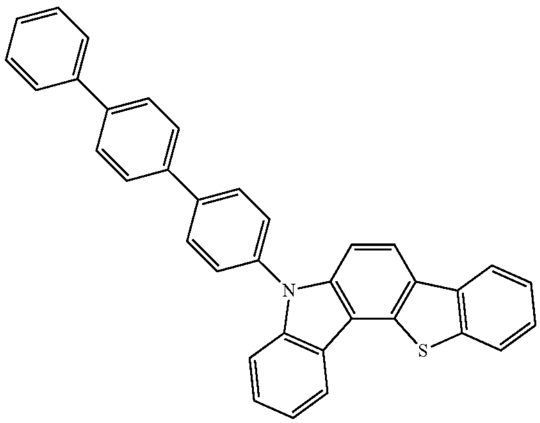
(5-48)
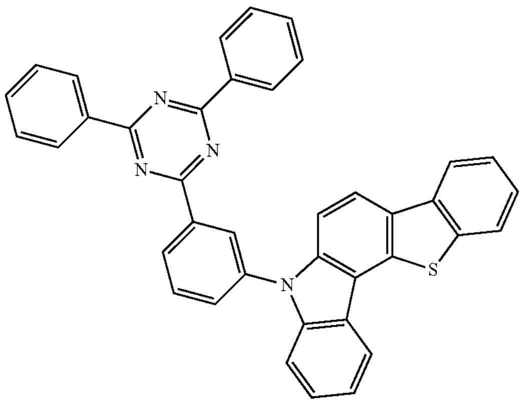
(5-49)
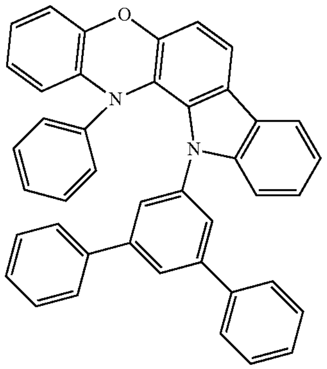
(5-50)
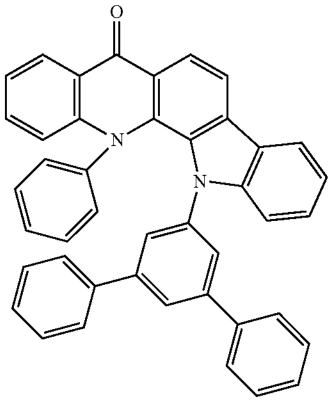
(5-51)
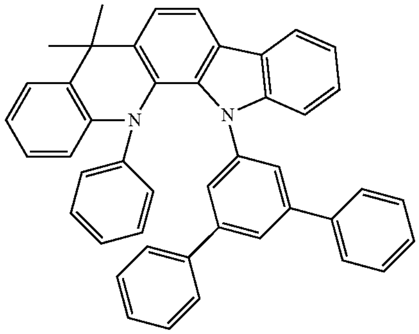
(5-52)
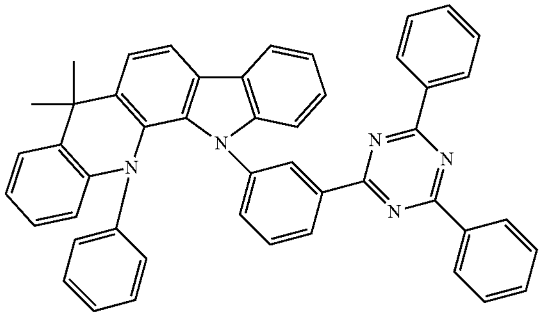
(5-53)
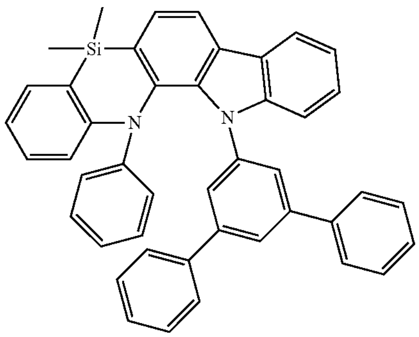
(5-54)
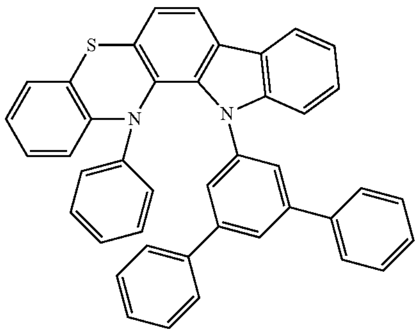

-continued
(5-55)
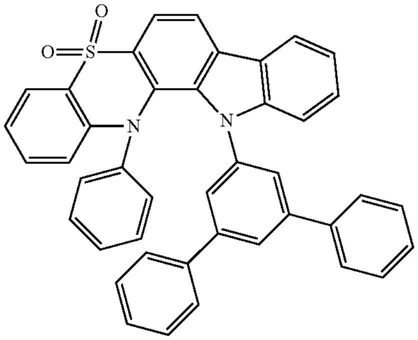
(5-56)
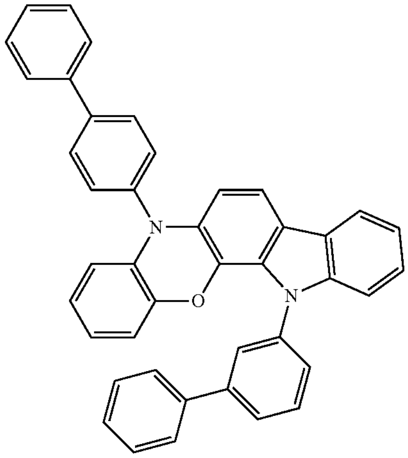
(5-57)
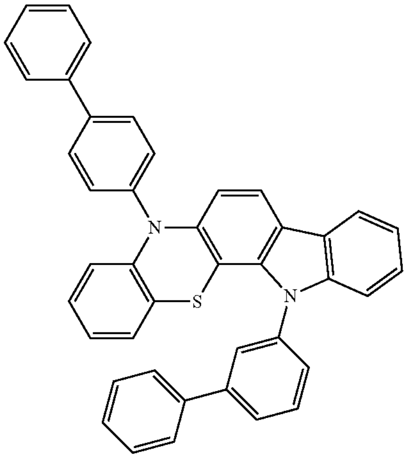
(5-58)
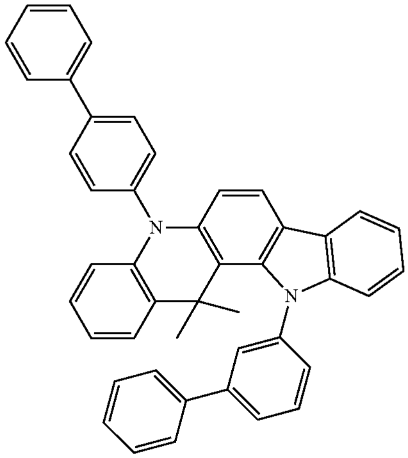
(5-59)
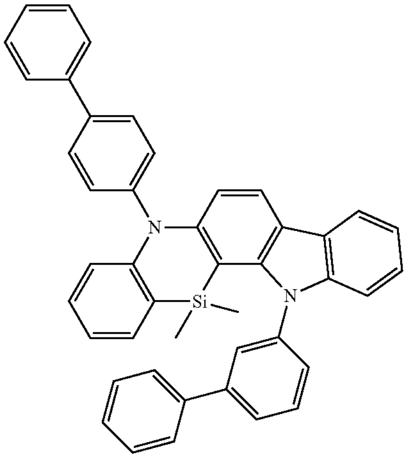
(5-60)
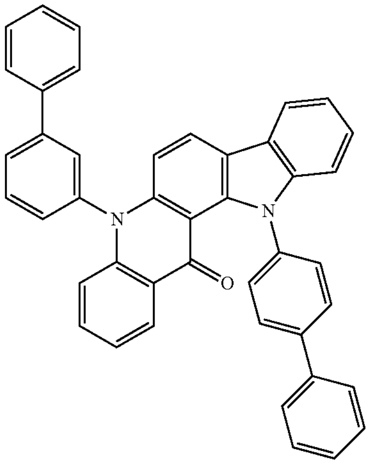

-continued
(5-61)
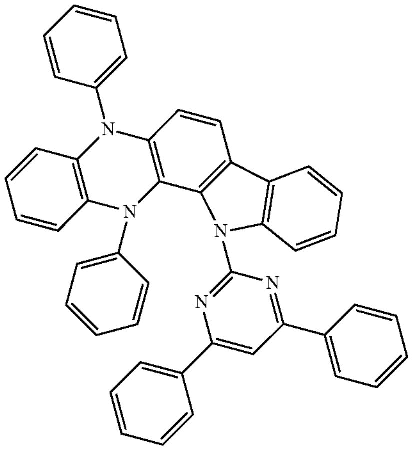
(5-62)
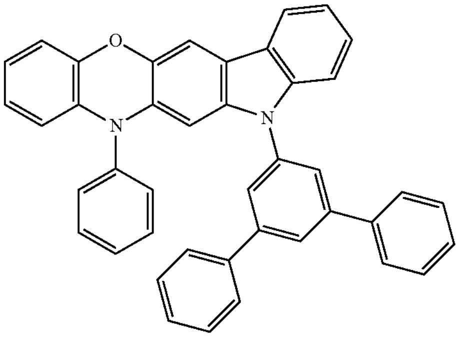
(5-63)
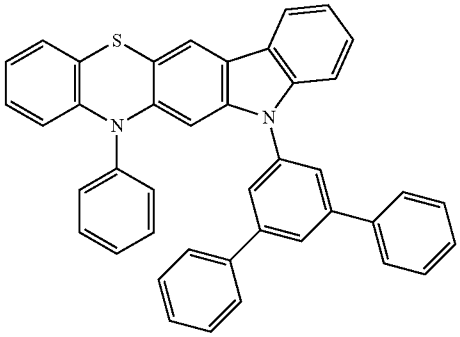
(5-64)
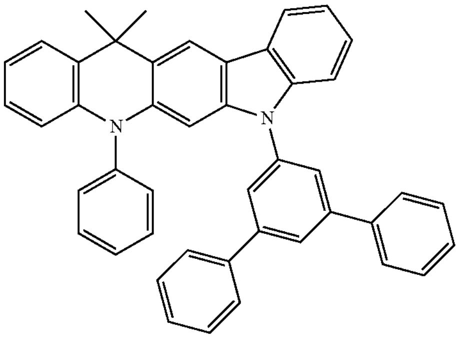
(5-65)
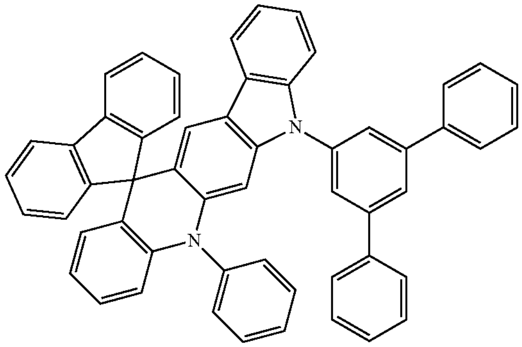
(5-66)
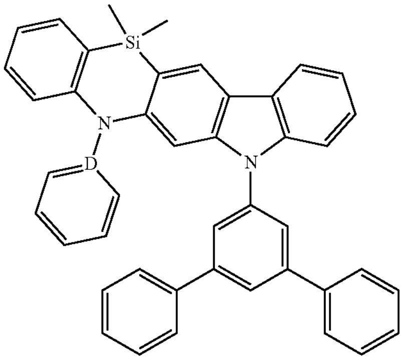
(5-67)
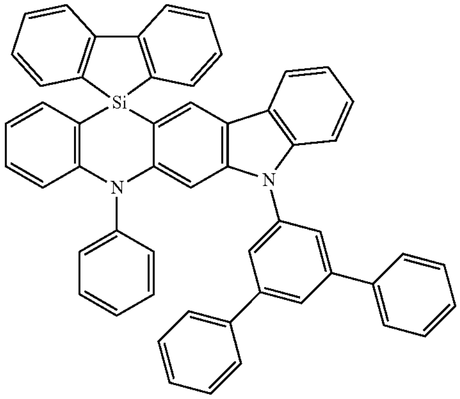
(5-68)
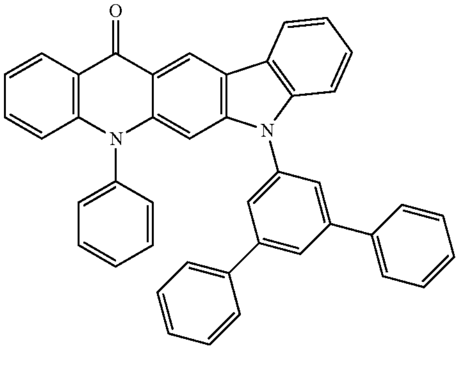

-continued
(5-69)
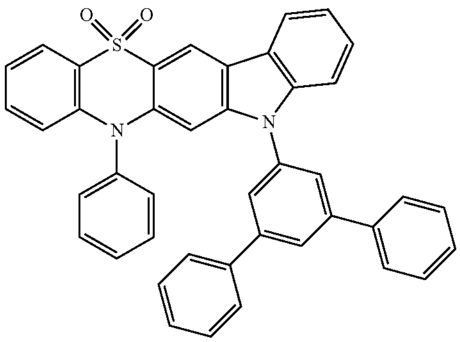
(5-70)
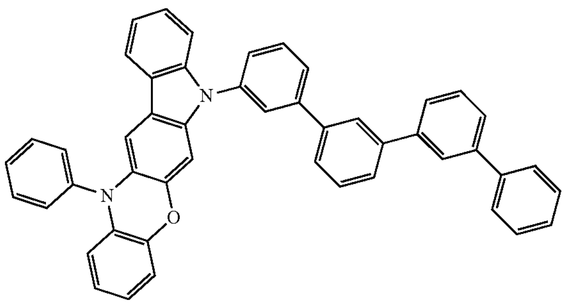
(5-71)
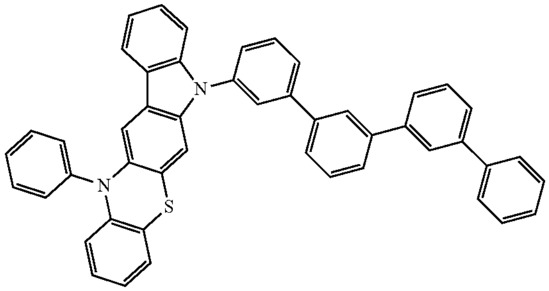
(5-72)
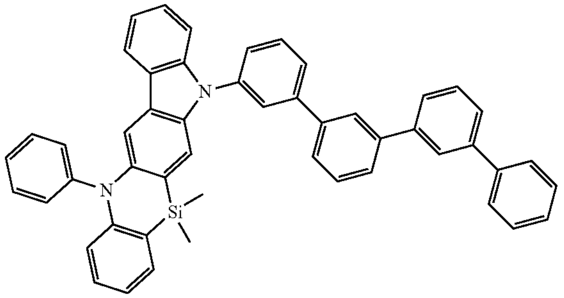
(5-73)
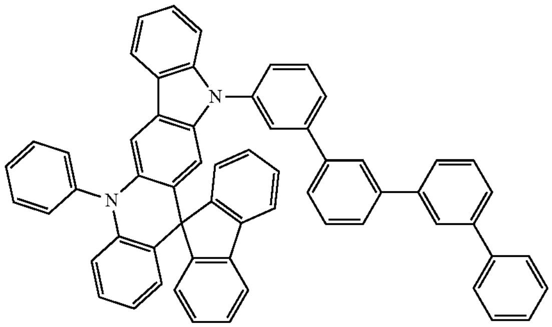
(5-74)
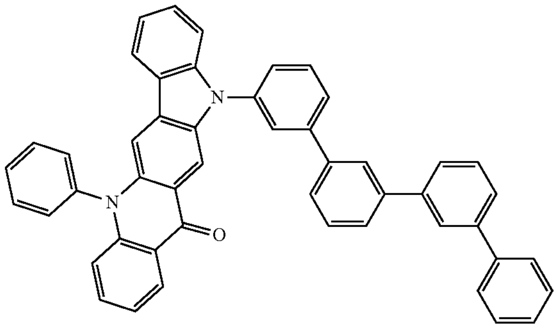
(5-75)
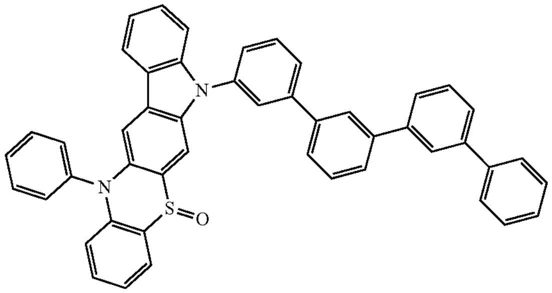
(5-76)
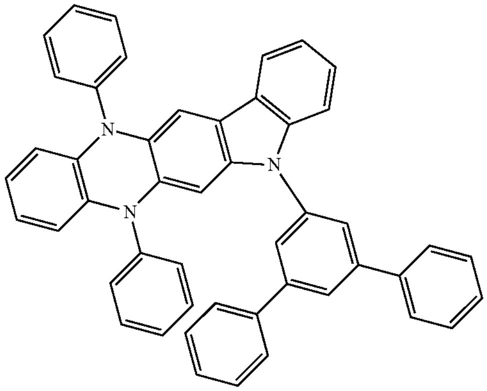

-continued
(5-77)
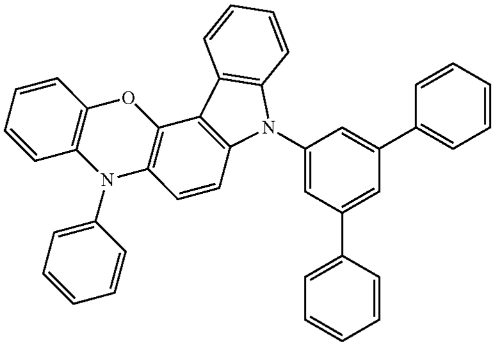
(5-78)
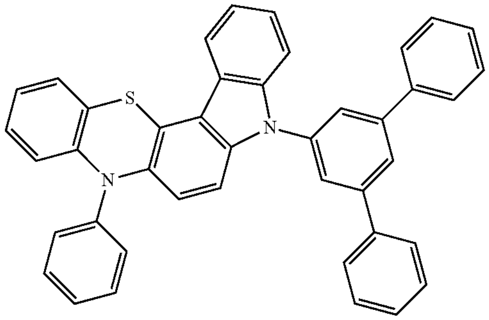
(5-79)
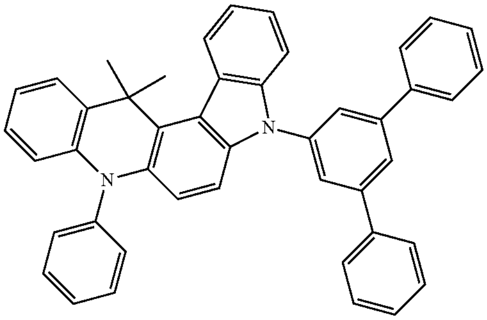
(5-80)
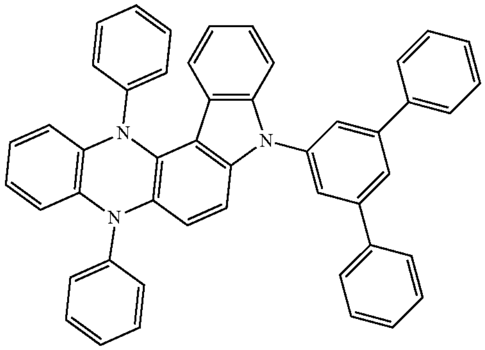
(5-81)
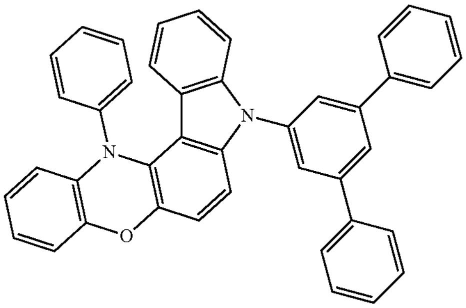
(5-82)
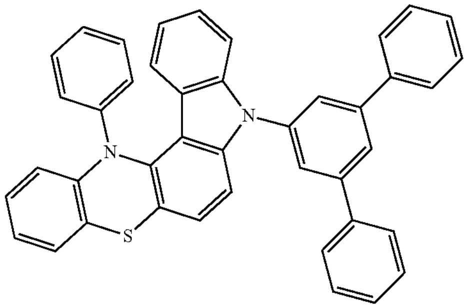
(5-83)
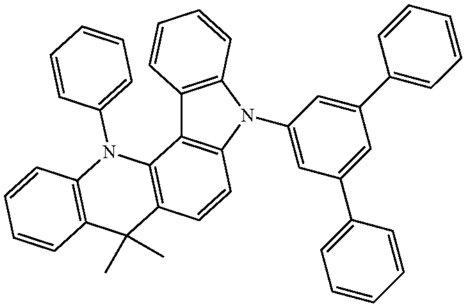
(5-84)
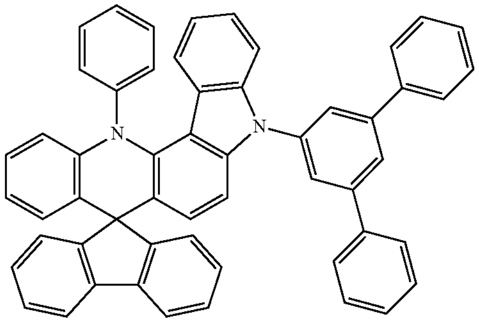

-continued
(5-85)
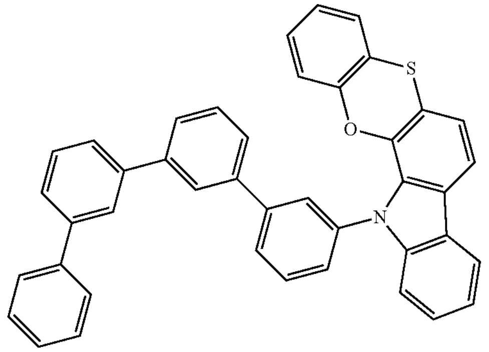
(5-86)
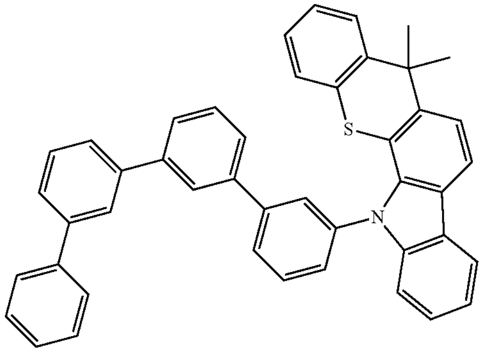
(5-87)
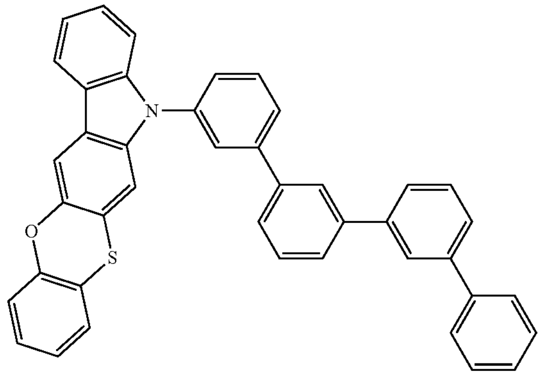
(5-88)
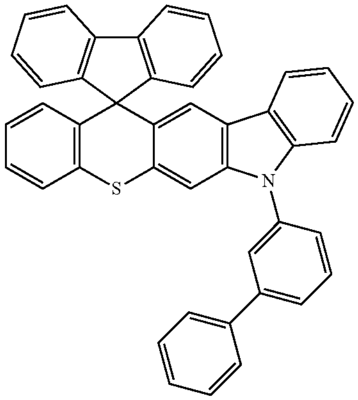
(5-89)
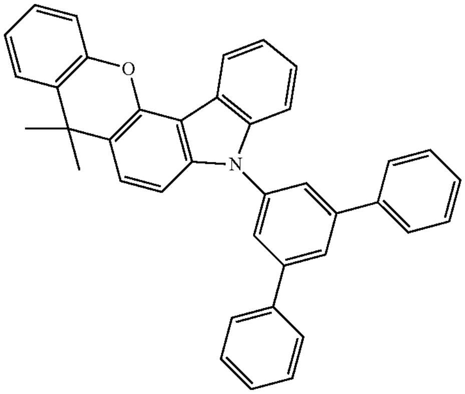
(5-90)
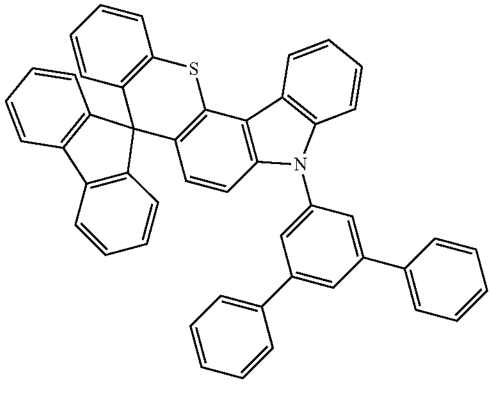
(5-91)
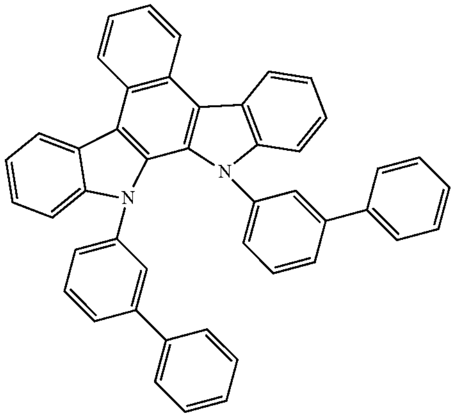
(5-92)
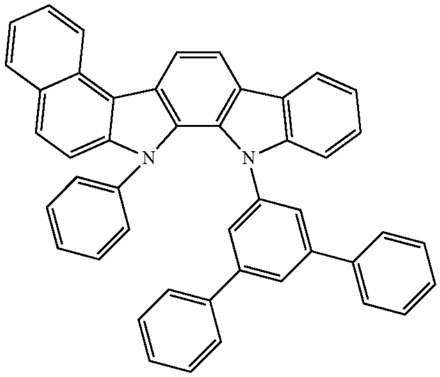

-continued
(5-93)
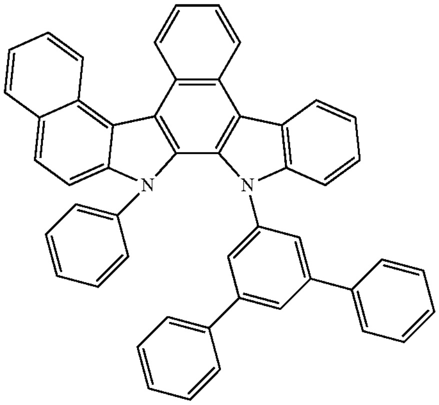
(5-94)
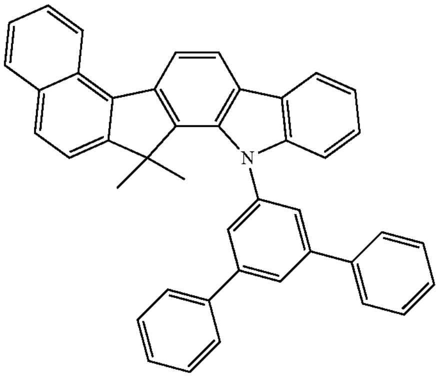
(5-95)
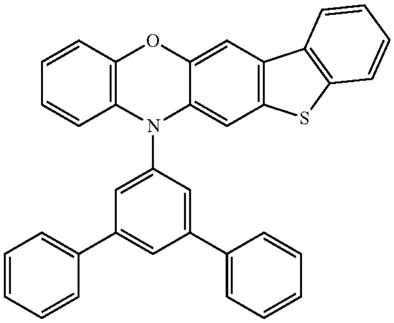
(5-96)
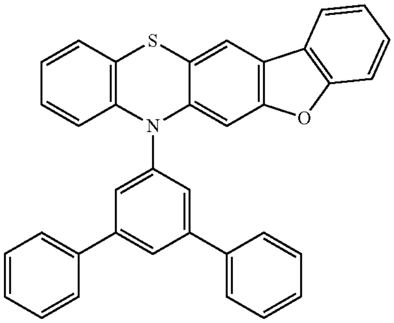
(5-97)
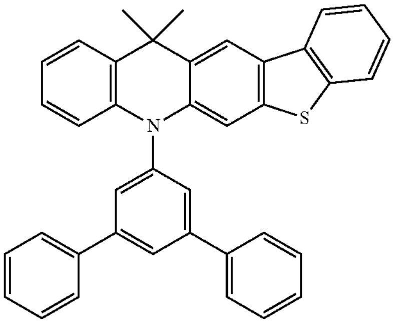
(5-98)
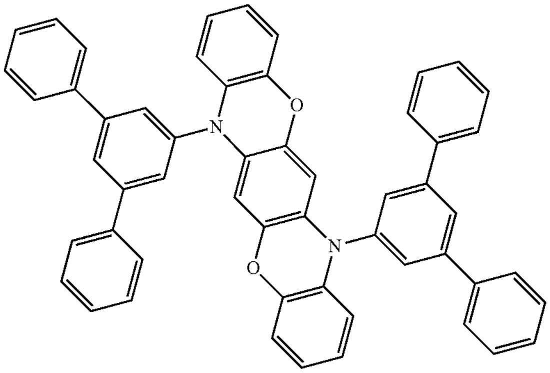
(5-99)
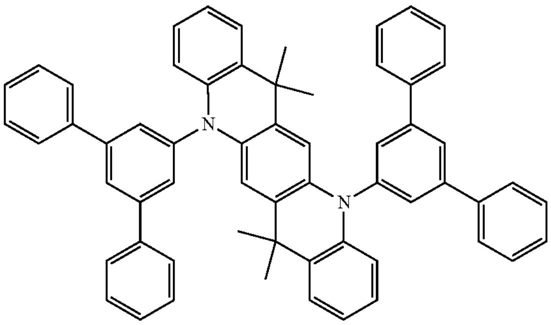
(5-100)
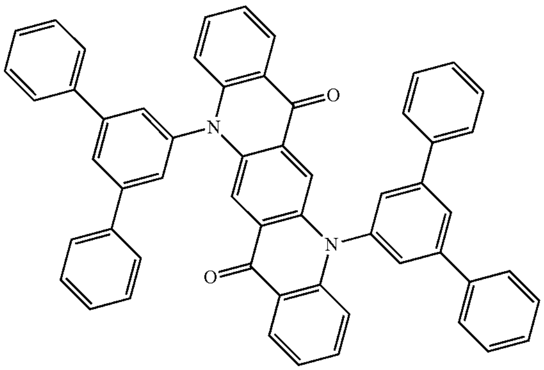

-continued
(5-101)
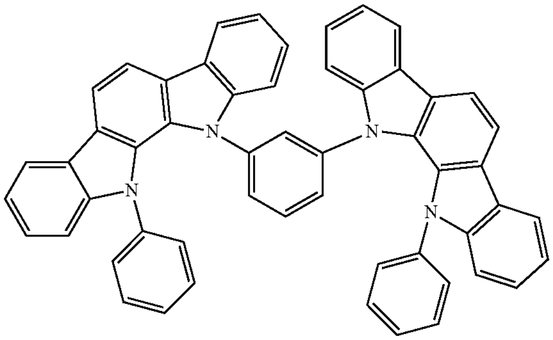
(5-102)
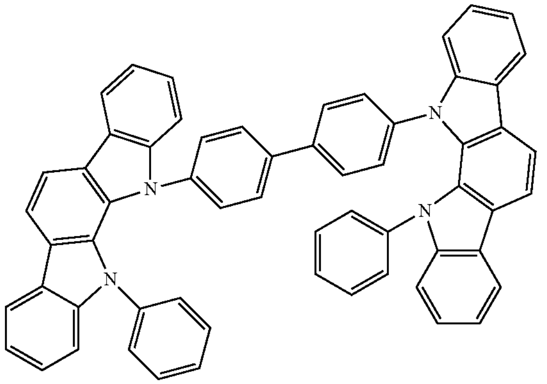
(5-103)
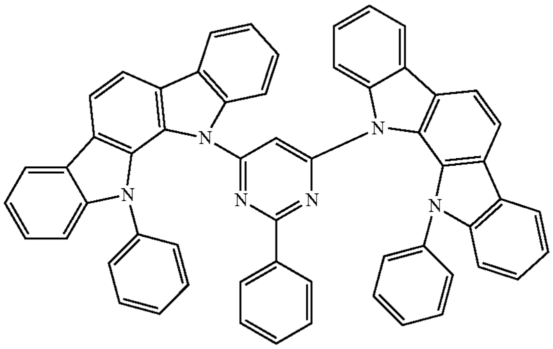
(5-104)
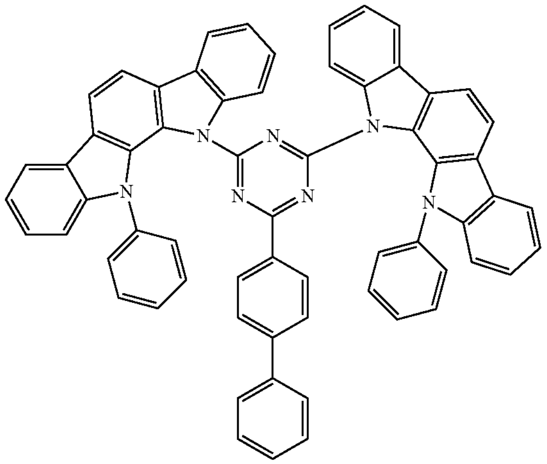
(5-105)
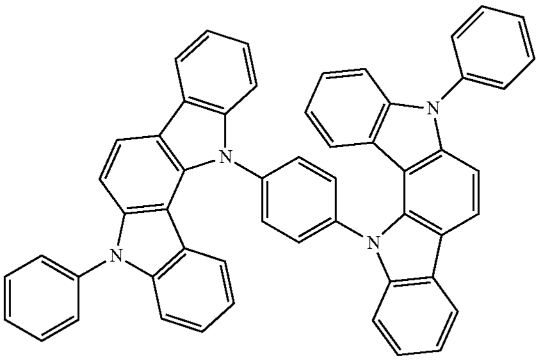
(5-107)
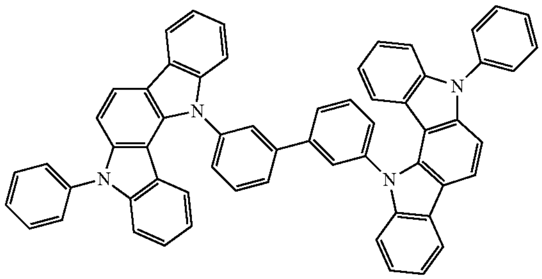

-continued
(5-108)
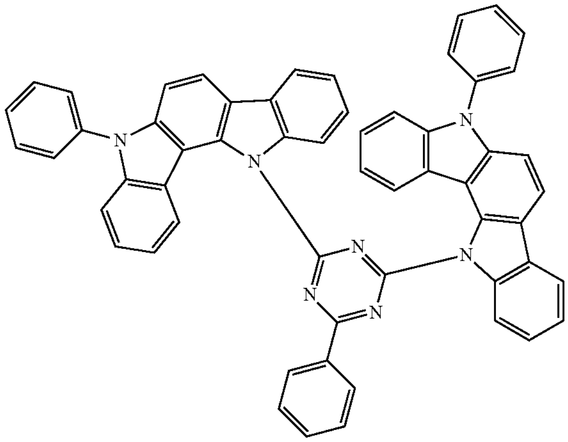
(5-109)
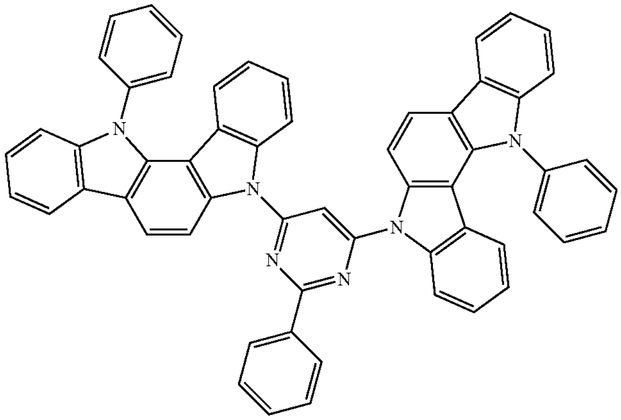
(5-110)
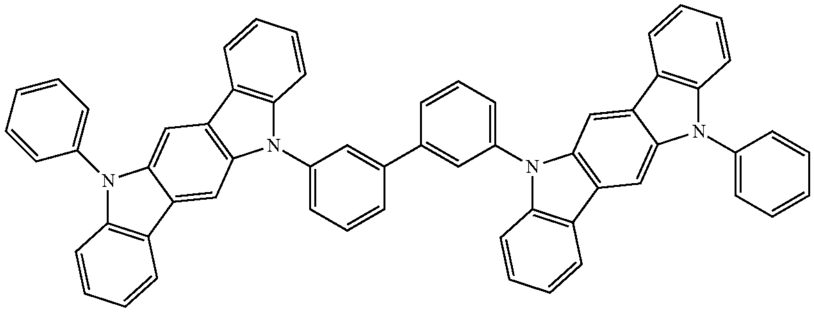
(5-111)
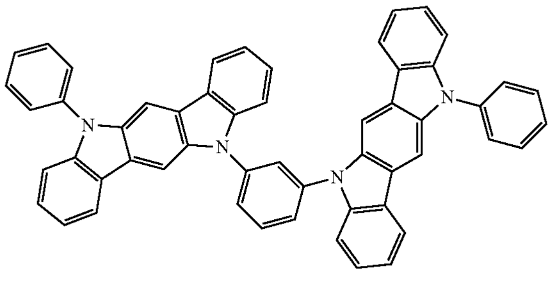
(5-112)
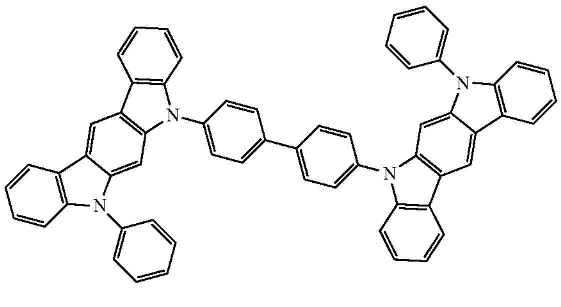

-continued
(5-113)
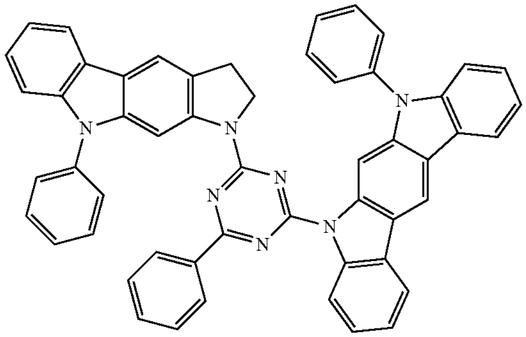
(5-114)
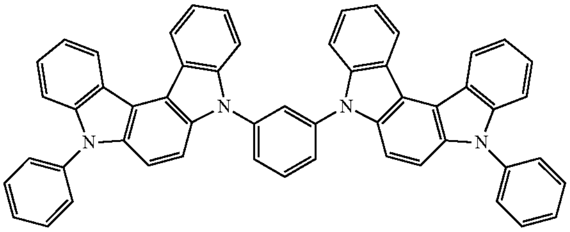
(5-115)
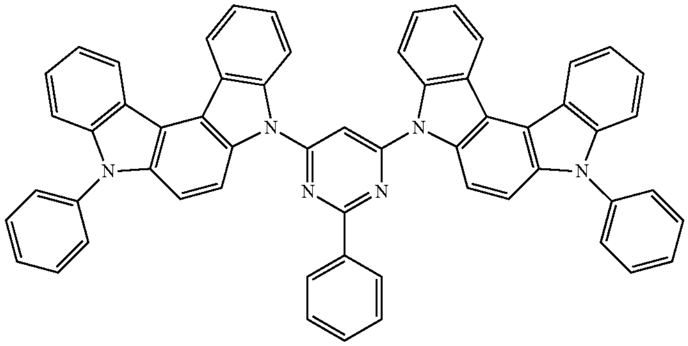
(5-116)
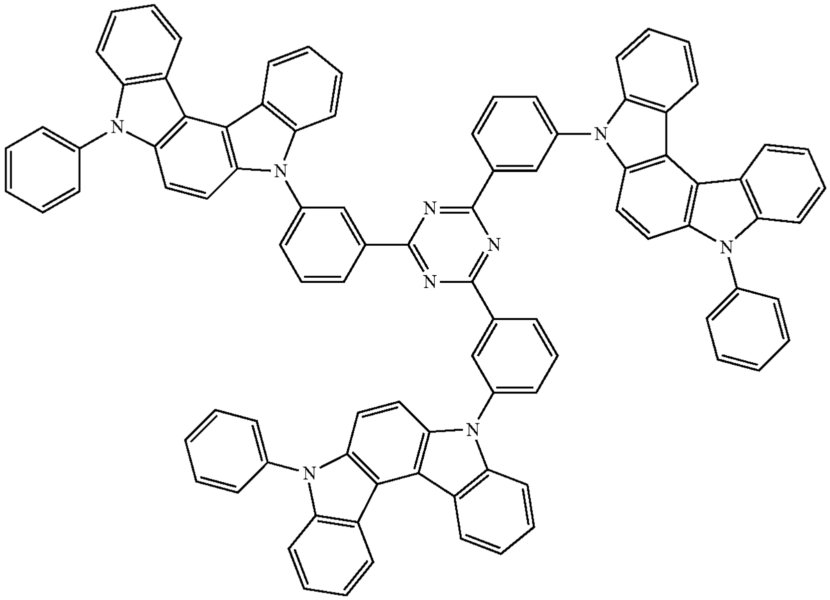

-continued
(5-117)
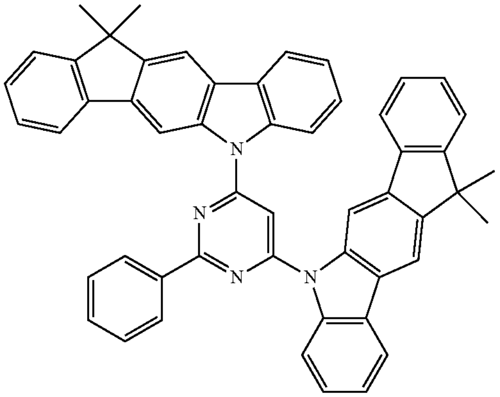
(5-118)
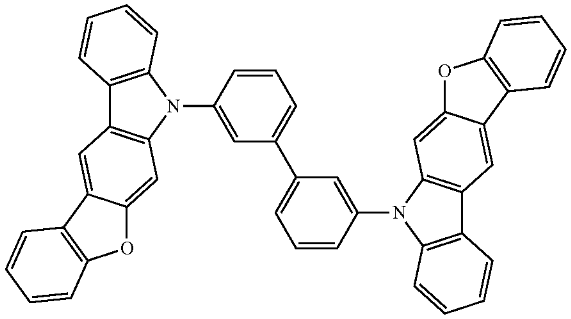
(5-119)
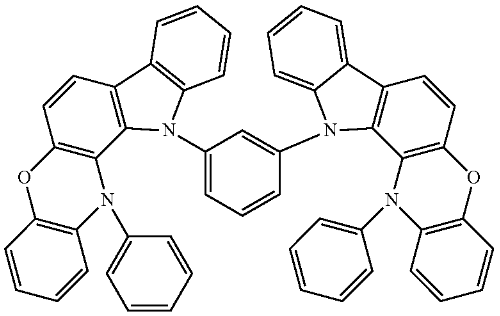
(5-120)
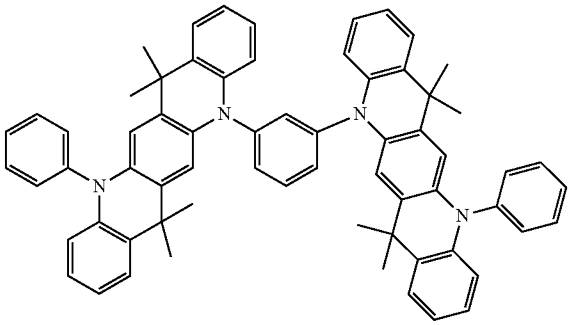
Further, the organic compounds represented by general formula (6) are all selected from the following structural formulas:
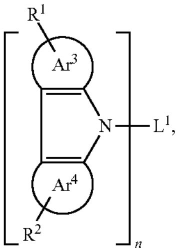
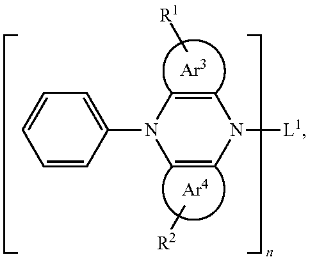
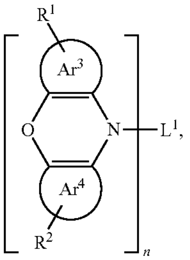
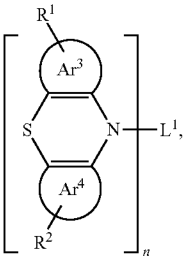
-continued
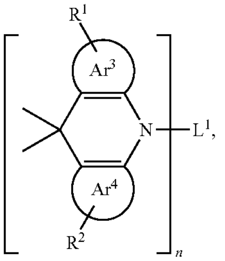
and
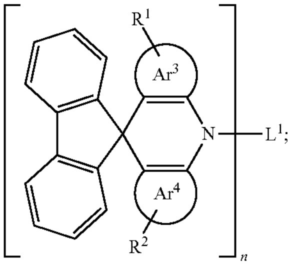
wherein $Ar^3$, $Ar^4$, $R^1$, $R^2$, $L^1$ and n are defined as above.
Even further, the compounds represented by general formula (6) are:

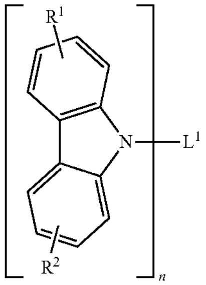
wherein $R^1$, $R^2$, $L^1$ and n are defined as above.
Specifically, the organic compounds represented by general formula (6) are each selected from the following structural formulas:
(6-1)
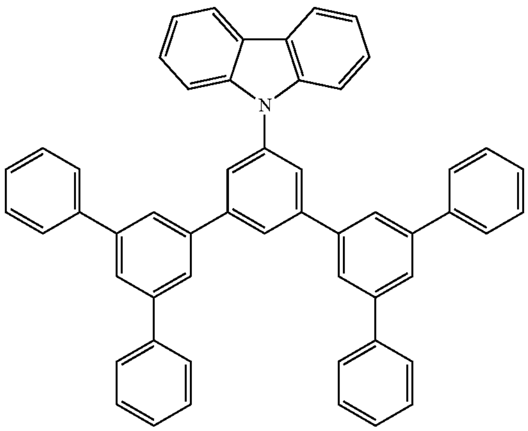
(6-2)
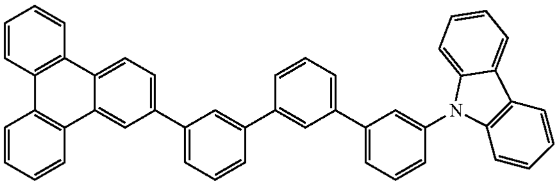
(6-3)
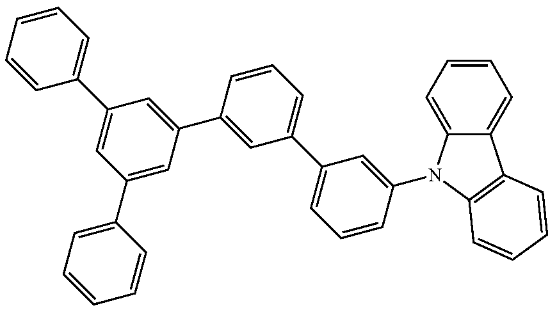
(6-4)
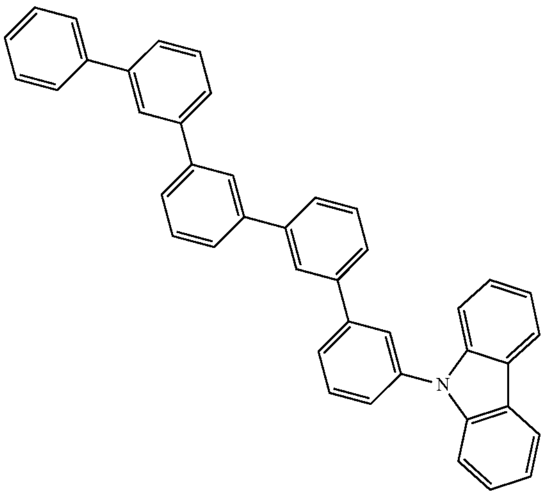

-continued
(6-5)
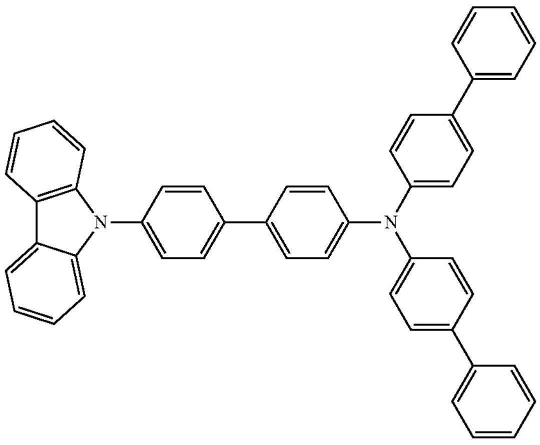
(6-6)
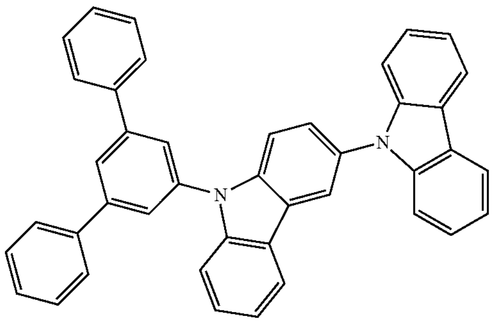
(6-7)
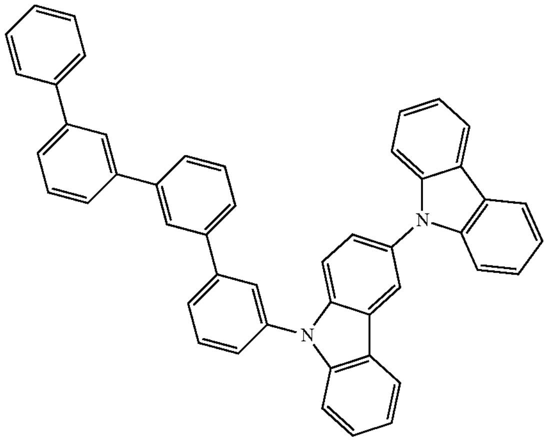
(6-8)
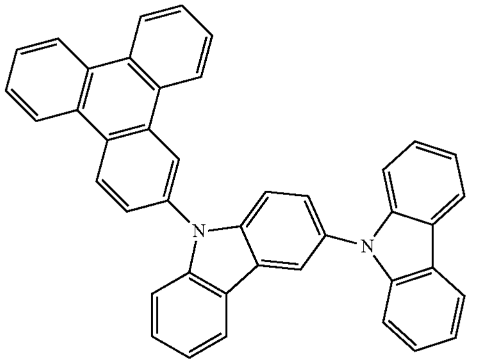
(6-9)
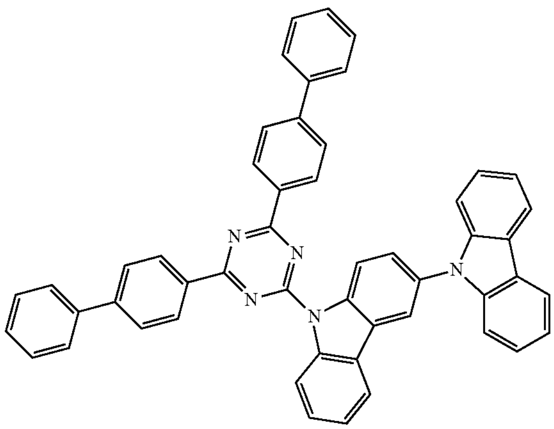
(6-10)
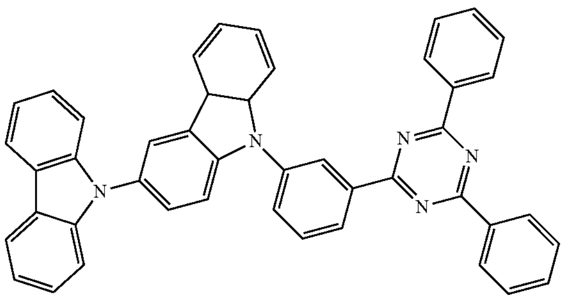

-continued
(6-11)
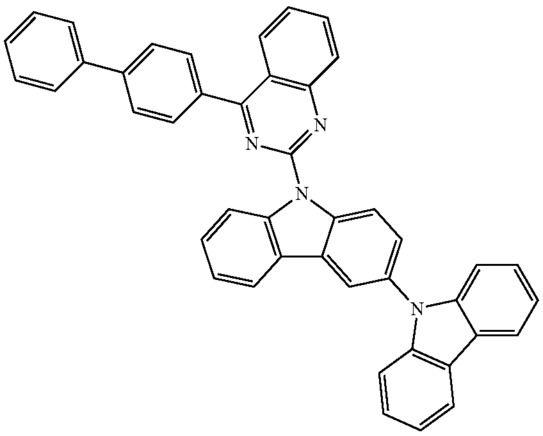
(6-12)
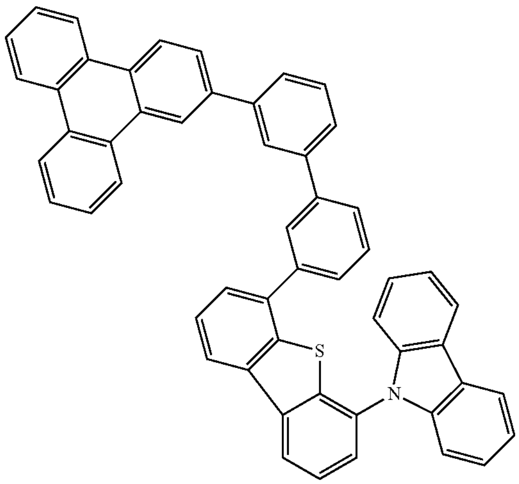
(6-13)
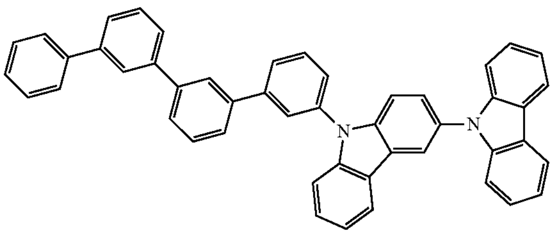
(6-14)
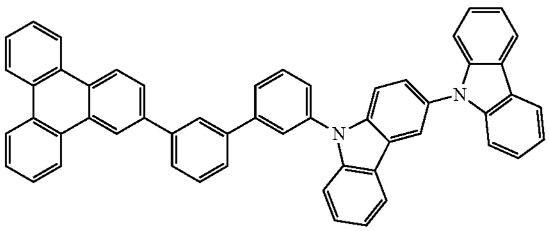
(6-15)
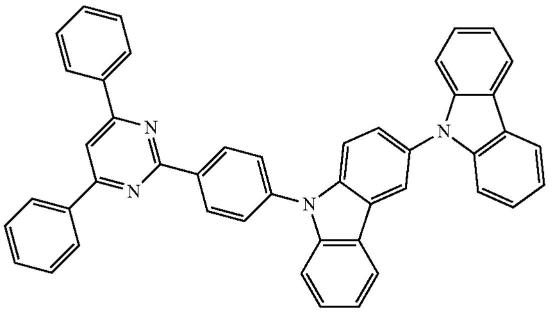
(6-16)
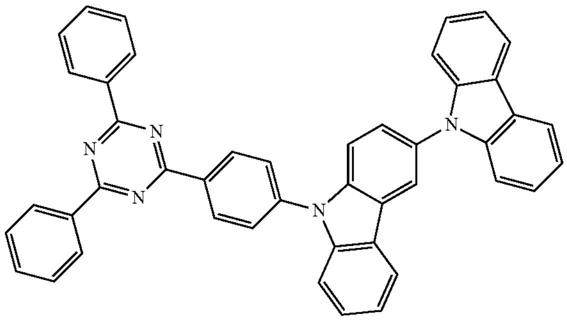
(6-17)
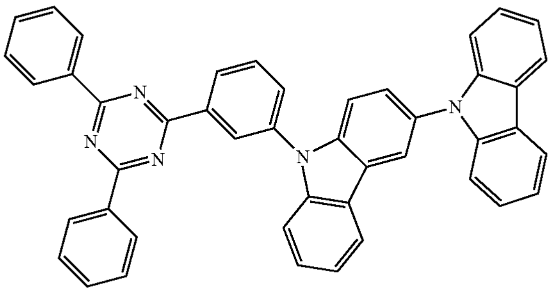
(6-18)
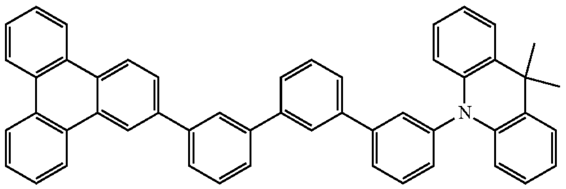
(6-19)
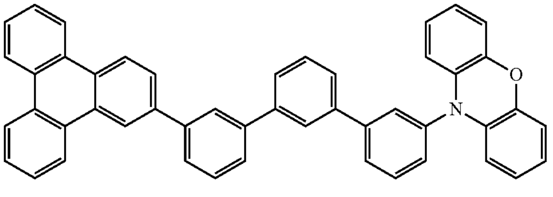
(6-20)
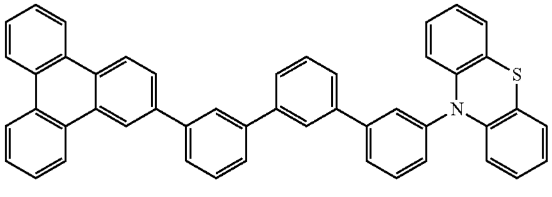

-continued
(6-21)
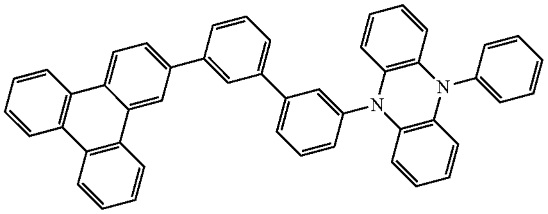
(6-22)
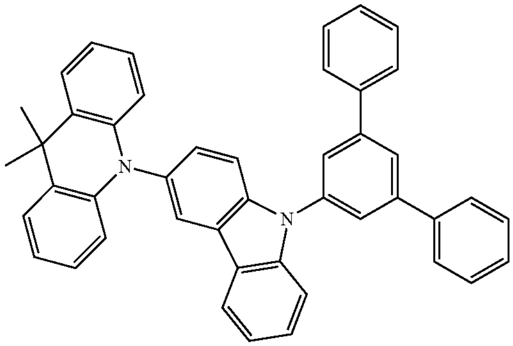
(6-23)
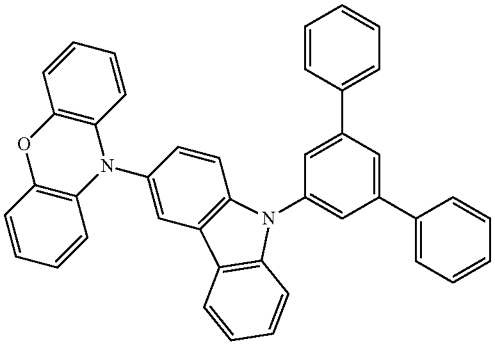
(6-24)
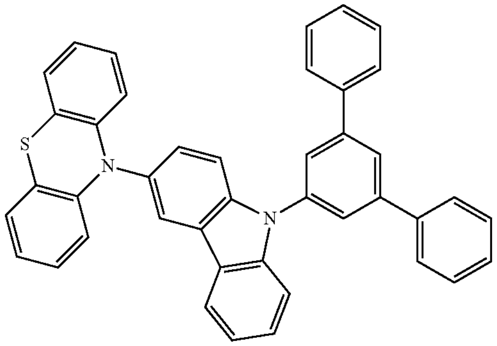
(6-25)
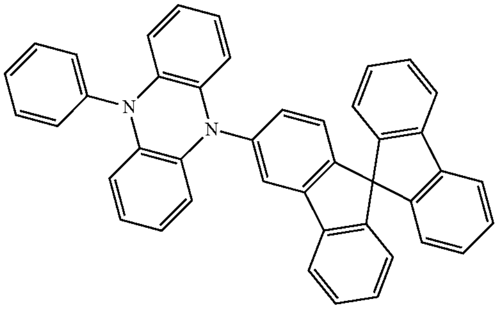
(6-26)
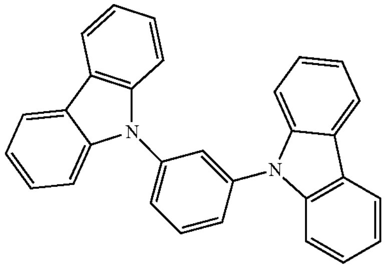
(6-27)
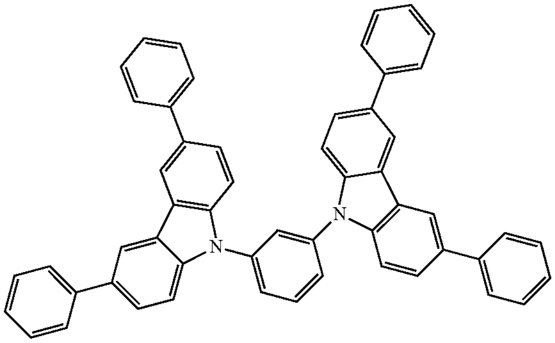
(6-28)
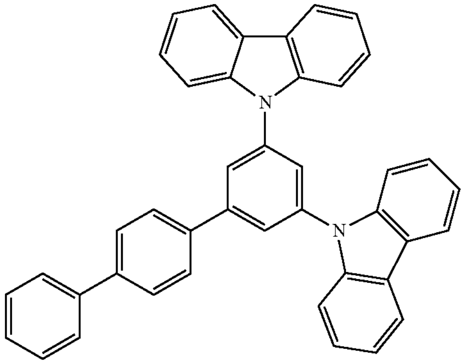

-continued
(6-29)
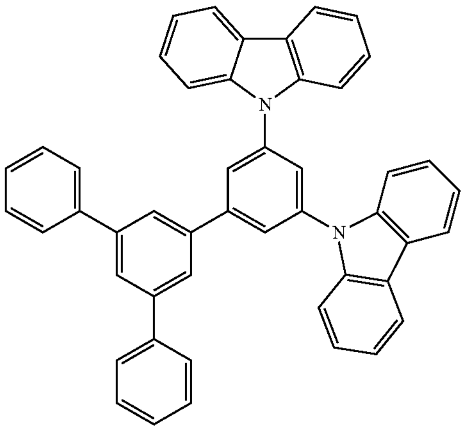
(6-30)
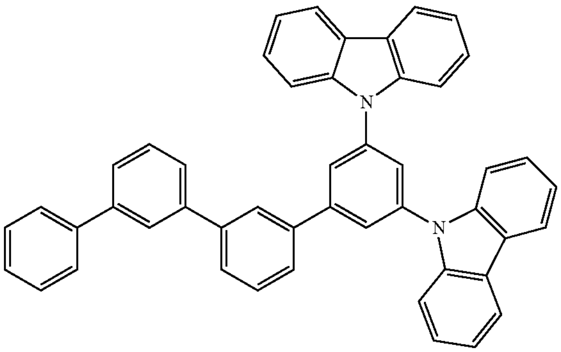
(6-31)
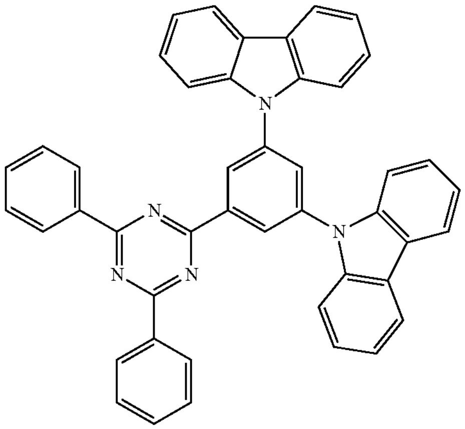
(6-32)
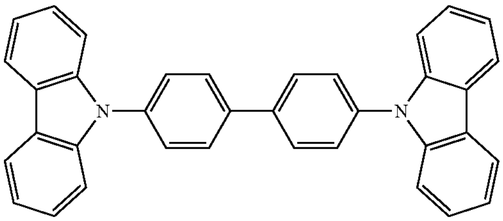
(6-33)
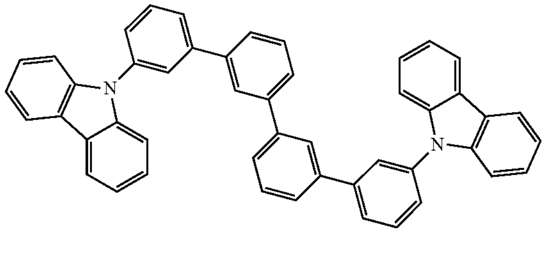
(6-34)
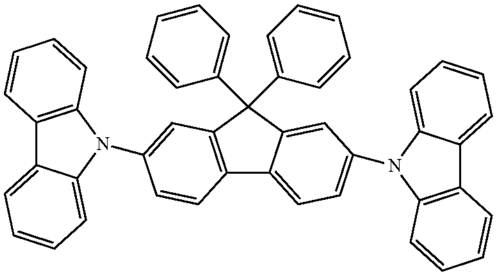
(6-35)
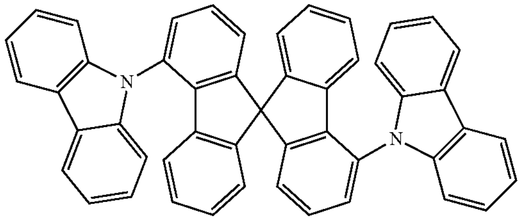
(6-36)
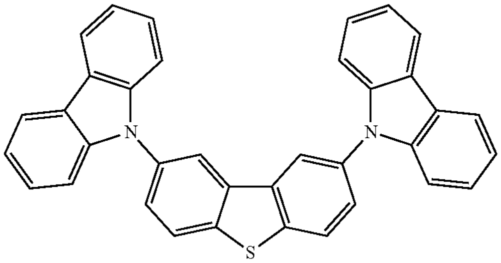

-continued
(6-37)
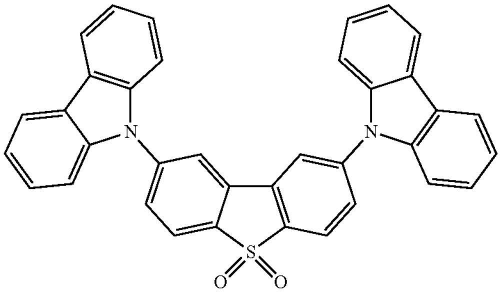
(6-38)
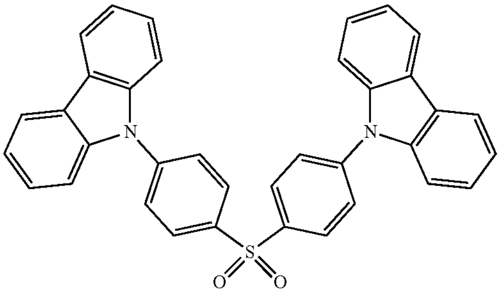
(6-39)
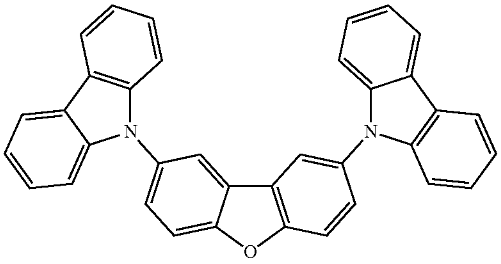
(6-40)
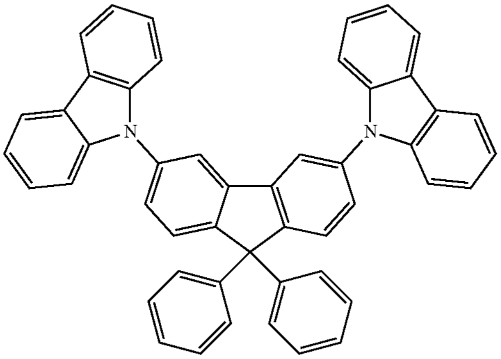
(6-41)
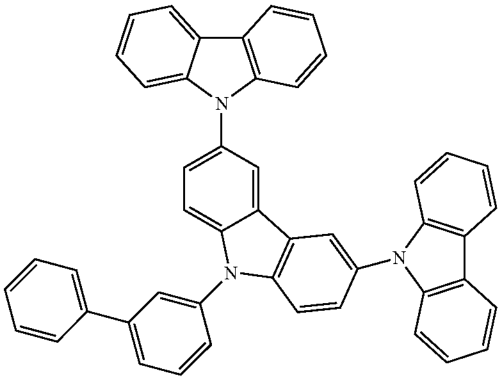
(6-42)
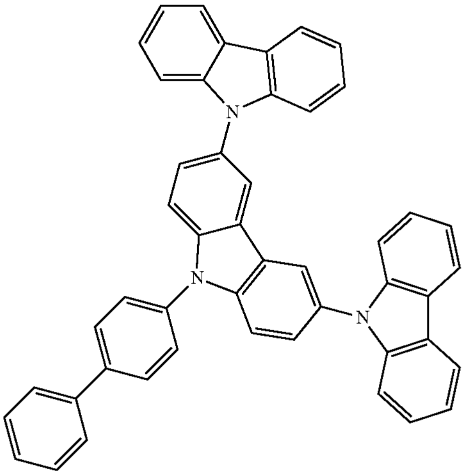

-continued
(6-43)
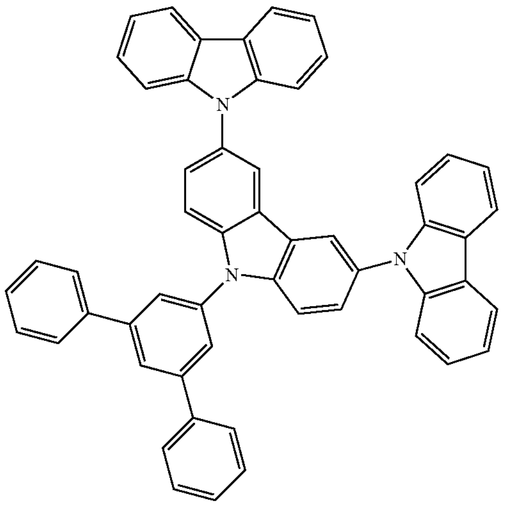
(6-44)
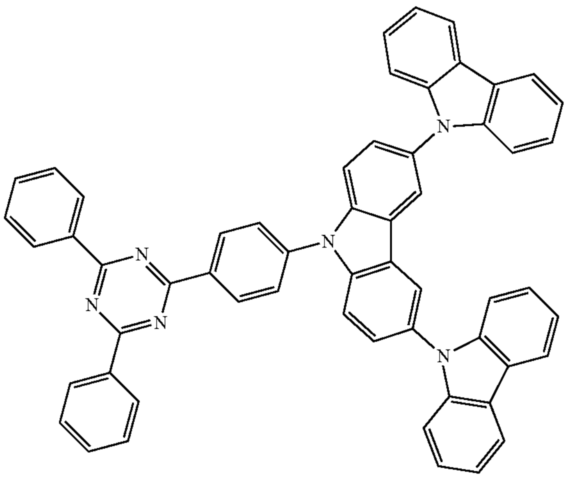
(6-45)
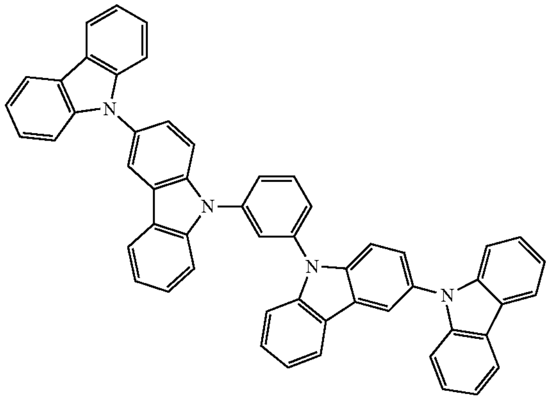
(6-46)
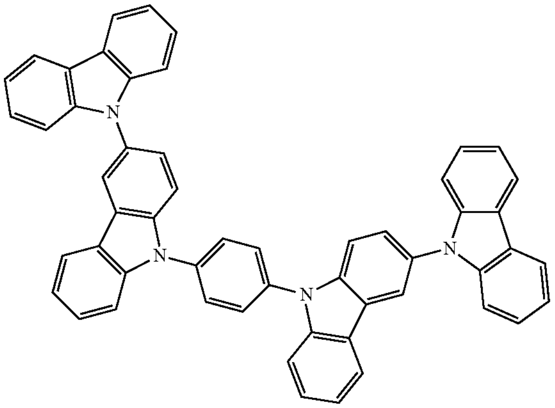
(6-47)
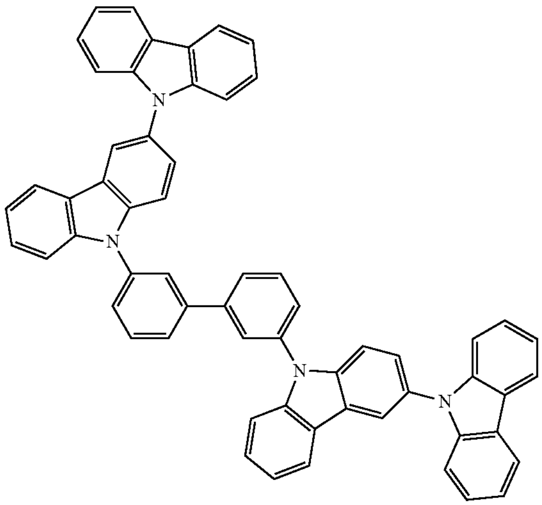
(6-48)
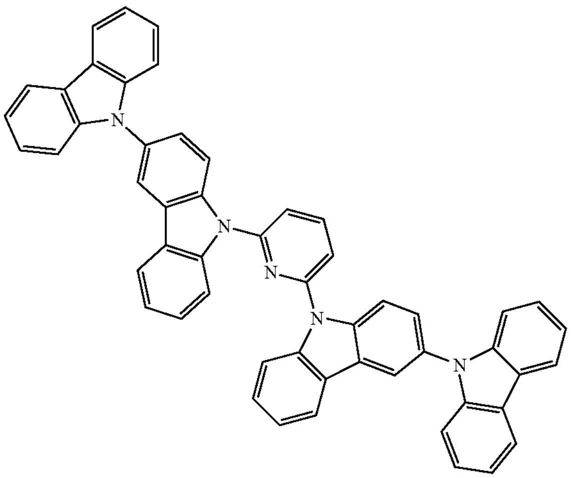

-continued
(6-49)
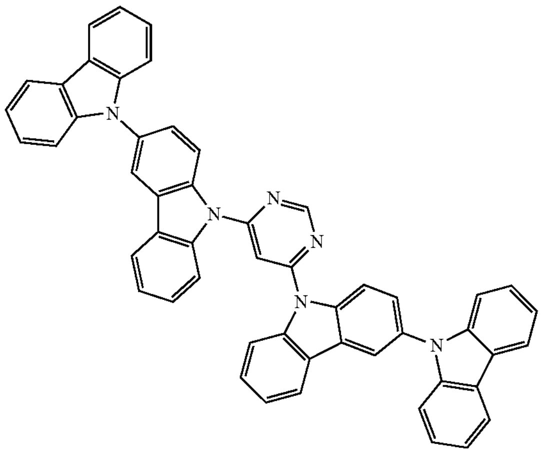
(6-50)
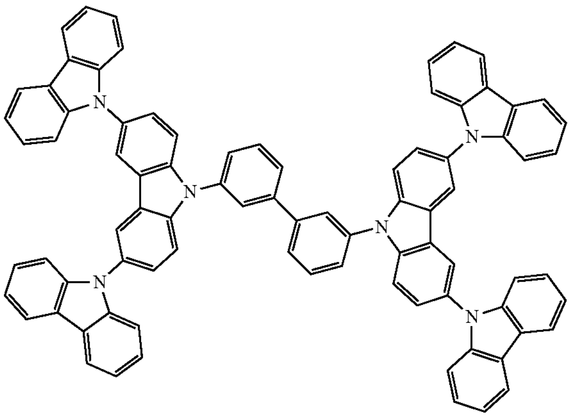
(6-51)
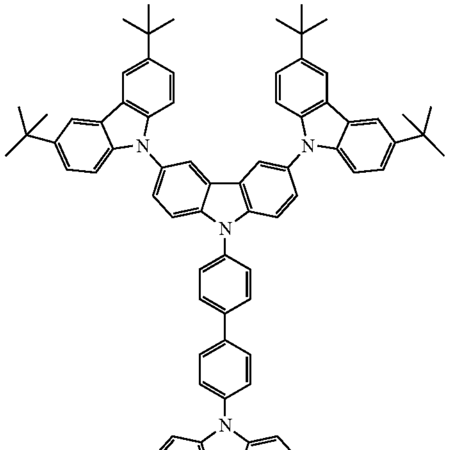
(6-52)
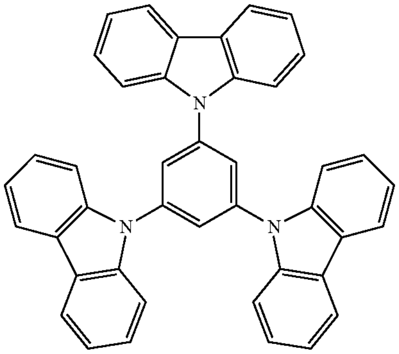

-continued
(6-53)
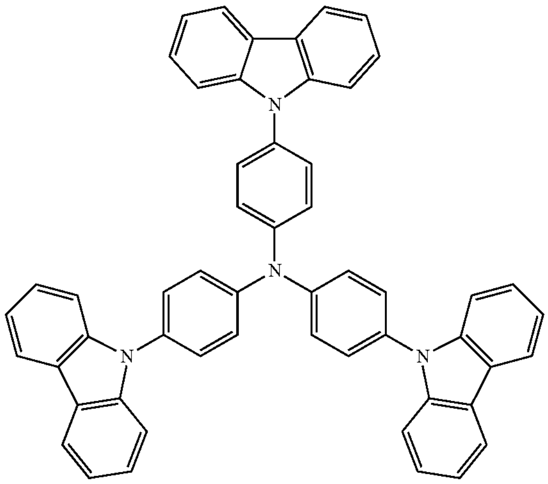
(6-54)
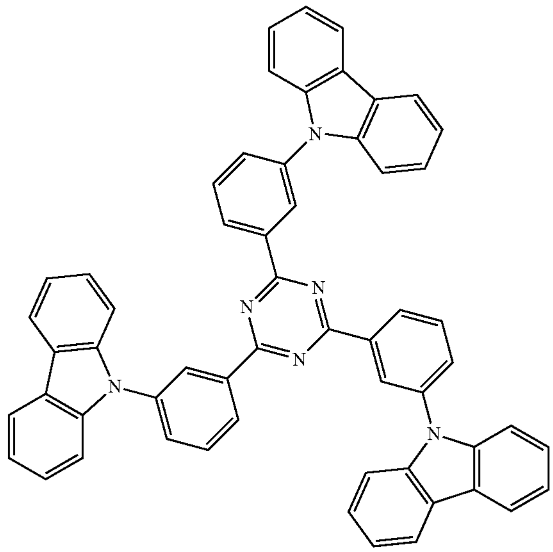
(6-55)
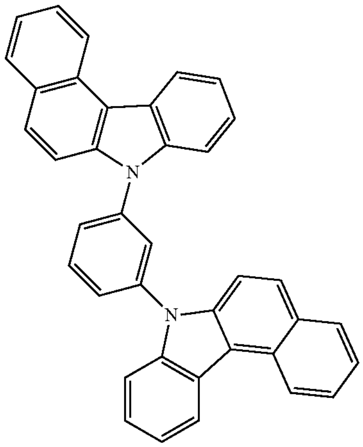
(6-56)
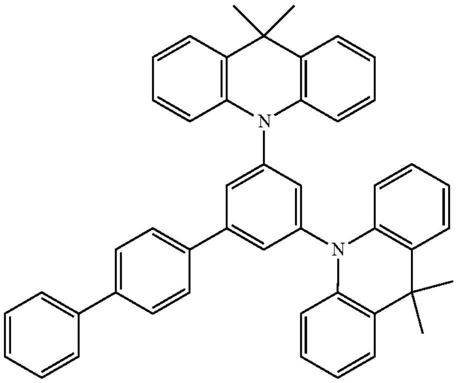
(6-57)
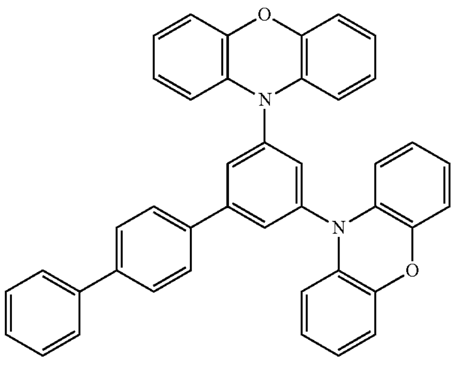
(6-58)
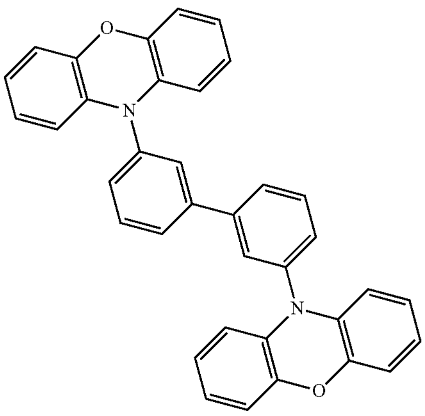

-continued (6-59)

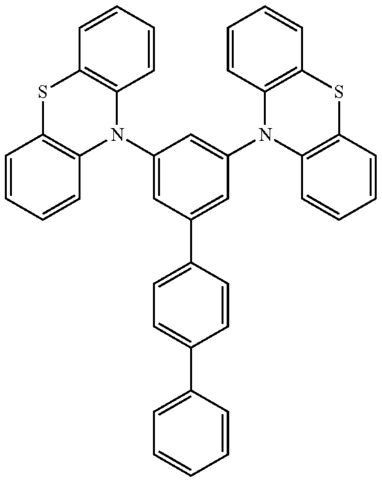

(6-60)

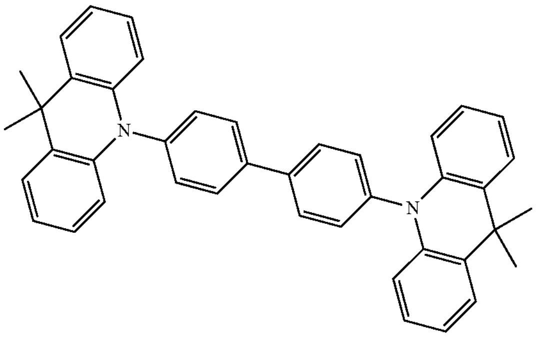

In one of the embodiments, the organic compounds in the foregoing mixture are all phosphorescent host materials, and in such case, the core structure of the organic compounds is one selected from the group consisting of a group containing a cyclic aromatic hydrocarbonyl, a group containing a heteroaromatic ring, and a group containing 2 to 10 ring structures.

Further, the group containing a cyclic aromatic hydrocarbonyl is one selected from group consisting of biphenyl, triphenyl, benzo and fluorene; the group containing a heteroaromatic ring is one selected from dibenzothiophene, dibenzofuran, dibenzoselenophen, furan, thiophene, benzofuran, benzothiophene, benzoselenophen, carbazole, indolocarbazole, pyridine indole, pyrrole dipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, oxazole, dibenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furopyridine, benzothiophene pyridine, thiophene pyridine, benzoselenophene pyridine and selenophene benzodipyridine; the group containing 2 to 10 ring structures is a cyclic aromatic hydrocarbonyl group or a heteroaromatic ring group, and linked to each other directly or through at least one of the following groups: an oxygen atom, a nitrogen atom, a sulfur atom, a silicon atom, a phosphorus atom, a boron atom, a chain structure unit, and an aliphatic ring group.

Further, the organic compounds in the mixture all have a core structure selected from the following groups:

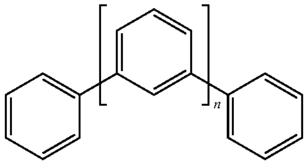

-continued

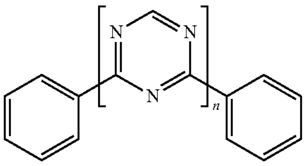

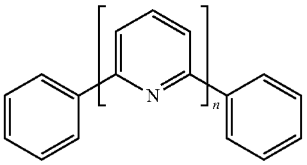

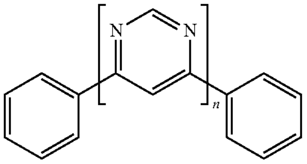

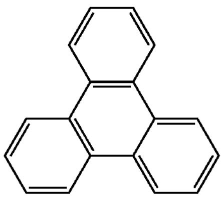

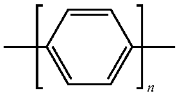

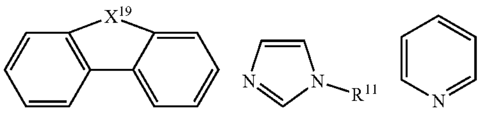

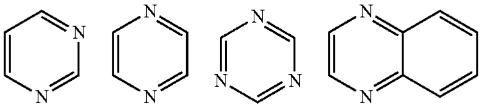

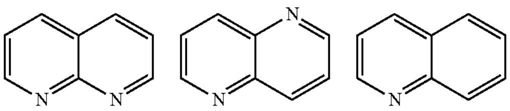

-continued

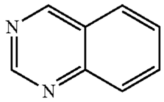

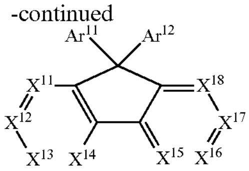

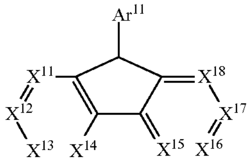

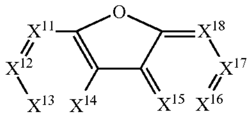

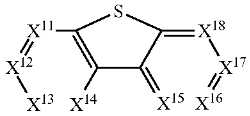

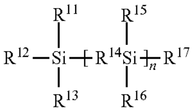

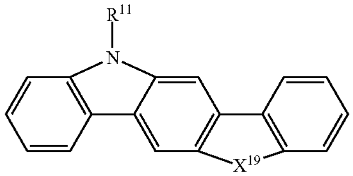

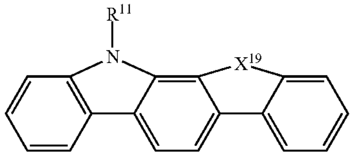

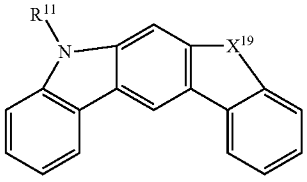

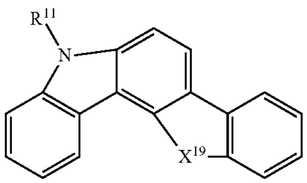

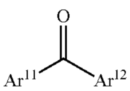

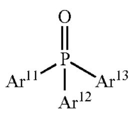

wherein $R^{11}$ to $R^{17}$ are each independently selected from the group consisting of hydrogen, alkyl, alkoxy, amino, alkene, alkyne, aralkyl, heteroalkyl, aryl and heteroaryl; $Ar^{11}$ is one selected from the group consisting of an aryl group containing 6 to 60 carbon atoms, a heteroaryl group containing 3 to 60 carbon atoms, a fused cyclic aryl group containing 6 to 60 carbon atoms and a fused cyclic heteroaryl group containing 3 to 60 carbon atoms; n is any integer from 0 to 20; $X^{11}$ to $X^{18}$ are each selected from CH and N; and $X^{19}$ is one selected from $CR^1R^2$ and $NR^1$.

Specifically, when the organic compounds in the mixture are all phosphorescent host materials, the organic compounds are each selected from the following structures:

PH-1

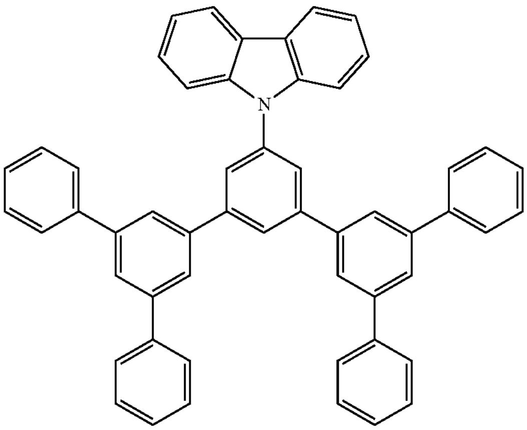

PH-2

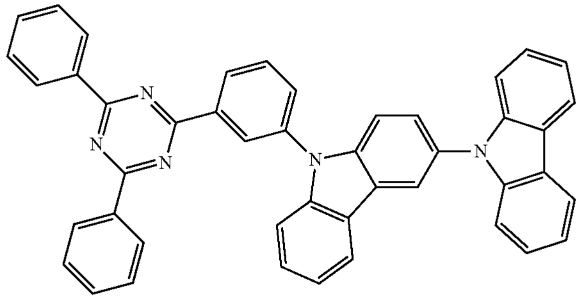

PH-3

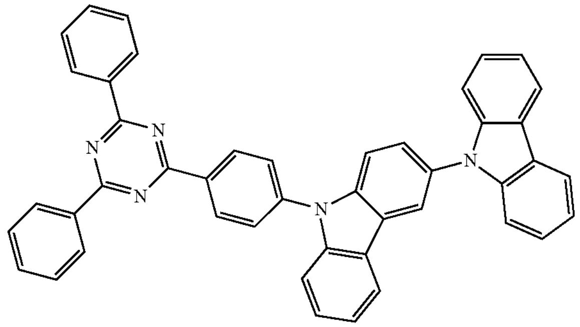

PH-4

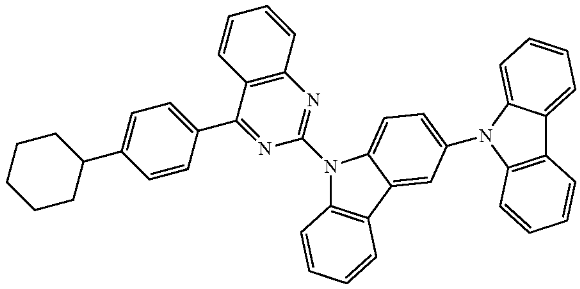

-continued
PH-5
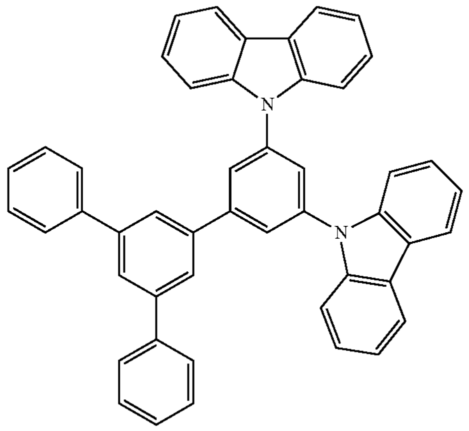
PH-6
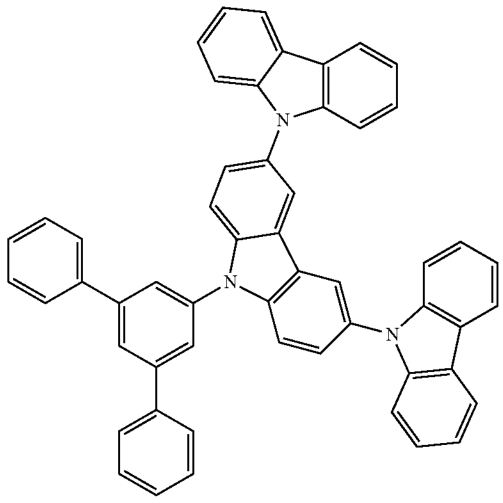
PH-7
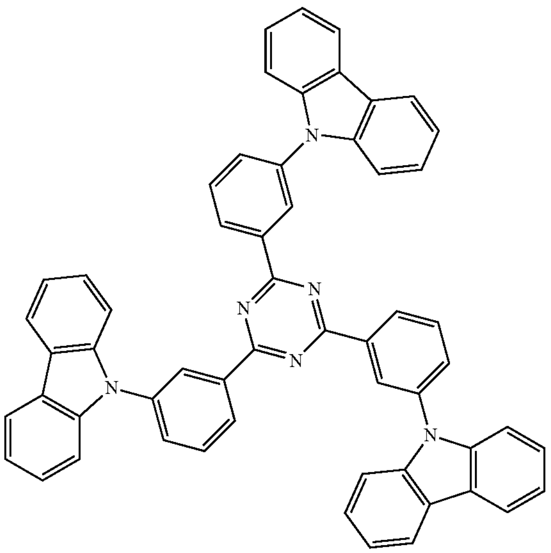
-continued
PH-8
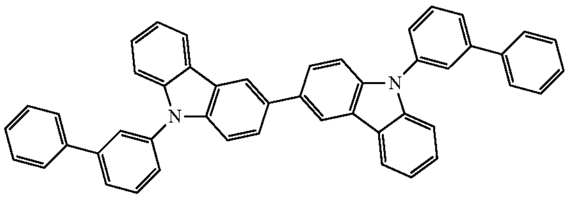
PH-9
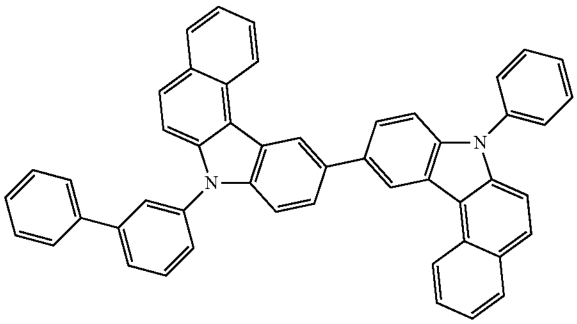
PH-10
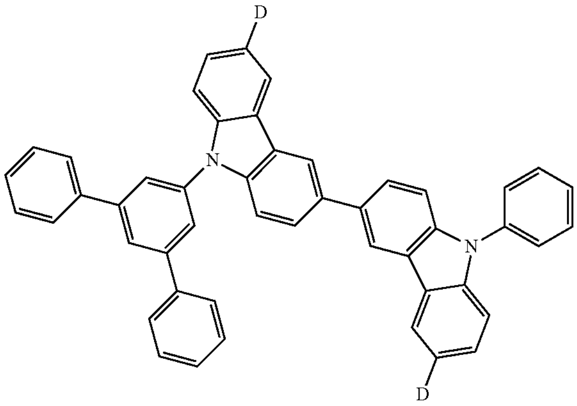
PH-11
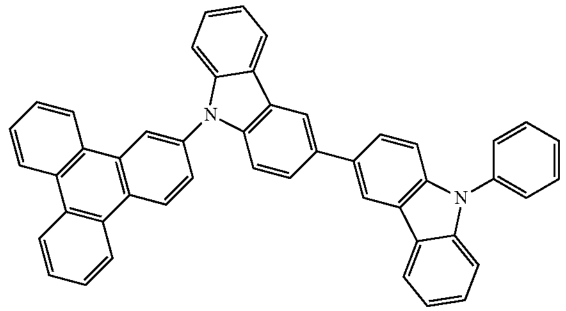

-continued
PH-12
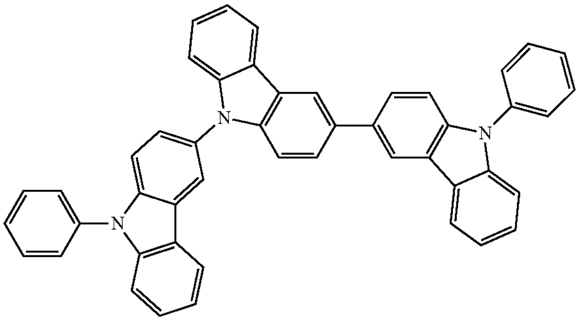
PH-13
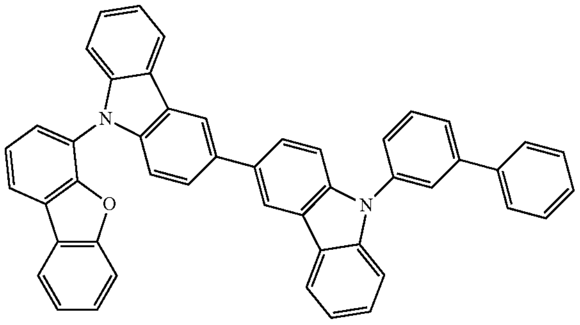
PH-14
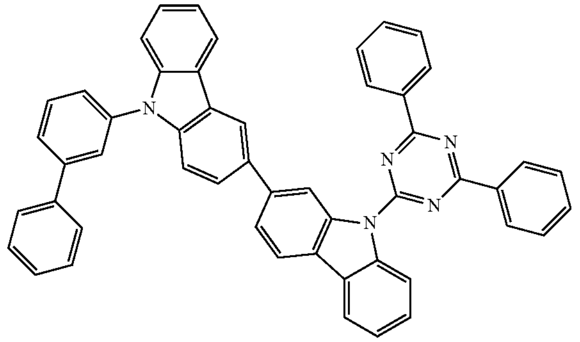
PH-15
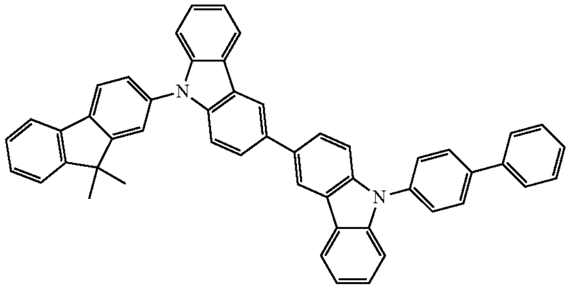
-continued
PH-16
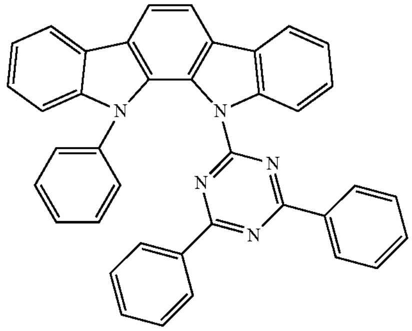
PH-17
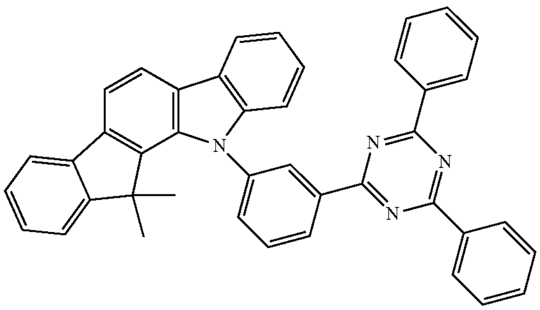
PH-18
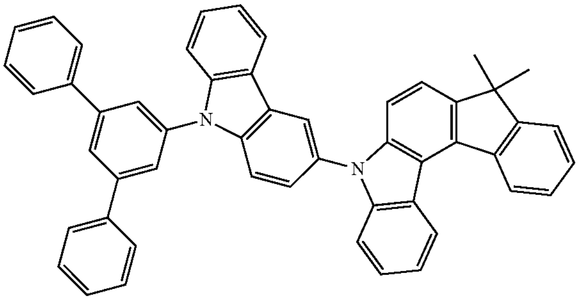
PH-19
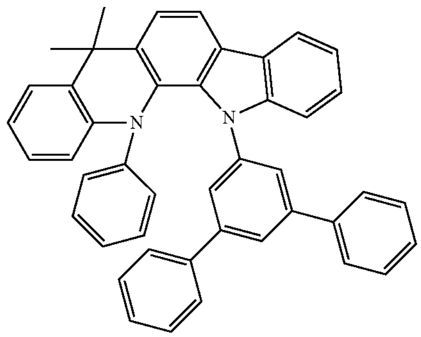

-continued

PH-20

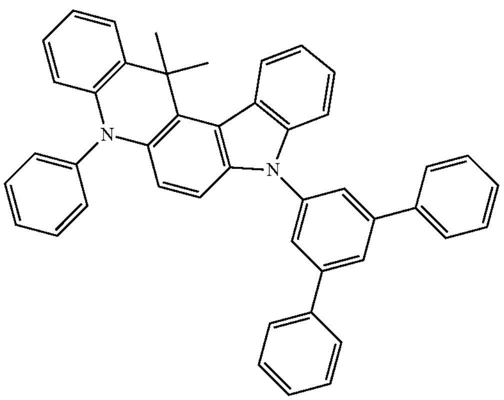

PH-21

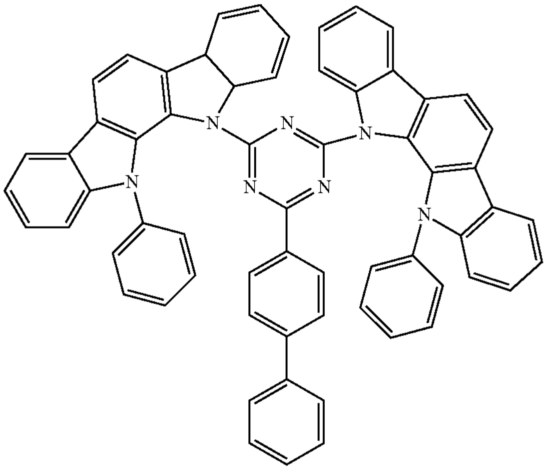

PH-22

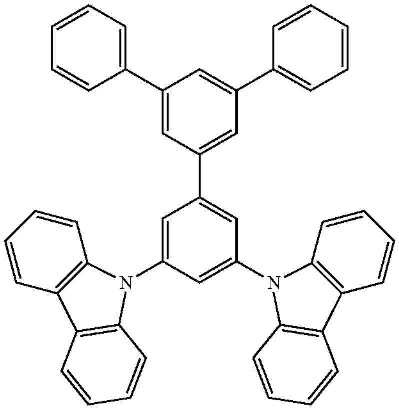

PH-23

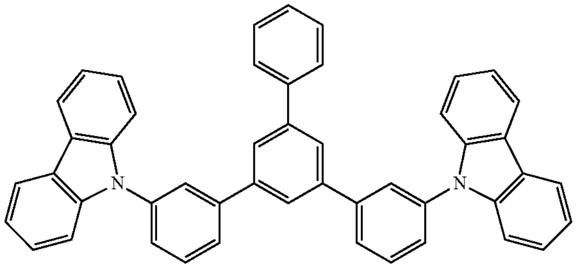

-continued

PH-24

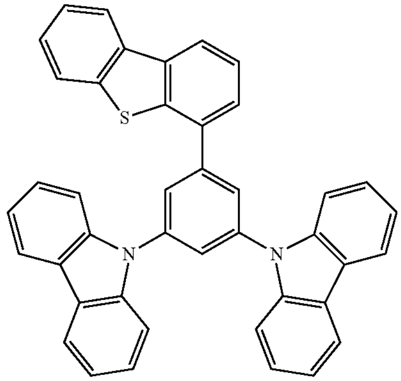

In another embodiment, the organic compounds in the mixture are all hole transporting materials.

In another embodiment, the organic compounds in the mixture are all electron transporting materials.

Further, the mixture further includes an organic functional material selected from the group consisting of a hole injection material (HIM), a hole transporting material (HTM), an electron transporting material (ETM), an electron injection material (EIM), an electron blocking material (EBM), a hole blocking material (HBM), an emitter and a matrix material. Among them, the emitter is selected from a fluorescent emitter, a thermally activated delayed fluorescent emitter or a phosphorescent emitter.

In one of the embodiments, the organic compounds in the mixture are all fluorescent host material, and the organic functional material is a fluorescent emitter. The fluorescent emitter in the mixture has a weight percentage no greater than 15 wt %. Further, the fluorescent emitter in the mixture has a weight percentage no greater than 12 wt %. Still further, the fluorescent emitter in the mixture has a weight percentage no greater than 9 wt %. Still further, the fluorescent emitter in the mixture has a weight percentage no greater than 8 wt %. Even further, the fluorescent emitter in the mixture has a weight percentage no greater than 7 wt %.

The fluorescent emitter is one selected from the group consisting of a derivative of indenofluorene-amine, a derivative of indenofluorene-diamino anthracene, a derivative of naphthalene, a derivative of tetracene, a derivative of xanthene, a derivative of phenanthrene, a derivative of pyrene, a derivative of indenopyrene; a derivative of phenylene, a derivative of diindenopyrene, a derivative of decacycene, a derivative of hexabenzobenzene, a derivative of fluorene, a derivative of spirobifluorene, a derivate of aryl pyrene, a derivative of arylene vinyl, a derivative of cyclopentadiene, a derivative of rubrene, a derivative of coumarin, a derivative of rhodamine, a derivative of quinacridone, a derivative of pyran, a derivative of thiopyran, a derivative of bis(azine) imide boron, a derivative of bis(azine)methylene, a derivative of quinolone, a derivative of oxazinone, a derivative of benzoxazole, a derivative of benzothiazole, a derivative of benzimidazole, and a derivative of pyrrolopyrroledione.

Further, the organic functional material is a thermally activated delayed fluorescent emitter (TADF).

In another embodiment, the organic compounds in the mixture are all phosphorescent host materials, and the organic functional material is a phosphorescent emitter. The phosphorescent emitter in the mixture has a weight percentage no greater than 30 wt %. Further, the phosphorescent emitter in the mixture has a weight percentage of no greater than 25 wt %. Still further, the phosphorescent emitter in the mixture has a weight percentage of no greater than 20 wt %.

The HIM, HTM, ETM, HBM, phosphorescent light-emitting material, fluorescent emitter, and TADF material are described in detail below.

1. HIM/HTM

An HTM is also known as a p-type organic semiconductor material. The HIM/HTM material is selected from the compounds containing the following structural units: phthalocyanine, porphyrin, amine, aryl amine, biphenyl triarylamine, thiophene, fused thiophene (such as dithienothiophene and fused thiophene), pyrrole, aniline, carbazole, indolocarbazole, a derivative of phthalocyanine, a derivative of porphyrin, a derivative of amine, a derivative of aryl amine, a derivative of biphenyl triarylamine, a derivative of thiophene, a derivative of fused thiophene (such as dithienothiophene and fused thiophene), a derivative of pyrrole, a derivative of aniline, a derivative of carbazole, a derivative of indolocarbazole.

In one of the embodiments, the HIM may also be selected from a fluorocarbon-containing polymer, a conductive doped polymer, a conductive polymer (PEDOT/PSS), a self-assembling monomer (e.g., a compound containing a phosphonic acid and a silane derivative), a metal oxide (MoOx), a metal clathrate, and a crosslinking compound.

In one of the embodiments, the cyclic aryl amine-derived compound which may be used as an HIM or HTM is one selected from, but not limited to, the following structures:

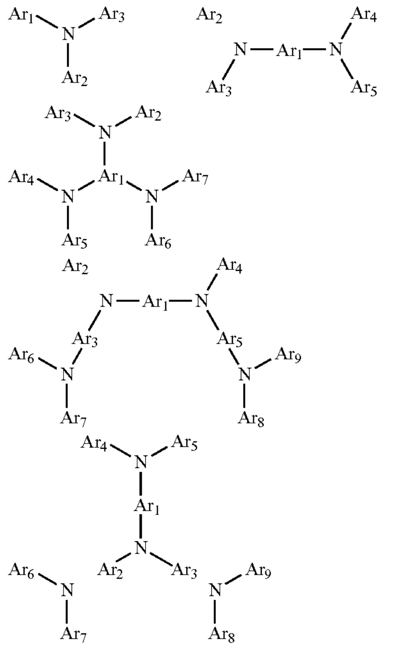

wherein $Ar_1$ to $Ar_9$ are each independently selected from the group consisting of a cyclic aromatic hydrocarbonyl group, a heteroaromatic ring group, and a group containing 2 to 10 ring structures. Among them, the cyclic aromatic hydrocarbonyl group is one selected from the group consisting of benzene, biphenyl, triphenyl, benzo, naphthalene, anthracene, phenalene, phenanthrene, fluorene, pyrene, chrysene, perylene, and azulene; the heteroaromatic ring group is one selected from the group consisting of dibenzothiophene, dibenzofuran, furan, thiophene, benzofuran, benzothiophene, carbazole, pyrazole, imidazole, triazole, isoxazole, thiazole, oxadiazole, oxytriazole, dioxazole, thiadiazole, pyridine, pyridazine, pyrimidine, pyrazine, triazine, oxazine, oxathiazole, oxadiazine, indole, benzimidazole, indazole, indoleamine, benzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, quinoline, indolocarbazole, pyridine indole, dipyridinipyrrole, dipyridine furan, phenylthienopyridine, thiophene dipyridine, phenylpyridine selenophene and dipyridyl selenophene; the groups containing 2 to 10 ring structures is one selected from a cyclic aromatic hydrocarbonyl group containing 2 to 10 ring structures and a heteroaromatic ring group containing 2 to 10 ring structures, and each ring structure is linked through at least one of the following groups: an oxygen atom, a nitrogen atom, a sulfur atom, a silicon atom, a phosphorus atom, a boron atom, a chain structure unit, and an aliphatic ring group. Ar1 to Ar9 may be each independently substituted with one of hydrogen, alkyl, alkoxy, amino, alkene, alkyne, aralkyl, heteroalkyl, aryl and heteroaryl.

Further, Ar1 to $Ar^9$ each independently include one of the following groups:

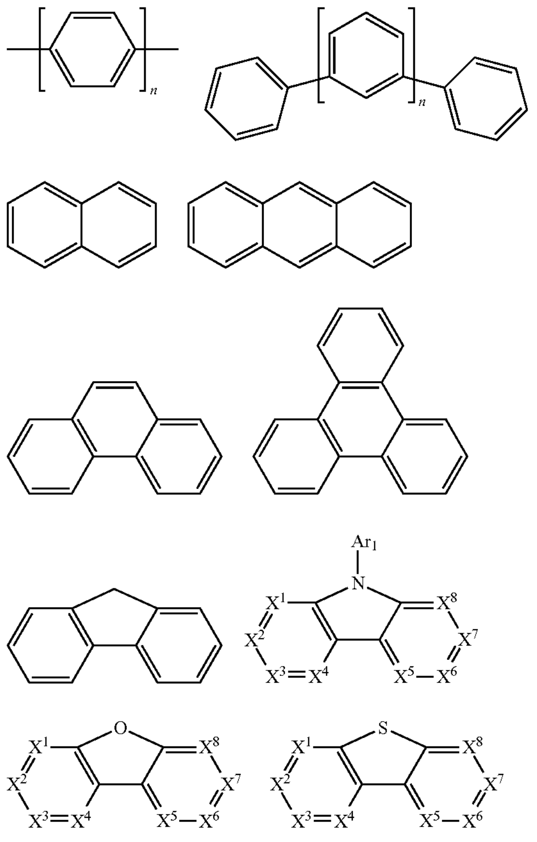

wherein n is any integer from 1 to 20; $X^1$ to $X^8$ are each selected from CH and N; $Ar_1$ is as defined above.

In another embodiment, the aryl amine-derived compounds which may be used as an HIM or HTM are the aryl amine-derived compounds disclosed in U.S. Pat. No. 3,567,450, 4,720,432, 5,061,569, 3,615,404 or 5,061,569.

In one of the embodiments, the metal clathrate which can be used as an HTM or HIM includes but is not limited to the following structures:

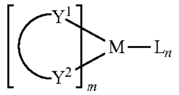

wherein M is a metal having an atomic weight greater than 40; ($Y^2$-$Y^4$) is a bidentate ligand, $Y^1$ and $Y^2$ are each independently selected from the group consisting of C, N, O, P and S; L is an auxiliary ligand; m is any integer from 1 to m+n, and m+n is the maximum coordination number of M.

In one of the embodiments, (Y1-Y2) is a derivative of 2-phenylpyridine. In another embodiment, (Y1-Y2) is a carbene ligand.

In one of the embodiments, M is one selected from the group consisting of Ir, Pt, Os and Zn. The metal clathrate of M has a HOMO greater than −5.5 eV (relative to the vacuum energy level).

Specifically, the organic compound which can be used as an HTM is one selected from the following structures:

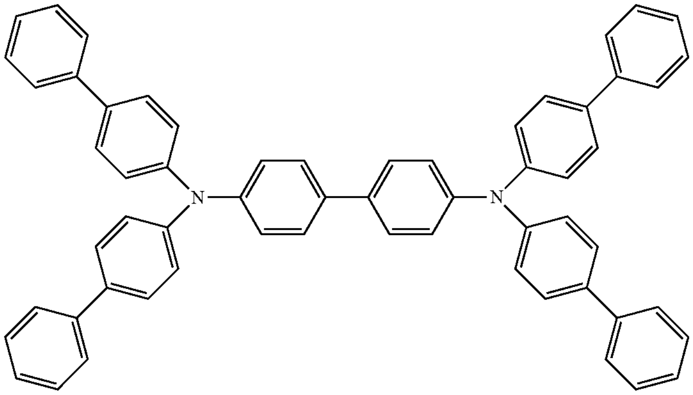

,

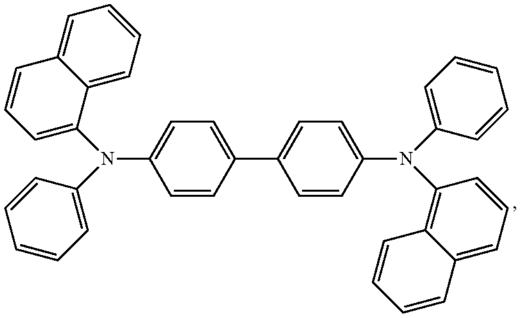

,

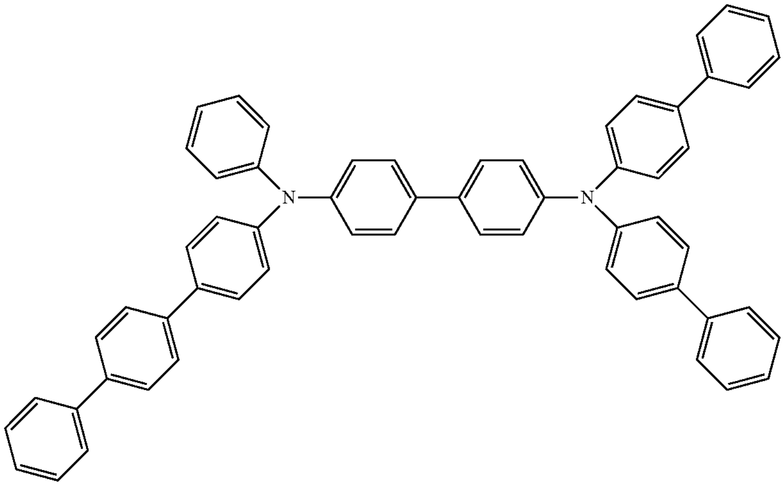

,

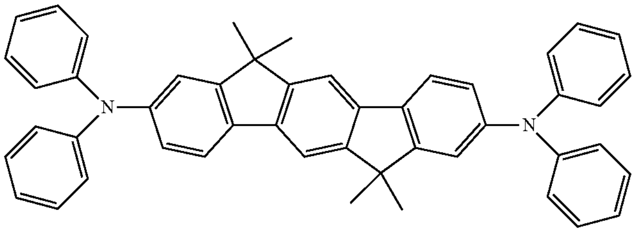

,

-continued

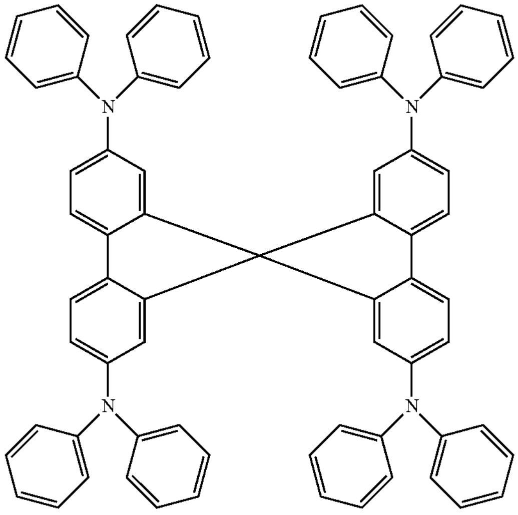

,

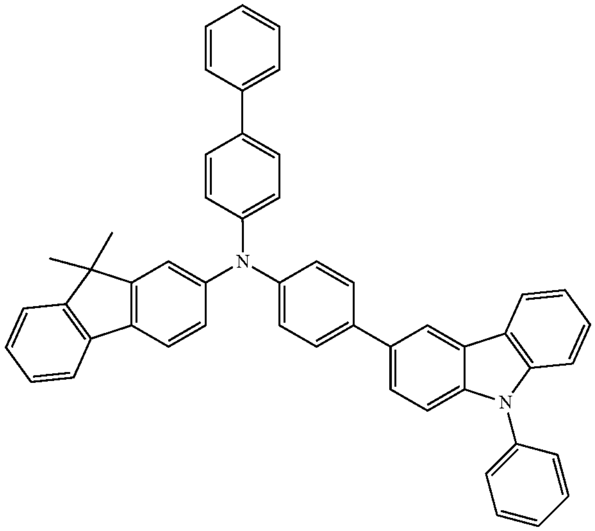

,

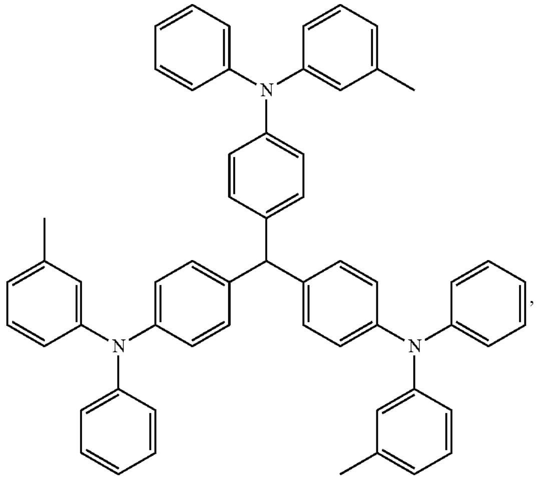

,

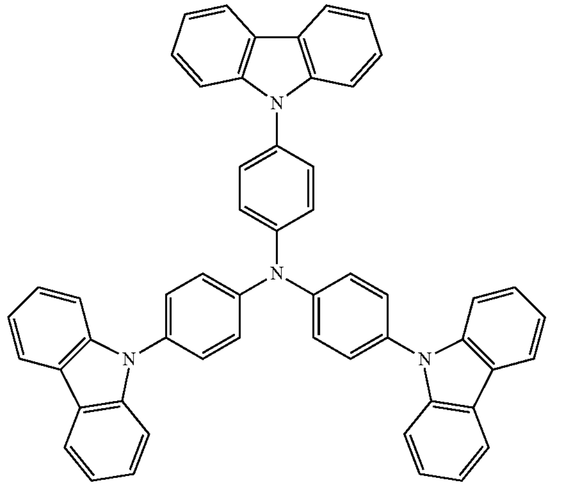

and

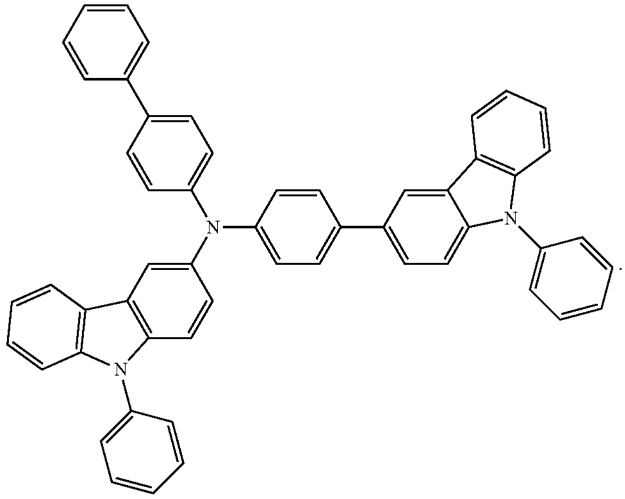

.

2. EIM/ETM/HBM:

An EIM/ETM material is not particularly limited, and any metal clathrate or organic compound may be used as an EIM/ETM as long as it can transport electrons. The EIM/ETM material is one selected from the group consisting of tris(8-hydroxyquinoline)aluminum (AlQ3), phenazine, phenanthroline, anthracene, phenanthrene, fluorene, difluorene, spirobifluorene, p-phenylacetylene, pyridazine, pyrazine, triazine, triazole, imidazole, quinoline, isoquinoline, quinoxaline, oxazole, isoxazole, oxadiazole, thiadiazole, pyridine, pyrazole, pyrrole, pyrimidine, acridine, pyrene, perylene, trans-indenofluorene, cis-indeno, dibenzo-indolefluorene, indenonaphthalene, benzoanthracene, azaphosphole, azaborole, an aromatic ketone, lactam, a derivative of tris(8-hydroxyquinoline)aluminum (AlQ3), a derivative of phenazine, a derivative of phenanthroline, a derivative of anthracene, a derivative of phenanthrene, a derivative of fluorene, a derivative of difluorene, a derivative of spirobifluorene, a derivative of p-phenylacetylene, a derivative of pyridazine, a derivative of pyrazine, a derivative of triazine, a derivative of triazole, a derivative of imidazole, a derivative of quinoline, a derivative of isoquinoline, a derivative of quinoxaline, a derivative of oxazole, a derivative of isoxazole, a derivative of oxadiazole, a derivative of thiadiazole, a derivative of pyridine, a derivative of pyrazole, a derivative of pyrrole, a derivative of pyrimidine, a derivative of acridine, a derivative of pyrene, a derivative of perylene, a derivative of trans-indenofluorene, a derivative of cis-indeno, a derivative of dibenzo-indolefluorene, a derivative of indenonaphthalene, a derivative of benzoanthracene, a derivative of azaphosphole, a derivative of azaborole, a derivative of an aromatic ketone, a derivative of lactam.

A hole blocking layer (HBL) is generally used to block holes from adjacent functional layers, particularly the light emitting layer. Compared with a light emitting device without the blocking layer, the presence of the HBL generally leads to an increase in luminous efficiency. The hole blocking material (HBM) of the hole blocking layer (HBL) needs to have a lower LUMO than the adjacent functional layer, such as a light emitting layer. In one embodiment, HBM has a greater excited state energy level such as a singlet state or a triplet state than the adjacent light emitting layer, depending on the emitter. In another preferred embodiment, the HBM has a function of transporting electrons. EIM/ETM materials that generally have a high HOMO energy level can be used as HBMs.

In one of the embodiments, the organic compound which may be used as an EIM/ETM/HBM includes at least one of the following groups:

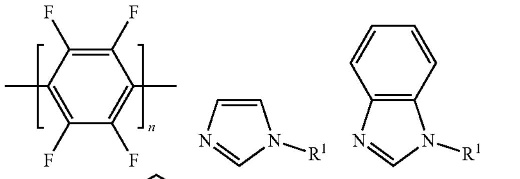

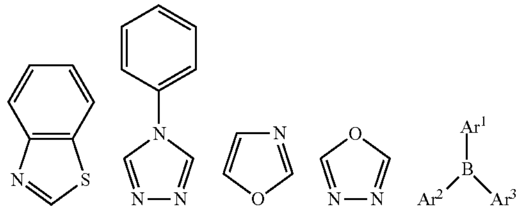

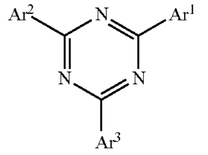

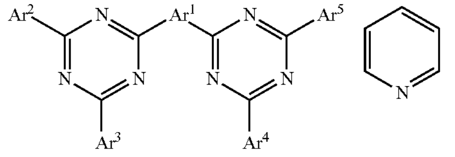

-continued

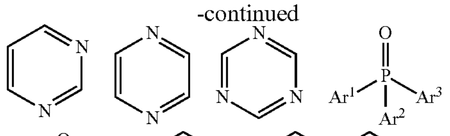

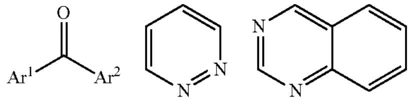

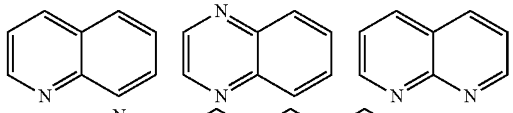

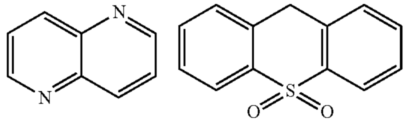

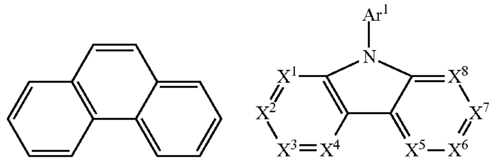

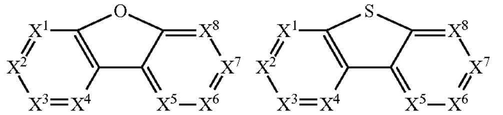

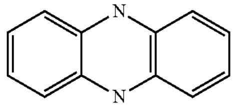

wherein $R^1$ is one selected from hydrogen, alkyl, alkoxy, amino, alkene, alkyne, aralkyl, heteroalkyl, aryl and heteroaryl. When $R^1$ is an aryl group or a heteroaryl group, $R^1$ has the same meaning as $Ar^1$ and $Ar^2$ in the foregoing HTM;

$Ar^1$ to $Ar^5$ are each independently selected from the group consisting of a cyclic aromatic hydrocarbonyl group, a heteroaromatic ring group, and a group containing 2 to 10 ring structures. Among them, the cyclic aromatic hydrocarbonyl group is one selected from the group consisting of benzene, biphenyl, triphenyl, benzo, naphthalene, anthracene, phenalene, phenanthrene, fluorene, pyrene, chrysene, perylene, and azulene; the heteroaromatic ring group is one selected from the group consisting of dibenzothiophene, dibenzofuran, furan, thiophene, benzofuran, benzothiophene, carbazole, pyrazole, imidazole, triazole, isoxazole, thiazole, oxadiazole, oxytriazole, dioxazole, thiadiazole, pyridine, pyridazine, pyrimidine, pyrazine, triazine, oxazine, oxathiazole, oxadiazine, indole, benzimidazole, indazole, indoleamine, benzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, quinoline, indolocarbazole, pyridine indole, dipyridinipyrrole, dipyridine furan, phenylthienopyridine, thiophene dipyridine, phenylpyridine selenophene and dipyridyl selenophene; the group containing 2 to 10 ring structures is one selected from a cyclic aromatic hydrocarbonyl group containing 2 to 10 ring structures and a heteroaromatic ring group containing 2 to 10 ring structures, and each ring structure is linked through at least one of an oxygen atom, a nitrogen atom, a sulfur atom, a silicon atom, a phosphorus atom, a boron atom, a chain structure unit, and an aliphatic ring group. Among them, $Ar^1$ to $Ar^5$ may be each independently substituted with one of hydrogen, alkyl, alkoxy, amino, alkene, alkyne, aralkyl, heteroalkyl, aryl and heteroaryl; n is any integer from 0 to 20; X1 to X8 is one selected from CR1 and N.

In one of the embodiments, a metal clathrate which can be used as an HTM or HIM includes but is not limited to one of the following structures:

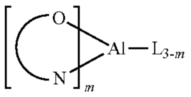

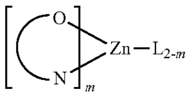

-continued

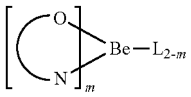

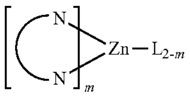

wherein (O—N) and (N—N) are each bidentate ligands, the metal is coordinated with O, N or with N, N; L is an auxiliary ligand; m is an integer from 1 to the maximum coordination number of the metal.

Specifically, the organic compound which can be used as an ETM is one selected from the following structures:

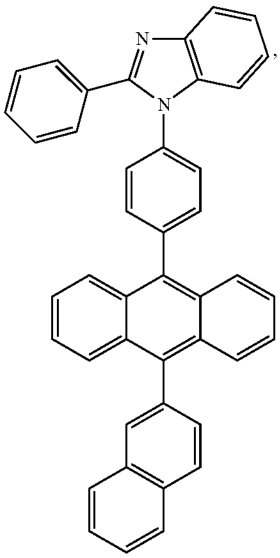
,

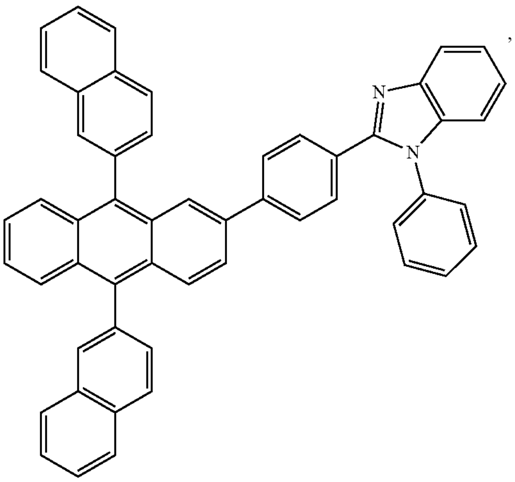
,

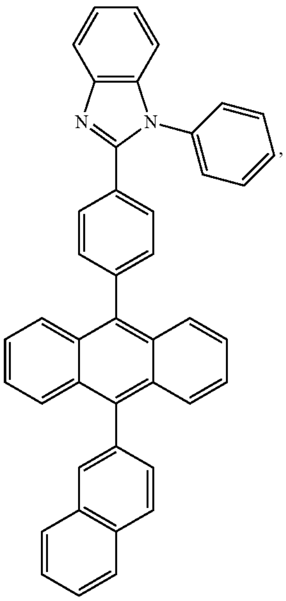
,

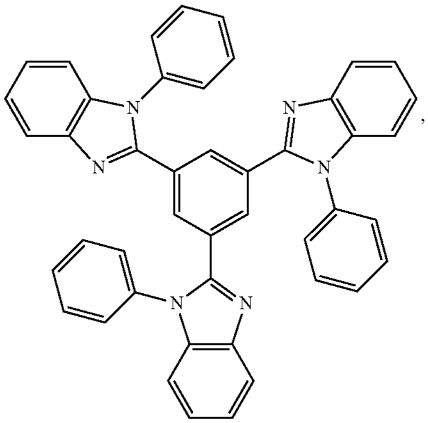
,

-continued

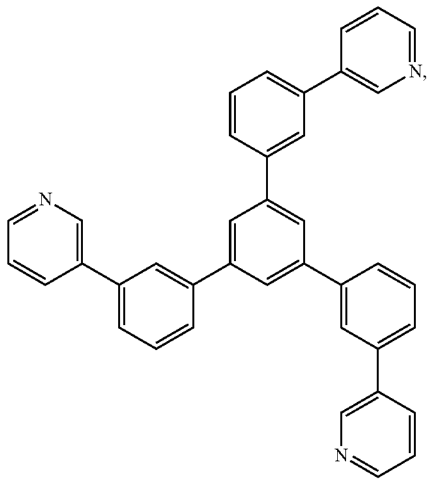

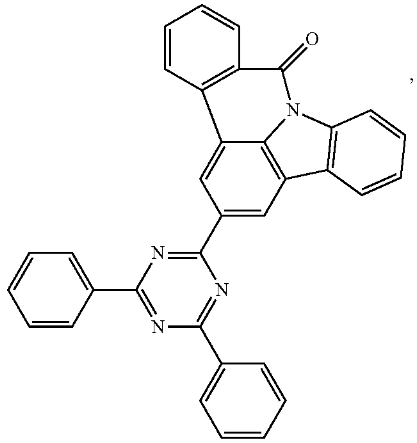

,

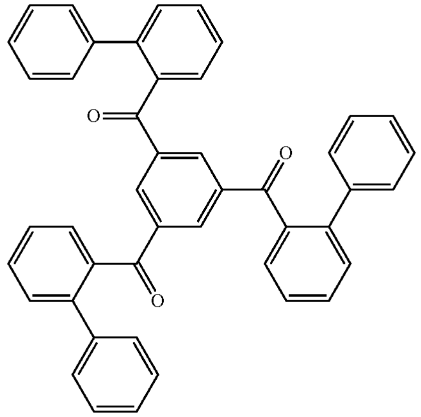

and

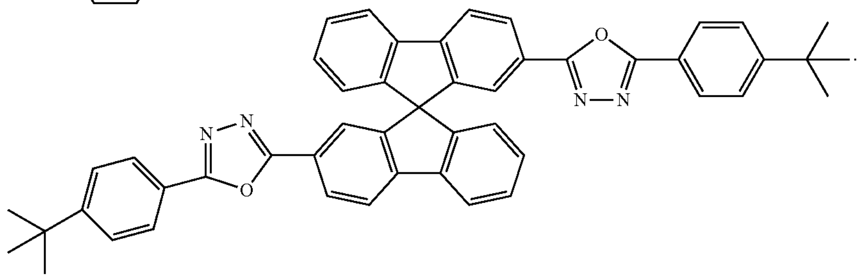

.

3. Phosphorescent Material

Phosphorescent material is also called a triplet emitter. In one of the embodiments, the phosphorescent material has a general formula M(L)n, wherein M is a metal atom; L is an organic ligand which is bonded or coordinated to M through one or more positions; n is an integer greater than 1, and further, n is one selected from 1, 2, 3, 4, 5 and 6. Optionally, these metal clathrates are attached to a polymer through one or more positions, particularly through organic ligands.

Further, M is one selected from a transition metal element, a lanthanide element and an actinide element. Specifically, M is one selected from Ir, Pt, Pd, Au, Rh, Ru, Os, Sm, Eu, Gd, Tb, Dy, Re, Cu and Ag. More specifically, M is one selected from Os, Ir, Ru, Rh, Cu, Au and Pt.

The phosphorescent material includes the chelating ligand (i.e., a ligand) that coordinates with a metal through at least two binding sites. Further, the phosphorescent material includes one of two to three bidentate ligands and two to three multidentate ligands. The chelating ligand is advantageous for improve the stability of the metal clathrates.

The organic ligand may be one selected from a derivative of phenylpyridine, a derivative of 7,8-benzoquinoline, a derivative of 2-(2-thienyl)pyridine derivatives, 2-(1-naphthyl)pyridine derivatives, or a derivative of 2-phenylquinoline. The organic ligands may be further substituted, for example with fluoromethyl or trifluoromethyl.

The auxiliary ligand may be one selected from acetone acetate or picric acid.

In one of the embodiments, the metal clathrate which may be used as a triplet emitter has the following general formula:

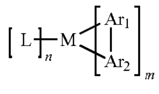

wherein M is one selected from a transition metal element, a lanthanide element and an actinide element.

Ar1 is a cyclic group and includes at least one donor atom (i.e., an atom having one lone pair of electrons, such as nitrogen or phosphorus) through which the cyclic group is coordinately bonded to a metal;

Ar2 is a cyclic group and includes at least one carbon atom through which the cyclic group is bonded to a metal; Ar1 and Ar2 are linked by a covalent bond, and Ar1 and Ar2 can each carry one or more substituents, and also be further linked together by substituents;

L is an auxiliary ligand, and further, L is a bidentate chelating ligand, specifically, L is a monoanionic bidentate chelating ligand;

m is one selected from 1, 2 and 3, further, m is one selected from 2 and 3, specifically, m is 3;

n is one selected from 0, 1 and 2, further, n is one selected from 0 and 1, specifically, n is 0;

In another embodiment, the phosphorescent material is one selected from the phosphorescent materials disclosed in WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, WO 2009118087A1.

Specifically, the phosphorescent material may be one selected from the following structures:

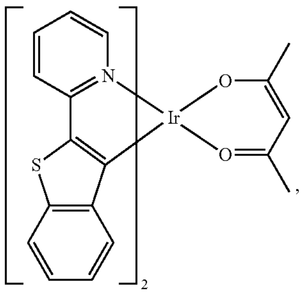

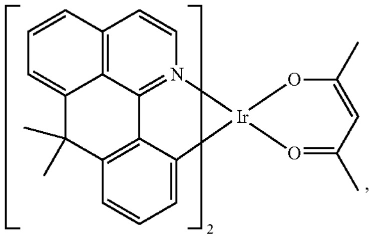

-continued

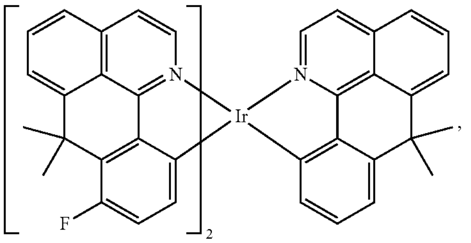

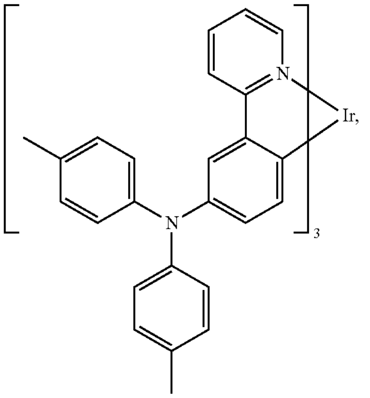

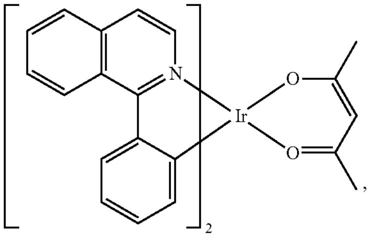

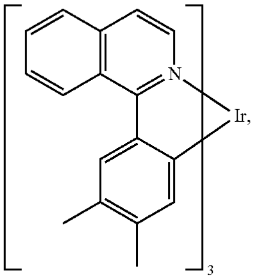

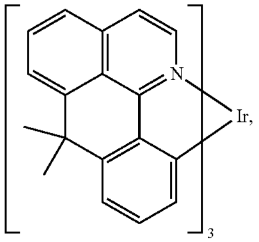

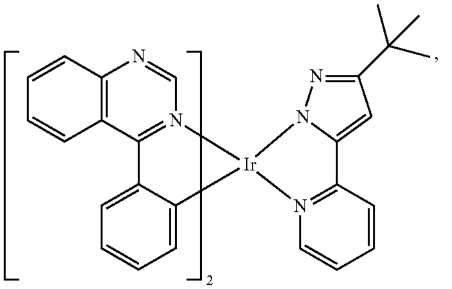

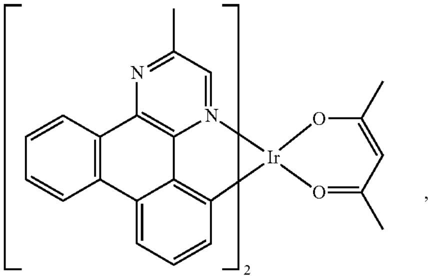

-continued
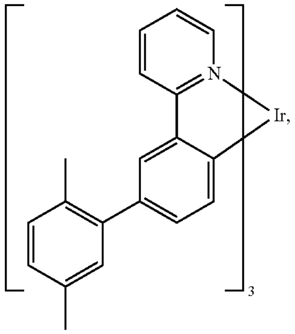
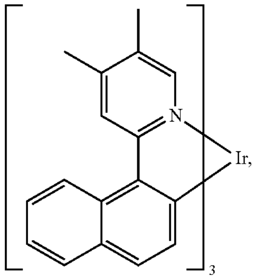
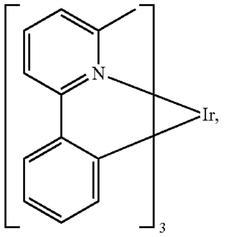
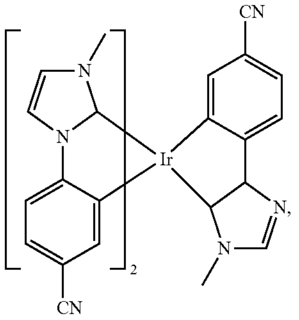
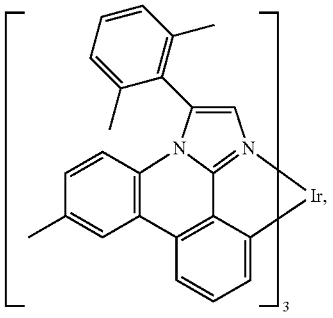
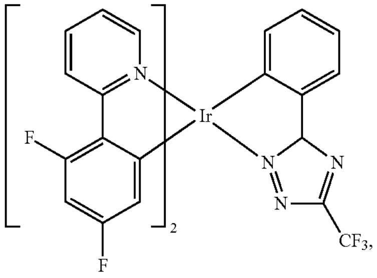
-continued
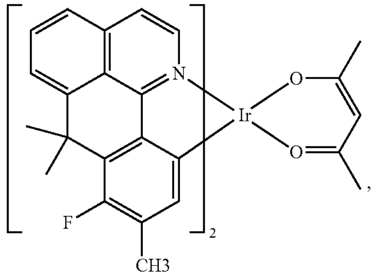
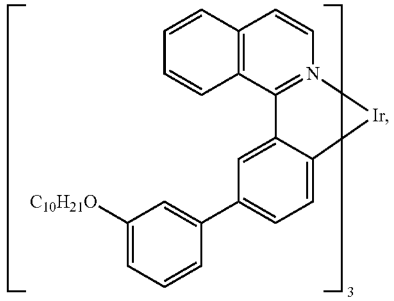
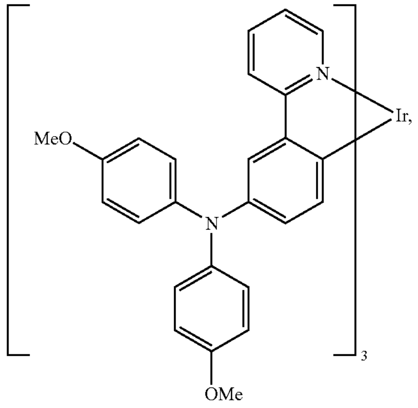
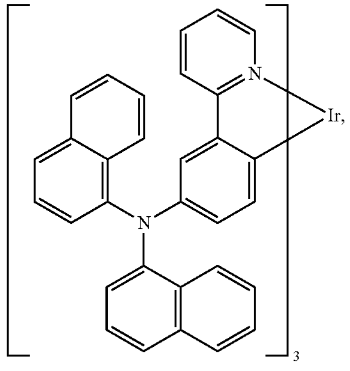
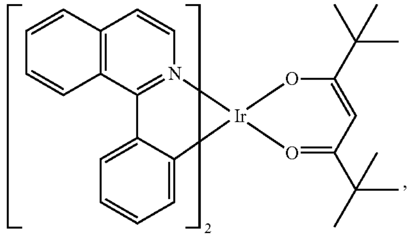

-continued
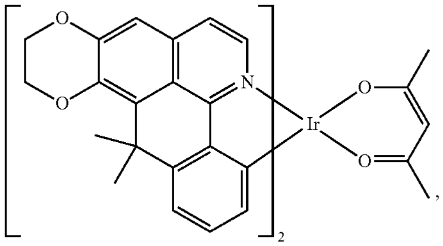
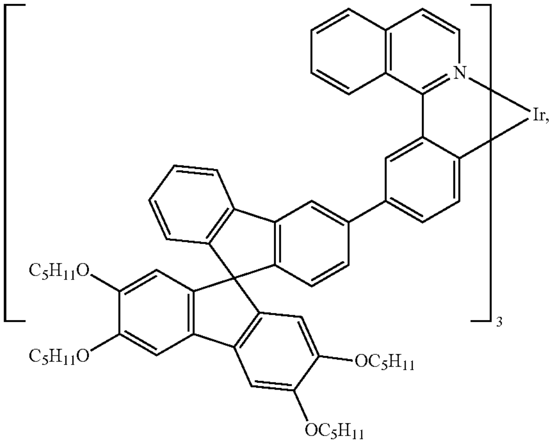
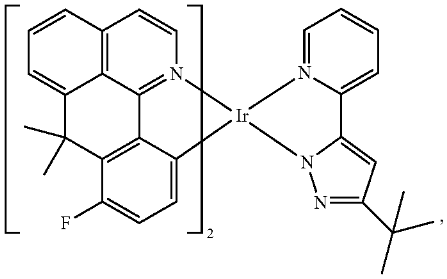
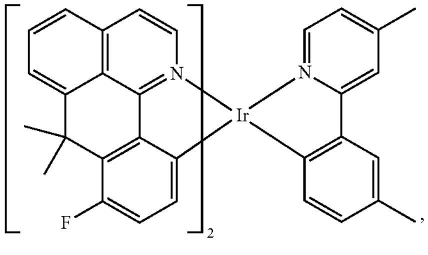
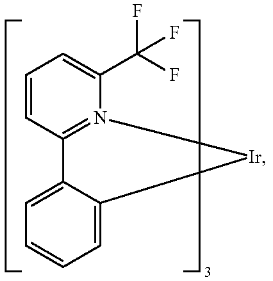
-continued
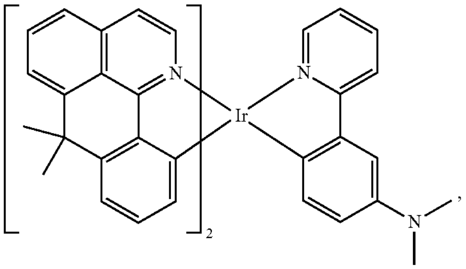
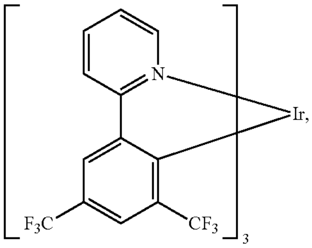
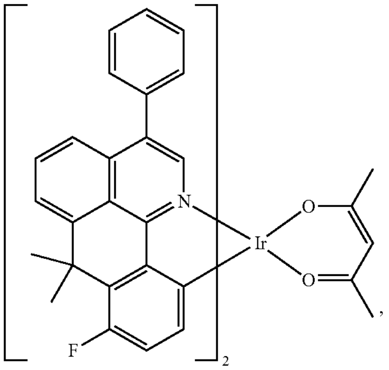
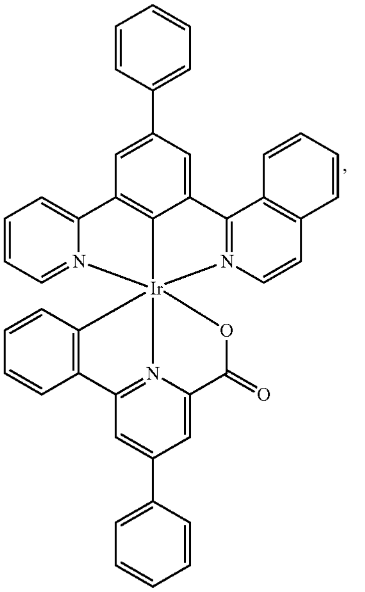

-continued
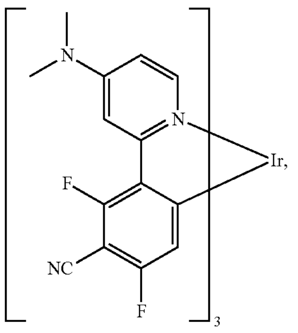
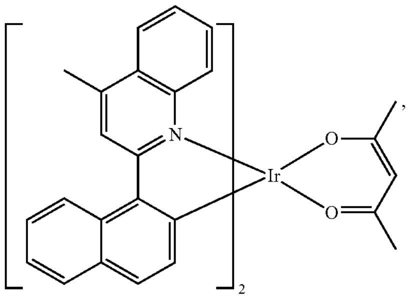
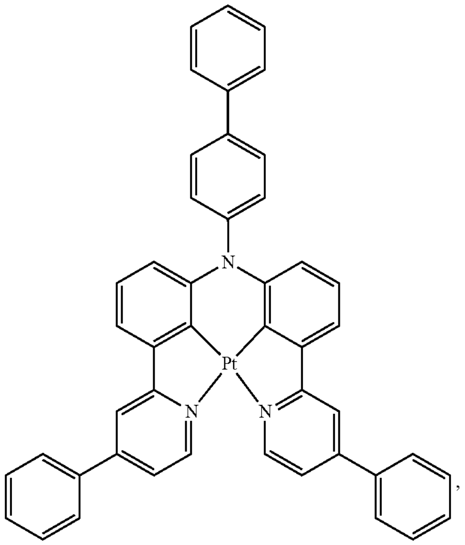
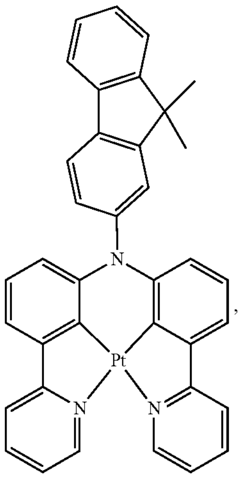
-continued
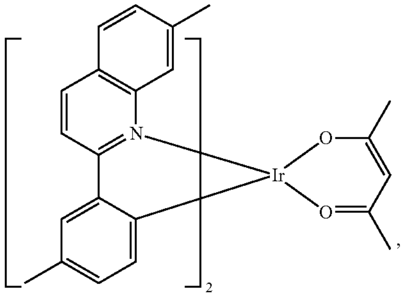
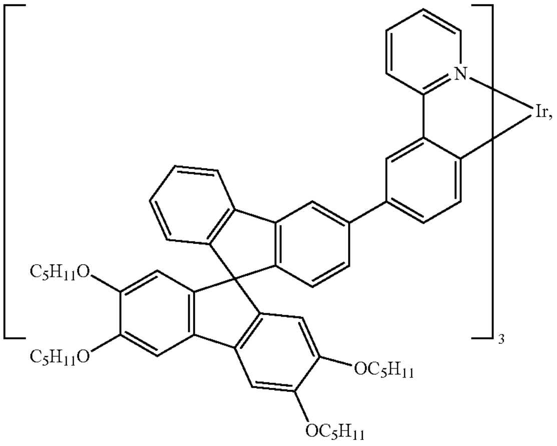
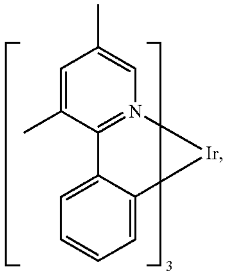
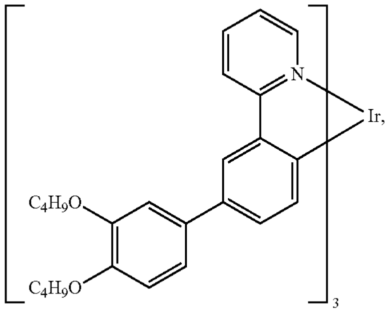
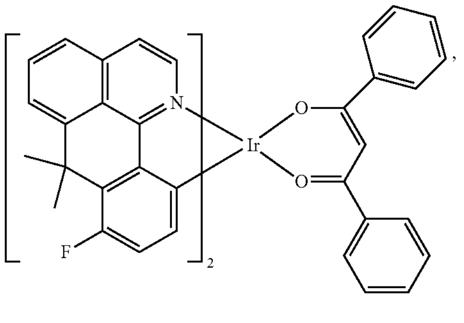

-continued

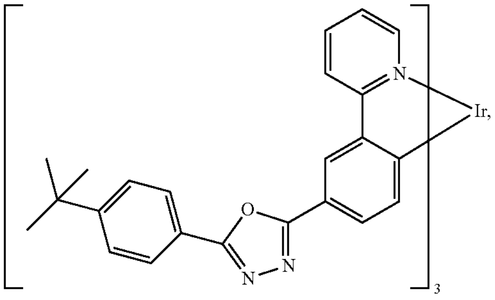

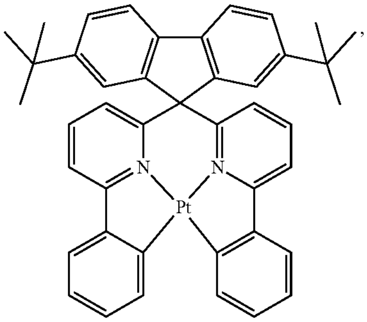
,

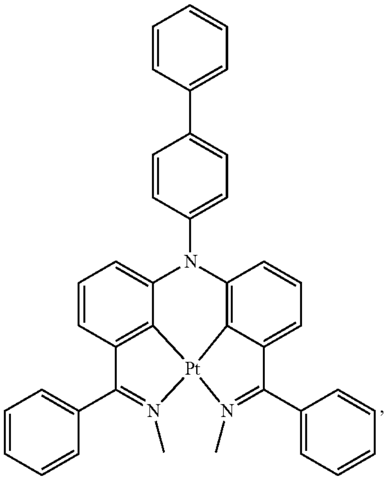
,

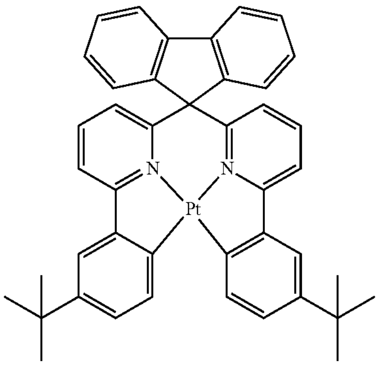
,

-continued

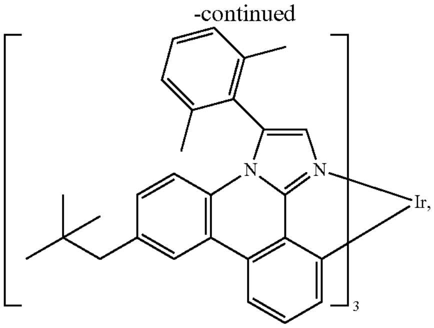

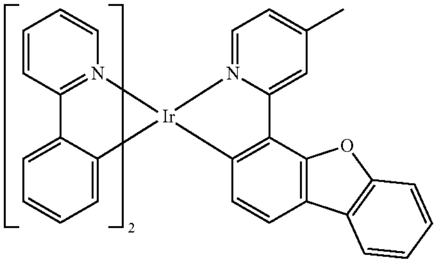

and

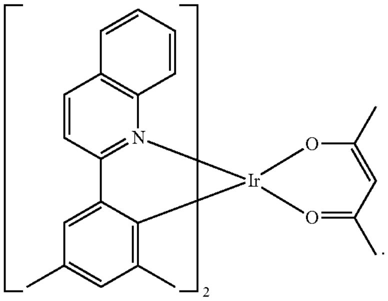
.

4. Fluorescent Emitter (Singlet Emitter)

A fluorescent emitter is one selected from the group consisting of mono-styrylamine, di-styrylamine, tri-styrylamine, tetra-styrylamine, styryl phosphine, styrene ether and aryl amine.

A mono-styrylamine includes a styryl group and at least one amine. Further, a mono-styrylamine includes a styryl group and an aryl amine. A di-styrylamine includes two unsubstituted or substituted styryl groups and at least one amine. Further, a di-styrylamine includes two unsubstituted or substituted styryl groups and an aryl amine. A tri-styrylamine includes three styryl groups and at least one amine. Further, a tri-styrylamine includes three styryl groups and an aryl amine. A tera-styrylamine includes four styryl groups and at least one amine. Further, a tera-styrylamine includes four styryl groups and an aryl amine. A styryl group may be substituted or unsubstituted. Further, a styrene is a stilbene and can be further substituted. An aryl amine refers to a compound including three aromatic ring or heteroaromatic ring systems directly coupled to nitrogen. At least one of these aromatic ring or heteroaromatic ring systems is a fused ring system. Further, the aromatic ring or heteroaromatic ring system has at least 14 aromatic carbon atoms. Specifically, the aryl amine is one selected from the group consisting of an aryl anthramine, an aryl anthradiamine, an aryl pyrene amine, an aryl pyrene diamine, an aryl chrysene amine and an aryl chrysene diamine. The diarylamine group of an aryl anthramine is directly linked to an anthracene, preferably at the position 9. The diarylamine group of an aryl anthramine is directly linked to an anthracene, preferably at the positions 9, 10. The diarylarylamino groups of an aryl pyrene amine, an aryl pyrene diamine, an aryl chrysene amine and an aryl chrysene diamine. are directly linked to position 1 or 1, 6 of pyrene. A styryl phosphine and a styrene ether are defined similarly as the aryl amine.

Specifically, a fluorescent emitter base on an ethylene amine and an aryl amine is one selected from the fluorescent emitters disclosed in WO2006/000388, WO2006/058737, WO2006/000389, WO2007/065549, WO2007/115610, U.S. Pat. No. 7,250,532B2, DE102005058557 A1, CN1583691 A, JP08053397A, U.S. Pat. No. 6,251,531 B1, US2006/210830A, EP1957606A1 and US2008/0113101A1.

Specifically, a fluorescent emitter based on stilbene and a derivative thereof is the fluorescent emitter disclosed in U.S. Pat. No. 5,121,029.

Further, a fluorescent emitter is the indenofluorene-amine disclosed in WO2006/122630, the indenofluorene-diamine disclosed in WO2006/122630, the benzoindenofluorene-amine disclosed in WO2008/006449, the benzoindenofluorene-diamine disclosed in WO2008/006449, the dibenzoindenofluorene-amine disclosed in WO2007/140847 and the dibenzofluorenone-diamine disclosed in WO2007/140847.

Materials which may be used as singlet emitters include polycyclic aromatic hydrocarbon compounds. Further, the polycyclic aromatic hydrocarbon compound is one selected from the group consisting of a derivative of anthracene (e.g., 9,10-di(2-naphthanthracene)), a derivative of naphthalene, a derivative of tetraphenyl, a derivative of xanthene, a derivative of phenanthrene, a derivative of pyrene (e.g., 2,5,8,11-tetra-t-butylperylene), a derivative of indenopyrene, a derivative of phenylene (e.g., 4,4'-bis(9-ethyl-3-carbazole vinyl)-1,1'-biphenyl), a derivative of periflanthene, a derivative of decacyclene, a derivative of hexabenzobenzene, a derivative of fluorene, a derivative of spirobifluorene, a derivative of arylpyrene (e.g., the arylpyrene disclosed in US20060222886), a derivative of arylene ethylene (e.g., the arylene ethylene disclosed in U.S. Pat. Nos. 5,121,029 and 5,130,603), a derivative of cyclopentadiene (e.g., tetraphenyl cyclopentadiene), a derivative of rubrene, a derivative of coumarin, a derivative of rhodamine, a derivative of quinacridone, a derivative of pyran (e.g., 4(dicyanomethylene)-6-(4-p-dimethylamino styryl-2-methyl)-4H-pyran (DCM)), a derivative of thiopyran, a derivative of bis(azinyl)imine boron compound (e.g., the bis(azinyl)imine boron compound disclosed in US2007/0092753 A1), a derivative of bis(azinyl)methylene compound, a derivative of carbostyryl compound, a derivative of oxazinone, a derivative of benzoxazole, a derivative of benzothiazole, a derivative of benzimidazole, and a derivative of diketopyrrolopyrrole. In one of the embodiments, a fluorescent emitter material is the fluorescent emitter material disclosed in US20070252517A1, U.S. Pat. Nos. 4,769,292, 6,020,078, US2007/0252517A1 or US2007/0252517A1.

Further, a fluorescent emitter has the following general formula:

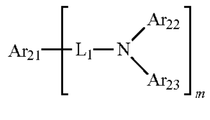

wherein Ar21 represents an aryl group containing C6 to C50 or a styryl group containing C6 to C50; L1 represents a single bond, an arylene group containing C6 to C30 or a heteroarylene group containing C3 to C30; Ar22 and Ar23 each independently represent hydrogen, deuterium, halogen, an alkyl group containing C1 to C30, an aryl group containing C6 to C30, a heteroaryl group containing C3 to C30, an aliphatic cyclic group containing C3 to C30 formed by linking to an adjacent substituent, an aromatic cyclic group containing $C_3$ to $C_{30}$ formed by linking to an adjacent substituent, and carbon atoms in Ar22 and Ar23 may be replaced by at least one heteroatom of nitrogen, oxygen and sulfur;

m is 1 or 2, and when m is 2,

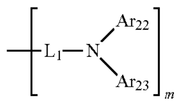

m may be the same or different.

Further, Ar21 is one selected from phenyl, fluorenyl, anthryl, pyrenyl, chrysenyl, benzofluorenyl, and spiro[fluorene-benzofluorene].

Specifically, the fluorescent emitter is one selected from, but not limited to the following structures:

FD-1

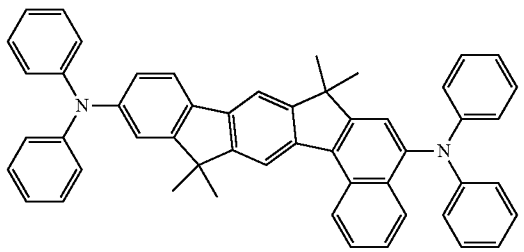

FD-2

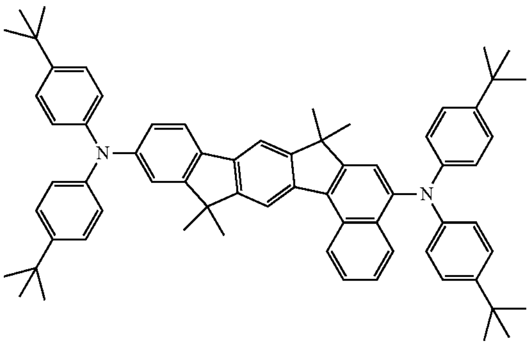

FD-3

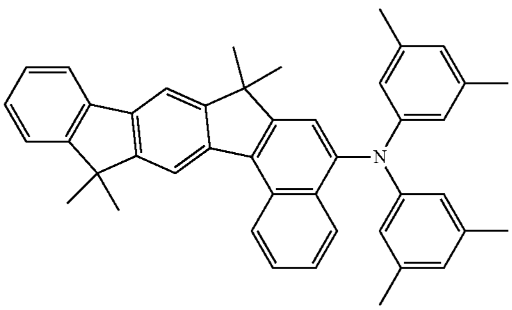

-continued
FD-4
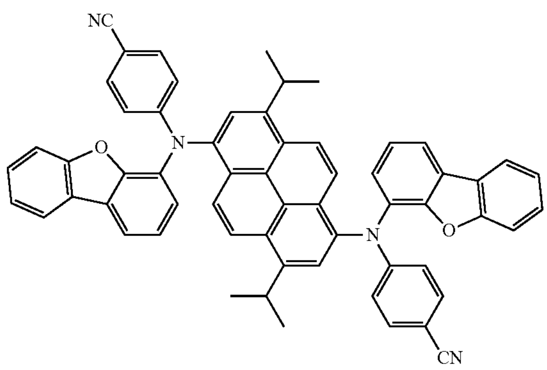
FD-5
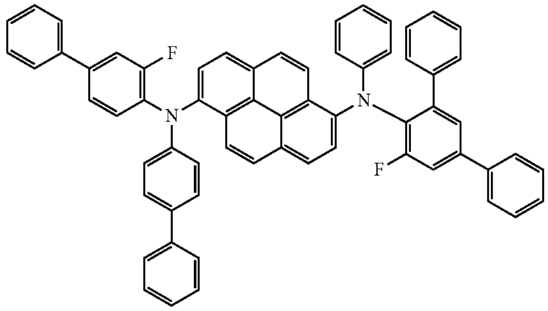
FD-6
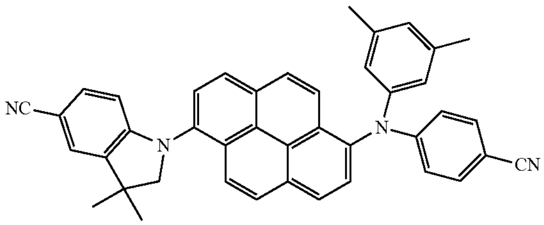
FD-7
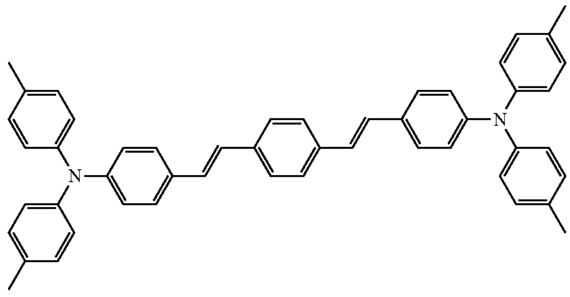
FD-8
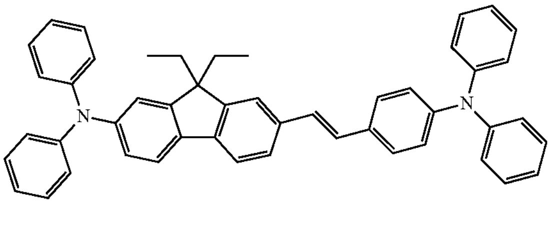
-continued
FD-9
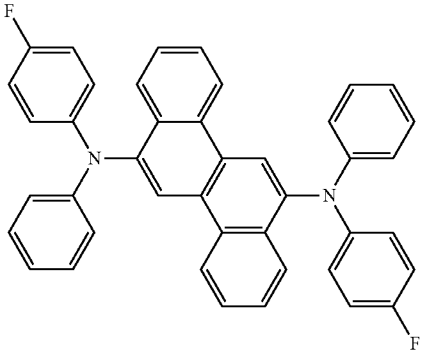
FD-10
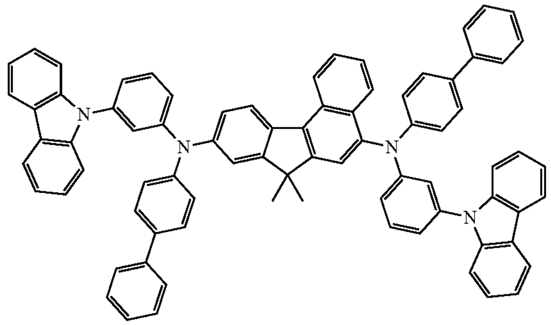
FD-11
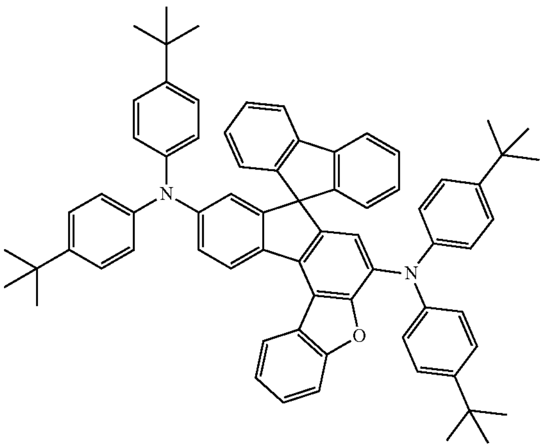
FD-12
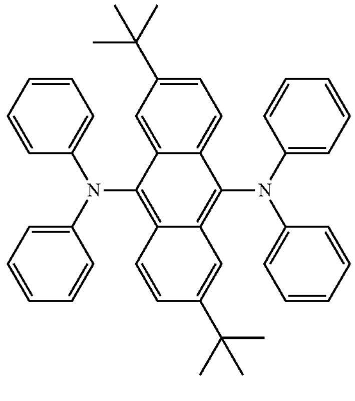

5. Thermally Activated Delayed Fluorescent (TADF) Material

Traditional organic fluorescent materials can only emit light using 25% singlet excitonic luminescence formed by electrical excitation, thus the devices have relatively low internal quantum efficiency (up to 25%). Although the phosphorescent material enhances the intersystem crossing due to the strong spin-orbit coupling of the heavy atom center, the singlet exciton and the triplet exciton emission formed by electric excitation can be effectively utilized, so that the internal quantum efficiency of the device can reach 100%. However, the application of phosphorescent material in OLEDs is limited by the problems such as high cost, poor material stability and serious roll-down of the device efficiency, etc. The thermally activated delayed fluorescent (TADF) material is the third generation of organic light-emitting material developed after the organic fluorescent material and the organic phosphorescent material. A TADF material generally has a small singlet-triplet energy level difference (ΔEst), and triplet excitons can be converted to singlet excitons by anti-intersystem crossing. This can make full use of the singlet excitons and triplet excitons formed by electric excitation and the device can achieve 100% internal quantum efficiency. At the same time, a TADF material is controllable in structure, stable in property, low cost, unnecessary to use noble metals, and have a promising application prospect in the OLED field.

A TADF material needs to have a smaller singlet-triplet energy level difference (ΔEst), preferably ΔEst<0.3 eV. Further, ΔEst<0.2 eV. Still further, ΔEst<0.1 eV In one of the embodiments, the TADF material has a relatively small ΔEst, and in another embodiment, the TADF has a better fluorescence quantum efficiency.

In one of the embodiments, the TADF material is selected from the TADF materials disclosed in CN103483332(A), TW201309696(A), TW201309778(A), TW201343874(A), TW201350558(A), US20120217869(A1), WO2013133359 (A1), WO2013154064(A1), Adachi, et. al. Adv. Mater., 21, 2009, 4802, Adachi, et. al. Appl. Phys. Lett., 98, 2011, 083302, Adachi, et. al. Appl. Phys. Lett., 101, 2012, 093306, Adachi, et. al. Chem. Commun., 48, 2012, 11392, Adachi, et. al. Nature Photonics, 6, 2012, 253, Adachi, et. al. Nature, 492, 2012, 234, Adachi, et. al. J. Am. Chem. Soc, 134, 2012, 14706, Adachi, et. al. Angew. Chem. Int. Ed, 51, 2012, 11311, Adachi, et. al. Chem. Commun., 48, 2012, 9580, Adachi, et. al. Chem. Commun., 48, 2013, 10385, Adachi, et. al. Adv. Mater., 25, 2013, 3319, Adachi, et. al. Adv. Mater., 25, 2013, 3707, Adachi, et. al. Chem. Mater., 25, 2013, 3038, Adachi, et. al. Chem. Mater., 25, 2013, 3766, Adachi, et. al. J. Mater. Chem. C., 1, 2013, 4599 and Adachi, et. al. J. Phys. Chem. A., 117, 2013, 5607.

Specifically, the TADF material is one selected from the following structures:

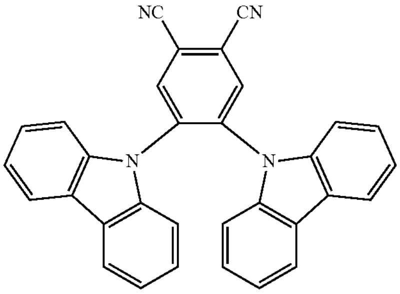
,
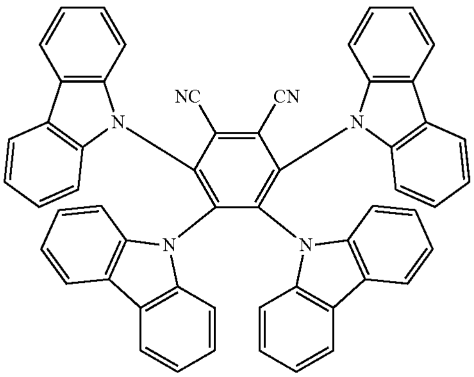
,
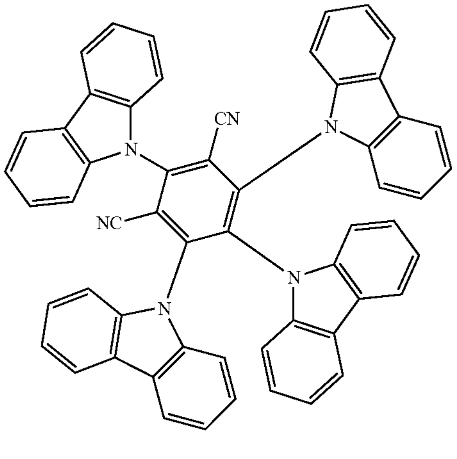
,
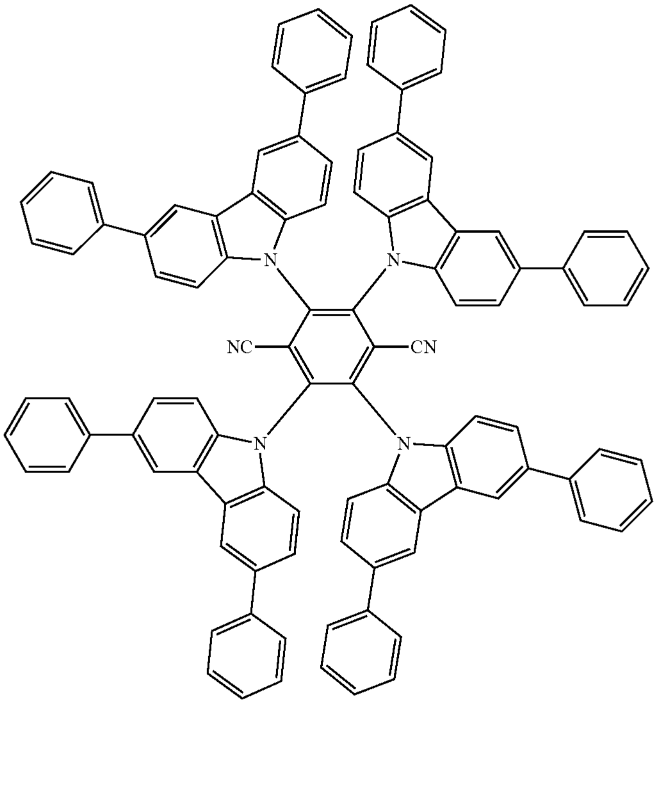
,

-continued
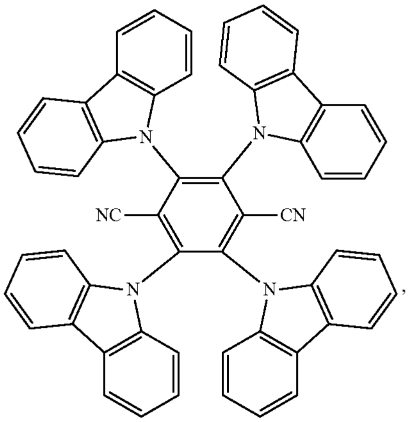,
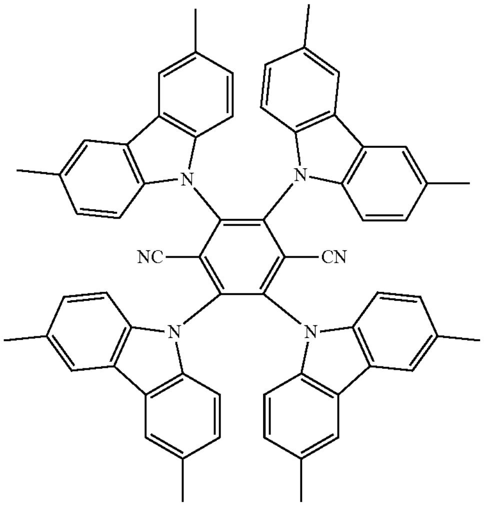,
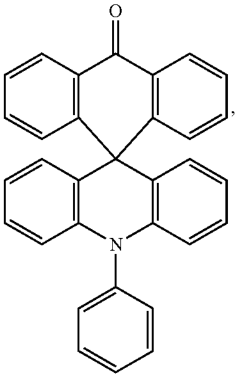,
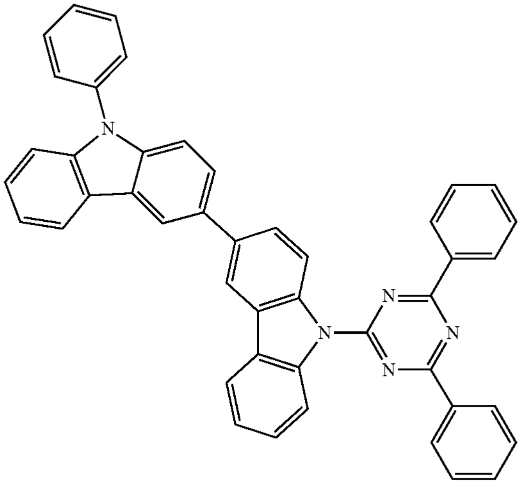,
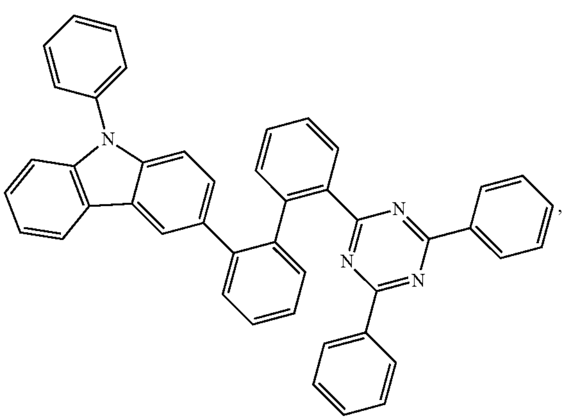,

-continued
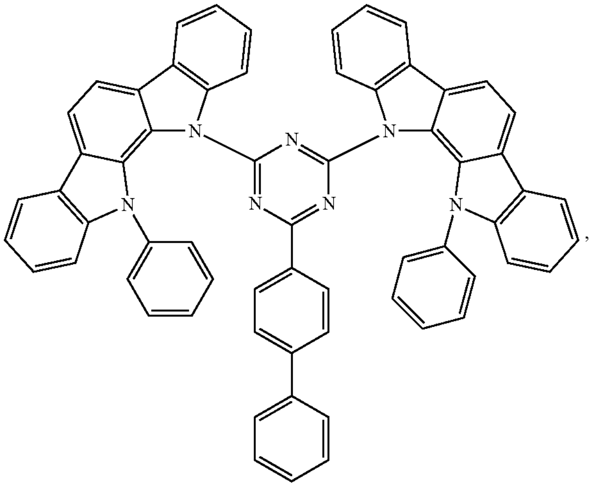
,
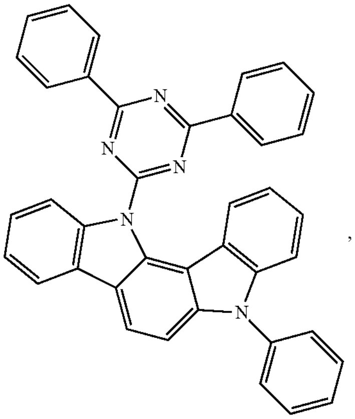
,
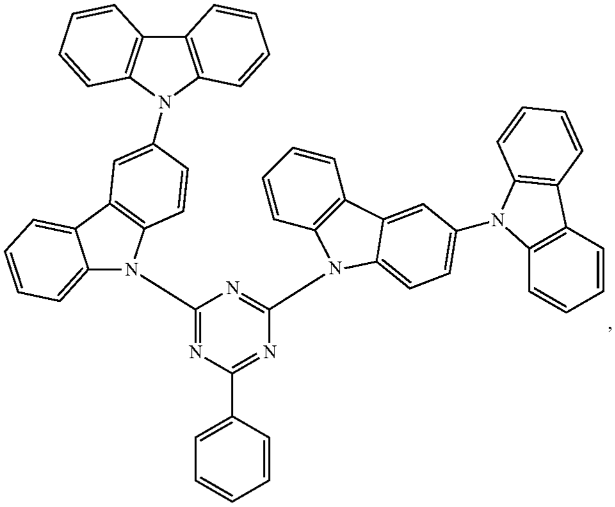
,
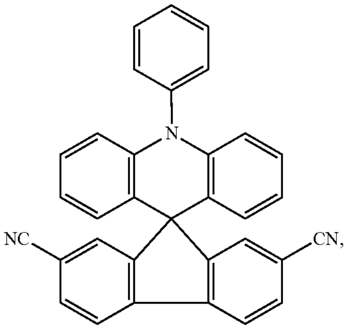
,
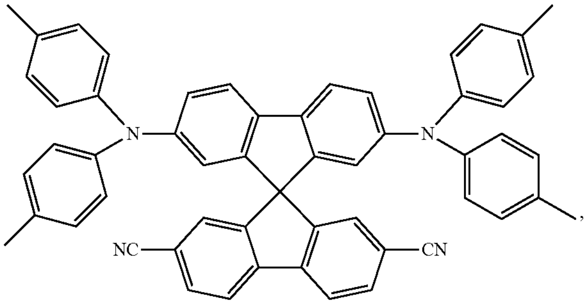
, -continued
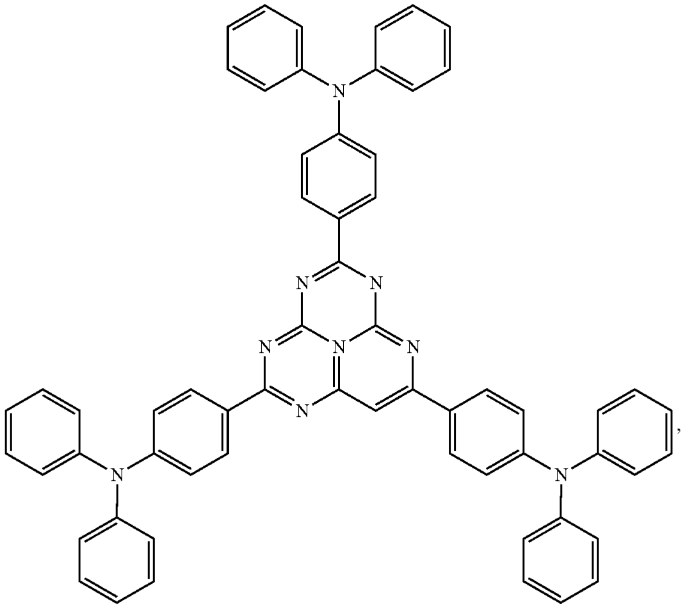,
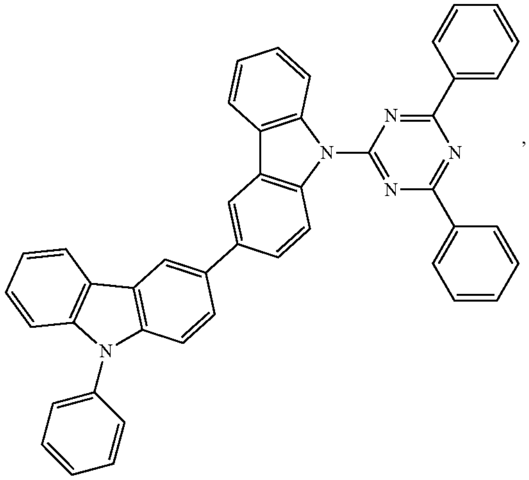,
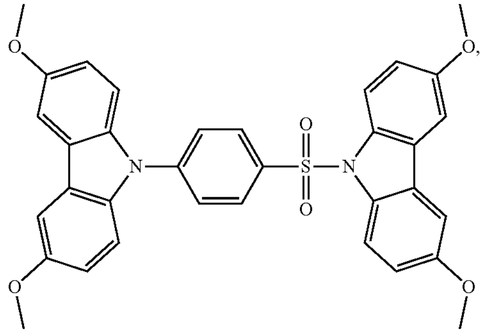,
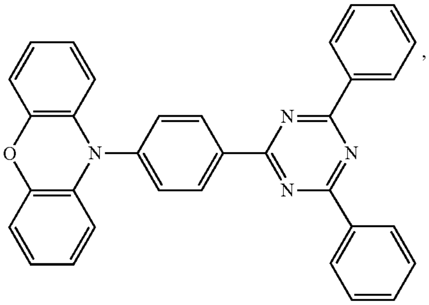,
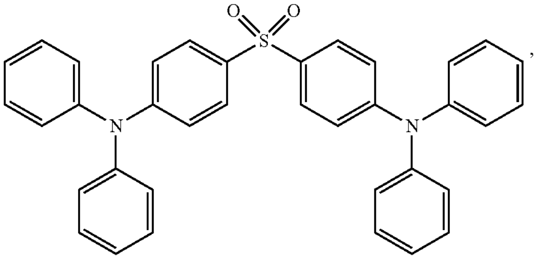, -continued
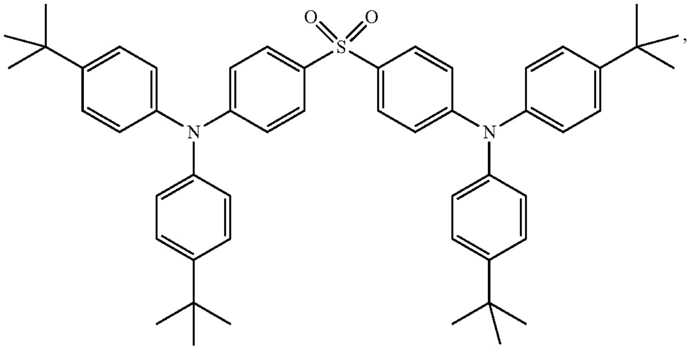
,
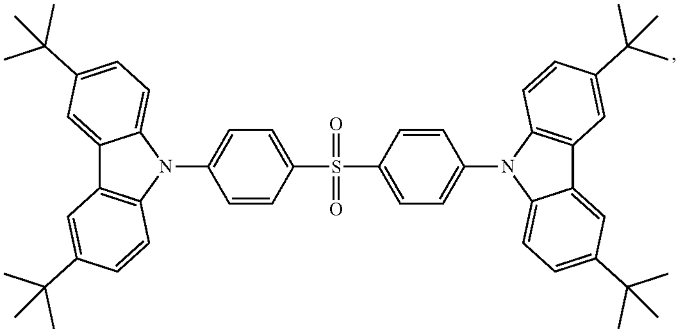
,
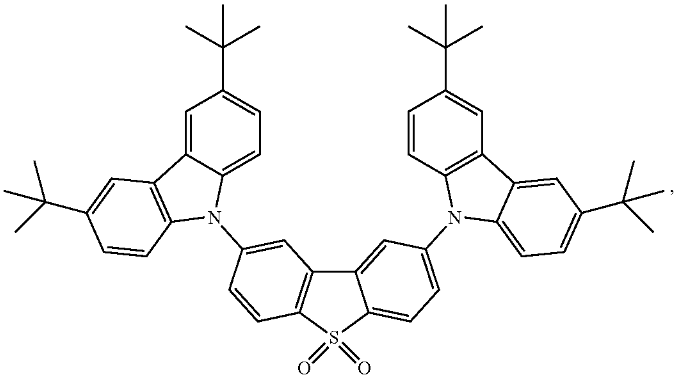
,
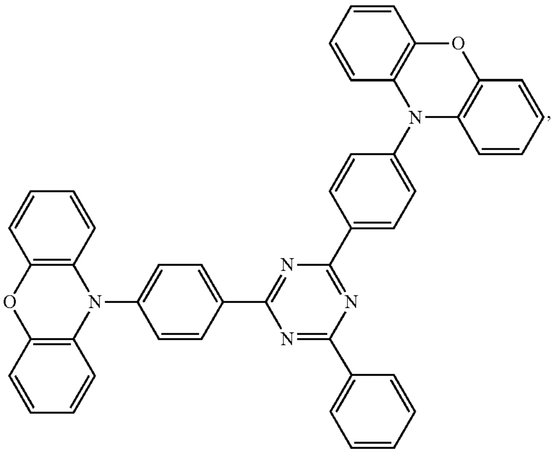
, -continued
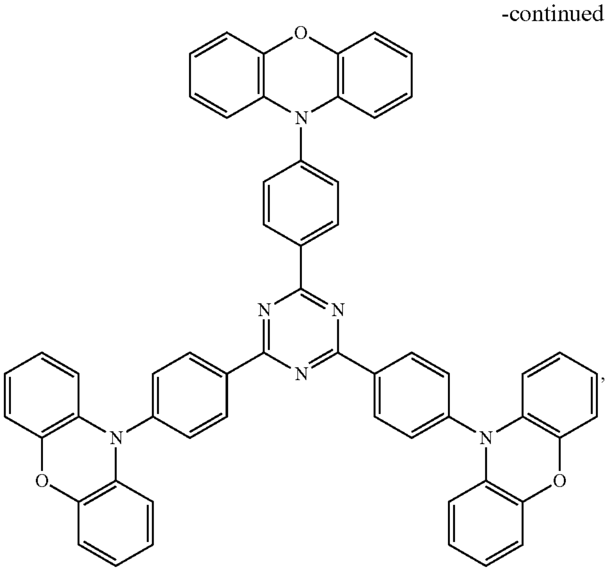,
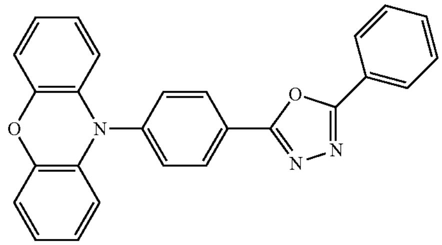,
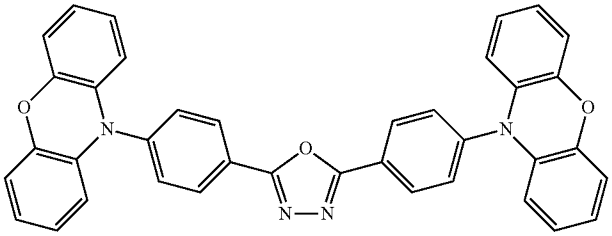,
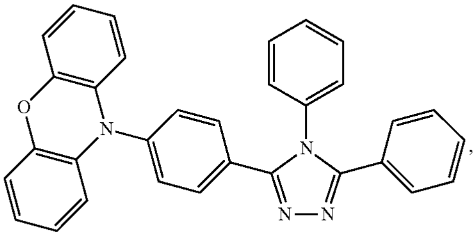,
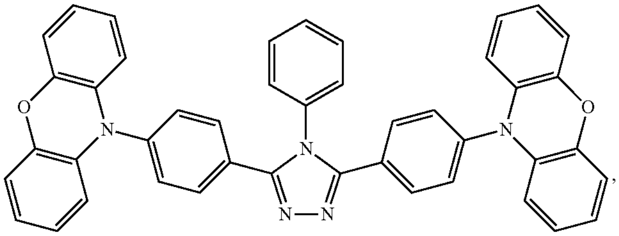,
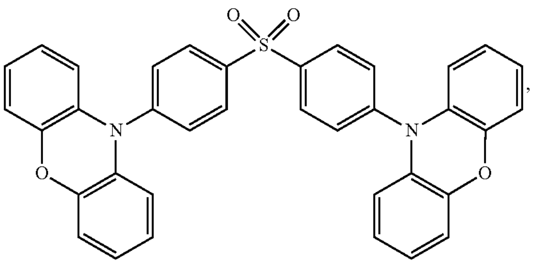,
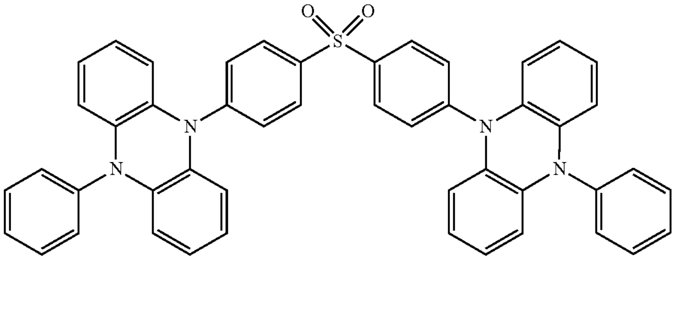, -continued
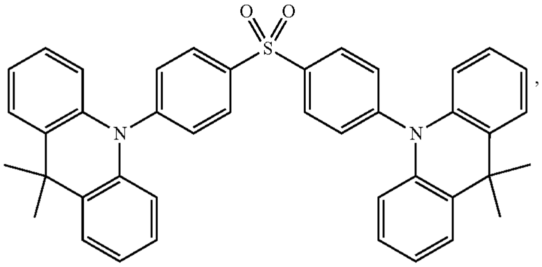
,
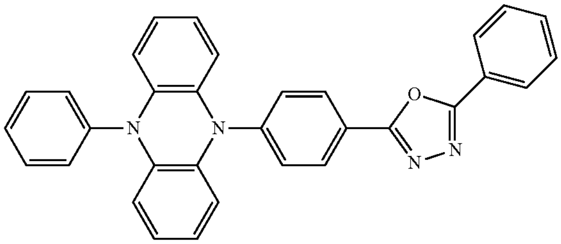
,
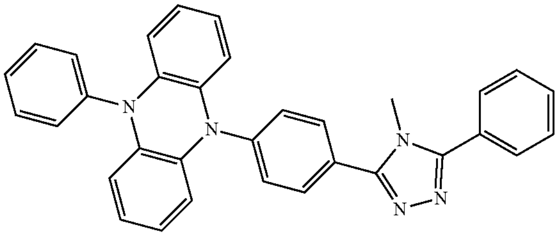
,
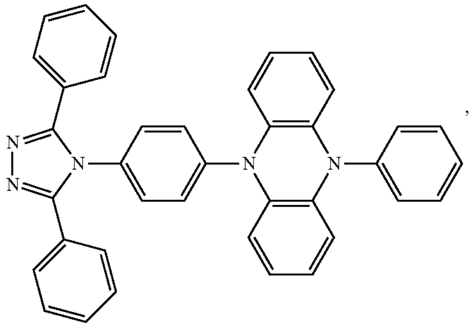
,
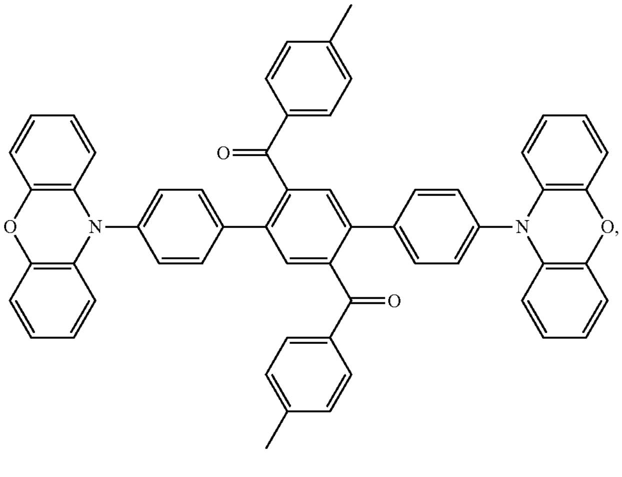
,
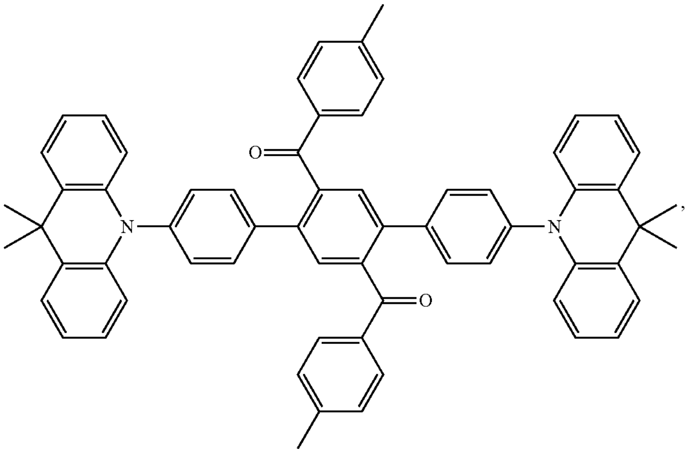
, -continued
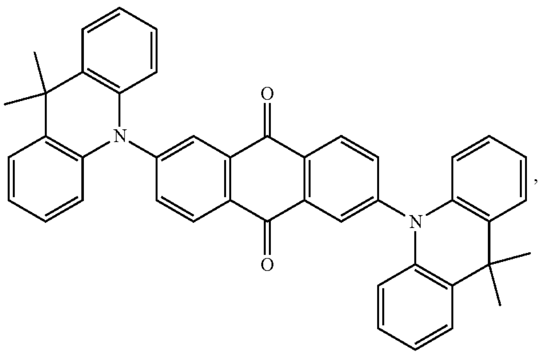
,
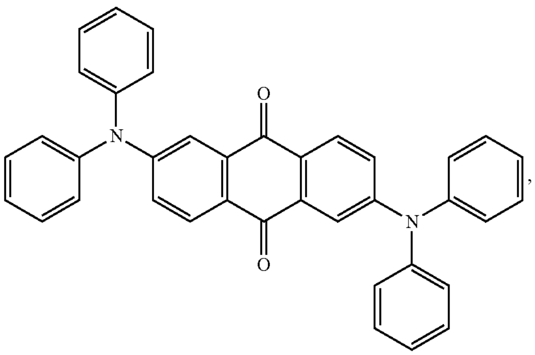
,
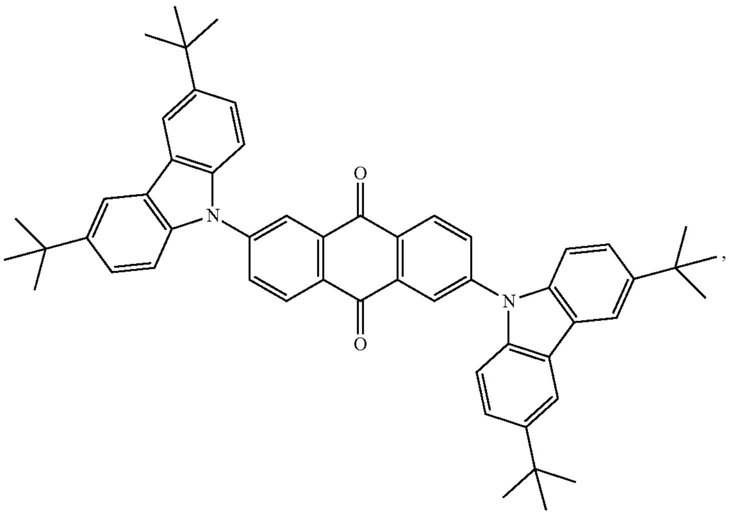
,
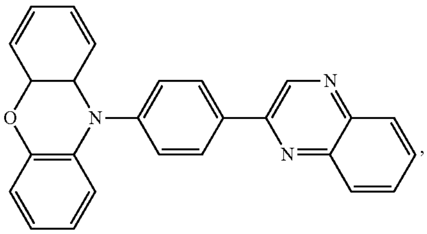
,
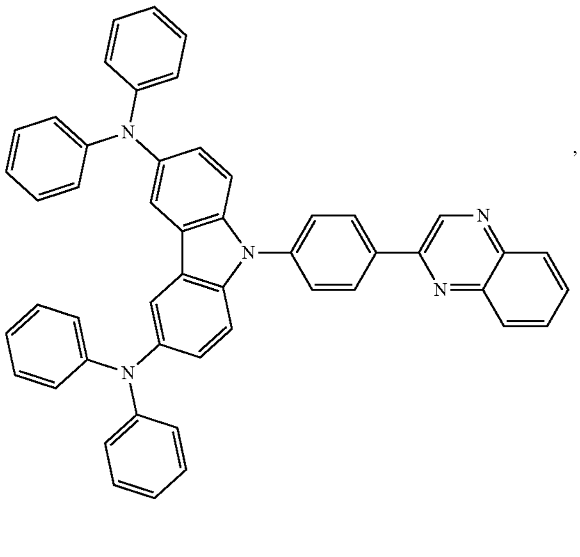
, -continued
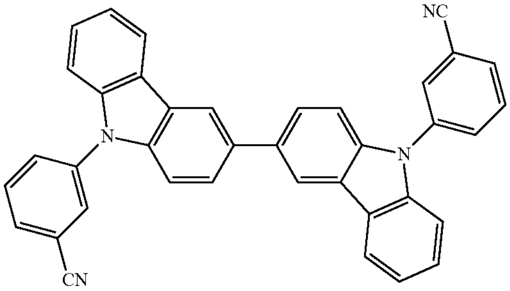
,
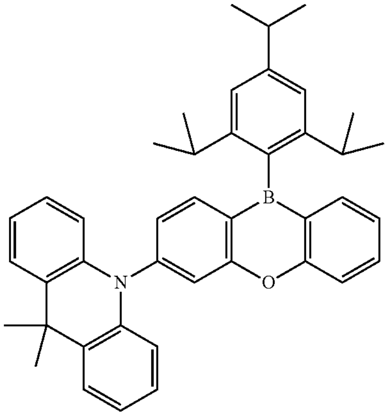
,
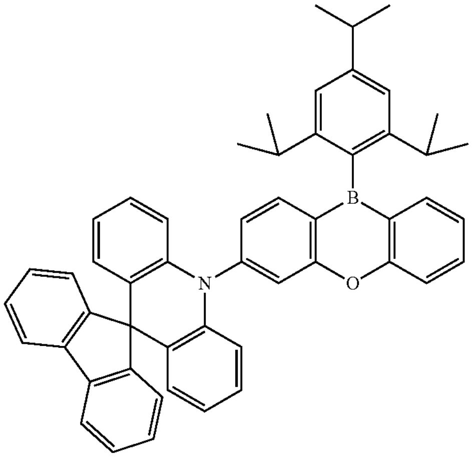
,
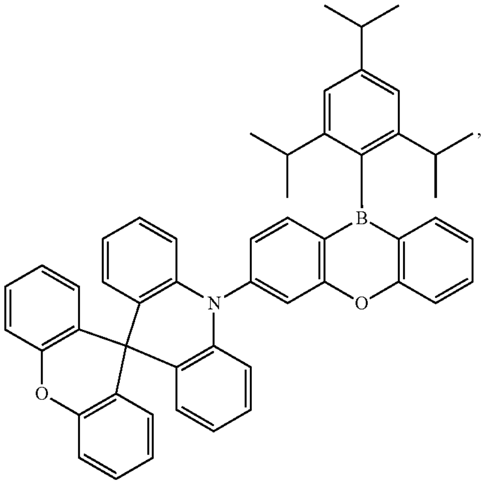
,
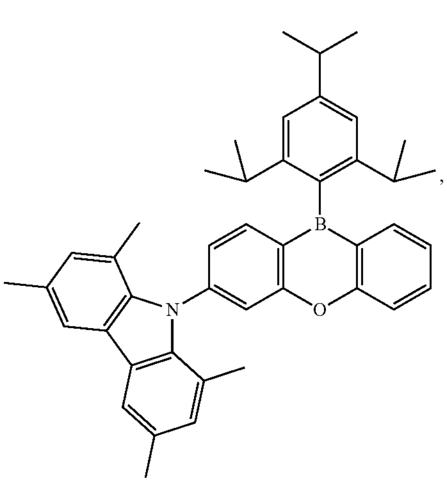
,
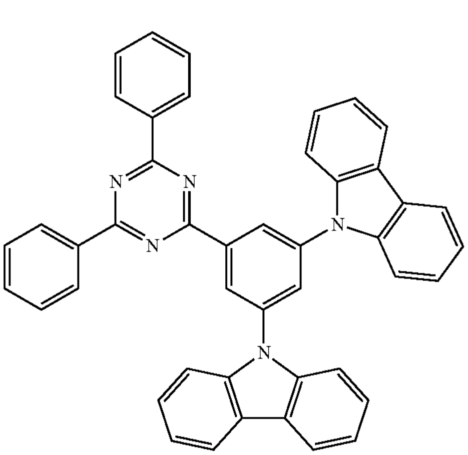
, -continued
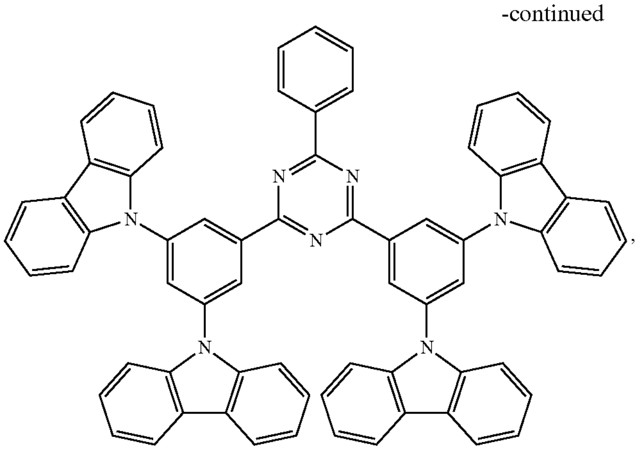
,
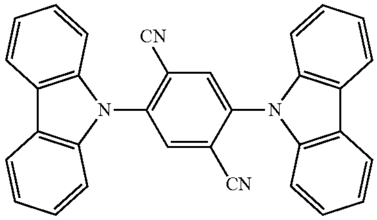
,
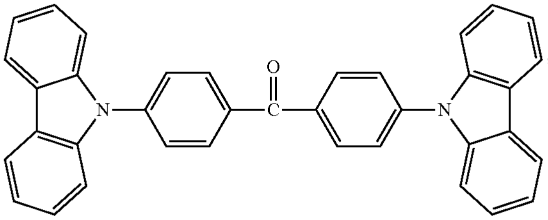
,
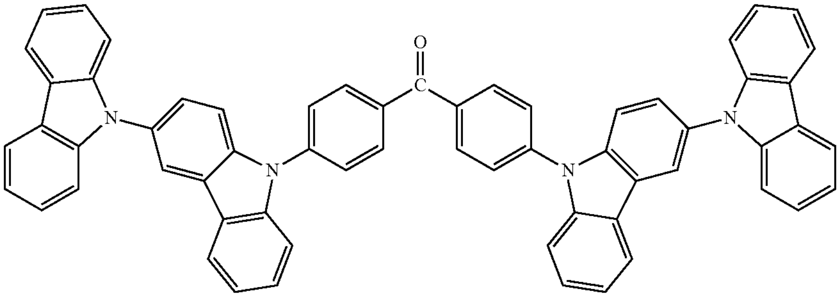
,
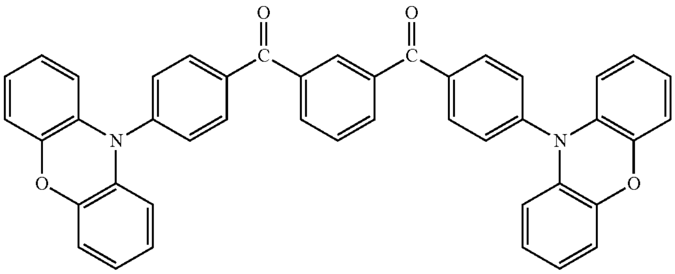
,
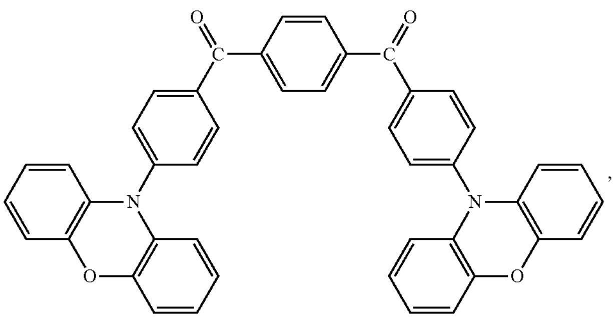
,
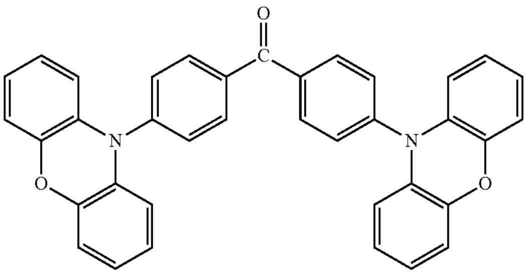
, -continued
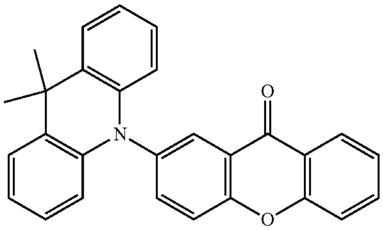,
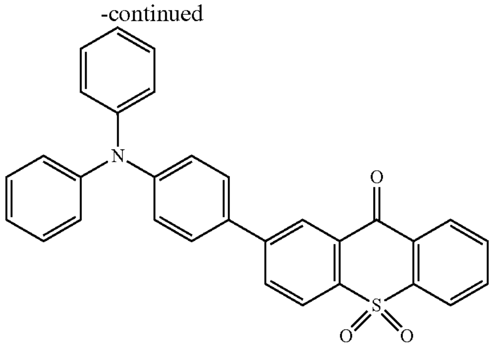,
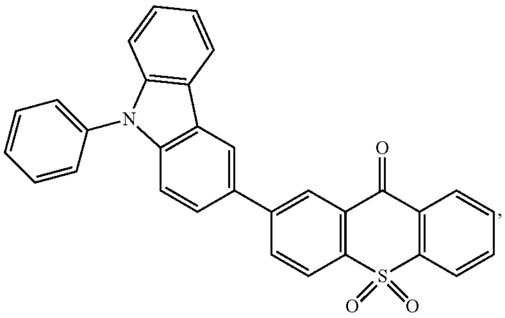,
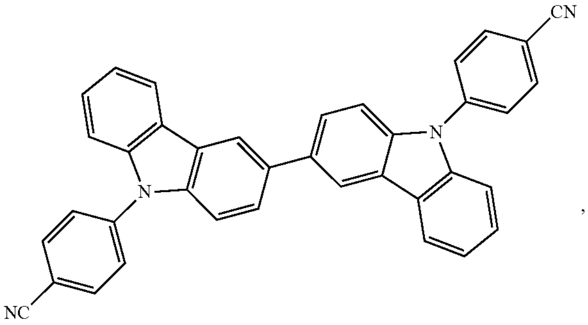,
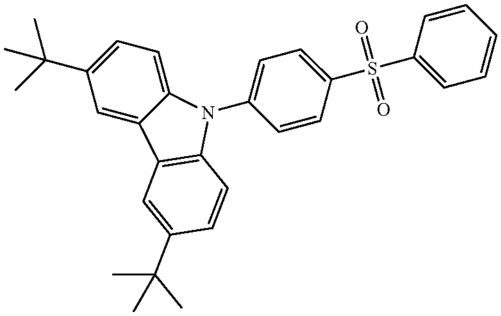,
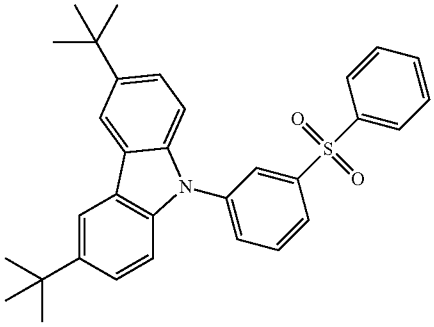,
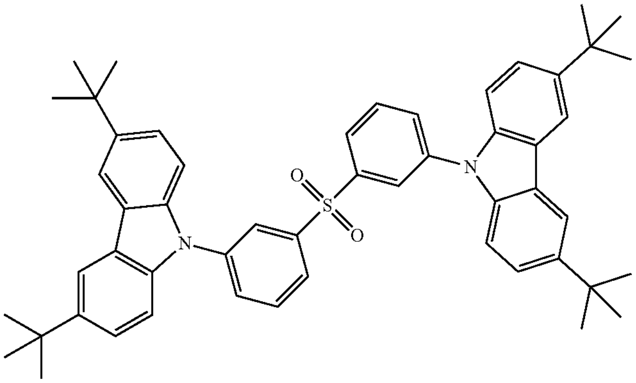, -continued

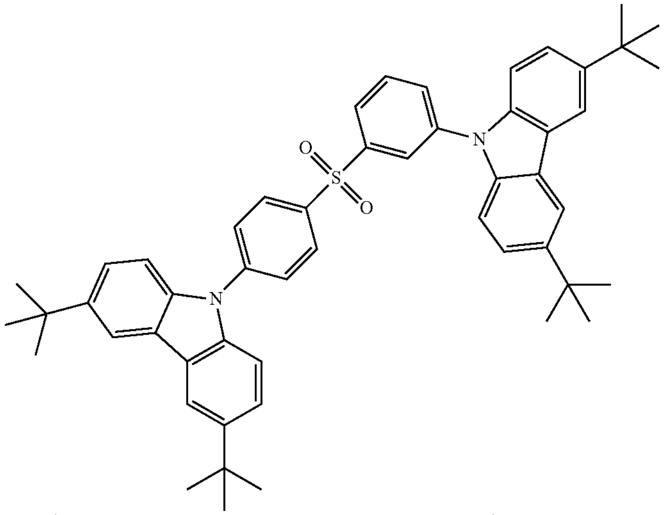

and

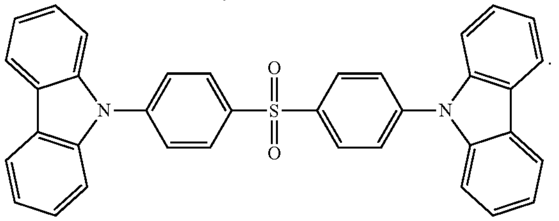

The foregoing mixture can be applied in an organic electronic device selected from, but not limited to, an organic light-emitting diode (OLED), an organic photovoltaic cell (OPV), an organic light-emitting electrochemical cell (OLEEC), an organic field effect transistor (OFET), an organic light-emitting field effect transistor, an organic laser, an organic spintronic device, organic sensor and an organic plasmon emitting diode.

A formulation of an embodiment includes the mixture and an organic solvent.

Viscosity and surface tension of a formulation are important parameters when the formulation is used in a printing technique. The surface tension parameters of a formulation should match with a specific substrate and a specific printing method.

In one of the embodiments, the formulation has a surface tension of 19 dyne/cm to 50 dyne/cm at 25° C. Further, the formulation has a surface tension of 22 dyne/cm to 35 dyne/cm at 25° C. Still further, the formulation has a surface tension of 25 dyne/cm to 33 dyne/cm.

In one of the embodiments, the formulation has a viscosity of 1 cps to 100 cps at 25° C. Further, the formulation has a viscosity of 1 cps to 50 cps. Still further, the formulation has a viscosity of 1.5 cps to 20 cps. Even further, the formulation has a viscosity of 4.0 cps to 20 cps. The formulation of such viscosity facilitates inkjet printing.

In one of the embodiments, the organic solvent has a boiling point greater than 150° C. at 1 standard atmosphere. Further, the organic solvent has a boiling point greater than 180° C. Still further, the organic solvent has a boiling point greater than 200° C. Still further, the organic solvent has a boiling point greater than 250° C. Even further, the organic solvent has a boiling point greater than 300° C. The organic solvent of such boiling points is beneficial for preventing the nozzle of the inkjet printing head from clogging. The organic solvent can be evaporated from the solvent system to form a thin film including a functional material.

The viscosity can be adjusted by different methods, such as by selecting solvents and adjusting the concentration of an organic functional material in the formulation. The mixture including the metal organic complex or polymer can facilitate the adjustment of the printing mixture in an appropriate range according to the printing method used.

In one of the embodiments, the mixture has a mass percentage of 0.01 wt % to 20 wt % in the formulation. Further, the mixture has a mass percentage of 0.1 wt % to 15 wt % in the formulation. Still further, the mixture has a mass percentage of 0.2 wt % to 10 wt % in the formulation. Even further, the mixture has a mass percentage of 0.25 wt % to 5 wt % in the formulation.

In one of the embodiments, when the mixture includes an organic functional material, the organic functional material has a mass percentage of 0.3 wt % to 30 wt % in the formulation. Further, the organic functional material has a mass percentage of 0.5 wt % to 20 wt % in the formulation. Still further, the organic functional material has a mass percentage of 0.5 wt % to 15 wt % in the formulation. Still further, the organic functional material has a mass percentage of 0.5 wt % to 10 wt % in the formulation. Even further, the organic functional material has a mass percentage of 1 wt % to 5 wt % in the formulation.

The organic solvent includes a first solvent including at least one of an aromatic solvent, a heteroaromatic solvent, a ketone solvent, and an ether solvent. Further, the aromatic solvent is one selected from an aliphatic chain-substituted aromatic solvent and a ring-substituted aromatic solvent.

Specifically, the aromatic solvent or the heteroaromatic solvent is one selected from the group consisting of p-diisopropylbenzene, pentylbenzene, tetrahydronaphthalene, cyclohexyl benzene, chloronaphthalene, 1,4-dimethylnaphthalene, 3-isopropylbiphenyl, p-cymene, dipentylbenzene, tripentylbenzene, pentyltoluene, o-xylene, m-xylene, p-xylene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, 1-methoxynaphthalene, cyclohexylbenzene, dimethylnaphthalene, 3-isopropylbiphenyl, p-cymene, 1-methylnaphthalene, 1,2,4-trichlorobenzene, 1,3-dipropoxybenzene, 4,4-difluorodiphenylmethane, 1,2-dimethoxy-4-(1-propenyl)benzene, diphenylmethane, 2-phenylpyridine, 3-phenylpyridine, N-methyldiphenylamine 4-isopropylbiphenyl, α,α-dichlorodiphenylmethane, 4-(3-phenylpropyl)pyridine, benzylbenzoate, 1,1-di(3,4-dimethylphenyl)ethane, 2-isopropylnaphthalene and dibenzylether.

Specifically, the ketone solvent is one selected from the group consisting of 1-tetralone, 2-tetralone, 2-(phenylepoxy)tetralone, 6-(methyloxy)tetralone, acetophenone, propiophenone, benzophenone, 4-methylacetophenone, 3-methylacetophenone, 2-methylacetophenone, 4-methylpropiophenone, 3-methylpropiophenone, 2-methylpropiophenone, isophorone, 2,6,8-trimethyl-4-nonanone, fenchone, 2-nonanone, 3-nonanone, 5-nonanone, 2-decanone, 2,5-hexanedione, phorone and 6-undecanone.

Specifically, the ether solvent is one selected from the group consisting of 3-phenoxytoluene, butoxybenzene, benzyl butylbenzene, p-anisaldehyde dimethyl acetal, tetrahydro-2-phenoxy-2H-pyran, 1,2-dimethoxy-4-(1-propenyl) benzene, 1,4-benzodioxane, 1,3-dipropylbenzene, 2,5-dimethoxytoluene, 4-ethylphenetole, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenyl anisole, 1,2-dimethoxybenzene, 1-methoxynaphthalene, diphenyl ether, 2-phenoxymethyl ether, 2-phenoxytetrahydrofuran, ethyl-2-naphthyl ether, pentyl ether, hexyl ether, dicaprylyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethyl ether butyl methyl ether, tripropylene glycol dimethyl ether and tetraethylene glycol dimethyl ether.

Specifically, the ester solvent is one selected from the group consisting of alkyl caprylate, alkyl sebacate, alkyl stearate, alkyl benzoate, alkyl phenylacetate, alkyl cinnamate, alkyl oxalate, alkyl maleate, alkyl lactone and alkyl oleate.

Further, the first solvent includes at least one of an aliphatic ketone and an aliphatic ether. The aliphatic ketone is at least one selected from the group consisting of 2-nonanone, 3-nonanone, 5-nonanone, 2-decanone, 2,5-hexanedione, 2,6,8-trimethyl-4-nonanone, phorone and di-n-pentyl ketone; the aliphatic ether is at least one selected from the group consisting of amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethyl ether alcohol ethyl methyl ether, triethylene glycol butyl methyl ether, tripropylene glycol dimethyl ether and tetraethylene glycol dimethyl ether.

In another embodiment, the organic solvent further includes a second solvent including at least one of methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxy toluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin and indene.

A formulation of an embodiment can be used as an ink and can be applied in an organic electronic device. The formulation may be a solution or a suspension. The organic electronic device is selected from, but not limited to, one of an organic light-emitting diode (OLED), an organic photovoltaic cell (OPV), an organic light-emitting electrochemical cell (OLEEC), an organic field effect transistor (OFET), an organic light-emitting field effect transistor, an organic laser, an organic spintronic device, an organic sensor and an organic plasmon emitting diode. Specifically, the organic electronic device is an OLED. Specifically, the mixture is used in a light-emitting layer of an OLED device.

Further, the formulation can be applied in an electronic device by a printing or coating method. The printing or coating method is selected from, but not limited to, inkjet printing, nozzle printing, letterpress printing, screen printing, dip coating, spin coating, blade coating, roller printing, torsion roller printing, lithography, flexographic printing, rotary printing, spray coating, brush coating, or pad printing, slot die coating, and the like. Preferred is one of gravure printing, nozzle printing and inkjet printing.

In one of the embodiments, when the formulation is applied in an organic electronic device, the formulation will further include at least one of a surfactant compound, a lubricant, a wetting agent, a dispersant, a hydrophobic agent and a binder, to adjust the viscosity, film-forming property and adhesion of the formulation. Specifically, the printing or coating method and the adjustment of the viscosity, film-forming property and adhesion of the formulation may be referred to the method disclosed in Handbook of Print Media: Technologies and Production Methods, Helmut Kipphan, ISBN 3-540-67326-1.

An organic electronic device of an embodiment includes one of the foregoing mixtures or is prepared by formulation. The organic electronic device is one selected from, but not limited to, an organic light-emitting diode (OLED), an organic photovoltaic cell (OPV), an organic light-emitting electrochemical cell (OLEEC), an organic field effect transistor (OFET), an organic light-emitting field effect transistor, an organic laser, an organic spintronic device, an organic sensor and an organic plasmon emitting diode. Specifically, the organic electronic device is an organic electroluminescent device, such as an OLED, an OLEEC and an organic light-emitting field effect transistor.

Further, the organic electronic device includes a functional layer including one of the foregoing mixture or the foregoing formulation. Still further, the organic electronic device includes a cathode, an anode and a functional layer located between the cathode and the anode. The functional layer includes the foregoing mixture or is prepared by formulation.

In one of the embodiments, the organic electronic device includes a hole transporting layer including the foregoing mixture, wherein the organic compounds in the mixture are all hole transporting materials.

In one of the embodiments, the organic electronic device is an organic electroluminescent device the light-emitting layer of which includes the foregoing mixture, or includes the foregoing mixture and a phosphorescent emitter, or includes the foregoing mixture and a fluorescent emitter or includes the foregoing mixture, a phosphorescent emitter and a matrix material. The organic electronic device has an emission wavelength of 300 nm to 1000 nm. Further, the organic electronic device has an emission wavelength of 350 nm to 900 nm. Still further, the organic electronic device has an emission wavelength of 400 nm to 800 nm.

In one of the embodiments, the organic electronic device includes a substrate, an anode, a light-emitting layer and a cathode. Particularly, the organic electronic device is an organic light emitting diode.

The substrate can be opaque or transparent. A transparent substrate can be used to fabricate a transparent light-emitting device. For example, the transparent light-emitting device may be that disclosed in Bulovic et al. Nature 1996, 380, p 29 and Gu et al. Appl. Phys. Lett. 1996, 68, p 2606. The substrate may be rigid or elastic. The substrate can be plastic, metal, semiconductor wafer or glass. Further, the substrate has a smooth surface. The substrate without any surface defects is a particular desirable choice.

In one of the embodiments, the substrate is flexible and is a polymer thin film or a plastic. The substrate has a glass transition temperature (Tg) greater than 150° C., and further, the substrate has a glass transition temperature greater than 200° C. Still further, the substrate has a glass transition temperature greater than 250° C. Even further, the substrate has a glass transition temperature greater than 300° C. Specifically, the flexible substrate is polyethylene terephthalate (PET) and polyethylene 2,6-naphthalate (PEN).

The anode includes one of a conductive metal, a metallic oxide and a conductive polymer. The anode can inject holes easily into the hole injection layer (HIL), the hole transporting layer (HTL), or the light-emitting layer.

In one of the embodiments, the absolute value of the difference between the work function of the anode and the HOMO energy level or the valence band energy level of the emitter in the light-emitting layer or of the p-type semiconductor material as the HIL or HTL or the electron blocking layer (EBL) is less than 0.5 eV, further less than 0.3 eV, still further less than 0.2 eV. The anode material includes, but is not limited to one of Al, Cu, Au, Ag, Mg, Fe, Co, Ni, Mn, Pd, Pt, ITO and aluminum-doped zinc oxide (AZO). The anode material can be applied to physical vapor deposition including radio frequency magnetron sputtering, vacuum thermal evaporation, electron beam (e-beam), and the like. In one of the embodiments, the anode is patterned and structured. A patterned ITO conductive substrate may be used in preparing the organic electronic device. The patterned ITO conductive substrate is commercially available.

The cathode includes a conductive metal or metal oxide. The cathode can inject electrons into the EIL or ETL, or light-emitting layer. In one of the embodiments, the absolute value of the difference between the work function of the cathode and the LUMO energy level or the valence band energy level of the emitter in the light-emitting layer or of the n type semiconductor material as the electron injection layer (EIL) or the electron transporting layer (ETL) or the hole blocking layer (HBL) is less than 0.5 eV, further less than 0.3 eV, still further less than 0.2 eV In principle, all materials that can be used as a cathode for an OLED can be used as a cathode material for the devices of the disclosure.

The cathode material is selected from, but not limited to Al, Au, Ag, Ca, Ba, Mg, LiF/Al, MgAg alloy, BaF2/Al, Cu, Fe, Co, Ni, Mn, Pd, Pt, and ITO. The cathode material can be applied to physical vapor deposition including radio frequency magnetron sputtering, vacuum thermal evaporation, electron beam (e-beam), and the like.

In one of the embodiments, an OLED includes one of a hole injection layer (HIL), a hole transporting layer (HTL), an electron blocking layer (EBL), an electron injection layer (EIL), an electron transporting layer (ETL) and a hole blocking layer (HBL). Specifically, the OLED includes the hole injection layer (HIL), hole transporting layer (HTL), electron blocking layer (EBL), electron injection layer (EIL), electron transporting layer (ETL), and hole blocking layer (HBL) disclosed in WO2010135519A1, US20090134784A1 and WO20111100277A1.

Specifically, referring to FIG. 1, an organic light emitting diode according to an embodiment includes a substrate 101, an anode 102, a hole injection layer or a hole transporting layer 103, a light emitting layer 104, an electron injection layer or an electron transporting layer 105, and a cathode 106.

An electronic equipment according to an embodiment includes the foregoing organic electronic device. The electronic equipment is one selected from a display equipment, a lighting equipment, a light source, and a sensor.

The present disclosure will be described below with reference to the preferred embodiments, but the present disclosure is not limited to the following embodiments. It should be understood that the appended claims summarized the scope of the present disclosure. Those skilled in the art should realize that certain changes to the embodiments of the present disclosure will be covered by the spirit and scope of the claims of the present disclosure.

The following are specific examples.

Example 1

1. Material and Energy Level Structure

FH-18

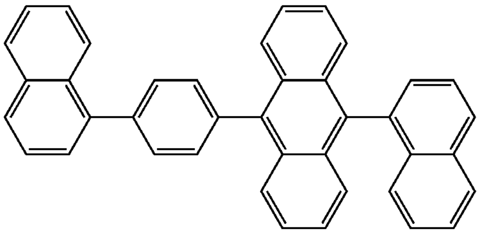

FH-19

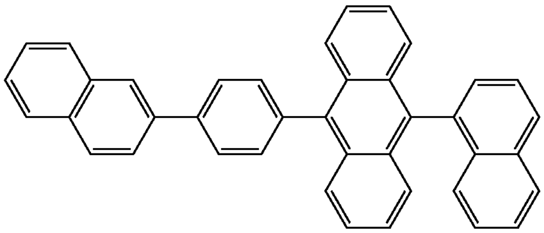

FH-21

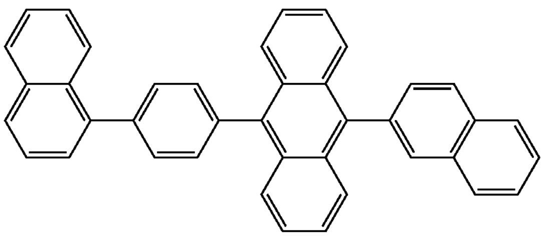

-continued

FH-29

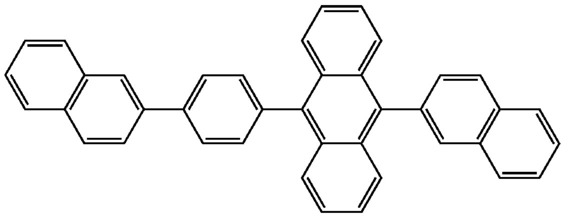

FH-8

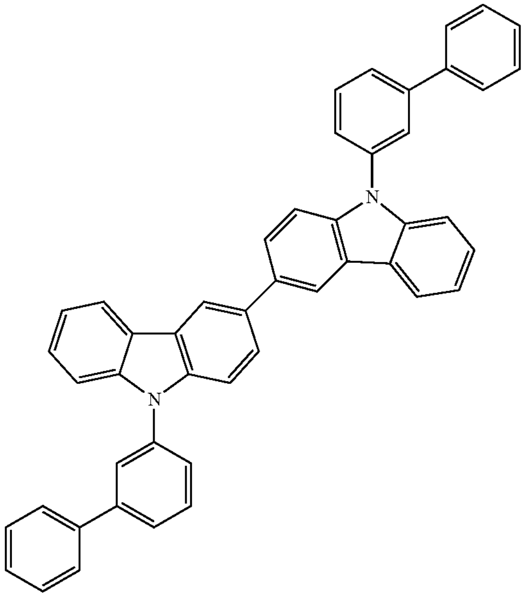

PH-12

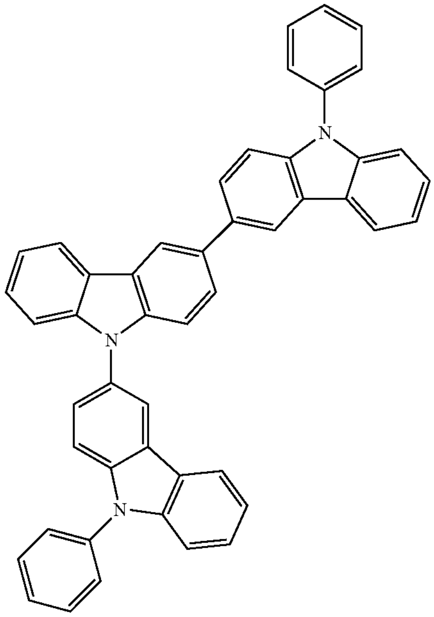

-continued

PH-13

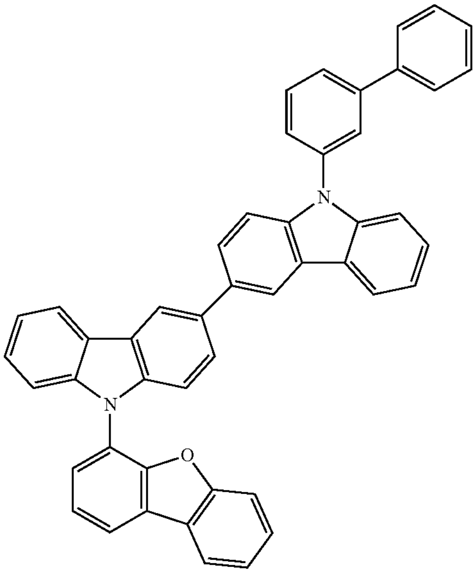

FD-1

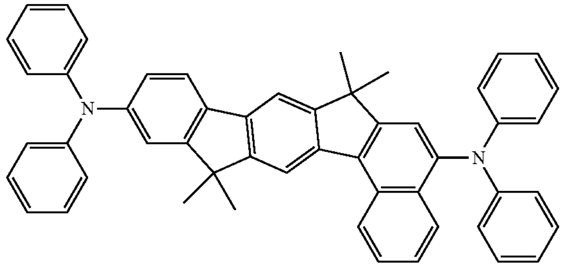

PD-1

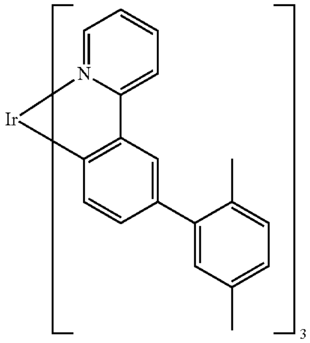

FH-18, FH-19, FH-21 and FH-29 were all purchased from Jilin OLED Material Tech Co., Ltd;

PH-8, PH-11, PH-12 were synthesized according to patent WO201034125A1;

FD-1 was synthesized according to patent WO2008006449;

PD-1 was synthesized according to patent CN102668152;

The energy levels of the foregoing materials can be obtained by quantum calculation. The results are shown in Table 1. For example, TD-DFT (time-density functional theory) was used through Gaussian09W (Gaussian Inc.), and the specific simulation methods can be found in WO2011141110: firstly, the molecular geometry is optimized by semi-empirical method "Ground State/Semi-empirical/Default Spin/AM1" (Charge 0/Spin Singlet), and then the energy structure of organic molecules is calculated by TD-DFT (time-density functional theory) to obtain "TD-SCF/DFT/Default Spin/B3PW91" and the basis set "6-31G (d)" (Charge 0/Spin Singlet). The HOMO and LUMO energy levels are calculated according to the following calibration formulas, and S1 and T1 are used directly.

$$HOMO(eV)=((HOMO(G)\times 27.212)-0.9899)/1.1206$$

$$LUMO(eV)=((LUMO(G)\times 27.212)-2.0041)/1.385$$

wherein the HOMO(G) and LUMO (G) are the direct calculation results of Gaussian 09W, in units of Hartree, and the specific simulation methods can be found in WO2011141110; the polymer HT-1 was obtained by simulating a trimer.

TABLE 1

| Material | HOMO[eV] | HOMO − 1[eV] | LUMO[eV] | LUMO + 1[eV] | T1[eV] | S1[eV] |
|---|---|---|---|---|---|---|
| FH-18 | −5.57 | −6.08 | −2.70 | −2.31 | 1.71 | 3.17 |
| FH-19 | −5.54 | −6.11 | −2.70 | −2.37 | 1.71 | 3.15 |
| FH-21 | −5.53 | −6.07 | −2.71 | −2.31 | 1.70 | 3.12 |
| FH-29 | −5.53 | −6.11 | −2.70 | −2.30 | 1.70 | 3.12 |
| PH-8 | −5.44 | −5.86 | −2.22 | −2.17 | 2.92 | 3.12 |
| PH-12 | −5.36 | −5.75 | −2.18 | −1.99 | 3.01 | 3.20 |
| PH-13 | −5.47 | −5.90 | −2.37 | −2.16 | 2.91 | 3.13 |

2. Preparation of OLED Devices

1) Cleaning of an ITO transparent electrode (anode) glass substrate: the substrate was subjected to ultrasonic treatment with an aqueous solution of 5% Decon90 cleaning solution for 30 minutes, followed by ultrasonic cleaning with deionized water for several times, then subjected to ultrasonic cleaning with isopropanol and nitrogen drying. The substrate was treated under oxygen plasma for 5 minutes to clean the ITO surface and to improve the work function of the ITO electrode.

2) Preparation of a hole transporting layer: a PEDOT:PSS solution was spin-coated on the oxygen plasma-treated glass substrate to obtain an 80-nm thin film, the film was annealed in air at 150° C. for 20 minutes, and a 20-nm Poly-TFB thin film (CAS: 223569-31-1, purchased from Lumtec. Corp; 5 mg/mL toluene solution) was spin-coated on the PEDOT:PSS layer, followed by treatment on a hot plate at 180° C. for 60 minutes.

3) Preparation of a light-emitting layer: FH-18, FH-19, FH-21, FH-28, FD-1 were dissolved in toluene at a ratio of 25:25:22:22:6, and the concentration of the solution is 18 mg/mL. This solution was spin-coated in a nitrogen glove box to obtain a 60-nm film and was then annealed at 120° C. for 10 minutes.

4) Preparation of a cathode: the spin-coated device was placed in a vacuum evaporation chamber, and 2-nm barium and 100-nm aluminum were sequentially deposited to obtain a light-emitting device.

5) The light-emitting device was encapsulated in a nitrogen glove box using an ultraviolet curing resin and a glass cover.

Example 2

The preparation method of the OLED device according to Example 2 is similar to that of the OLED device according to Example 1, except that in the preparation of the light-emitting layer and the cathode, PH-8, PH-11, PH-12, PD-1 were dissolved in toluene in a ratio of 30:30:30:10, and the concentration of the solution is 24 mg/mL. This solution was spin-coated in a nitrogen glove box to obtain a 60-nm thin film, and then annealed at 120° C. for 10 minutes. The spin-coated device was placed in a vacuum evaporation chamber, and 2-nm barium and 100-nm aluminum were sequentially deposited to obtain a light-emitting device.

Comparative Example 1

The preparation method of the OLED device according to Comparative Example 1 is similar to that of the OLED device according to Example 1, except that in the preparation of the light-emitting layer, FH-19:FD-1 were dissolved in toluene in a ratio of 94:6, and the concentration of the toluene solution is 18 mg/mL.

Comparative Example 2

The preparation method of the OLED device according to Comparative Example 2 is similar to that of the OLED device according to Example 2, except that in the preparation of the light-emitting layer, FH-8:FD-1 were dissolved in toluene in a ratio of 90:10, and the concentration of the toluene solution is 20 mg/mL.

Test:

Current-voltage (I-V) curve of the OLED devices is recorded by a computer-controlled Keithley 2400 source measurement unit, brightness was measured by using a calibrated silicon photodiode (HAMAMATSU, S3204-08), and electroluminescent spectra were measured by a fiber optic spectrometer (Ocean Optics USB2000+). Lifetime is the time it takes for the measured initial brightness (assumed to be 100%) to decrease to 80%. The performance results of the OLED devices obtained in Examples 1, 2 and Comparative Examples 1, 2 are shown in Table 2.

TABLE 2

| | Driving Voltage (V) | Current Efficiency (cd/A) | T80 (hr@10 mA/cm$^2$) |
|---|---|---|---|
| Example 1 | 6.2 | 5.6 | 85 |
| Example 2 | 5.9 | 50 | 170 |
| Comparative Example 1 | 6.1 | 4.8 | 49 |
| Comparative Example 2 | 6.0 | 37 | 101 |

As can be seen from Table 2, by using the multi-component mixture as a host material for phosphorescent and fluorescent systems, the performance of the device has been improved significantly. It shows that the multi-component main body system can inhibit the crystallization of a single material and improve the film formation quality.

It should be understood that the application of the present disclosure is not limited to the above-described examples, and those skilled in the art can make modifications and changes in accordance with the above description, all of which are within the scope of the appended claims.

What is claimed is:

1. A mixture comprising three or more organic compounds, wherein a molecular weight difference between any two organic compounds is less than 160 Dalton, in the mixture, a molar content of each organic compound is no less than 3% and no more than 90%, and all of the organic compounds have at least one identical optoelectronic function, wherein all of the organic compounds satisfy at least one of the following conditions:

wherein a difference in singlet excited state energy level between any two of the organic compounds is no greater than 0.2 eV, wherein a difference in triplet excited state energy level between any two of the organic compounds is no greater than 0.2 eV, wherein a difference in HOMO energy level between any two of the organic compounds is no greater than 0.2 eV, wherein a difference in LUMO energy level between any two of the organic compounds is no greater than 0.2 eV, wherein any one of the organic compound has a ΔHOMO no less than 0.2 eV, wherein any one of the organic compound has a ΔLUMO no less than 0.2 eV, wherein any one of the organic compound has a Δ(S1−T1) no less than 0.8 eV, wherein a difference in sublimation temperature between any two of the organic compounds is no greater than 30° C.

2. The mixture according to claim 1, wherein a difference in molar content between any two organic compounds in the mixture is no greater than 0.3%.

3. The mixture according to claim 1, wherein all of the organic compounds in the mixture are selected from the group consisting of a fluorescent host material, a phosphorescent host material, a hole transporting material, and an electron transporting material.

4. The mixture according to claim 1, wherein all of the organic compounds are selected from the group consisting of the following general formulas:

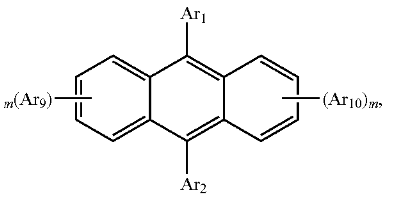

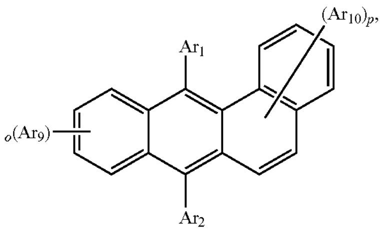

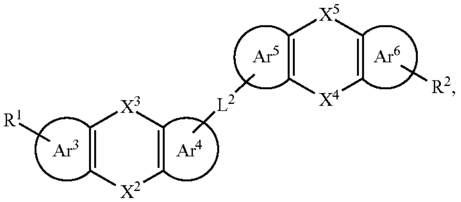

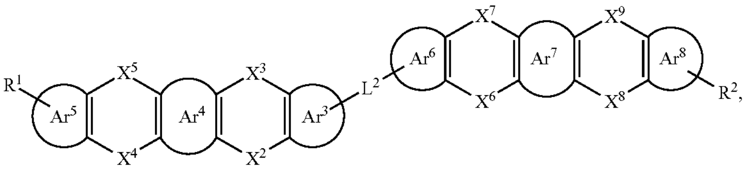

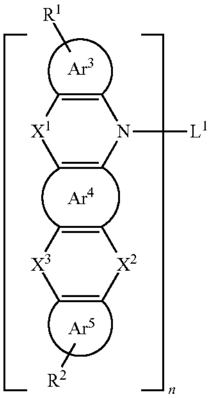

and

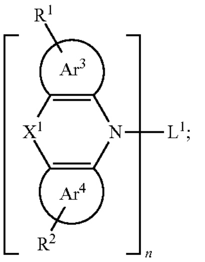

wherein $Ar^1$ and $Ar^2$ are each independently selected from the group consisting of an aryl group containing 6 to 60 carbon atoms, and a heteroaryl group containing 3 to 60 carbon atoms;

$Ar^9$ and $Ar^{10}$ are each independently selected from the group consisting of H, D, F, CN, NO2, CF3, alkenyl, alkynyl, amino, acyl, amide, cyano, isocyano, alkoxy, hydroxy, carbonyl, sulfonyl, an alkyl group containing 1 to 60 carbon atoms, a cycloalkyl group containing 3 to 60 carbon atoms, an aryl group containing 6 to 60 carbon atoms, and a heteroaromatic ring group containing 3 to 60 carbon atoms;

$L^1$ is one selected from an aryl group containing 5 to 60 ring atoms and an heteroaryl group containing 5 to 60 ring atoms;

-$L^2$- is a single bond, or $L^2$ is one selected from an aryl group containing 5 to 30 ring atoms and a heteroaryl group containing 5 to 30 ring atoms;

$Ar^3$, $Ar^4$, $Ar^5$, $Ar^6$, $Ar^7$ and $Ar^8$ are each independently selected from an aryl group containing 5 to 30 ring atoms and a heteroaryl group containing 5 to 30 ring atoms;

—$X^1$— is a single bond, or $X^1$ is one selected from the group consisting of N(R), $C(R)_2$, $Si(R)_2$, O, C═N(R), C═$C(R)_2$, P(R), P(═O)R, S, S═O or $SO_2$;

—$X^2$—, —$X^3$—, —$X^4$—, —$X^5$—, —$X^6$—, —$X^7$—, —$X^8$— and —$X^9$— are each a single bond, or $X^2$, $X^3$, $X^4$, $X^5$, $X^6$, X7, X8 and X9 are each independently selected from the group consisting of N(R), $C(R)_2$, $Si(R)_2$, O, C═N(R), C═C(R)2, P(R), P(═O)R, S, S═O or $SO_2$, wherein —$X^2$— and —$X^3$— are not single bonds simultaneously, —$X^4$— and —$X^5$— are not single bonds simultaneously, —$X^6$— and —$X^7$— are not single bonds simultaneously, and —$X^8$— and —$X^9$— are not single bonds simultaneously;

$R^1$, $R^2$ and R are each independently selected from the group consisting of H, D, F, CN, alkenyl, alkynyl, nitrile, amine, nitro, acyl, alkoxy, carbonyl, sulfonyl, an alkyl containing 1 to 30 carbon atoms, a cycloalkyl containing 3 to 30 carbon atoms, an aromatic hydrocarbyl group containing 5 to 60 ring atoms and an heteroaromatic ring group containing 5 to 60 carbon atoms;

m is any integer from 0 to 4, o is any integer from 0 to 4, p is any integer from 0 to 6, and n is any integer from 1 to 4.

5. The mixture according to claim 4, wherein all of the organic compounds are selected from the group consisting of the following general formulas:

(1-1)

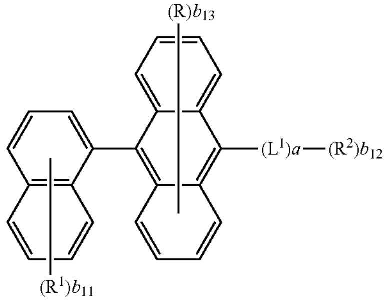

(1-2)

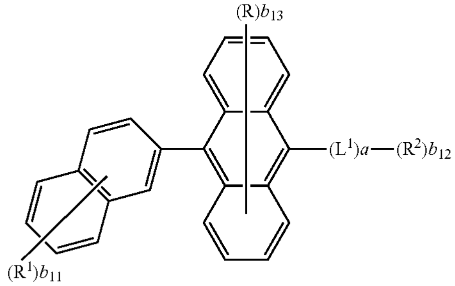

wherein, L1 is one selected from an aryl group containing 5 to 60 ring atoms and a heteroaryl group containing 5 to 60 ring atoms;

R1, R2 and R are each independently selected from the group consisting of H, D, F, CN, alkenyl, alkynyl, nitrile, amine, nitro, acyl, alkoxy, carbonyl, sulfonyl, an alkyl containing 1 to 30 carbon atoms, a cycloalkyl containing 3 to 30 carbon atoms, an aromatic hydrocarbyl group containing 5 to 60 ring atoms, and a heteroaromatic ring group containing 5 to 60 ring atoms;

a is any integer from 1 to 3, b11~b13 are each any integer from 0 to 6.

6. The mixture according to claim 4, wherein all of the organic compounds are selected from the group consisting of the following general formulas:

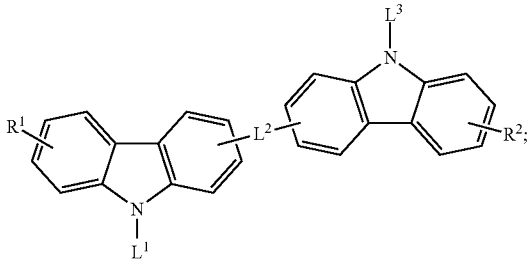

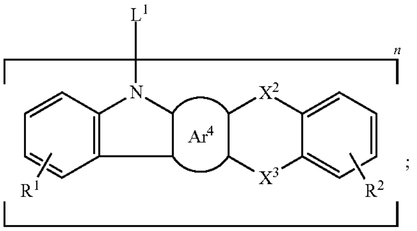

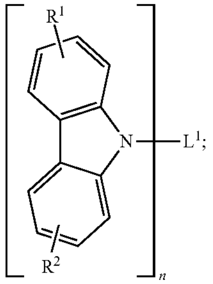

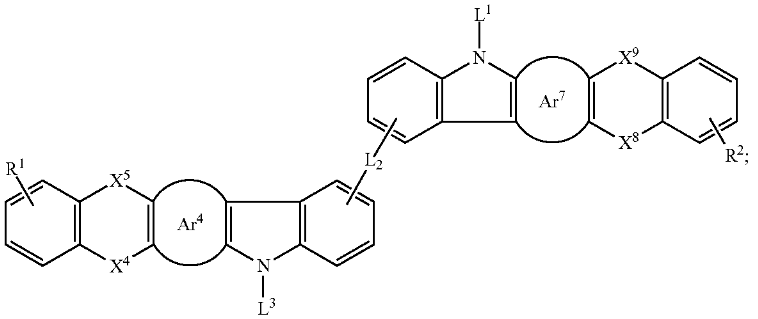

$L^1$ and $L^3$ are selected from an aryl group containing 5 to 60 ring atoms and a heteroaryl group containing 5 to 60 ring atoms;

$-L^2-$ is a single bond, or $L^2$ is one selected from an aryl group containing 5 to 30 ring atoms and a heteroaryl group containing 5 to 30 ring atoms;

$Ar^4$ and $Ar^7$ are each independently selected from an aryl group containing 5 to 30 ring atoms and a heteroaryl group containing 5 to 30 ring atoms;

$—X^2—$, $—X^3—$, $—X^4—$, $—X^5—$, $—X^8—$ and $—X^9—$ are each a single bond, or $X^2$, $X^3$, $X^4$, $X^5$, $X^8$ and $X^9$ are each independently selected from the group consisting of N(R), $C(R)_2$, $Si(R)_2$, O, C═N(R), C═C$(R)_2$, P(R), P(═O)R, S, S═O, and $SO_2$, wherein $—X^2—$ and $—X^3—$ are not single bonds simultaneously, $—X^4—$ and $—X^5—$ are not single bonds simultaneously, and $—X^8—$ and $—X^9—$ are not single bonds simultaneously;

$R^1$, $R^2$ and R are each independently selected from the group consisting of H, D, F, CN, alkenyl, alkynyl, nitrile, amine, nitro, acyl, alkoxy, carbonyl, sulfonyl, an alkyl containing 1 to 30 carbon atoms, a cycloalkyl containing 3 to 30 carbon atoms, an aromatic hydrocarbyl group containing 5 to 60 ring atoms, and a heteroaromatic ring group containing 5 to 60 ring atoms;

n is any integer from 1 to 4.

7. The organic electronic device according to claim 6, wherein the functional layer is a light emitting layer.

8. The mixture according to claim 1, wherein the mixture further comprises an organic functional material selected from the group consisting of a hole injection material, a hole transporting material, an electron transporting material, an electron injection material, an electron blocking material, a hole blocking material, an emitter, and a host material.

9. The mixture according to claim 8, wherein the emitter is one selected from the group consisting of a fluorescent emitter, a thermally activated delayed fluorescent emitter, and a phosphorescent emitter.

10. The mixture according to claim 9, wherein all of the organic compounds are fluorescent host materials, and the organic functional material is a fluorescent emitter.

11. The mixture according to claim 9, wherein the fluorescent emitter is one selected from the group consisting of a derivative of indenofluorene-amine, a derivative of indenofluorene-diamino anthracene, a derivative of naphthalene, a derivative of tetracene, a derivative of xanthene, a derivative of phenanthrene, a derivative of pyrene, a derivative of indenopyrene; a derivative of phenylene, a derivative of diindenopyrene, a derivative of decacycene, a derivative of hexabenzobenzene, a derivative of fluorene, a derivative of spirobifluorene, a derivate of aryl pyrene, a derivative of arylene vinyl, a derivative of cyclopentadiene, a derivative of rubrene, a derivative of coumarin, a derivative of rhodamine, a derivative of quinacridone, a derivative of pyran, a derivative of thiopyran, a derivative of bis(azine)imide boron, a derivative of bis(azine)methylene, a derivative of quinolone, a derivative of oxazinone, a derivative of benzoxazole, a derivative of benzothiazole, a derivative of benzimidazole, and a derivative of pyrrolopyrroledione.

12. The mixture according to claim 9, wherein all of the organic compounds are phosphorescent host materials, and the organic functional material is a phosphorescent emitter.

13. A formulation comprising a mixture according to claim 1, and an organic solvent.

14. The formulation according to claim 13, wherein the formulation has a viscosity of 1 cPs to 100 cPs at 25° C.

15. The formulation according to claim 13, wherein the formulation has a surface tension of 19 dyne/cm to 50 dyne/cm at 25° C.

16. The formulation of claim 13, wherein the formulation has a boiling point greater than 150° C. under one standard atmosphere.

17. An organic electronic device comprising a functional layer, wherein the functional layer includes a mixture according to claim 1.

18. The organic electronic device according to claim 17, wherein the organic electronic device is one selected from the group consisting of an organic light emitting diode, an organic photovoltaic cell, an organic light-emitting electrochemical cell, an organic field effect transistor, an organic light emitting field effect transistor, an organic laser, an organic spintronic device, an organic sensor, and an organic plasmon emitting diode.

19. The mixture according to claim 1, wherein the optoelectronic function is one selected from a hole transporting function, a hole blocking function, an electron transporting function, an electron blocking function, an exciton blocking function, a fluorescent light-emitting function, a phosphorescent light-emitting function, a host function, and a light-absorption function.

* * * * *